United States Patent [19]
Saito et al.

[11] Patent Number: 5,429,685
[45] Date of Patent: Jul. 4, 1995

[54] PHOTOELECTRIC CONVERSION ELEMENT AND POWER GENERATION SYSTEM USING THE SAME

[75] Inventors: Keishi Saito, Soraku; Tatsuyuki Aoike, Nara; Masafumi Sano, Nara; Mitsuyuki Niwa, Nara; Ryo Hayashi, Nara; Masahiko Tonogaki, Tokyo, all of Japan

[73] Assignee: Canon Kabushiki Kaisha, Tokyo, Japan

[21] Appl. No.: 150,813

[22] Filed: Nov. 12, 1993

[30] Foreign Application Priority Data

Nov. 16, 1992 [JP] Japan .................... 4-305203
Nov. 16, 1992 [JP] Japan .................... 4-305367

[51] Int. Cl.⁶ ............... H01L 31/075; H01L 31/0376; H01L 31/0384
[52] U.S. Cl. .................... 136/255; 136/258; 136/293; 257/458; 320/2; 320/27
[58] Field of Search .............. 136/255, 258 AM, 293; 257/458; 320/2, 27; 429/9

[56] References Cited

U.S. PATENT DOCUMENTS

| | | | |
|---|---|---|---|
| 4,471,155 | 9/1984 | Mohr et al. | 136/258 |
| 4,782,376 | 11/1988 | Catalano . | |
| 4,816,082 | 3/1989 | Guha et al. | 136/249 |
| 5,104,455 | 4/1992 | Yokota et al. | 136/249 |
| 5,204,272 | 4/1993 | Guha et al. | 437/4 |
| 5,256,576 | 10/1993 | Guha et al. | 437/4 |
| 5,324,364 | 6/1994 | Matsuda et al. | 136/249 |

FOREIGN PATENT DOCUMENTS

0092925 11/1983 European Pat. Off. ... H01L 31/075
0180781 5/1986 European Pat. Off. ............ H01L 31/075B

OTHER PUBLICATIONS

Shing, et al., "Electron cyclotron resonance microwave plasma deposition...", Solar Cells, vol. 30, pp. 391–401 (1991).
Hamakawa, "Electron Cyclotron Resonance CVD of a-SiC Alloy..." Proc. 8th EC Photovoltaic Solar Energy Conf., pp. 1211-1219 (1988).
Bragagnolo et al., "Optimum Deposition Conditions..System", Conf. Rec. 19th IEEE Photovoltaic Specialists Conf., 1987, pp. 878–883.
Yoshida et al., "Efficiency Improvement in Amorphous-SiGe:H Solar..." Conf. Rec. 19th IEEE Photovoltaic Specialists Conf., 1987, pp. 1101–1106.
Hiroe et al., "Stability and Terrestrial Application... Cells", Conf. Rec. 20th IEEE Photovoltaic Specialists Conf., 1987, pp. 1111–1116.
Sato et al., "Preparation of High Quality a-SiGe:H Films... Cells", Conf. Rec., 19th IEEE Photovoltaic Specialists Conf., 1988, pp. 73–78.
Guha et al., "A Novel Design for Amorphous Silicon Alloy Solar Cells", Conf. Rec., 20th IEEE Photovoltaic Specialists Conf., 1988, pp. 79–84.
Pawliliewicz et al., "Numerical Modeling of Multijunctions,... Cells", Conf. Rec., 20th IEEE Photovoltaic Specialists Conf., 1988, pp. 251–255.

*Primary Examiner*—Aaron Weisstuch
*Attorney, Agent, or Firm*—Fitzpatrick, Cella, Harper & Scinto

[57] ABSTRACT

The present invention provides a photovoltaic element in which the open-circuit voltage and the path length of holes are improved by preventing the recombination of photoexcited carriers.

The p-i-n junction type photovoltaic element is composed of a p-type layer, an i-type layer of a laminated structure consisting of an i-type layer formed by RF plasma CVD on the p-type layer side and an i-type layer formed by microwave ($\mu$W) CVD on the n-type layer side, or an i-type layer formed by microwave ($\mu$W) plasma CVD on the p-type layer side and an i-type layer formed by RF plasma CVD on the n-type layer side, characterized in that the i-type layer formed by $\mu$W plasma CVD is formed by a process in which a lower $\mu$W energy and a higher RF energy than the $\mu$W energy needed to decompose 100% of the source gas are simultaneously applied to a source gas containing Si and Ge at a pressure of 50 mTorr or less, such that the minimum value of the bandgap is shifted toward the p-type layer side, away from the center of the i-type layer, and the i-type layer formed by RF plasma CVD is formed 30 nm thick or less by using a source gas containing a silicon-containing gas at a deposition rate of 2 nm/sec or less.

35 Claims, 27 Drawing Sheets

(P-TYPE LAYER SIDE)             (N-TYPE LAYER SIDE)

PHOTOELECTRIC CONVERSION ELEMENT AND POWER GENERATION SYSTEM USING THE SAME

BACKGROUND OF THE INVENTION

1. Field of the Invention

The present invention relates to a photoelectric conversion element composed of silicon non-single crystalline material, a fabrication method thereof, and a power generation system using the photoelectric conversion element.

Particularly, the invention relates to a photoelectric conversion element wherein the bandgap of a pin-type photoelectric conversion semiconductor is changed, and a deposition method of said photoelectric conversion element by plasma CVD.

2. Related Background Art

In the prior art, various proposals have been made for a photoelectric conversion element of the pin-type structure composed of silicon non-single crystalline material, in which an i-type layer contains silicon and germanium atoms, with the bandgap varying in the i-type layer. For example, the following have been reported:

(1) "Optimum deposition conditions for a-(Si, Ge):H using a triode-configured rf glow discharge system," J. A. Bragagnolo, P. Littlefield, A. Mastrovito, and G. Storti, Conf. Rec. 19th IEEE Photovoltaic Specialists Conference, 1987, pp. 878–883.

(2) "Efficiency improvement in amorphous-SiGe:H solar cells and its application to tandem type solar cells;" S. Yoshida, S. Yamanaka, M. Konagai, and K. Takahashi, Conf. Rec. 19th IEEE Photovoltaic Specialists Conference, 1987, pp. 1101–1106.

(3) "Stability and terrestrial application of a-Si tandem type solar cells," A. Hiroe, H. Yamagishi, H. Nishio, M. Kondo, and Y. Tawada, Conf. Rec. 19th IEEE Photovoltaic Specialists Conference, 1987, pp. 1111–1116.

(4) "Preparation of high quality a-SiGe:H films and its application to the high efficiency triple-junction amorphous solar cells," K. Sato, K. Kawabata, S. Terazono, H. Sasaki, M. Deguchi, T. Itagaki, H. Morikawa, M. Aiga, and K. Fujikawa, Conf. Rec. 20th IEEE Photovoltaic Specialists Conference, 1988, pp. 73–78.

(5) U.S. Pat. No. 4,816,082

(6) U.S. Pat. No. 4,471,155

(7) U.S. Pat. No. 4,782,376

Also, several theoretical researches on the characteristics of a photovoltaic element having a variable bandgap have been reported, for example, (8) "A novel design for amorphous silicon alloy solar cells," S. Guha, J. Yang, A. Pawlikiewicz, T. Glatfelter, R. Ross, and S. R. Ovshinsky, Conf. Rec. 20th IEEE Photovoltaic Specialists Conference, 1988, pp. 79–84.

(9) "Numerical modeling of multijunction, amorphous silicon based P-I-N solar cells," A. H. Pawlikiewicz and S. Guha, Conf. Rec. 20th IEEE Photovoltaic Specialists Conference, 1988, pp. 251–255.

Such photovoltaic elements in the prior arts have a varying bandgap layer inserted into p/i and n/i interfaces for preventing recombination of photoexcited carriers in the vicinity of the interfaces, increasing open-circuit voltage, and enhancing carrier range of holes.

SUMMARY OF THE INVENTION

Conventional photovoltaic elements containing silicon and germanium atoms and having a variable bandgap are required to have higher performance, e.g., in the photoelectric conversion efficiency, and reliability in practical use, however, a further improvement is desired in the open-circuit voltage and the diffusion length of holes by suppressing the recombination of photoexcited carriers.

Also, in conventional photovoltaic elements the photoelectric conversion efficiency may decrease when the illuminating light applied to the photovoltaic elements is weak.

Further, in conventional photovoltaic elements, photoelectric conversion efficiency may decrease if they are annealed due to distortion in the i-type layer.

An object of the present invention is to provide a photoelectric conversion element which can solve the above conventional problems.

That is, it is an object of the present invention to provide a photoelectric conversion element in which the open-circuit voltage and the diffusion length of holes are improved by preventing the recombination of photoexcited carriers.

It is another object of the present invention to provide a photoelectric conversion element with improved conversion efficiency when the illuminating light applied to the photoelectric conversion element is weak.

Further, it is another object of the present invention to provide a photoelectric conversion element which has a smaller decrease in the photoelectric conversion efficiency when annealed for a long time.

In addition, it is another object of the present invention to provide a photoelectric conversion element which has a smaller change in photoelectric conversion efficiency as a result of temperature variations.

Further, it is another object of the present invention to provide a system utilizing a photoelectric conversion element in which the aforementioned objects have been achieved.

The present invention has been achieved as a result of careful research to solve the conventional problems and to accomplish the above objects. It provides a photovoltaic element in which at least a p-type layer, an i-type layer, and an n-type layer made of silicon non-single crystalline semiconductor material are laminated. The i-type layer is of a laminated structure consisting of an i-type layer formed by microwave plasma CVD located on the side of the n-type layer and an i-type layer formed by RF plasma CVD located on the side of the p-type layer. The i-type layer formed by microwave plasma CVD is formed such that the minimum value of bandgap is positioned toward the p-type layer side displaced from the central position of the i-type layer by a microwave plasma CVD process in which a lower microwave energy and a higher RF energy than the microwave energy necessary to decompose 100% of the source gas are simultaneously applied to a source gas composed at least of a silicon atom-containing gas and a germanium atom-containing gas at a pressure of 50 mTorr or less. The i-type layer formed by RF plasma CVD is formed 30 nm thick or less at a deposition rate of 2 nm/sec or less by an RF plasma CVD process using a source gas at least containing a silicon atom-containing gas.

A photovoltaic element of the present invention in desirable form is characterized by a valence electron control agent serving as an electron donor and a valence electron control agent serving as an electron acceptor simultaneously doped into the i-type layer formed by microwave plasma CVD and/or the i-type layer formed by RF plasma CVD. These valence electron control agents are a Group III and/or Group V element of the periodic table, and preferably are distributed in the i-type layer by microwave plasma CVD.

A photovoltaic element of the present invention in desirable form is characterized by the maximum value of the bandgap positioned in the p-type layer side and/or the n-type layer side within the i-type layer formed by microwave plasma CVD. The region of the maximum value of bandgap is from 1 to 30 nm.

Further, oxygen and/or nitrogen atoms are contained in the i-type layer formed by microwave plasma CVD and/or the i-type layer formed by RF plasma CVD.

Also, it is characterized by the content of hydrogen contained in the i-type layer formed by microwave plasma CVD changing corresponding to the content of silicon atoms.

Further, a photovoltaic element of the present invention in desirable form is one in which the p-type layer and/or the n-type layer is of a laminated structure consisting of a layer having a Group III or Group V element of the periodic table as the main constituent and a layer containing a valence electron control agent and having silicon atoms as the main constituent. In particular, the layer having a Group III and/or Group V element of the periodic table as the main constituent is desirably 1 nm thick or less.

A power generation system of the present invention comprises a photovoltaic element, an accumulator for accumulating electric power supplied from the photovoltaic element and/or supplying electric power to an external load, and a control system for controlling the electric power to be supplied from the photovoltaic element to the accumulator and/or the external load while monitoring the voltage and/or current of the photovoltaic element.

A photovoltaic element of the present invention in which at least a p-type layer, an i-type layer, and an n-type layer made of silicon non-single crystalline semiconductor material are laminated is characterized in that the i-type layer is of a laminated structure consisting of an i-type layer formed by microwave plasma CVD located on the side of the p-type layer and an i-type layer formed by RF plasma CVD located on the side of the n-type layer. The i-type layer is formed by microwave plasma CVD such that the minimum value of bandgap is displaced toward the p-type layer side away from the central position of the i-type layer by a microwave plasma CVD process in which a lower microwave energy and a higher RF energy than the microwave energy necessary to decompose 100% of the source gas are simultaneously applied to a source gas composed at least of a silicon atom-containing gas and a germanium atom-containing gas at a pressure of 50 mTorr or less. The i-type layer formed by RF plasma CVD is 30 nm thick or less at a deposition rate of 2 nm/sec or less.

A photovoltaic element of the present invention in desirable form is characterized by a valence electron control agent as an electron donor and a valence electron control agent as an electron acceptor simultaneously doped into the i-type layer formed by microwave plasma CVD and/or the i-type layer formed by RF plasma CVD. These valence electron control agents are a Group III or Group V element of the periodic table, and preferably are distributed in the i-type layer by microwave plasma CVD.

Also, a photovoltaic element of the present invention in desirable form is characterized by the maximum value of the bandgap located in the p-type layer side and/or the n-type layer side within the i-type layer formed by microwave plasma CVD. The region of the maximum value of bandgap is from 1 to 30 nm.

Further, oxygen and/or nitrogen atoms are contained in the i-type layer formed by microwave plasma CVD and/or the i-type layer formed by RF plasma CVD.

Also, it is characterized by the content of hydrogen contained in the i-type layer formed by microwave plasma CVD which changes corresponding to the content of silicon atoms.

A power generation system of the present invention comprises a photovoltaic element, an accumulator for accumulating electric power supplied from the photovoltaic element and/or supplying electric power to an external load, and a control system for controlling the electric power to be supplied from the photovoltaic element to the accumulator and/or the external load while monitoring the voltage and/or current of the photovoltaic element.

DETAILED DESCRIPTION OF THE PREFERRED EMBODIMENTS

The methods and configurations of the present invention will now be described with reference to the drawings.

Figure 1:
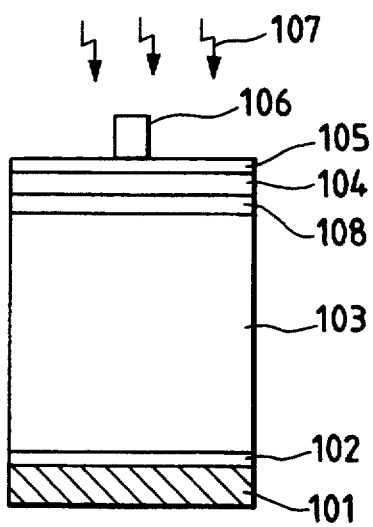
FIG. 1 is a typical view of the layer structure of a photovoltaic element according to the present invention.

FIG. 1 is a typical view of the structure of a photovoltaic element according to the present invention, wherein incident light is indicated by 107. The photovoltaic element is comprised of conductive substrate 101 having a light reflecting layer and a light reflection multiplying layer, n-type silicon non-single crystalline semiconductor layer 102, non-single crystalline semiconductor layer 103 substantially of i-type formed by microwave plasma CVD and containing silicon and germanium atoms, i-type layer 108 formed by RF plasma CVD, p-type silicon non-single crystalline semiconductor layer 104, transparent electrode 105, and collector electrode 106.

Figure 2:
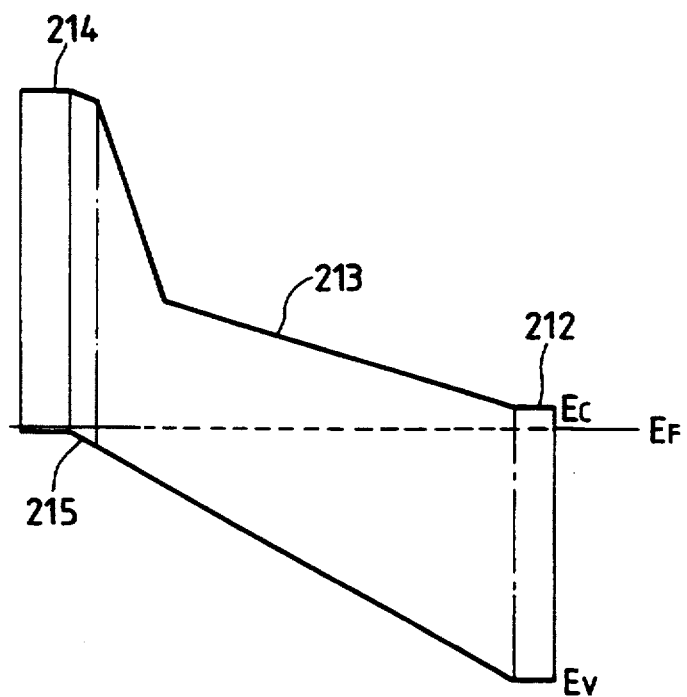
FIG. 2 is a typical band diagram of the photovoltaic element according to the present invention in the thermal equilibrium state.

FIG. 2 is a typical band diagram of the photovoltaic element having a layer structure as shown in FIG. 1, in a state of thermal equilibrium, which is an example of the photovoltaic element of the present invention. In FIG. 2, $E_F$ represents the Fermi level, $E_C$ the conduction band, and $E_V$ the valence band. This figure shows the joining of an n-type silicon non-single crystalline semiconductor layer 212, a non-single crystalline semiconductor layer 213 substantially of i-type formed by microwave plasma CVD and containing silicon and germanium atoms, an i-type layer 215 formed by RF plasma CVD, and a p-type silicon non-single crystalline semiconductor layer 214. Since the minimum value of bandgap takes place at a position shifted toward the p-type layer 214 side in the i-type layer 213 by microwave plasma CVD and there is a larger conduction band electric field on the p-type layer side in the i-type layer 213, the efficient separation of electrons and holes results, whereby the recombination of electrons and positive holes in the vicinity of the interface between the p-type layer and i-type layer can be reduced. Also, since the electric field of the valence band increases from the i-type layer 213 toward the n-type layer, the recombination of electrons and holes photoexcited in the vicinity of the i-type layer 213 and the n-type layer 212 can be reduced.

Further, by adding a valence electron control agent as an electron donor and a valence electron control agent as an electron acceptor simultaneously into the i-type layer formed by microwave plasma CVD, the diffusion length of electrons and holes can be extended. In particular, by containing a relatively great amount of valence electron control agent in the region where the bandgap is minimum, the diffusion length of electrons and holes can be effectively extended. As a result, the high electric field in the vicinity of the interface between the n-type layer and the i-type layer formed by microwave plasma CVD can be further effectively utilized, so that the collection efficiency of electrons and holes photoexcited in the i-type layer can be significantly enhanced. Since the defect levels (so-called $D_-$, $D_+$) can be compensated by the valence electron agent in the vicinity of the interface between the n-type layer and the i-type layer, the dark current (in reverse bias) decreases due to hopping conduction via the defect level. In particular; if more valence electron control agent is contained in the vicinity of the interface than inside the i-type layer, internal stress such as distortion caused by rapid change of the constituents peculiar to the vicinity of the interface can be decreased, so that the defect level in the vicinity of the interface can be lowered. Therefore, the open-circuit voltage and fill factor of the photovoltaic element can be improved.

In addition, by simultaneously adding a valence control agent as the electron donor and a valence electron agent as the electron acceptor into the i-type layer formed by microwave plasma CVD, the resistance to optical degradation can be increased. The exact mechanism is unknown, but may be considered as follows. That is, it is generally believed that the characteristics of a photovoltaic element may be degraded due to recombination centers of carriers with dangling bonds produced by illumination. In the present invention, both the valence electron agent as the electron donor and the valence electron agent as the electron acceptor are contained within the i-type layer and are not 100% activated. As a result, if dangling bonds were produced by light illumination, they would react with inactive valence electron control agent to compensate the dangling bonds.

Also, particularly when the intensity of light illuminating the photovoltaic element is weak, the probability of trapping photoexcited electrons and holes will decrease because the defect level is compensated by the valence electron control agent. A sufficient electromotive force can be produced because the dark current in reverse bias is small, as previously described. As a result, even when the intensity of light illuminating the photovoltaic element is weak, excellent photoelectric conversion efficiency can be exhibited.

In addition, the photovoltaic element according to the present invention is less likely to suffer a decrease in photoelectric conversion efficiency even when annealed for a long time. The exact mechanism is unknown, but may be considered as follows. That is, a photovoltaic element is formed by changing the constituents to provide a continuous change of the bandgap. Hence, a distortion is produced inside the photovoltaic element. That is, this results in a number of weak bonds within the photovoltaic element. Owing to vibrations, the weak bonds within the i-type non-single crystalline semiconductor may be severed to form dangling bonds. However, it is believed that because of the adding of a valence electron control agent serving as an electron donor and a valence electron control agent serving as an electron acceptor simultaneously, the photovoltaic element has an increased local flexibility to prevent the photoelectric conversion efficiency of the photovoltaic element from decreasing even with annealing for a long time. Besides, since inactive donor or acceptor atoms are primarily three-coordinated, the local flexibility may also increase. As a result, the photoelectric conversion efficiency is less liable to decrease during annealing for a long time. However, since inactive donor or acceptor atoms form defects, they must be limited below a certain amount. That is, the preferable amount of inactive donor or acceptor atoms is from 0.1 to 100 ppm.

By providing an i-type layer 215 formed by RF plasma CVD and having a thickness of 30 nm or less between the p-type layer 214 and the i-type layer 213 at a deposition rate of 2 nm/sec or less, the photoelectric conversion efficiency of the photovoltaic element can be further improved. In particular, the photovoltaic element of the present invention is less likely to change in photoelectric conversion efficiency when used in an environment where temperature varies greatly.

The non-single crystalline semiconductor layer of the i-type layer deposited by RF plasma CVD can be deposited at low power at a deposition rate of 2 nm/sec or less because vapor phase reaction hardly occurs. As a result, the packing density of the deposited film is higher, and when the i-type layer is laminated on the film deposited by microwave plasma CVD, the amount of interface levels between the i-type layers becomes lower. In particular, when the deposition rate of the film deposited by microwave plasma CVD is 5 nm/sec or greater, the surface level is very high because the surface of the i-type layer is not sufficiently relaxed after the microwave plasma is stopped. By forming a film by microwave plasma CVD at a slow deposition rate on the surface of such i-type layer, the surface level of the film deposited by microwave plasma CVD may possibly be reduced by the annealing due to diffusion of hydrogen atoms which occurs at the same time as formation of the film deposited by RF plasma CVD.

Also, by containing more valence electron control agent in the vicinity of the interface between the p-type layer and the i-type layer formed by RF plasma CVD than inside the i-type layer, internal stress such as distortion caused by rapid change of constituents peculiar to the vicinity of the interface can be decreased, and consequently the defect level in the interface vicinity can be decreased. Therefore, the open-circuit voltage and fill factor of the photovoltaic element can be improved.

In addition, by simultaneously adding a valence electron control agent serving as an electron donor and a valence electron control agent serving as an acceptor within the i-type layer formed by RF plasma CVD, resistance to optical degradation can be increased. The exact mechanism is unknown, but may be considered as follows. That is, it is generally believed that the characteristics of a photovoltaic element may be degraded due to recombination of carriers with dangling bonds produced by light illumination. In the present invention, both the valence electron control agent serving as the electron donor and the valence electron control agent serving as the acceptor are contained within the i-type layer and are not 100% activated. As a result, if dangling bonds were produced by light illumination, they would react with the inactive valence control agent to compensate for dangling bonds.

Also, particularly when the intensity of light directed to the photovoltaic element is weak, the probability of trapping of photoexcited electrons and holes will decrease because the defect levels are compensated by the valence control agent. Sufficient electromotive force can be produced because the dark current in reverse bias is small, as previously described. As a result, when the intensity of light illuminating the photovoltaic element is weak, excellent photoelectric conversion efficiency can be exhibited.

In addition, the photovoltaic element has a photoelectric conversion efficiency which hardly decreases even when annealed for a long time. The exact mechanism is unknown, but may be considered as follows. That is, it is believed that if a valence electron control agent serving as an electron donor and a valence electron control agent serving as an acceptor are added simultaneously in the vicinity of the interface between the p-type layer and the i-type layer composed of very different constituents, the photovoltaic element has an increased local flexibility which prevents the photoelectric conversion efficiency from decreasing even during annealing for a long time.

The p-type layer of the photovoltaic element according to the present invention has a laminated structure consisting of a layer containing a Group III element of the periodic table as the main constituent (hereinafter referred to as a doping A layer) and a layer having silicon atoms as the main constituent and containing a valence electron control agent (hereinafter referred to as a doping B layer), whereby the light transmittance of the p-type layer can be increased and the specific resistance of the p-type layer reduced. In particular, the contact side of the p-type layer and the i-type layer is preferably a layer containing the valence electron control agent and having silicon atoms as the main constituent (doping layer B). This makes it possible to decrease defects between the i-type layer and the p-type layer. The layer thickness of doping layer A is preferably in the range from 0.01 to 1 nm. Also, the amount of hydrogen contained in doping layer A is preferably 5% or less. Further, the amount of valence electron control agent contained in doping layer B is preferably in the range from 1500 to 10,000 ppm. The p-type layer has been thus described, but the n-type layer can be also formed to the same effect by making a similar laminated structure using a Group V element of the periodic table.

Figure 5:
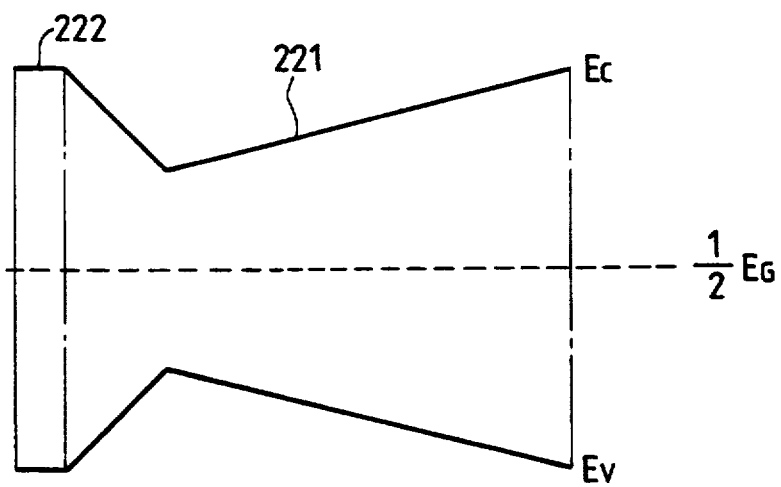

FIG. 5 is a typical diagram for explaining an example of the bandgap variation of the photovoltaic element of the present invention. (Hereinafter, the bandgap variation within the i-type layer is represented with reference to ½ the bandgap ($E_g/2$), unless otherwise specified, and the n-type layer (not shown) side is located to the right and the p-type layer (not shown) side to the left in the figure.) The example of FIG. 5 has an i-type layer formed by microwave plasma CVD on the p-type layer side, wherein the minimum value of the bandgap is shifted closer to the p-type layer side within the i-type layer formed by microwave plasma CVD, and the maximum value of bandgap occurs both on the p-type layer side and the n-type layer side.

Figure 6:
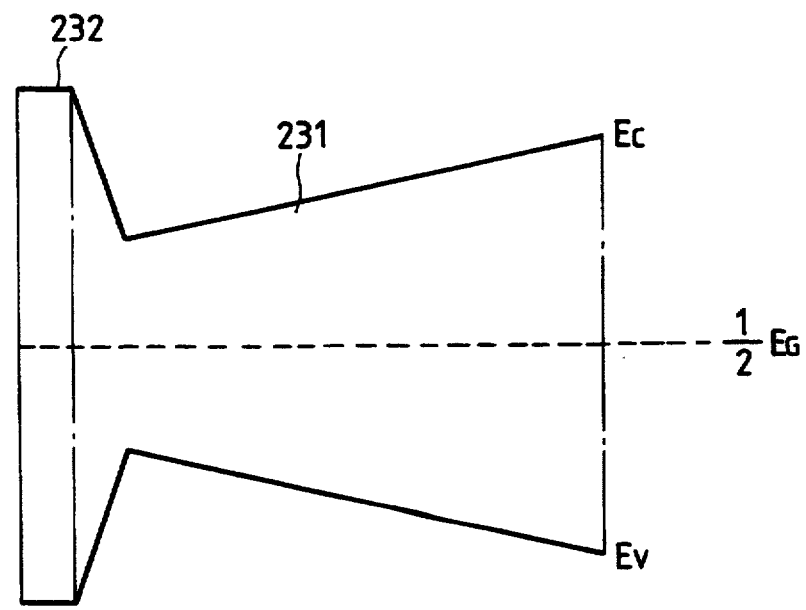

FIG. 6 is a typical explanatory diagram for the bandgap variation, drawn similar to FIG. 5. In FIG. 6, as in FIG. 5, an i-type layer formed by RF plasma CVD is provided on the p-type layer side, wherein the minimum value of bandgap is shifted closer to the p-type layer within the i-type layer formed by microwave plasma CVD, and the maximum value of the bandgap is on the p-type layer side.

Figure 7:
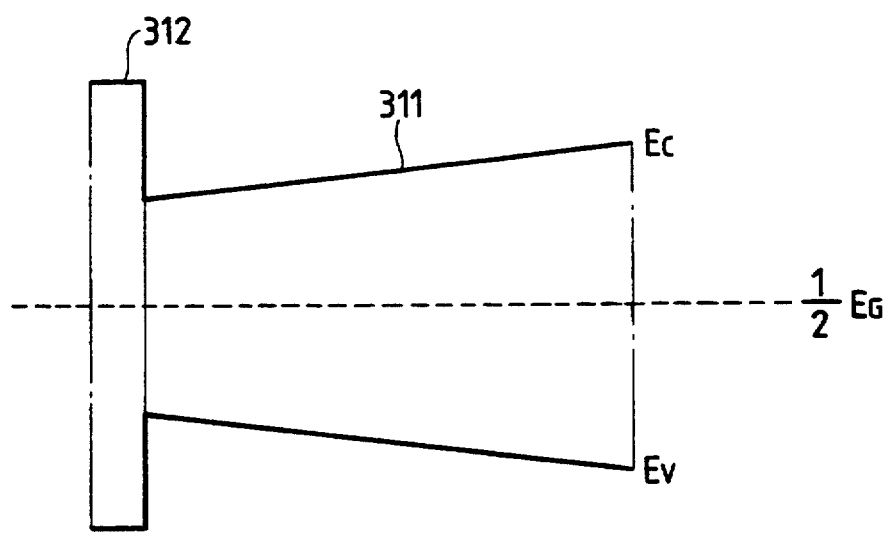
Figure 8:
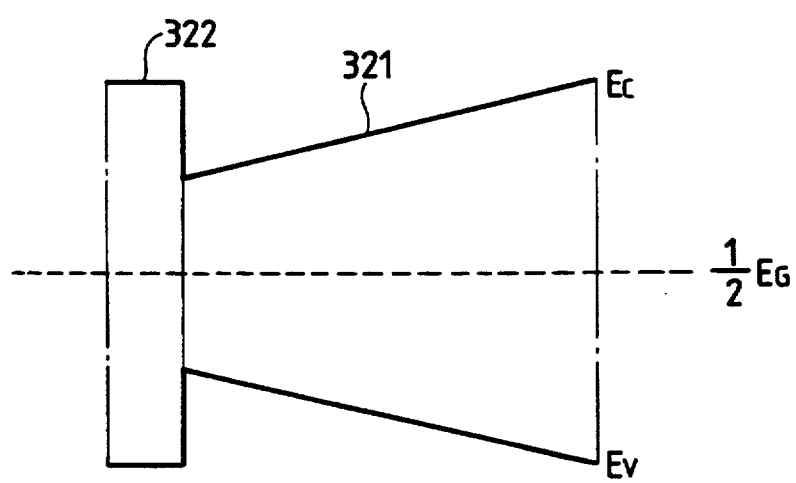
Figure 9:
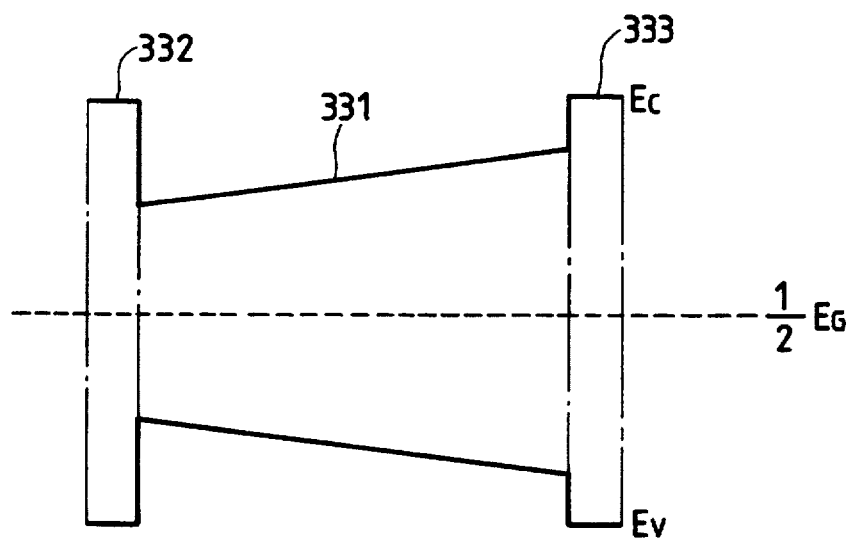

FIGS. 7 to 9 are examples of photovoltaic elements wherein an i-type layer formed by RF plasma CVD is provided on the p-type layer side, with the bandgap of the microwave plasma CVD layer decreasing monotonically until the i-type layer formed by microwave plasma CVD contacts the i-type layer formed by RF plasma CVD.

FIG. 7 shows an example comprising an i-type layer 312 formed by RF plasma CVD having a fixed bandgap on the p-type layer side, and an i-type layer 311 formed by microwave plasma CVD having its bandgap decreasing from the n-type layer side to the i-type layer 312. The minimum value of the bandgap occurs at the interface between the i-type layer 312 and the i-type layer 311. The band junction between the i-type layer 311 and the i-type layer 312 is discontinuous. In this way, by providing a region of fixed bandgap, the dark current due to hopping conduction via the defect levels in reverse bias of the photovoltaic element can be suppressed to a minimum. As a result, the open-circuit voltage of the photovoltaic element is increased.

The layer thickness of i-type layer 312 with the fixed bandgap is a very important factor, and preferably is in the range from 1 to 30 nm. When the layer thickness of the region with the fixed bandgap is below 1 nm, the dark current due to hopping conduction via the defect levels cannot be suppressed, so that a higher open-circuit voltage of the photovoltaic element cannot be expected. On the other hand, when the layer thickness of the i-type layer with the fixed bandgap is above 30 nm, photoexcited holes are likely to accumulate in the interface vicinity between the i-type layer with the fixed bandgap and the i-type layer having varying bandgap, resulting in decreased collection efficiency of photoexcited carriers. That is, the short-circuit photocurrent decreases.

FIG. 8 is an example in which an i-type layer 322 formed by RF plasma CVD and having a fixed bandgap is provided on the p-type layer side. An i-type layer 321 formed by microwave plasma CVD has a varying bandgap, which on the n-type layer side is equal to that of the i-type layer 322.

FIG. 9 is an example comprising an i-type layer 332 formed by RF plasma CVD and having a fixed bandgap provided on the p-type layer side, an i-type layer 331 formed by microwave plasma CVD and having its bandgap decreasing monotonically from the n-type layer side to the p-type layer side, and an i-type layer 333 having a fixed bandgap formed by microwave plasma CVD or by RF plasma CVD on the n-type layer side. The minimum value of bandgap occurs at the interface between the i-type layer 332 and the i-type layer 331. The band junction between the i-type layer 332 and the i-type layer 331 is discontinuous. In this way, by providing a region of fixed bandgap between the p-type layer and the i-type layer 331 and between the n-type layer and the i-type layer 331, the dark current due to hopping conduction via the defect levels in reverse bias of the photovoltaic element can be suppressed to the minimum. As a result, the open-circuit voltage of the photovoltaic element is increased.

FIGS. 10 to 13 are examples in which the minimum value of bandgap occurs within the i-type layer formed by microwave plasma CVD.

Figure 10:
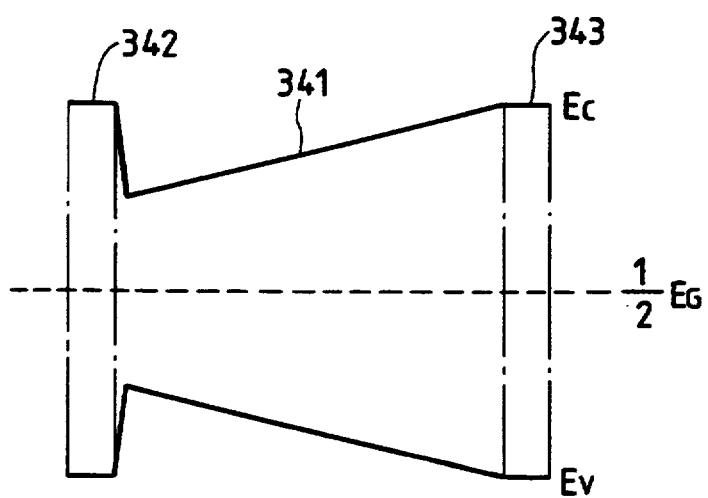

FIG. 10 is an example in which the photoconductive layer of a photovoltaic element comprises an i-type layer 342 formed by RF plasma CVD having a fixed bandgap provided on the p-type layer side, an i-type layer 341 formed by microwave plasma CVD having the minimum value of bandgap inside thereof, and an i-type layer 343 having a constant bandgap formed by microwave plasma CVD or by RF plasma CVD continuously joined with the i-type layer 341. Because the bandgap variation is continuous, electrons and holes photoexcited in the varying bandgap region of the i-type layer can be efficiently collected in the n-type layer and the p-type layer, respectively. In particular, when the fixed bandgap regions 342, 343 are as thin as 5 nm or less, the dark current when a reverse bias is applied to the photovoltaic element is decreased in the region of the i-type layer having the greatly changing bandgap, and therefore the open-circuit voltage of the photovoltaic element is increased.

Figure 11:
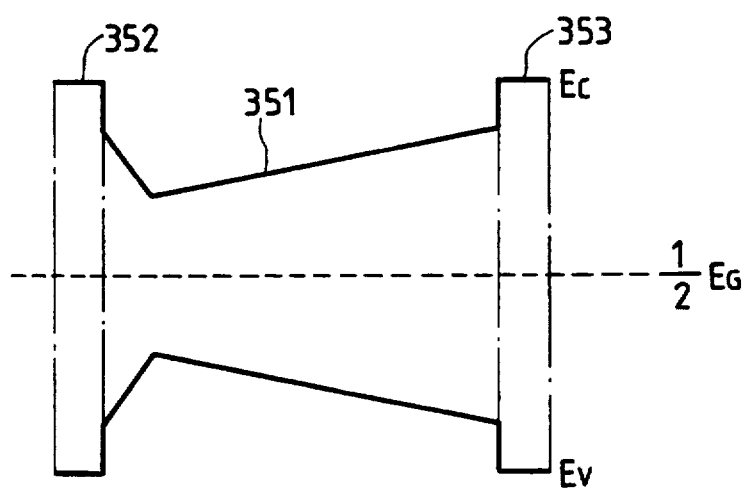

FIG. 11 is an example of a photoconductive layer in which an i-type layer 351 formed by microwave plasma CVD having a varying bandgap is joined discontinuously, but relatively moderately, with an i-type layer 352 formed by RF plasma CVD having a constant bandgap and an i-type layer 353 having a constant bandgap formed by microwave plasma CVD or by RF plasma CVD. However, since the fixed bandgap region and the varying bandgap region are moderately connected in the direction where the bandgap is widening, photoexcited carriers in the varying bandgap region are efficiently injected into the fixed bandgap region. As a result, the collection efficiency of photoexcited carriers increases.

Whether to connect the fixed bandgap region and the varying bandgap region continuously or not will depend on the layer thicknesses of the fixed bandgap region and the abruptly varying bandgap region. When the fixed bandgap region is as thin as 5 nm or less and the rapidly varying bandgap region is 10 nm or less in layer thickness, higher photoelectric conversion efficiency of the photovoltaic element can be obtained if the fixed bandgap region and the varying bandgap region are continuously connected. On the other hand, when the fixed bandgap region is as thin as 5 nm or greater and the rapidly varying bandgap region is from 10 to 30 nm in layer thickness, higher photoelectric conversion efficiency of the photovoltaic element can be obtained if the fixed bandgap region and the varying bandgap region are discontinuously connected.

Figure 12:
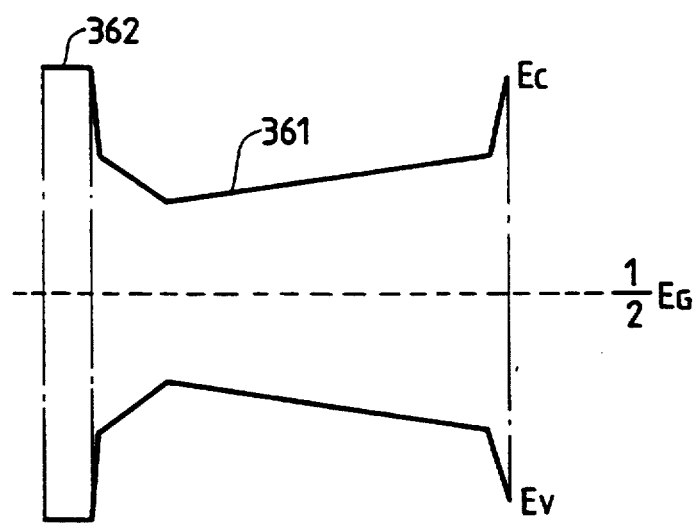

FIG. 12 is an example comprising an i-type layer 362 formed by RF plasma CVD on the p-type layer side and an i-type layer 361 formed by microwave plasma CVD having the minimum value of bandgap, in which the fixed bandgap region and the varying bandgap region are connected at two steps. The minimum value of bandgap is displaced to the p-type layer side. Photoexcited carriers in the varying bandgap region can be efficiently collected so as to connect with a wider, fixed bandgap region through moderately widening the bandgap from a minimum bandgap position and rapidly widening the bandgap. Also, in FIG. 12, a region where the bandgap rapidly increases toward the n-type layer is provided within the i-type layer in the vicinity of the n-type layer.

Figure 13:
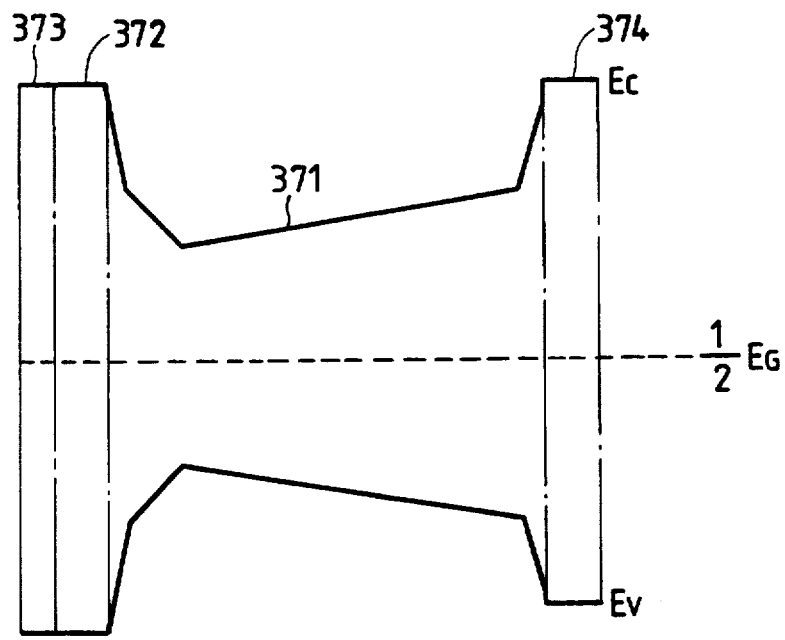

FIG. 13 is an example comprising an i-type layer 373 formed by RF plasma CVD on the p-type side, an i-type layer 372 formed by microwave plasma CVD having a fixed bandgap, an i-type layer 371 formed by microwave plasma CVD which presents a region having the minimum value of bandgap inside thereof, and an i-type layer 374 formed by microwave plasma CVD or by RF plasma CVD in which a fixed bandgap region is provided within the i-type layer on either the p-type layer side or the n-type layer side. The fixed bandgap region on the p-type layer side is connected through two steps of varying the bandgap through the varying bandgap region, and connecting the bandgap region on the n-type layer side through a rapid bandgap change.

As described above, by connecting the fixed bandgap region and the varying bandgap region through similar constituents, internal distortion can be decreased. As a result, there is less possibility of causing weak bonds within the i-type layer to be severed when annealed for a long time, thereby increasing the defect level and decreasing the photoelectric conversion efficiency, so that the high photoelectric conversion efficiency can be maintained.

Also, by containing a valence electron control agent in the i-type layer, as previously described, the diffusion length of carriers within the i-type layer can be extended, and therefore the collection efficiency of carriers can be increased. In particular, by changing the amount of valence electron control agent in accordance with the variation of bandgap such that a greater amount is added in the narrower bandgap region and a smaller amount in the wider bandgap region, the collection efficiency of photoexcited carriers can be further increased. By containing more valence electron control agent on the p-type layer side and the n-type layer side within the i-type layer having a fixed bandgap than the region having the minimum bandgap, the recombination of photoexcited carriers can be prevented from occurring in the vicinity of the p/i interface and the n/i interface, so that the photoelectric conversion efficiency of the photovoltaic element can be improved.

Figure 3:
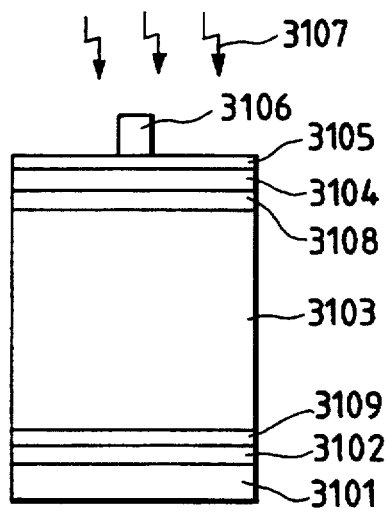
FIG. 3 is a typical view of another layer structure of a photovoltaic element according to the present invention.

FIG. 3 is a typical explanatory view showing another example of a photovoltaic element according to the present invention, wherein the incident light is indicated by 3107. The photovoltaic element of the present invention is comprised of a conductive substrate 3101 having a light reflecting layer and a light reflection multiplying layer, an n-type silicon non-single crystalline semiconductor layer 3102, an i-type layer 3109 formed by RF plasma CVD, a non-single crystalline semiconductor layer 3103 of substantially i-type formed by microwave plasma CVD and containing silicon and germanium atoms, an i-type layer 3108 formed by RF plasma CVD, a p-type silicon non-single crystalline semiconductor layer 3104, a transparent electrode 3105, and a collector electrode 3106.

By inserting an i-type layer formed by RF plasma CVD 30 nm thick or less between the n-type layer and the i-type layer formed by microwave plasma CVD at a deposition rate of 2 nm/sec or less, the photoelectric conversion efficiency of the photovoltaic element can be further enhanced. In particular, the photovoltaic element of the present invention is less likely to change in photoelectric conversion efficiency when used in an environment of great temperature variations.

The microwave plasma CVD involves a greater kinetic energy of ions in the deposition as compared with the RF plasma CVD, and may possibly cause damage to the lower semiconductor layer. Accordingly, it is required that the lower semiconductor layer be resistant to ion damage, and that the film deposited by microwave plasma CVD be of as good quality as the underlying semiconductor and made under conditions which cause less damage to the lower semiconductor layer. The deposition conditions of the photovoltaic element of the present invention accomplish this object.

Consequently, it is possible to form a photovoltaic element having a reduced number of interface states at the interface between the n-type layer and the i-type layer formed by RF plasma CVD, which results in improved open-circuit voltage and short-circuited current of the photovoltaic element.

Figure 4:
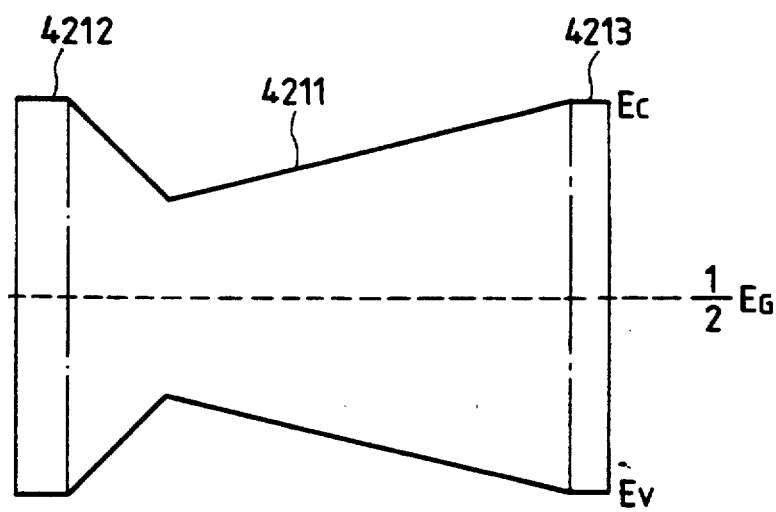
FIGS. 4-17 are typical band diagrams for explaining other bandgap variations of the photovoltaic elements according to the present invention.

FIG. 4 is a typical explanatory diagram showing an example of the bandgap variation of the photovoltaic element of FIG. 3. In an example of a FIG. 4 embodiment, the minimum value of the bandgap is near the p-type layer, and the maximum value of the bandgap is at the contact with the p-type layer or the n-type layer. The i-type layer 4211 and the i-type layer 4212 are deposited by microwave plasma CVD, and i-type layer 4213 is a non-single crystalline silicon layer deposited by RF plasma CVD. The i-type layer 4211 and the i-type 4213 are made to have a substantially equal bandgap by adjusting the content of hydrogen.

Figure 14:
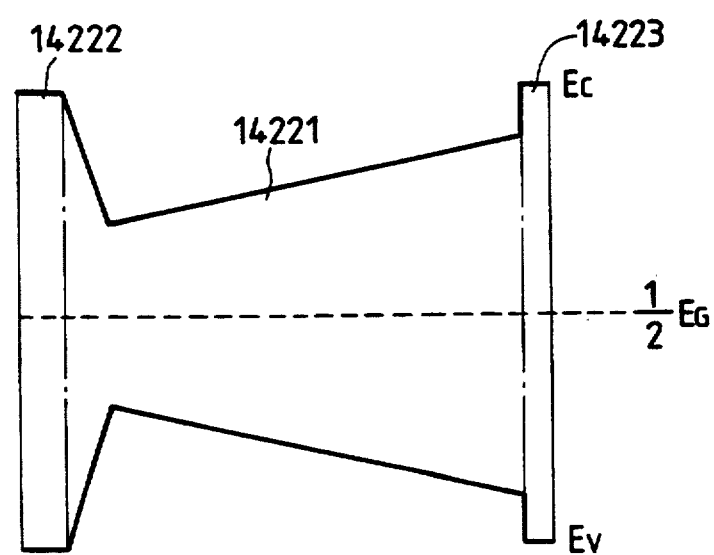

FIG. 14 is a typical explanatory diagram of another bandgap variation, similar to FIG. 4. In FIG. 14, as in FIG. 4, the minimum value of bandgap is closer to the p-type layer, but the maximum value of bandgap is in contact with the p-type layer. i-type layer 14221 and i-type layer 14222 are deposited by microwave plasma CVD, and i-type layer 14223 is a non-single crystalline silicon layer deposited by RF plasma CVD. The bandgap of the i-type layer 14221 and of the i-type layer 14223 are discontinuous. With the bandgap configuration of FIG. 14 particularly, the open-circuit voltage can be increased.

FIGS. 9 to 11, FIG. 13, and FIGS. 15 to 17 are typical explanatory diagrams showing the bandgap variations of photovoltaic elements in which a non-single crystalline layer of substantially i-type is provided between the n-type layer and the i-type layer by microwave plasma CVD and between the p-type layer and the i-type layer by RF plasma CVD.

In FIG. 9, the layer thickness of i-type layer 333 formed by RF plasma CVD is a very important factor, and preferably is in the range from 1 to 30 nm. When the layer thickness of the i-type layer with the fixed bandgap is below 1 nm, the dark current due to hopping conduction via the defect levels cannot be suppressed, so that the higher open-circuit voltage of the photovoltaic element cannot be expected. On the other hand, when the layer thickness of the i-type layer 333 is above 30 nm, photoexcited holes are likely to accumulate in the vicinity of the interface between the i-type layer 332 and the i-type layer 331 having a varying bandgap, resulting in decreased collection efficiency of photoexcited carriers. Consequently, the short-circuit photocurrent decreases.

Figure 15:
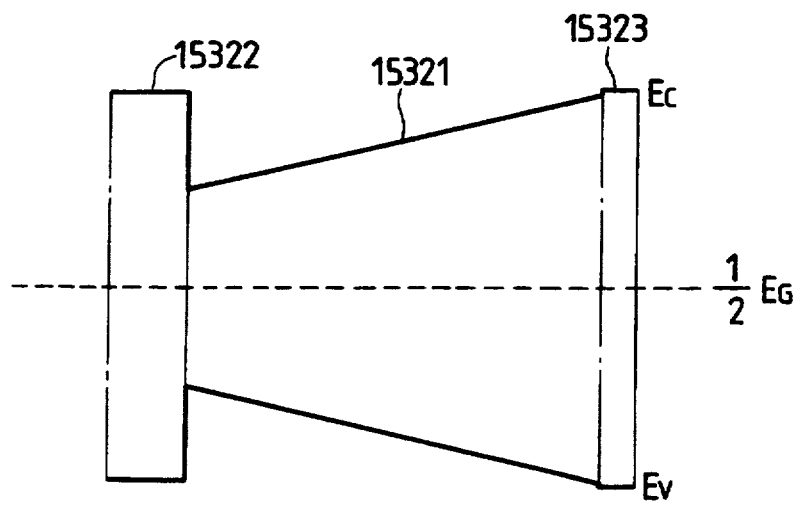

FIG. 15 is an example in which an i-type layer 15322 having a fixed bandgap formed by RF plasma CVD is provided between the p-type layer and an i-type layer 15321 formed by microwave CVD. An i-type layer 15323 formed by RF plasma CVD having a bandgap equal to that of the i-type layer 15321 is provided between the n-type layer and i-type layer 15321.

Figure 16:
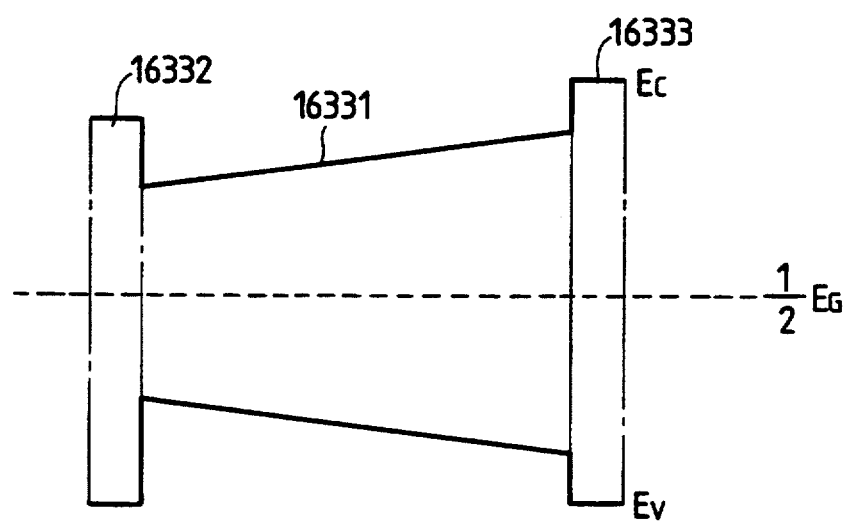

FIG. 16 is an example in which i-type layers 16332, 16333 formed by RF plasma CVD are provided between the p-type layer and the i-type layer 16331 formed by microwave plasma CVD and between the n-type layer and the i-type layer 16331. When a reverse bias is applied to the photovoltaic element, the dark current is further decreased, resulting in increased open-circuit voltage of the photovoltaic element.

FIGS. 10, 11, 13, and 17 are examples of photovoltaic elements in which the i-type layer having fixed bandgap and formed by RF plasma CVD is provided between the p-type layer and the i-type layer formed by microwave plasma CVD and between the n-type layer and the i-type layer formed by microwave plasma CVD. The rapidly varying bandgap region is provided on the p-type layer side or n-type layer side of the i-type layer formed by microwave plasma CVD.

Figure 17:
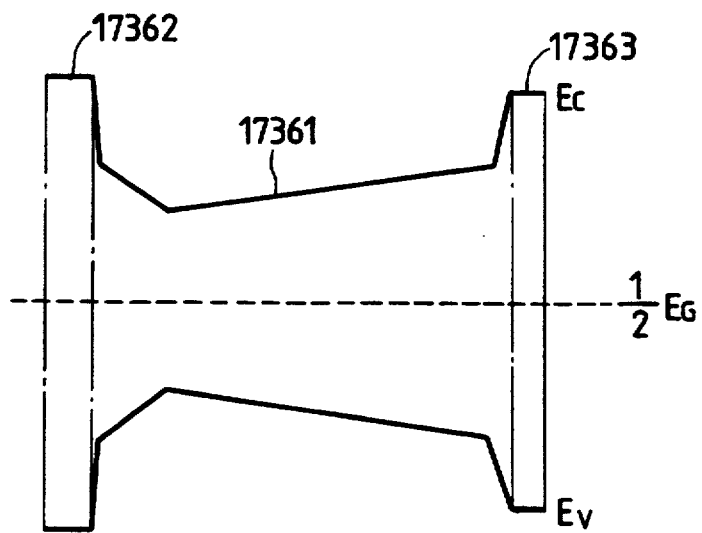

FIG. 17 is an example in which the i-type layers 17362, 17363 with fixed bandgap and an i-type layer 17361 with varying bandgap are connected through two steps, and in which the minimum bandgap position is closer to the p-type layer side. Photoexcited carriers in the varying bandgap region can be efficiently collected by connecting the i-type layers 17362, 17363 having wider fixed bandgap with the i-type layer 17361 through two steps of moderately widening the bandgap from the minimum bandgap position and rapidly widening the bandgap therefrom. Also, in FIG. 17, the i-type layer 17361 is provided with a rapidly varying bandgap toward the i-type layer 17363.

In the present invention, the minimum value of bandgap in the i-type layer containing silicon and germanium atoms is preferably from 1.1 to 1.6 eV, depending on the spectrum of illuminating light.

In the photovoltaic element with continuously varying bandgap according to the present invention, the inclination of the tail states in the valence band is an important factor governing the characteristics of the photovoltaic element, in which it preferably is smoothly continuous from the inclination of the tail states at the minimum value of bandgap to the inclination at the maximum value of bandgap.

Thus, photovoltaic elements of a pin structure have been described, but the above discussion can also apply to a photovoltaic element having laminated pin structures such as a pinpin or pinpinpin structure.

Figure 18:
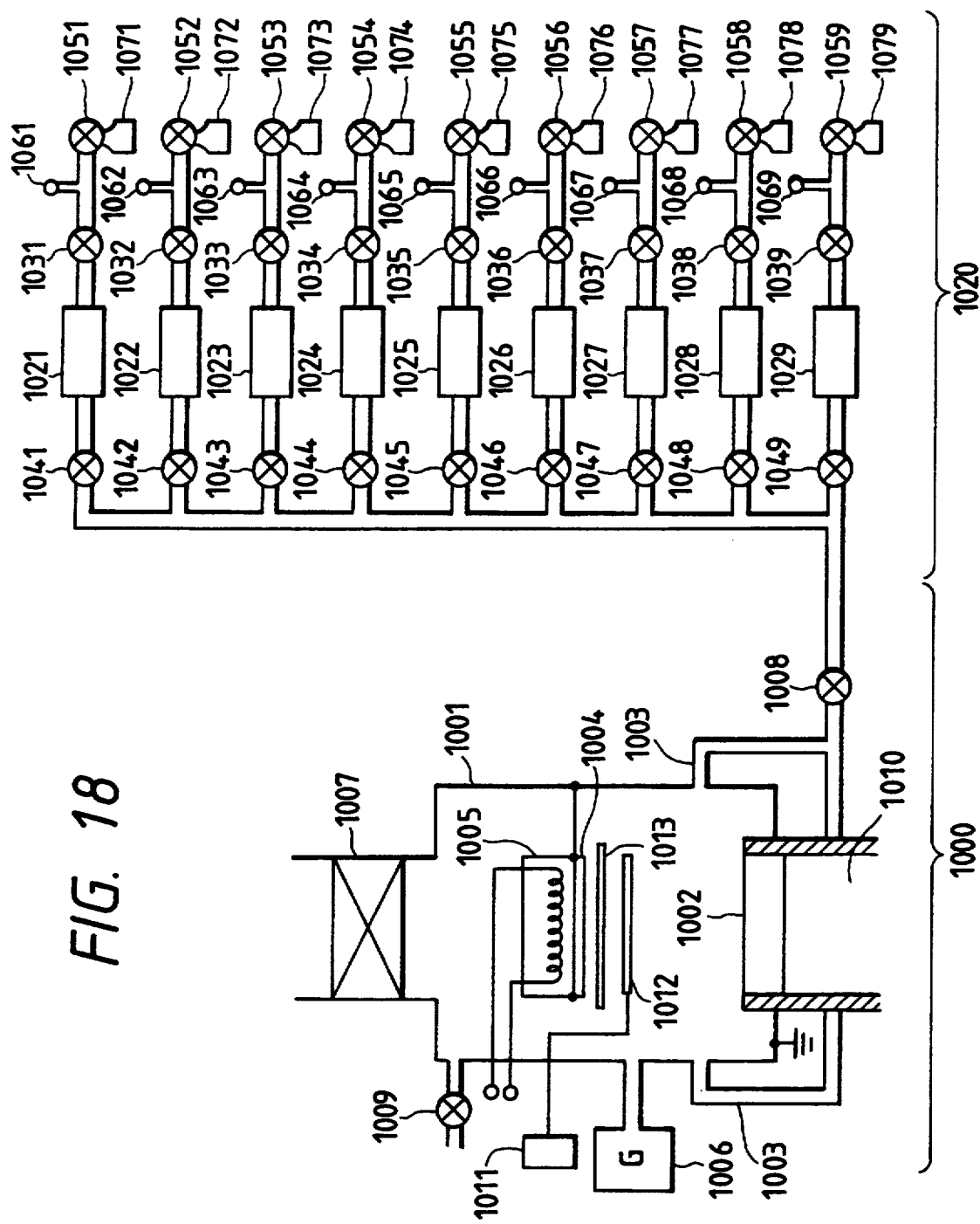
FIG. 18 is a schematic view of a manufacturing apparatus relying on the microwave plasma CVD method for fabricating the photovoltaic element according to the present invention.

FIG. 18 is an explanatory diagram of a typical film forming apparatus suitable for carrying out a film forming method of the photovoltaic elements according to the present invention. The apparatus is comprised of deposition chamber 1001, dielectric window 1002, gas introducing tube 1003, substrate 1004, heater 1005, vacuum gauge 1006, conductance valve 1007, auxiliary valve 1008, leak valve 1009, waveguide 1010, bias power source 1011, bias rod 1012, shutter 1013, source gas supply unit 1020, mass flow controllers 1021 to 1029, gas inlet valves 1031 to 1039, source gas cylinder valves 1051 to 1059, pressure regulators 1061 to 1069 and source gas cylinders 1071 to 1079.

The detailed deposition mechanism of the preferred deposition method of the photovoltaic element according to the present invention has not been clarified, but may be considered as in the following.

It is believed that the active species suitable for forming a deposited film can be selected in such a manner as to apply to a source gas a lower microwave energy than the microwave energy required to decompose 100% of the source gas and simultaneously apply a higher RF energy to the source gas. Further, it is believed that the mean free path of active species suitable for forming a high-quality deposited film is long enough in the state where the internal pressure of the deposition chamber during decomposition of the source gas is 50 mTorr or less, and therefore the vapor phase reaction can be suppressed to a minimum. It is believed that in the state where the internal pressure of the deposition chamber is 50 mTorr or less, the RF energy controls the potential between the plasma and the substrate within the deposition chamber practically without any effect on the decomposition of source gas. That is, with the microwave plasma CVD method, the potential between the plasma and the substrate is small, but the potential (+ at the plasma side and − at the substrate side) between the plasma and the substrate can be increased by inputting the RF energy together with the microwave energy. In this way, it is believed that if the plasma potential is positive or higher than the substrate active species decomposed by microwave energy deposited on the substrate, at the same time + ions accelerated by the plasma potential will impinge onto the substrate to promote a relaxation reaction on the surface and provide a higher-quality deposited film. In particular, this is remarkable when the deposition rate is several nm/sec or greater.

Further, since the RF frequency is high, unlike DC, the potential between the plasma and the substrate can be determined from the distribution of dissociated ions and electrons. That is, the potential between the substrate and the plasma can be determined by synergistic action of ions and electrons. Accordingly, there is the effect that less sparking will occur within the deposition chamber. As a result, a stable glow discharge can be maintained for a long time, e.g. over 10 hours.

In addition, since the flow rate and flow ratio of source gas may change with time or spatially while depositing the layer with a varying bandgap, the DC voltage must be changed appropriately with time or spatially, in the case of DC. However, in the deposited film forming method of the present invention, the percentage of ions may change due to changes in the flow rate and flow ratio of source gas occurring with time or spatially. In correspondence thereto, the RF self-bias is automatically changed. As a result, when RF is applied to the bias rod to change the flow rate and flow ratio of source gas, the discharge can be quite stable as compared with the DC bias method.

In the deposited film forming method, to obtain a desired bandgap variation, it is preferable to mix a silicon atom-containing gas and a germanium atom-containing gas at a distance 5 m or less away from the deposition chamber. If those source gases are mixed over 5 m apart, a delay in the mixing of source gases or a mutual diffusion of source gases may occur even by controlling mass flow controllers corresponding to the desired bandgap variation, because the mixing position of the source gases is away from the deposition chamber, resulting in a drift from the desired bandgap. That is, if the mixing position of the source gases is too far away from the deposition chamber, the controllability of the bandgap may decrease.

Furthermore, to change the content of hydrogen contained in the i-type layer in a direction of layer thickness, it is necessary that the RF energy to be applied to the bias rod be increased when the content of hydrogen is desired to be greater, while the RF energy applied to the bias rod is decreased when the content of hydrogen is desired to be smaller. On the other hand, when the DC energy is applied together with the RF energy, a large positive DC voltage may be applied to the bias rod, if the content of hydrogen atoms is desired to be greater, while a small positive DC voltage may be applied to the bias rod if the content of hydrogen atoms is desired to be smaller.

The photovoltaic element of the present invention is formed with a deposited film, for example, in the following manner. First, a substrate 1004 for the formation of the deposited film is mounted within a deposition chamber 1001 as shown in FIG. 18, and the deposition chamber is sufficiently exhausted of air to $10^{-5}$ Torr or less. A turbo molecular pump is suitable for this purpose, but an oil diffusion pump may also be used. In the case of the oil diffusion pump, a gas such as $H_2$, He, Ar, Ne, Kr, Xe should be introduced into the deposition chamber if the internal pressure of the deposition chamber 1001 falls below $10^{-4}$ Torr to prevent the oil from diffusing back to the deposition chamber. After the deposition chamber is sufficiently exhausted, the gas such as $H_2$, He, Ar, Ne, Kr, Xe is introduced into the deposition chamber so that the deposition chamber may reach an internal pressure substantially equal to that when the source gas for the formation of the deposited film is flowed. The optimal range of pressure within the deposition chamber is from 0.5 to 50 mTorr. If the internal pressure within the deposition chamber is stabilized, a substrate heater 1005 is turned on to heat the substrate from 100° to 500° C. If the temperature of the substrate is stabilized at a predetermined value, the flow of gas is stopped and the source gas for the formation of the deposited film is introduced in a predetermined quantity from the gas cylinder via the mass flow controllers into the deposition chamber.

The supply of the source gas for the formation of deposited film to be introduced into the deposition chamber may be determined depending on the deposition conditions within the deposition chamber. On the other hand, the internal pressure within the deposition chamber when introducing the source gas is very important, the optimal internal pressure within the deposition chamber being from 0.5 to 50 mTorr.

Also, in the deposited film forming method of the photovoltaic element according to the present invention, the microwave energy to be input into the deposition chamber is important. The microwave energy may be appropriately determined by the flow rate of source gas introduced into the deposition chamber, but must be smaller than the microwave energy necessary to decompose 100% of the source gas, the preferred range being from 0.02 to 1 $W/cm^3$. The preferred frequency range of microwave energy is from 0.5 to 10 GHz. In particular, the frequencies near 2.45 GHz are suitable. Also, in order to reproducibly form the deposited film by the film forming method and form the film over a few to several tens of hours, the stability of the frequency of microwave energy is very important. The frequency variation preferably should fall within the range of ±2%. Further, the ripple of the microwaves is preferably within the range of ±2%. Further, the RF energy input into the deposition chamber together with the microwave energy is very important, the preferable range of the RF energy being from 0.04 to 2 $W/cm^3$.

The preferable frequency range of the RF energy is from 1 to 100 MHz. In particular, 13.56 MHz is optimal. Also, the variation in the RF frequency is within ±2%, and the waveform is preferably smooth.

When the RF energy is supplied, the RF energy may be appropriately selected by the area ratio between the area of the bias rod for the supply of the RF energy and the grounded area, and in particular, when the area of the bias rod for the supply of the RF energy is narrower than the grounded area, the self-bias (DC component) for the supply of the RF energy on the power supply side should be grounded. Further, when the self-bias (DC component) for the supply of the RF energy on the power supply side is not grounded, the area of the bias rod for the supply of the RF energy is preferably larger than the grounded area with which the plasma makes contact.

Such microwave energy is introduced from the waveguide 1010 via the dielectric window 1002 into the deposition chamber, and concurrently the RF energy is introduced from the bias power supply 1011 via the bias rod 1012 into the deposition chamber. In such a state, the source gases are decomposed for a desired time to form a deposited film having a desired layer thickness on the substrate. Thereafter, the input of the microwave energy and the RF energy is stopped, the deposition chamber is exhausted of air, and then purged with a gas such as $H_2$, He, Ar, Ne, Kr or Xe, whereafter a deposited non-single crystalline semiconductor film is taken out from the deposition chamber.

In addition to the RF energy, DC voltage may be applied to the bias rod 1012. The DC voltage preferably has such a polarity that the bias rod is positive. The preferable range of the DC voltage is from 10 to 300 V.

Figure 19:
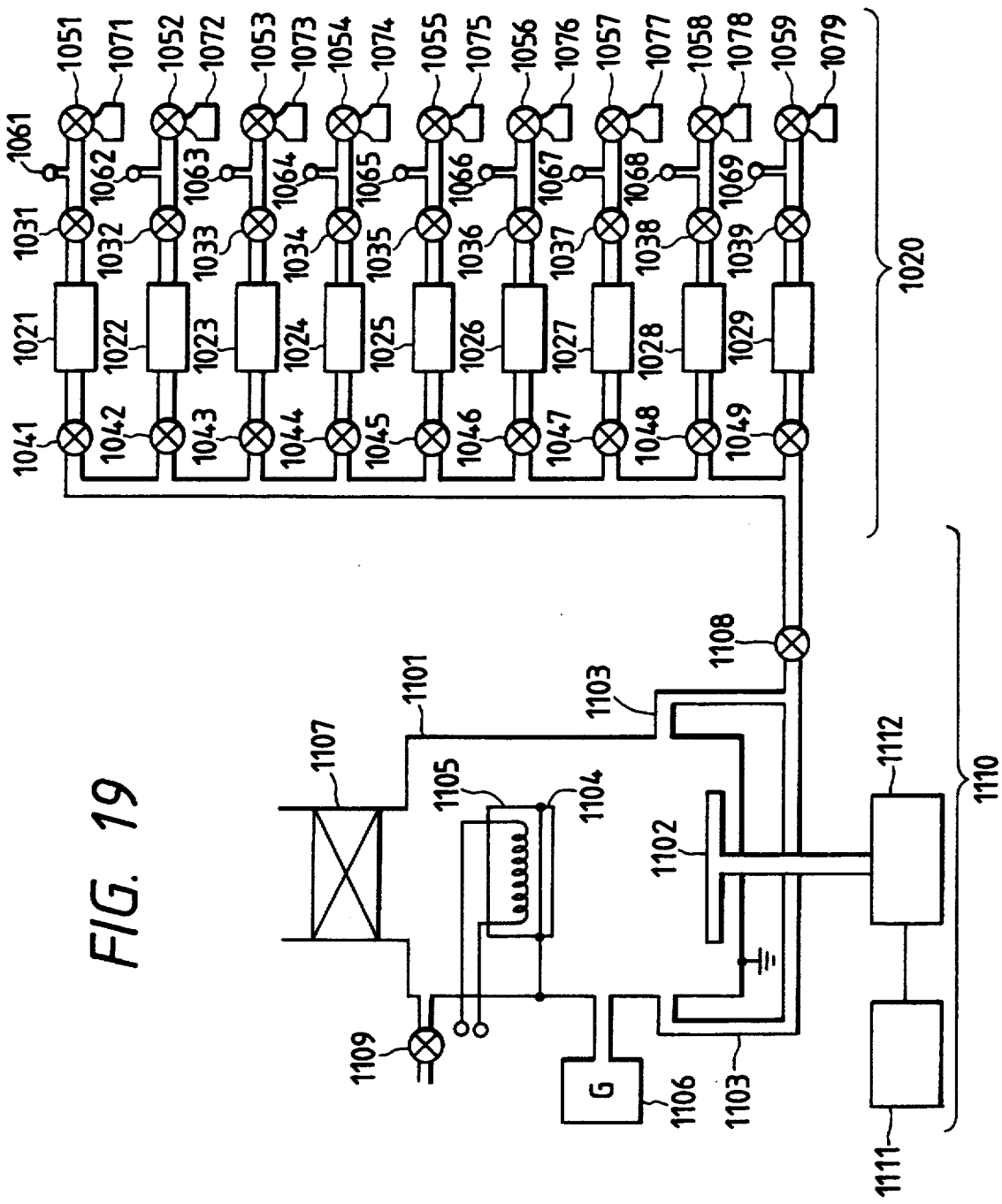
FIG. 19 is a schematic view of a manufacturing apparatus relying on the RF plasma CVD method for fabricating the photovoltaic element according to the present invention.

FIG. 19 is a typical explanatory diagram of a deposited film forming apparatus suitable for the deposition of an i-type layer by an RF plasma CVD method for making a photovoltaic element according to the present invention. The apparatus is comprised of deposition chamber 1101, cathode 1102, gas introducing tube 1103, substrate 1104, heater 1105, vacuum gauge 1106, conductance valve 1107, auxiliary valve 1108, leak valve 1109, RF power supply 1111, RF matching box 1112, source gas supply unit 1020, mass flow controllers 1021 to 1029, gas inlet valves 1031 to 1039, source gas cylinder valves 1051 to 1059, pressure regulators 1061 to 1069, and source gas cylinders 1071 to 1079.

The i-type layer formed by RF plasma CVD of the photovoltaic element according to the present invention can be formed, for example, in the following manner.

First, a substrate on which the i-type layer formed by microwave plasma CVD has been deposited is mounted as the substrate 1104 on the heater within the deposition chamber 1101. The door is closed, and the deposition chamber 1101 is exhausted below $10^{-3}$ Torr. A substrate heating gas such as $H_2$, He, Ar, Ne, Kr or Xe is flowed at the same flow rate and under the same pressure as when conducting the RF plasma CVD. At the same time, the substrate heater 1105 is turned on, and is set at a desired substrate temperature. If the temperature is stabilized at a predetermined value, the flow of the substrate heating gas is stopped, and a predetermined amount of source gas for the formation of deposited film is introduced from the gas cylinders via mass flow controllers into the deposition chamber 1101.

If the internal pressure of the deposition chamber is stabilized at a desired pressure by the source gas, a desired RF energy is introduced from the RF power supply via the matching box 1112 to the cathode electrode 1102. A plasma is then excited and deposition is sustained for a predetermined time. After deposition for the predetermined time, the supply of RF energy is stopped, the substrate heater is turned off, the supply of source gas is stopped, and the deposition chamber is sufficiently purged. If the substrate temperature falls below room temperature, the substrate is taken out from the deposition chamber.

When the i-type layer is deposited by RF plasma CVD, optimal conditions are: the substrate temperature is from 100° to 350° C., the internal pressure is from 0.1 to 10 Torr, the RF power is from 0.01 to 5.0 $W/cm^2$, and the deposition rate is from 0.01 to 2 nm/sec.

Figure 20:
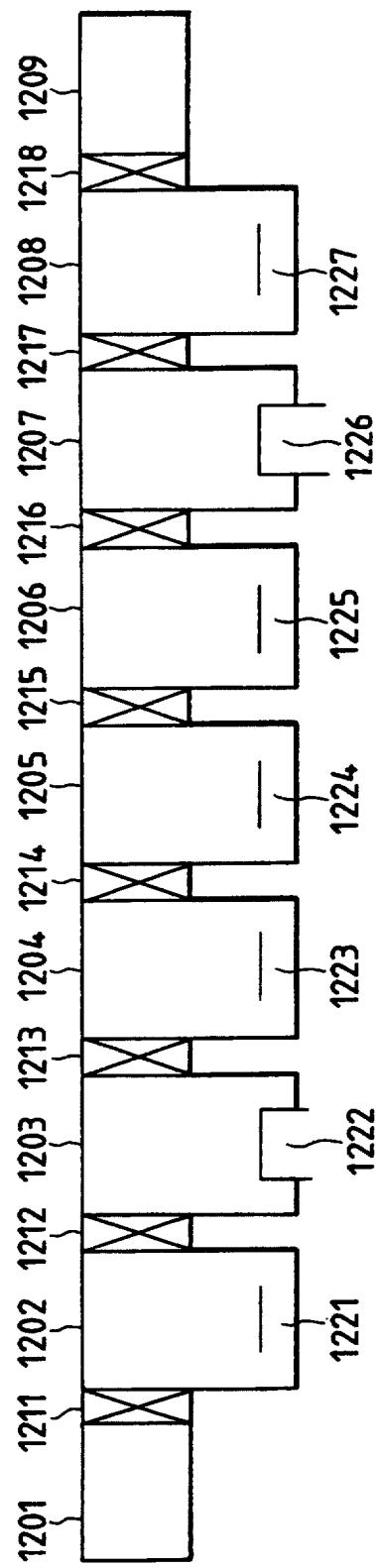
FIGS. 20-22 are schematic views of manufacturing apparatuses of the separated, multi-chamber deposition type for fabricating photovoltaic elements according to the present invention.
Figure 21:
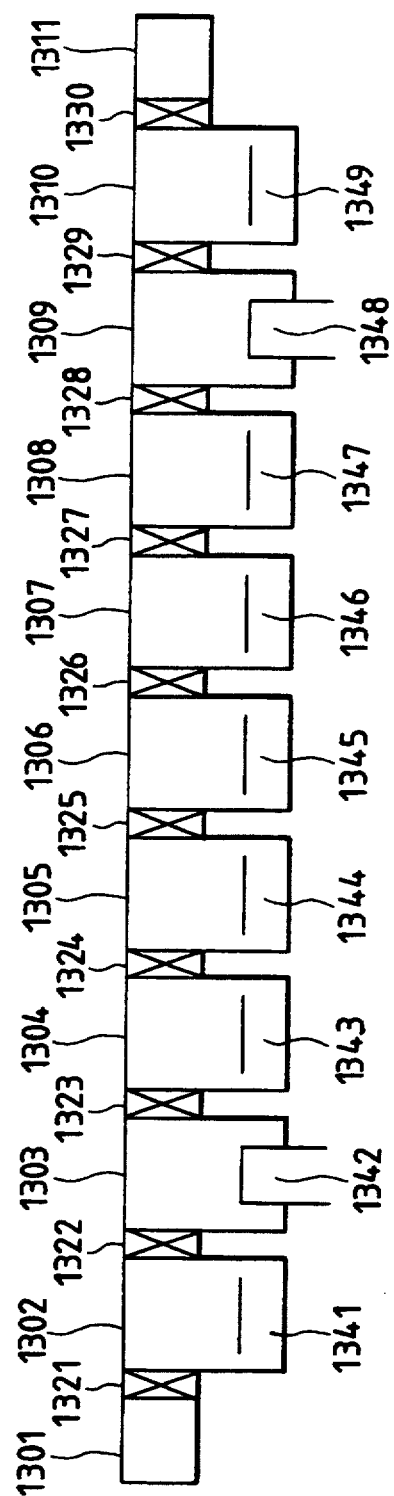
Figure 22:
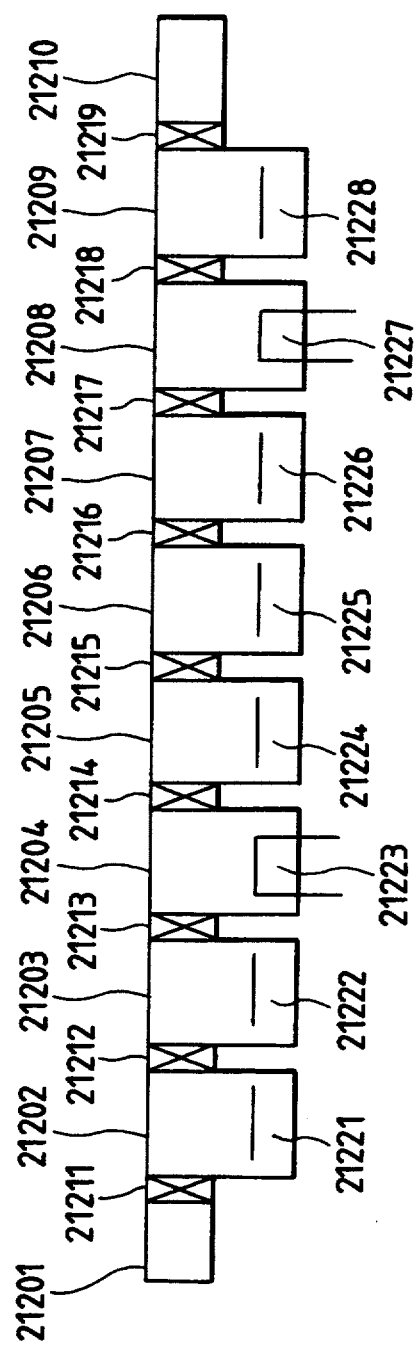

A more preferable deposition apparatus for the photovoltaic element of the present invention successively combines microwave plasma CVD apparatuses and RF plasma CVD apparatuses, as shown in FIGS. 20, 21, and 22. The deposition chamber for microwave plasma CVD and the deposition chamber for RF plasma CVD are preferably separated by a gate. The gate is preferably a mechanical gate valve or gas gate.

In the film forming method as described above, suitable source gases for the deposition of silicon include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$.

Suitable sources gases for the deposition of germanium include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

In the present invention, valence electron control agents to be introduced into the non-single crystalline semiconductor for the control of the valence electrons of the non-single crystalline semiconductor layer may include Group III or Group V atoms.

In the present invention, starting materials used for the introduction of Group III atoms include boron hydrides such as $B_2H_6$, $B_4H_{10}$, $B_5H_9$, $B_5H_{11}$, $B_6H_{10}$, $B_6H_{12}$, and $B_6H_{14}$, and boron halides such as $BF_3$ and $BCl_3$, for the introduction of boron atoms. Besides these, $AlCl_3$, $GaCl_3$, $InCl_3$, and $TlCl_3$ may be included.

In the present invention, the starting materials used for the introduction of Group V atoms include phosphorus hydrides such as $PH_3$ and $P_3H_4$, and phosphorus halides such as $PH_4I$, $PF_3$, $PF_5$, $PCl_3$, $PCl_5$, $PBr_3$, $PBr_5$, and $PI_3$, for the introduction of phosphorus atoms. Besides these, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ may also be included.

The amount of Group III or Group V atoms introduced into the i-type layer of the non-single crystalline semiconductor layer to accomplish the objects of the present invention are preferably in the range of 1000 ppm or less. It is preferable to add the Group III or Group V atoms simultaneously to compensate.

Also, the gasifiable compounds as cited above may be introduced into the deposition chamber by diluting them with a gas such as $H_2$, $D_2$, He, Ne, Ar, Xe, or Kr. The optimal gases are $H_2$ and He.

Examples of nitrogen-containing gases include $N_3$, $NH_3$, $ND_3$, NO, $NO_3$, and $N_2O$.

Examples of oxygen-containing gases include $O_2$, CO, $CO_2$, NO, $NO_2$, $N_2O$, $CH_3CH_2OH$, and $CH_3OH$.

The p-type layer and the n-type layer having a laminated structure composed of a layer containing a Group III and/or Group V element as the main constituent (doping layer A) and a layer containing a valence electron control agent and having silicon atoms as the main constituent (doping layer B) can be formed using a deposited film forming apparatus relying on the microwave CVD or RF plasma CVD.

Doping layer A is preferably deposited using a gas containing a Group III and/or Group V element as the source gas and by microwave CVD or RF plasma CVD. In particular, in order to reduce the content of hydrogen in doping layer A, it is preferred that the source gas is decomposed at as high a power as is possible.

Doping layer B is preferably deposited using a gas containing a Group III and/or Group V element as the valence electron control agent which is mixed with a silicon atom-containing gas and by microwave CVD or RF plasma CVD.

On the other hand, if a doping layer B containing a crystalline phase is deposited by microwave CVD, it is preferable that the RF energy is smaller than the microwave energy and the microwave energy is relatively large. The preferable microwave energy is from 0.1 to 1.5 W/cm$^3$. To make the crystal grain diameter larger, hydrogen dilution is preferable. The rate of dilution of source gas by a hydrogen-containing gas is preferably from 0.01 to 10%.

Also, when the doping layer B containing crystal phase is deposited by RF plasma CVD, the silicon atom-containing gas is diluted with hydrogen gas ($H_2$, $D_2$) to a concentration from 0.01 to 10%, and the RF power is preferably from 1 to 10 W/cm$^2$.

When the p-type layer and/or the n-type layer of the photovoltaic element of the present invention constitutes a lamination of doping layer A and doping layer B, it is preferable to start from doping layer B and end at doping layer B. For example, a constitution of BAB, BABAB, BABABAB, or BABABABAB is preferable.

In particular, when the transparent electrode and the p-type layer and/or the n-type layer having a lamination structure are in contact with each other, contact between doping layer B and the transparent electrode is preferable because the diffusion of a Group III and/or Group V element into indium oxide or tin oxide constituting the transparent electrode can be prevented, so that the decrease in photoelectric conversion efficiency of the photovoltaic element over time can be suppressed.

The constitution of a photovoltaic element according to the present invention will be now described in detail.

Conductive Substrate

The conductive substrate may be directly a conductive member itself, or made by forming a support of an insulating material or conductive material and having its surface subjected to conductive treatment. Examples of the conductive support include, for example, metals such as NiCr, stainless steel, Al, Cr, Mo, Au, Nb, Ta, V, Ti, Pt, Pb, Sn, and alloys thereof.

Examples of electrically insulating supports include synthetic resin films or sheets such as polyester, polyethylene, polycarbonate, cellulose acetate, polypropylene, polyvinylchloride, polyvinylidene chloride, polystyrene, and polyamide, glass, ceramics, and paper. Such electrical insulating supports preferably have at least one surface thereof subjected to conductive treatment.

For example, if glass is used, a thin film of NiCr, Al, Cr, Mo, Ir, Nb, Ta, V, Ti, Pt, Pb, $In_2O_3$, or ITO ($In_2O_3+SnO_2$) is formed on the surface to provide conductivity. If a synthetic resin film such as a polyester film is used, a metallic thin film of NiCr, Al, Ag, Pb, Zn, Ni, Au, Cr, Mo, Ir, Nb, Ta, V, Ti, or Pt is formed on the surface by vacuum vapor deposition, electron beam vapor deposition or sputtering, or a laminate is made on the surface with any of the above metals to provide conductivity on the surface. The shape of the support may be a sheet having a smooth or irregular surface. Its thickness can be appropriately determined to form a photovoltaic element as desired, but if the photovoltaic element is required to be flexible, the support should be formed as thin as possible as long as it can sufficiently exhibit its necessary function. However, for the convenience of fabricating or processing the support, the thickness is usually 10 μm or greater from the point of mechanical strength.

Light Reflecting Layer

The light reflecting layer is suitably made of a metal having high reflectance in the visible to near infrared region, such as Ag, Al, Cu, or AlSi. It is preferable to form these metals by resistance heating vacuum vapor deposition, co-vapor deposition, or sputtering. The layer thickness of these metals as the light reflecting layer suitably is from 10 to 5000 nm. To texturize these metals (concave and convex), it is necessary that the substrate temperature of these metals during deposition be above 200° C.

Light Reflection Multiplying Layer

The light reflection multiplying layer is optimally made of ZnO, SnO$_2$, In$_2$O$_3$, ITO, TiO$_2$, CdO, Cd$_2$Sn$_4$, Bi$_2$O$_3$, MoO$_3$, or Na$_x$WO$_3$.

The deposition method of the reflection multiplying layer preferably is a vacuum vapor deposition method, a sputtering method, a CVD method, a spray method, a spin-on method, or a dip method.

The layer thickness of the reflection multiplying layer may be different, depending on the refractive index of the material for the reflection multiplying layer, and preferably is in a range from 50 nm to 10 μm.

Further, to texturize the reflection multiplying layer, the substrate temperature during depositing the layer is preferably set above 300° C.

p-type Layer or n-type Layer

The p-type layer and the n-type layer are important layers governing the characteristics of the photovoltaic element.

The amorphous materials (denoted as "a-" but including crystalline materials denoted as "μc-" in the category of amorphous materials) may include a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, and μc-SiOCN:HX with the addition of a p-type valence control agent (e.g., Group III atoms such as B, Al, Ga, In, Tl) or an n-type valence control agent (e.g., Group V atoms such as P, As, Sb, Bi) at high concentration; and the polycrystalline materials (denoted as "poly-") may include poly-Si:H, poly-Si:HX, poly-SiC:H, poly-SiC:HX, poly-SiGe:H, poly-Si, poly-SiC, and poly-SiGe with the addition of a p-type valence control agent (e.g., Group III atoms such as B, Al, Ga, In, Tl) or an n-type valence control agent (e.g., Group V atoms such as P, As, Sb, Bi) at high concentration.

In particular, for the p-type layer or n-type layer on the light incident side, a crystalline semiconductor layer with reduced light absorption or an amorphous semiconductor layer having a wider bandgap is suitable.

The amount of Group III atoms added to the p-type layer or the amount of Group V atoms added to the n-type layer is optimally in a range from 0.1 to 50 at %.

Hydrogen atoms (H, D) or halogen atoms (X) contained in the p-type or n-type layer act to compensate dangling bonds in the p-type or n-type layer and to improve the doping efficiency of the p-type or n-type layer. The amount of hydrogen or halogen atoms added to the p-type or n-type layer is optimally in a range from 0.01 to 40 at %. In particular, when the p-type or n-type layer is crystalline, the content of hydrogen or halogen atoms is optimally from 0.1 to 8 at %. Further, a preferable distribution of hydrogen and/or halogen atoms is such that a greater concentration is present at each interface of p-type layer/i-type layer and n-type layer/i-type layer, the concentration of hydrogen and/or halogen atoms near the interface being preferably 1.1 to 2 times that within the bulk. In this way, by providing the greater concentration of hydrogen or halogen atoms near each interface of p-type layer/i-type layer and n-type layer/i-type layer, the defect level or mechanical distortion near the interface can be decreased, resulting in increased photovoltaic power or photocurrent of the photovoltaic element of the present invention.

Of the electrical characteristics of the p-type or n-type layer in the photovoltaic element, the activation energy is preferably 0.2 eV or less, and optimally 0.1 eV or less. The specific resistance is preferably 100 Ωcm or less, and optimally 1 Ωcm or less. The layer thickness of the p-type or n-type layer is preferably from 10 to 500 Å, and optimally from 30 to 100 Å.

The source gases suitable for the deposition of the p-type or n-type layer for the photovoltaic element include, for example, gasifiable compounds containing germanium atoms, gasifiable compounds containing nitrogen atoms and mixtures thereof.

Specifically, the gasifiable compounds containing silicon atoms include SiH$_4$, Si$_2$H$_6$, SiF$_4$, SiFH$_3$, SiF$_2$H$_2$, SiF$_3$H, Si$_3$H$_8$, SiD$_4$, SiHD$_3$, SiH$_2$D$_2$, SiH$_3$D, SiFD$_3$, SiF$_2$D$_2$, SiD$_3$H, and Si$_2$D$_3$H$_3$.

Also, specifically, the gasifiable compounds containing germanium atoms include GeH$_4$, GeD$_4$, GeF$_4$, GeFH$_3$, GeF$_2$H$_2$, GeF$_3$H, GeHD$_3$, GeH$_2$D$_2$, GeH$_3$D, Ge$_2$H$_6$, and Ge$_2$D$_6$.

Further, specifically, the gasifiable compounds containing carbon atoms include CH$_4$, CD$_4$, C$_n$H$_{2n+2}$ (n is an integer), C$_n$H$_{2n}$ (n is an integer), C$_2$H$_2$, C$_6$H$_6$, CO$_2$, and CO.

The nitrogen-containing gases include N$_2$, NH$_3$, ND$_3$, NO, NO$_2$, and N$_2$O.

Also, the oxygen-containing gases include O$_2$, CO, CO$_2$, NO, NO$_3$, N$_3$O, CH$_3$CH$_2$, OH, and CH$_3$OH.

The substances introduced into the p-type or n-type layer for the valence electron control include Group III and Group V atoms.

The starting materials effectively used for the introduction of Group III atoms include boron hydrides such as B$_2$H$_6$, B$_4$H$_{10}$, B$_5$H$_9$, B$_5$H$_{11}$, B$_6$H$_{10}$, B$_6$H$_{12}$, and B$_6$H$_{14}$, and boron halides such as BF$_3$ and BCl$_3$, for the introduction of boron atoms. Also, AlCl$_3$, GaCl$_3$, InCl$_3$, and TlCl$_3$ may be included. B$_2$H$_6$ and BF$_3$ are particularly suitable.

The starting materials effectively used for the introduction of Group V atoms include phosphorus hydrides such as PH$_3$ and P$_3$H$_4$, and phosphorus halides such as PH$_4$I, PF$_3$, PF$_5$, PCl$_3$, PCl$_5$, PBr$_3$, PBr$_5$, and PI$_3$, for the introduction of phosphorus atoms. Besides these, AsH$_3$, AsF$_3$, AsCl$_3$, AsBr$_3$, AsF$_5$, SbH$_3$, SbF$_3$, SbF$_5$, SbCl$_3$, SbCl$_5$, BiH$_3$, BiCl$_3$, and BiBr$_3$ may also be included. PH$_3$ and PF$_5$ are particularly suitable.

The deposition method of the p-type or n-type layer suitable for the photovoltaic element relies on RF plasma CVD or microwave plasma CVD. Of the RF plasma CVD methods for deposition, an RF plasma CVD method of the capacitive coupling type is particularly suitable.

In depositing the p-type or n-type layer by the RF plasma CVD, the optimal conditions are such that the substrate temperature within the deposition chamber is from 100° to 350° C., the internal pressure is from 0.1 to 10 Torr, the RF power is from 0.01 to 5.0 W/cm$^2$, and the deposition rate is from 0.1 to 30 Å/sec.

Also, the gasifiable compound as previously noted may be introduced into the deposition chamber by diluting it with a gas such as $H_2$, He, Ne, Ar, Xe, or Kr.

In particular, when depositing a layer having reduced light absorption or a wide bandgap such as a crystalline semiconductor or a-SiC:H, it is preferable to dilute the source gas to two to 100 times thereof with hydrogen gas and introduce a relatively high RF power. The RF frequency is preferably in a range from 1 MHz to 100 MHz, and a frequency near 13.56 MHz is particularly preferable.

When depositing the p-type or n-type layer by microwave plasma CVD, a microwave plasma CVD apparatus, in which microwaves are introduced through a waveguide via a dielectric window (made of alumina ceramics) into the deposition chamber is suitable.

When depositing the p-type or n-type layer by microwave plasma CVD, a method as previously described, of applying microwave power and RF power to the source gas at the same time, is also suitable, but it is possible to use wider deposition conditions for forming deposited films applicable to the photovoltaic element. That is, when depositing the p-type layer or n-type layer by typical microwave plasma CVD methods, it is preferable that the substrate temperature within the deposition chamber is from 100° to 400° C., the internal pressure is from 0.5 to 30 mTorr, the microwave power is from 0.01 to 1 W/cm$_3$, and the microwave frequency is from 0.5 to 10 GHz.

The gasifiable compound as previously cited may be introduced into the deposition chamber by diluting it with a gas such as $H_2$, He, Ne, Ar, Xe, or Kr.

In particular, when depositing a layer having reduced light absorption or a wide bandgap, such as a crystalline semiconductor or a-SiC:H, it is preferable to dilute the source gas 2 to 100 times with hydrogen gas and introduce a relatively high microwave power.

i-type Layer Formed by Microwave Plasma CVD

The i-type layer found by microwave plasma CVD in the photovoltaic element is an important layer for generating and transporting charge carriers by illuminating light thereon. The i-type may be slightly p-type or slightly n-type.

The i-type layer of the photovoltaic element of the present invention is a layer containing silicon and geranium atoms and having its bandgap smoothly changing in the direction of layer thickness thereof, the minimum value of bandgap being displaced in the direction of the interface between the p-type layer and the n-type layer, away from the central position of the i-type layer. Also, it is preferred that a valence electron control agent as a donor and a valence electron control agent an acceptor be doped in the i-type layer at the same time.

Hydrogen atoms (H, D) or halogen atoms (X) contained in the i-type layer act to compensate dangling bonds of the i-type layer and to enhance the product of the mobility and the lifetime charge of carriers in the i-type layer. Also, these atoms compensate the interfacial levels at each n-type layer/i-type layer interface, with the effect of enhancing the photovoltaic power, photocurrent, and light response of the photovoltaic element. The content of hydrogen and/or halogen atoms in the i-type layer is optimally in a range from 1 to 40 at %. In particular, a preferable distribution is such that a greater concentration of hydrogen and/or halogen atoms is present at each n-type layer/i-type layer interface, the concentration of hydrogen and/or halogen atoms changing corresponding to the content of silicon atoms. The content of hydrogen and/or halogen atoms is preferably from 1 to 10 at %, when the content of silicon atoms is at a minimum, and preferably 0.3 to 0.8 times the maximum content of hydrogen and/or halogen atoms.

The concentration of hydrogen and/or halogen atoms is changed corresponding to the content of silicon atoms. That is, corresponding to the bandgap, such that the content of hydrogen and/or halogen atoms is smaller in the narrower bandgap region. The detailed mechanism is not known, but in accordance with the deposited film forming method of the present invention, in depositing an alloy-type semiconductor containing silicon and germanium atoms, different RF energies are absorbed by respective atoms due to the difference in ionization rate between silicon and germanium atoms, causing sufficient relaxation even with a smaller content of hydrogen and/or halogen in the alloy-type semiconductor, so that an alloy-type semiconductor of high quality can be deposited.

In addition, by adding a slight amount of oxygen and/or nitrogen, i.e. 100 ppm or less, to the i-type layer containing silicon and germanium atoms, the photovoltaic element has greater durability against annealing over the long term. The detailed reason is not known, but may be considered to be as described below. That is, since the composition ration of silicon and germanium atoms continuously changes in the direction of layer thickness, there is a tendency of having more residual distortion than when the silicon and germanium atoms are mixed at a fixed ratio. It is believed that by adding oxygen and/or nitrogen atoms at such a layer, structural distortion can be reduced, so that the photovoltaic element has greater durability against annealing over the long term. A preferable distribution is such that the concentration of oxygen and/or nitrogen atoms in the direction of layer thickness increases or decreases corresponding to the concentration of germanium atoms. This distribution is inverse to the distribution of hydrogen and/or halogen atoms, but is believed preferable for both removing structural distortion and reducing dangling bonds.

Further, with such a distribution of hydrogen (and/or halogen) atoms and oxygen (and/or nitrogen) atoms, the tail states of the valence band and the conduction band can be connected smoothly and continuously.

The layer thickness of the i-type layer is optimally from 0.05 to 1.0 μm, although it may depend on the structure of the photovoltaic element (e.g., single cell, tandem cell, triple cell) and the bandgap of the i-type layer.

The i-type layer containing silicon and germanium atoms formed by the deposited film forming method of the present invention has few tail states on the valence band side even if the deposition rate is increased to 5 nm/sec or greater. The inclination of the tail states is 60 meV or less, and the density of dangling bonds due to electron spin resonance (esr) is $10^{17}/cm^3$ or less.

Also, it is preferable that the bandgap of the i-type layer be wider at each interface of p-type layer/i-type layer and n-type layer/i-type layer. Such a design increases the photovoltaic power and photocurrent of the photovoltaic element and prevents optical deterioration due to use over a long time.

For forming the i-type layer of the photovoltaic element, the deposited film forming method as previously described of applying microwave and high frequency (RF) simultaneously is an optimal method.

i-type Layer Formed by RF Plasma CVD

The i-type layer formed by RF plasma CVD is deposited at a rate of 1 nm/sec or less, the content of hydrogen and/or halogen atoms in the deposition film being preferably from 1 to 40 at %. The bonding state of hydrogen or halogen atoms is preferably one wherein a single hydrogen or halogen atom is bonded with a silicon atom. It is preferable that the half-width value of a peak of 2000 cm$^{-1}$, divided by the height of the peak, in the infrared absorption spectrum representing the state where one hydrogen atom is bonded with a silicon atom is greater than the value of half-width at the peak of 2000 cm$^{-1}$, divided by the height of peak, for the i-type layer by microwave plasma CVD.

Transparent Electrode

The transparent electrode is suitable made of indium oxide or indium-tin oxide. The optimal deposition methods for the transparent electrode are a sputtering method and a vacuum vapor deposition method.

The transparent electrode is deposited in a manner as described below.

When the transparent electrode composed of indium oxide is deposited on the substrate with a DC magnetron sputtering apparatus, the target may be made of metallic indium (In) or indium oxide (In$_2$O$_3$).

Further, when the transparent electrode composed of indium-tin oxide is deposited on the substrate, the target may be an appropriate combination of targets of metallic tin, metallic indium, an alloy of metallic tin and metallic indium, tin oxide, indium oxide, or indium-tin oxide.

When deposition is made by sputtering, the substrate temperature is an important factor, the preferable range being from 25° to 600° C. When depositing the transparent electrode by sputtering, the sputtering gases may include inert gases such as argon gas (Ar), neon gas (Ne), xenon gas (Xe), and helium gas (He), among which Ar gas is particularly preferable. Also, it is preferable to add oxygen gas (O$_2$) to the inert gas as necessary, and particularly when metal is used as the target, oxygen gas (O$_2$) is requisite.

Further, when the target is sputtered with an inert gas, the pressure in the discharge space is preferably from 0.1 to 50 mTorr for effective sputtering.

In addition, the electric power source for the sputtering may be a DC power source or an RF power source. The applied power during the sputtering is preferably in a range from 10 to 1000 W.

The deposition rate for the transparent electrode depends on the pressure within the discharge space or the discharge power, and optimally is in a range from 0.01 to 10 nm/sec.

In the vacuum vapor deposition, the vapor deposition source suitable for the deposition of transparent electrode may be metallic tin, metallic indium, or indium-tin alloy.

Also, the substrate temperature in depositing the transparent electrode is in a range from 25° to 600° C.

Further, when depositing the transparent electrode, it is necessary that after the pressure reduction of the deposition chamber to 10$^{-5}$ Torr or less, oxygen gas (O$_2$) is introduced into the deposition chamber in a range from $5 \times 10^{-5}$ to $9 \times 10^{-4}$ Torr. By introducing oxygen in this range, the metal gasified from the vapor deposition source will react with oxygen in the gas phase to deposit an excellent transparent electrode.

In addition, it is possible to introduce RF power with a degree of vacuum as above noted to produce a plasma, with which the vapor deposition is made.

The preferable deposition rate of the transparent electrode under the above conditions is from 0.01 to 10 nm/sec. If the deposition rate is below 0.01 nm/sec, the productivity is lowered, while if it is greater than 10 nm/sec, a rough film may be produced, resulting in lower transmittance, conductivity, or adherence.

It is preferred that the layer thickness of the transparent electrode meets the conditions of an antireflection film. Specifically, the layer thickness of the transparent electrode preferably ranges from 50 to 300 nm.

A power generation system of the present invention is comprised of a photovoltaic element of the present invention, a control system for controlling the supply of electric power from the photovoltaic element to an accumulator and/or an external load by monitoring the voltage and/or current of the photovoltaic element, and the accumulator for accumulating the electric power from the photovoltaic element and/or supplying the electric power to the external load.

Figure 27:
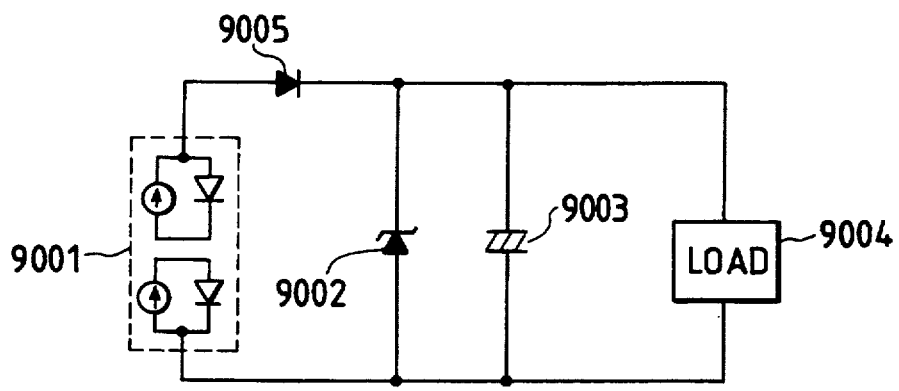
FIGS. 27-32 are typical circuit diagrams of power supply systems according to the present invention.

FIG. 27 is an example of a power supply system of the present invention, which is a basic circuit having only the photovoltaic element as the power source, wherein the power supply system is comprised of a photovoltaic element 9001 of the present invention as a solar cell, a diode 9002 for the voltage control of the photovoltaic element, a condenser 9003 for the voltage stabilization and acting as the accumulator, a load 9004, and a reverse current preventing diode 9005.

Figure 28:
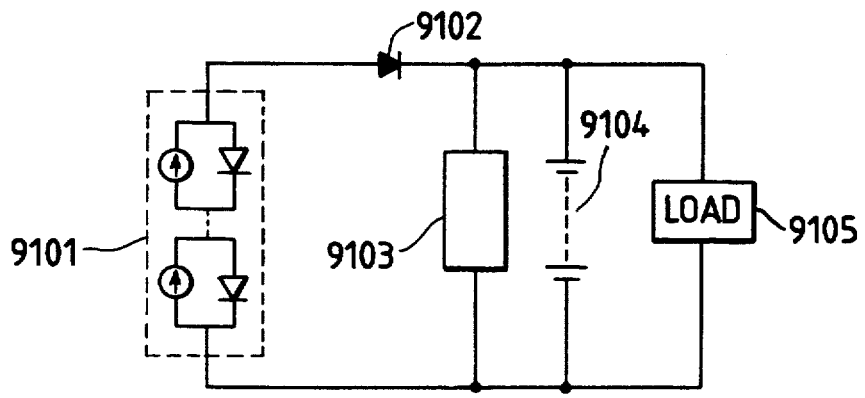
Figure 29:
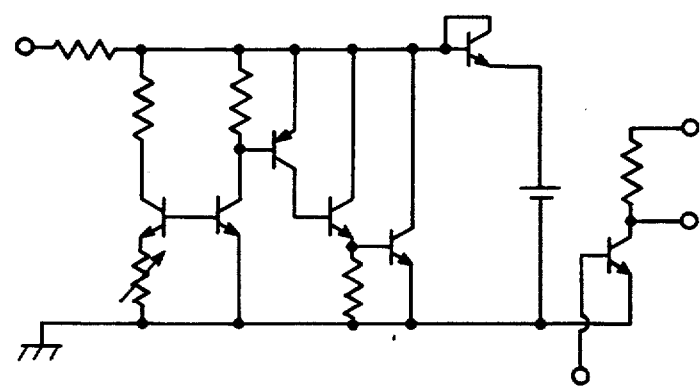

FIG. 28 is an example of a power supply system of the present invention, which is a basic charging circuit using a photovoltaic element. The circuit is comprised of solar cell 9101 which is a photovoltaic element of the present invention, reverse current preventing diode 9102, voltage control circuit 9103 for controlling the voltage by monitoring it, secondary cell 9104, and load 9105. The reverse current preventing diode suitably may be a silicon diode or Schottky diode. The secondary cell may be a nickel cadmium cell, rechargeable silver oxide cell, lead accumulator, and flywheel energy accumulating unit. FIG. 29 is an example of voltage control circuit 9103. The voltage control circuit outputs a voltage approximately equal to the output from the solar cell unit the cell is fully charged, but stops the charging current by a charging control IC if the cell is fully charged.

The solar cell system utilizing such photovoltaic power can be used as the battery for an automobile battery charging system, a marine battery charging system, a street lamp lighting system, and an exhaust system.

Figure 30:
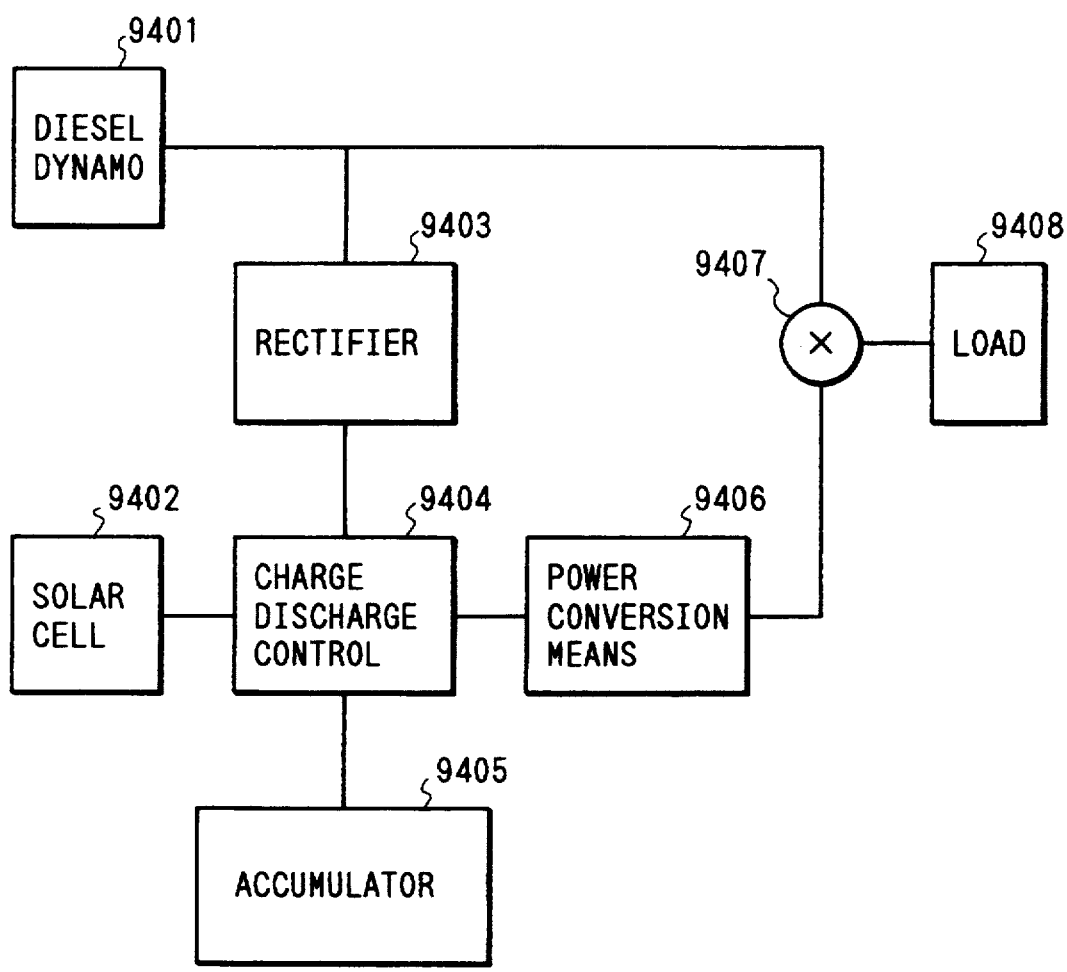

FIG. 30 is a block diagram of a solar cell, a diesel dynamo, and a power supply system of the hybrid type. The power generation system is comprised of diesel dynamo 9401, solar cell 9402 having a group of photoelectric conversion elements, rectifier 9403, charge/discharge control unit 9404, accumulator 9405, DC/AC conversion unit 9406 as a power conversion means, switch 9407, and AC load 9408.

Figure 31:
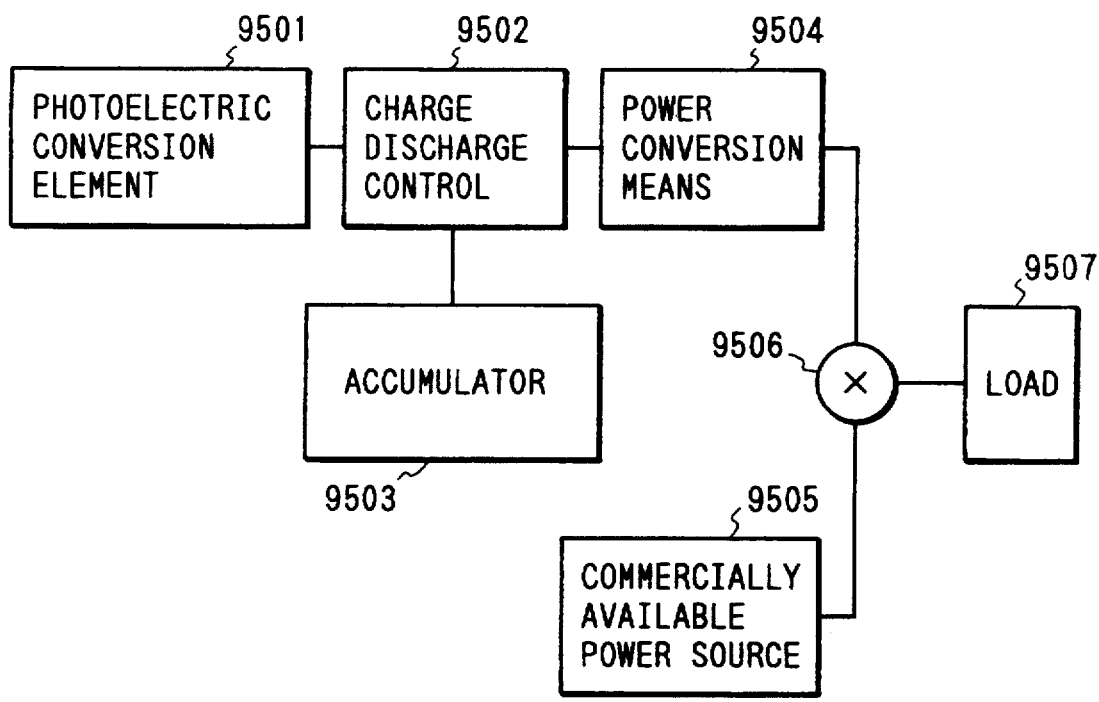

Further, FIG. 31 is a block diagram of a solar cell power supply system of commercially available backup type. The power supply system is comprised of a solar cell 9501 which is a photoelectric conversion element, a charge/discharge control unit 9502, an accumulator 9503, a DC/AC conversion unit 9504 as a power conversion means, a commercially available power source 9505, a non-instantaneous switch 9506, and a load 9507.

Figure 32:
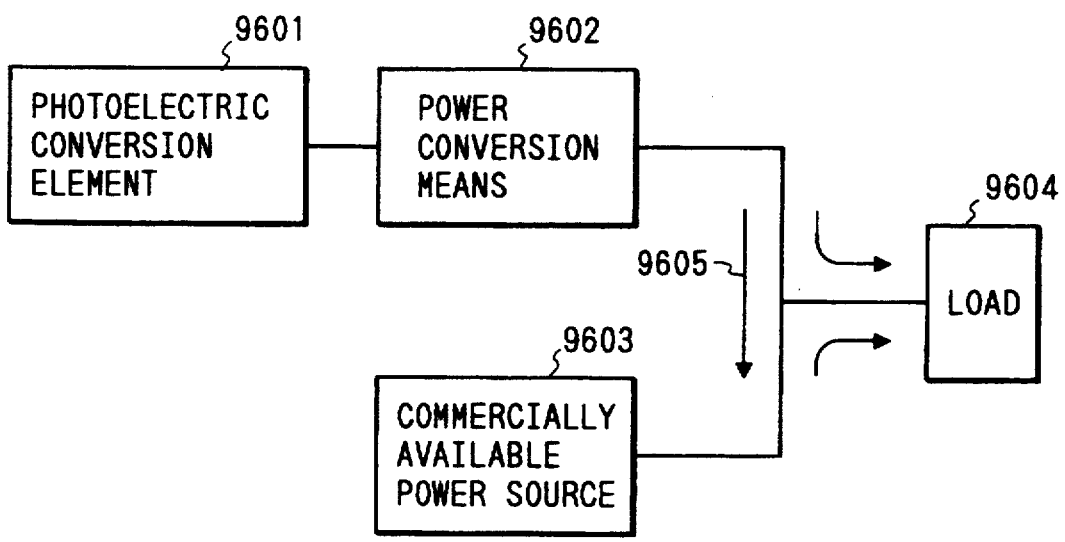

In addition, FIG. 32 is a block diagram of a commercially available solar cell power supply system of complete link type. The power supply system is comprised of a solar cell 9601 which is a photoelectric conversion element, a DC/AC converter 9602 as power conversion means, a commercially available power source 9603, a load 9604, and a reverse current 9605.

As described above, a power supply system, utilizing a photovoltaic element of the present invention as the solar cell, can be stably used for a long period, and sufficiently function as a photovoltaic element even when the illuminating light directed to the solar cell varies, with excellent stability.

EXAMPLES

The present invention will now be described in more detail by way of example, but the invention is not limited to such samples.

Example 1

Using a microwave plasma CVD apparatus comprising source gas supply unit 1020 and deposition unit 1000 as shown in FIG. 18 and an RF plasma CVD apparatus comprising source gas supply unit 1020 and deposition unit 1100 as shown in FIG. 19, a photovoltaic element of the present invention was fabricated.

Gas cylinders 1071 to 1079 in the figure contain source gases for the fabrication of a p-type layer, an i-type layer, and an n-type layer composed of silicon non-single crystalline semiconductor material of the present invention, wherein 1071 is an $SiH_4$ gas cylinder, 1072 is a cylinder of $H_2$ gas, 1073 is a cylinder of $BF_3$ gas diluted to 1% with $H_2$ gas (hereinafter abbreviated as "$BF_3(1\%)/H_2$"), 1074 is a cylinder of $PH_3$ gas diluted to 1% with $H_2$ gas (hereinafter abbreviated as "$PH_3(1\%)/H_2$"), 1075 is a cylinder of $Si_2H_6$ gas, 1076 is a cylinder of $GeH_4$ gas, 1077 is a cylinder of $BF_3$ gas diluted to 2000 ppm with $H_2$ gas (hereinafter abbreviated as "$BF_3(2000\ ppm)/H_2$"), 1078 is a cylinder of $PH_3$ gas diluted to 2000 ppm with $H_2$ gas (hereinafter abbreviated as "$PH_3(2000\ ppm)/H_2$"), and 1979 is a cylinder of NO gas diluted to 1% with He gas (hereinafter abbreviated as "NO/He"). Also, the gases are each preintroduced through the valves 1051 to 1059 via inlet valves 1031 to 1039 into the gas pipes when mounting the gas cylinders 1071 to 1079.

In the FIGS. 1004 and 1104 are substrates, made of stainless (SUS430BA), 50 mm square and 1 mm thick, each with its surface polished specularly, having a 100 nm-thick silver (Ag) thin film, made irregular, as the reflecting layer and a 1 μm-thick zinc oxide (ZnO) layer there as the reflection multiplying layer, which layers are deposited by sputtering.

First, $SiH_4$ gas from the gas cylinder 1071, $H_2$ gas from the gas cylinder 1072, $BF_3(1\%)/H_2$ gas from the gas cylinder 1073, $PH_3(1\%)/H_2$ gas from the gas cylinder 1074, $Si_2H_6$ gas from the gas cylinder 1075, $GeH_4$ gas from the gas cylinder 1076, $BF_3(2000\ ppm)/H_2$ gas from the gas cylinder 1077, $PH_3(2000\ ppm)/H_2$ gas from the gas cylinder 1078, and NO/He gas from the gas cylinder 1079 were introduced by opening the valves 1051 to 1059, whereby each gas pressure was regulated by each pressure regulator 1061 to 1069 to about 2 $Kg/cm^2$.

Next, confirming that the inflow valves 1031 to 1039 and leak valves 1009, 1109 within the deposition chambers 1001, 1101 were closed, and that the outflow valves 1041 to 1049 and auxiliary valves 1008, 1108 were open, conductance (butterfly type) valves 1007, 1107 were fully opened to evacuate the deposition chambers 1001, 1101 and the gas pipe by using a vacuum pump (not shown) and the auxiliary valves 1008, 1108 and the outflow valves 1041 to 1049 were closed at the time when the reading of vacuum gauges 1006, 1106 reached about $1 \times 10^{-4}$ Torr.

Next, the inflow valves 1031 to 1039 were gradually opened to introduce respective gases into the mass flow controllers 1021 to 1029.

After the preparation for the film formation has been completed in the above way, an n-type layer, an i-type layer formed by microwave plasma CVD, an i-type layer formed by RF plasma CVD, and a p-type layer were formed on the substrates 1004, 1104.

To make the n-type layer, the substrate 1004 was heated to 350° C. by the heater 1005, the outflow valves 1041 to 1044 and the auxiliary valve 1008 were gradually opened to flow $SiH_4$ gas and $PH_3(1\%)/H_2$ gas through the gas introducing pipe 1003 into the deposition chamber 1001. Then, they were regulated by mass flow controllers 1021, 1024 so that the $SiH_4$ gas flow and the $PH_3(1\%)/H_2$ gas flow were 50 sccm and 200 sccm. The opening of conductance valve 1007 was adjusted by referring to the vacuum gauge 1006 so that the pressure within the deposition chamber 1001 was 10 mTorr.

Thereafter, shutter 1013 was closed, and the direct current (hereinafter abbreviated as "DC") bias of bias power source 1011 was set at 50 V and applied to bias rod 1012. Subsequently, the output power of the microwave power source (not shown), was set at 130 $mW/cm^3$, and microwave electric power was introduced through the waveguide (not shown), waveguide portion 1010, and dielectric window 1002 into deposition chamber 1001 to excite a microwave glow discharge. Then, shutter 1013 was opened to start formation of the n-type layer on substrate 1004. Upon depositing the n-type layer 10 nm thick, shutter 1013 was closed to stop microwave glow discharge, and outflow valves 1041, 1044 and auxiliary valve 1008 were closed to stop the gas inflow into deposition chamber 1001, whereby the fabrication of the n-type layer was completed.

Next, to make the i-type layer by microwave plasma CVD, the substrate 1004 was heated to 350° C. by the heater 1005, and the outflow valves 1041, 1042, 1046, and the auxiliary valve 1008 were gradually opened to flow $SiH_4$ gas, $H_2$ gas, and $GeH_4$ gas, respectively, through the gas introducing tube 1003 into the deposition chamber 1001. Then, they were regulated by mass flow controllers 1021, 1022, 1026 so that $SiH_4$ gas flow, $H_2$ gas flow, and $GeH_4$ gas flow were 200 sccm, 500 sccm, and 1 sccm. The opening of conductance valve 1007 was adjusted by referring to the vacuum gauge 1006 so that the pressure within the deposition chamber 1001 reached a value as indicated in Table 2.

Next, the shutter 1013 was closed, the output power of the microwave power source (not shown) was set at 170 $mW/cm^3$, and microwave electric power was introduced through the waveguide, the waveguide portion 1010, and the dielectric window 1002 into the deposition chamber 1001 to excite a microwave glow discharge. The radio frequency (abbreviated as "RF") bias of bias power source 1011 was set at 350 mW/cm$^3$, and the DC bias was set at 0 V via a coil, which was then applied to the bias rod 1012. Thereafter, the shutter 1013 was opened to start formation of the i-type layer by microwave plasma CVD on the n-type layer, and at the same time, SiH$_4$ gas flow and GeH$_4$ gas flow were adjusted in accordance with a flow pattern as shown in FIG. 16A by the mass flow controllers 1021, 1026. Upon depositing the i-type layer having a layer thickness of 300 nm, the shutter 1013 was closed, the output of bias power source 1011 was turned off, the microwave glow discharge was stopped, and the outflow valves 1041, 1042, 1046, and the auxiliary valve 1008 were closed to stop the gas inflow into the deposition chamber 1001.

Then, the substrate 1004 was taken out from the deposition chamber 1001, and installed in the deposition chamber 1101 of the RF plasma CVD deposition apparatus 1100 where the i-type layer formed by RF plasma CVD was fabricated.

Next, to deposit the i-type layer formed by RF plasma CVD, the substrate 1104 was heated to 350° C. by the heater 1105, and the outflow valves 1041, 1042, and the auxiliary valve 1008 were gradually opened to flow SiH$_4$ gas and H$_2$ gas through the gas introducing tube 1103 into the deposition chamber 1101. Then, they were regulated by mass flow controllers 1021, 1022 so that SiH$_4$ gas flow and H$_2$ gas flow were 8 sccm and 100 sccm. The opening of conductance valve 1107 was adjusted by referring to the vacuum gauge 1106 so that the pressure within the deposition chamber 1101 became 0.5 Torr.

Thereafter, the output power of RF power source 1111 was set at 120 mW/cm$^3$, and RF electric power was introduced through the RF matching box 1112 into the cathode 1102 to excite an RF glow discharge. The deposition of the i-type layer found by RF plasma CVD was started on the i-type layer made by microwave plasma CVD. Upon depositing an i-type layer having a layer thickness of 10 nm, the RF glow discharge was stopped, and the outflow valves 1041, 1042 and the auxiliary valve 1108 were closed to stop the gas inflow into the deposition chamber 1101, whereby the fabrication of the i-type layer was completed.

Then, the substrate 1104 was taken out from the deposition chamber 1101, and installed in the deposition chamber 1001 of the microwave plasma CVD deposition apparatus 1000 as shown in FIG. 18, where the p-type layer was fabricated.

To make the p-type layer, the substrate 1004 was heated to 300° C. by the heater 1005, the outflow valves 1041 to 1043 and the auxiliary valve 1008 were gradually opened to flow SiH$_4$ gas, H$_2$ gas, and BF$_3$(1%)/H$_2$ gas, respectively, through the gas introducing tube 1003 into the deposition chamber 1001. Then, they were regulated by mass flow controllers 1021 to 1023 so that the SiH$_4$ gas flow, H$_2$ gas flow, and BF$_3$(1%)/H$_2$ gas flow were sccm, 700 sccm, and 30 sccm. The opening of conductance valve 1007 was adjusted by referring to the vacuum gauge 1006 so that the pressure within the deposition chamber 1001 was 25 mTorr.

Thereafter, the output power of the microwave power source (not shown) was set at 250 mW/cM$^3$, and microwave electric power was introduced through the waveguides (not shown), the waveguide portion 1010, and the dielectric window 1002 into the deposition chamber 1001 to excite a microwave glow discharge. And the shutter 1011 was opened to start fabrication of the p-type layer on the i-type layer by RF plasma CVD. Upon making the p-type layer 10 nm thick, the shutter 1013 was closed, the microwave glow discharge was stopped, and the outflow valves 1041 to 1043 and the auxiliary valve 1008 were closed to stop the gas inflow into the deposition chamber 1001, whereby the fabrication of the p-type layer was completed.

Outflow valves 1041 to 1049 other than those of the necessary gases are fully closed during deposition of the respective layers. In order to prevent each of the gases from remaining within the deposition chambers 1001, 1101 and the pipes leading from the outflow valves 1041 to 1049 to the deposition chambers 1001, 1101, the operation of closing the outflow valves 1041 to 1049, opening the auxiliary valves 1008, 1108, and further fully opening the conductance valves 1007, 1107 to evacuate the system into high vacuum may be conducted, as required.

Next, on the p-type layer, a 70 μm-thick ITO (In$_2$O$_3$+SnO$_2$) thin film as the transparent electrode and a 2 μm-thick aluminum (Al) thin film as the collector electrode were vapor deposited in vacuum to fabricate photovoltaic elements (Element No. Examples 1-1 to 1-7 and Comparative Example 1-1). The fabrication conditions for the photovoltaic element as described above are listed in Table 1.

The initial characteristics, low illuminance characteristic, and durability characteristic were measured for the fabricated photovoltaic element.

The measurement of the initial characteristics was performed in terms of the open-circuit voltage and fill vector obtained by placing the fabricated photovoltaic elements under illumination of light with AM-1.5 (100 mW/cm$^2$) and measuring the V-I characteristic. The results are listed in Table 2.

The measurement of the low illuminance characteristic was performed in terms of the photovoltaic conversion efficiency obtained by placing the fabricated photovoltaic elements under illumination of light with AM-1.5 (10 mW/cm$^2$) and measuring the V-I characteristic. The results are listed in Table 2.

The measurement of the durability characteristic was performed in terms of the change in the photoelectric conversion efficiency obtained by placing the fabricated photovoltaic elements in the dark at a humidity of 70% and a temperature of 60° C. and then applying vibrations of 1 mm at 3600 rpm 48 hours. The results are listed in Table 2.

As seen in Table 2, a photovoltaic element having excellent characteristics is fabricated by making the i-type layer by microwave plasma CVD under a pressure of the deposition chamber 1001 of 50 mTorr or less.

Next, using a substrate of barium borosilicate glass (7059 manufactured by Corning), an i-type layer formed by microwave plasma CVD was deposited on the substrate by opening the shutter 1013 for two minutes under the same conditions as the i-type layer formed by microwave plasma CVD in Element No. Example 1-5, except that the SiH$_2$ gas flow and GeH$_4$ gas flow and the microwave electric power were as indicated in Table 3, whereby samples for the measurement of source gas decomposition efficiency were fabricated (Sample Nos. 1-1 to 1-5).

The film thickness of the fabricated sample for the measurement of source gas decomposition efficiency was measured by a layer thickness measuring instrument (Alpha Step 100 manufactured by TENCOR INSTRUMENTS) to obtain the decomposition efficiency of source gas. The results are listed in Table 3.

Then, photovoltaic elements were fabricated (Element No. Examples 1-8 to 1-10 and Comparative Examples 1-2 to 1-3) by forming a reflecting layer, a reflection multiplying layer, an n-type layer, an i-type layer, a p-type layer, a transparent electrode, and a collector electrode on the substrate under the same conditions as those of the photovoltaic element in Element No. Example 1-5, except that the microwave electric power was as indicated in Table 4 for depositing the i-type layer formed by microwave plasma CVD.

For the fabricated photovoltaic, the initial characteristics, the low illuminance characteristic, and the durability characteristic were measured in the same manner as in Element No. Example 1-5. The results are listed in Table 4.

As will be seen from Tables 3 and 4, a photovoltaic element having excellent characteristics can be obtained by decomposing the source gas with a lower microwave energy than the microwave energy necessary to decompose 100% of the source gas.

Then, photovoltaic elements were fabricated (Element No. Examples 1-11 to 1-14 and Comparative Example 1-4) by forming a reflecting layer, a reflection multiplying layer, an n-type layer, an i-type layer, a p-type layer, a transparent electrode, and a collector electrode on the substrate under the same conditions as those of the photovoltaic element in Element No. Example 1-5, except that the RF bias was as indicated in Table 5 during deposition of the i-type layer formed by microwave plasma CVD.

For the fabricated photovoltaic elements, the initial characteristics, the low illuminance characteristic, and the durability characteristic were measured in the same manner as in Element No. Example 1-5. The results are listed in Table 5. As will be seen from Table 5, a photovoltaic element having excellent characteristics can be obtained by applying a higher RF energy to the source gas than the microwave energy.

Next, using a stainless steel substrate and a barium borosilicate glass (7059 manufactured by Corning) substrate, an i-type layer 1 μm thick was formed on the substrate under the same conditions as the substrate under the same conditions as the i-type layer formed by microwave plasma CVD in Element No. Example 1-5, except that $SiH_4$ gas flow and $GeH_4$ gas flow were as indicated in Table 6, whereby samples for the measurement of the material were fabricated (Sample Nos. 1-6 to 1-10).

Further, using a barium borosilicate glass (7059 manufactured by Corning) substrate, an i-type layer 1 μm thick was formed on the substrate under the same fabrication conditions as the i-type layer formed by RF plasma CVD in Element No. Example 1-5, whereby a sample for the measurement of the material was fabricated (Sample No. 1-11).

The bandgap and the composition of the fabricated samples for the measurement of the materials were determined to obtain the relation between the composition ratio of Si to Ge atoms and the bandgap.

The measurement of the bandgap was performed by installing the glass substrate having the i-type layer fabricated thereon in a spectrophotometer (330 type manufactured by Hitachi, Ltd.) to measure the wavelength dependency of absorption coefficient for the i-type layer and obtain the bandgap of the i-type layer in accordance with a method as described in "Amorphous solar cells" (written by Kiyoshi Takahashi and Makato Konagai, published by Shokodo, p. 109).

The analysis of composition was performed by installing the stainless substrate having the i-type layer fabricated thereon in an Auger electron spectral analysis instrument (JAMP-3 manufactured by JEOL, Ltd.), and measuring the composition ratio of Si atoms to Ge atoms. The results of bandgap and composition are shown in Table 6.

Then, a photovoltaic element was fabricated (Element No. Comparative Example 1-5) by forming a reflecting layer, a reflection multiplying layer, an n-type layer, an i-type layer, a p-type layer, a transparent electrode, and a collector electrode on the substrate under the same conditions as those of the photovoltaic element in Element No. Example 1-5, except that the $SiH_4$ gas flow and the $GeH_4$ gas flow were regulated by the mass flow controllers 1021, 1026 in accordance with the flow patterns as shown in FIG. 265 during deposition of the i-type layer by microwave plasma CVD.

For the fabricated photovoltaic element, the initial characteristics, the low illuminance characteristic, and the durability characteristic were measured in the same manner as in Element No. Example 1-5. The results indicated that the open-circuit voltage and the fill factor of the initial characteristics, the low illuminance characteristic, and the durability characteristic of Element No. Example 1-5 were 1.02 times, 1.03 times, 1.08 times and 1.07 times better than those in Comparative Example 1-5, respectively.

Figure 24:
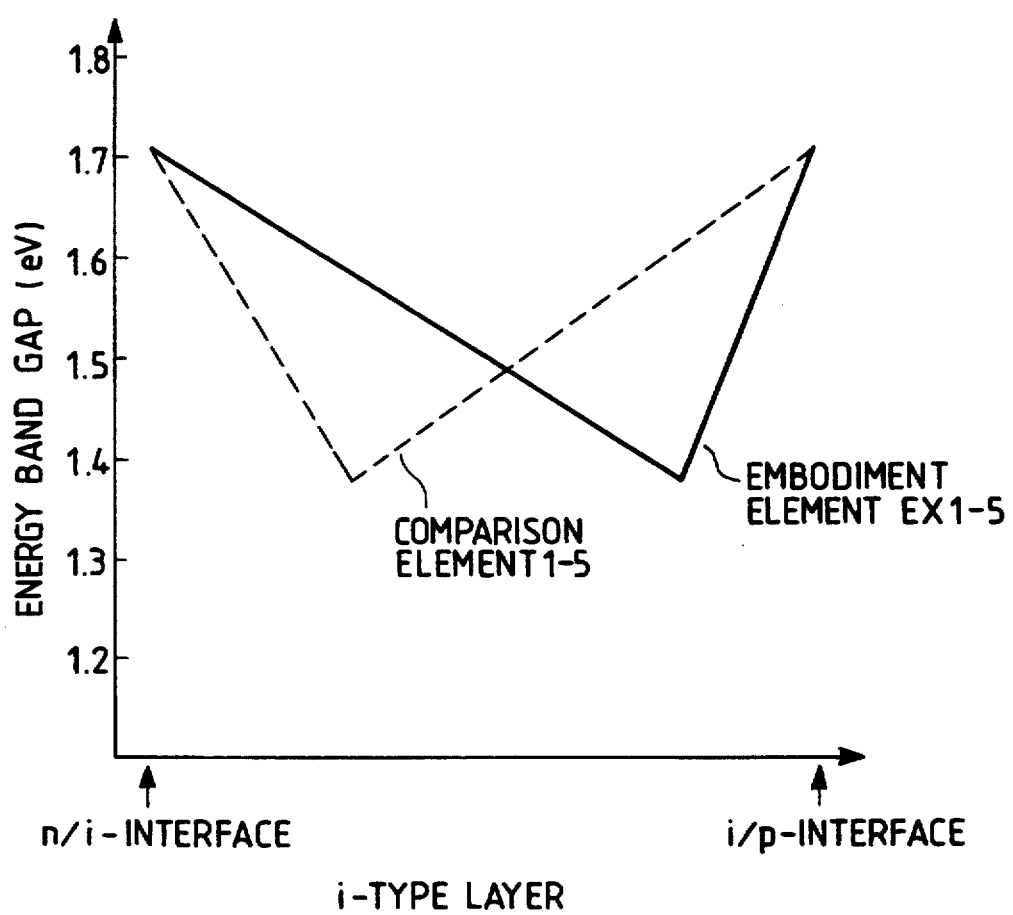
FIG. 24 is a graphical representation showing the variation of the i-type layer bandgap in the layer thickness direction.

Next, the composition analysis in the layer thickness direction of the Si atoms and the Ge atoms in the i-type layer formed by microwave plasma CVD in Element No. Example 1-5 and Element No. Comparative Example 1-5 was performed in the same manner as the previous composition analysis. From the relation between the composition ratio and the bandgap of Si atoms to Ge atoms obtained by Sample Nos. 1-6 to 1-10 as previously described, the variation of the bandgap in the layer thickness direction of the i-type layer was obtained. The results are shown in FIG. 24. As will be seen from FIG. 24, the photovoltaic element of Element No. Example 1-5 has the minimum value of bandgap at position shifted toward the interface between the p-type and the i-type layer, away from central position of the i-type layer, while the photovoltaic element of Element No. Comparative Example 1-5 has the minimum value of bandgap at a position shifted toward the interface between the n-type layer and the i-type layer away from the central position of the i-type layer.

Then, photovoltaic elements were fabricated (Element No. Examples 1-15 to 1-19 and Comparative Example 1-6) by forming a reflecting layer, a reflection multiplying layer, an n-type layer, an i-type layer, a p-type layer, a transparent electrode, and a collector electrode on the substrate under the same conditions as those of the photovoltaic element in Element No. Example 1-5, except that the $SiH_4$ gas flow and RF discharge power were as indicated in Table 7 during deposition of the i-type layer formed by RF plasma CVD.

For fabricated photovoltaic elements, the initial characteristics, the low illuminance characteristic, and the durability characteristic were measured in the same manner as in Element No. Example 1-5.

Next, using a barium borosilicate glass (7059 manufactured by Corning) substrate, an i-type layer 1 μm thick was formed on the substrate under the same conditions as the i-type layer formed on the substrate under the same conditions as the i-type layer formed by RF plasma CVD in Element No. Example 1-5, except that the SiH₄ gas flow and RF discharge power were as shown in Table 7, whereby a sample for the measurement of deposition rate was fabricated (Sample Nos. 1-12 to 1-17). The deposition rate of the fabricated sample was obtained in the same manner as in Sample Nos. 1-1 to 1-5. The results are listed in Table 7.

As will be seen from Table 7, it has been found that a photovoltaic element having excellent characteristics can be obtained by making the i-type layer by RF plasma CVD at a deposition rate of 2 nm/sec or less.

Then, photovoltaic elements were fabricated (Element No. Examples 1-20 to 1-22 and Comparative Examples 1-7 to 1-8) by forming a reflecting layer, a reflection multiplying layer, an n-type layer, an i-type layer, a p-type layer, a transparent electrode and a collector electrode on the substrate under the same conditions as those of the photovoltaic element in Element No. Example 1-5, except that the layer thickness of the i-type layer was as indicated in Table 8 during formation of the i-type layer by RF plasma CVD.

For the fabricated photovoltaic elements, the initial characteristics, the low illuminance characteristic, and the durability characteristic were measured in the same manner as in Element No. Example 1-5. The results are listed in Table 8. As will be seen from Table 8, the photovoltaic elements provided with the i-type layer formed by RF plasma CVD having a layer thickness of 30 nm or less (Element No. Examples 1-20 to 1-22) have excellent characteristics.

Using a single crystal silicon substrate, a 1 μm thick layer formed by RF plasma CVD was deposited on the substrate under the same conditions as the i-type layer formed by RF plasma CVD in Element No. Example 1-5, except that the RF discharge power was as shown in Table 9, whereby a sample for the measurement of the infrared spectrum was fabricated (Sample Nos. 1-18 to 1-22).

Further, using a single crystal silicon substrate, a 1 μm thick i-type layer formed by microwave plasma CVD was deposited on the substrate under the same conditions as the i-type layer formed by microwave plasma CVD in Element No. Example 1-5, whereby a sample for the measurement of the infrared spectrum was fabricated (Sample No. 1-23).

The fabricated sample for the measurement of the infrared spectrum (Sample Nos. 1-18 to 1-23) was installed in an infrared spectrophotometer (1720-X manufactured by PERKIN ELMER) to obtain a value of the half-width of a peak at 2000 cm$^{-1}$ in the infrared absorption spectrum divided by the height of the peak. The results are listed in Table 9.

Then, photovoltaic elements were fabricated (Element No. Examples 1-23 to 1-26) by forming a reflecting layer, a reflection multiplying layer, an n-type layer, an o-type layer, a p-type layer, a transparent electrode, and a collector electrode on the substrate under the same conditions as those of the photovoltaic element in Element No. Example 1-5, except that RF discharge power was indicated in Table 9 during formation of the i-type layer by RF plasma CVD.

For the fabricated photovoltaic elements, the infrared characteristics, the low illuminance characteristic, and the durability characteristic were measured in the same manner as in Element No. Example 1-5. The results are listed in Table 9. As will be seen from Table 9, the photovoltaic element having a greater value of half-width of a peak at 2000 cm$^{-1}$ in the infrared absorption spectrum divided by the height of the peak in the i-type layer was formed by RF plasma CVD rather than by microwave plasma CVD and has excellent characteristics.

From the above results, it has been found that the photovoltaic elements (Element No. Examples 1-1 to 1-23) of the present invention have better characteristics than the conventional photovoltaic elements (Element No. Comparative Examples 1-1 to 1-8). The photovoltaic elements of the present invention have an i-type layer formed by microwave plasma CVD at an internal pressure of 50 mTorr or less by applying a lower microwave energy and a higher RF energy then the microwave energy necessary to decompose 100% of the source gas. An i-type layer formed by RF plasma CVD is deposited to a thickness of 30 nm or less at a deposition rate of 2 nm/sec or less, in such a manner that the bandgap smoothly changes in the direction of layer thickness. The minimum value of bandgap occurs at a position shifted toward the interface between the p-type layer and the i-type layer, away from the central position of the i-type layer. Thus, the effects of the present invention have been evidenced.

Example 2

Photovoltaic elements were fabricated (Element No. Examples 2-1 to 2-8) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that the SiH₄ gas flow and the GeH₄ gas flow were regulated by the mass flow controllers 1021, 1026 in accordance with the flow patterns as shown in FIG. 13A. As in Example 1, the SiH₄ gas flow was maintained at 200 sccm and the GeH₄ gas flow at 1 sccm, and the region of the maximum value of bandgap had a layer thickness as indicated in Table 10 for making the i-type layer by microwave plasma CVD.

For the fabricated photovoltaic elements, the initial characteristics, the low illuminance characteristic, and the durability characteristic were measured in the same manner as in Example 1. The results are listed in Table 10. As will be seen from Table 10, the photovoltaic elements (Element No. Examples 2-1 to 2-7) having a layer thickness of 1 to 30 nm in the region of the maximum value of bandgap have excellent characteristics, whereby the effects of the present invention are evidenced.

Example 3

A photovoltaic element was fabricated (Element No. Example 3) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that the BF₃(2000 ppm)/H₂ gas flow and PH₃(2000 ppm)/H₂ gas flow were 0.04 sccm and 0.02 sccm, using cylinder 1077 and cylinder 1078, respectively, during formation of the i-type layer by RF plasma CVD.

For Element No. Example 3, the initial characteristics, the low illuminance characteristic, and the durability characteristic were measured in the same manner as in Example 1, and the results were equivalent to those of Element No. Example 1-5.

Also, the composition analysis for Element No. Example 3 was performed using a secondary ion mass spectrometer (IMS-3F manufactured by CAMECA), and it was confirmed that B atoms and P atoms were contained in the i-type layer formed by RF plasma CVD.

Example 4

A photovoltaic element was fabricated (Element No. Example 4) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that $AsH_3$ gas diluted to 2000 ppm with $H_2$ gas (hereinafter abbreviated as "$AsH_3/H_2$") was used instead of $PH_3(2000$ ppm$)H_2$ gas at a flow rate 0.1 sccm during formation of the i-type layer by RF plasma CVD.

For Element No. Example 4, the initial characteristics, the low illuminance characteristic, and the durability characteristic were measured in the same manner as in Example 1, and the results were equivalent to those of Element No. Example 1-5.

Example 5

A photovoltaic element was fabricated (Element No. Example 5) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that a cylinder of NO/He gas 1079 was used at a flow rate of 0.5 sccm for the i-type layer formed by microwave plasma CVD and at 0.05 sccm for the i-type layer formed by RF plasma CVD.

For the fabricated photovoltaic element, the initial characteristics, the low illuminance characteristic, and the durability characteristic were measured in the same manner as Example 1, and the results were equivalent to those of Element No. Example 1-5.

Also, composition analysis of Element No. Example 5 was performed using a secondary ion mass spectrometer, and it was confirmed that N atoms and O atoms were contained in the i-type layer.

Example 6

Figure 25A:
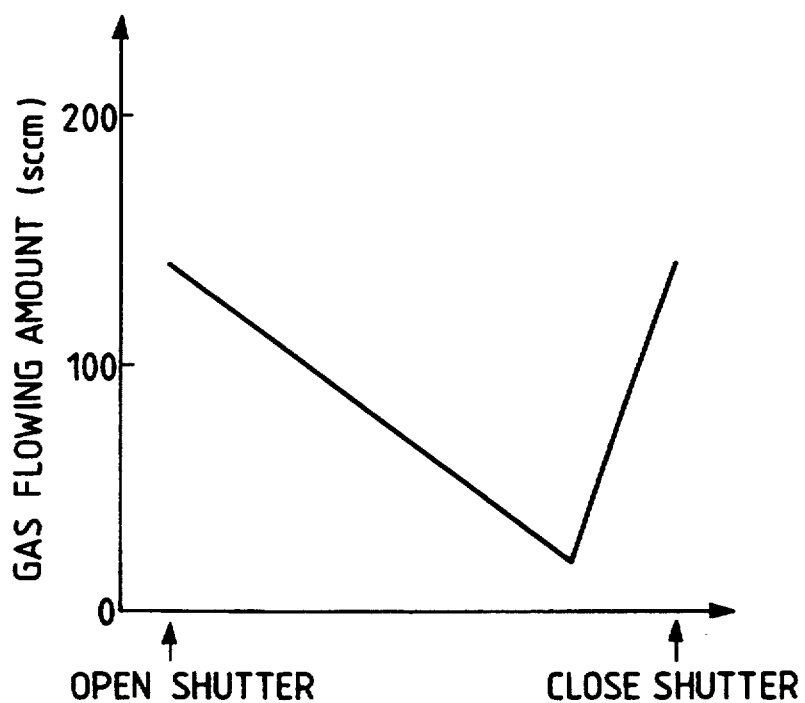
FIGS. 25A and 25B are graphical representations showing a $SiH_4$ gas flow rate pattern during forming of the i-type layer, and the variation in layer thickness direction of Si and H atoms in the i-type layer.

A photovoltaic element was fabricated (Element No. Example 6) by forming a reflecting layer, a transparent conductive layer, a n-type layer, an i-type layer, a p-type layer, a transparent electrode, and a collector electrode on the substrate under the same conditions as Element No. Example 1-5, except that a cylinder of $Si_2H_6$ gas was used at a flow rate of 40 sccm, regulated by a mass flow controller 1021 in accordance with the flow pattern as shown in FIG. 25A during a formation of the i-type layer by microwave plasma CVD.

For the fabricated photovoltaic element, the initial characteristics, the low illuminance characteristic, and the durability characteristic were measured in the same manner as in Example 1, and the results were equivalent to those of Element No. Example 1-5.

Figure 25B:
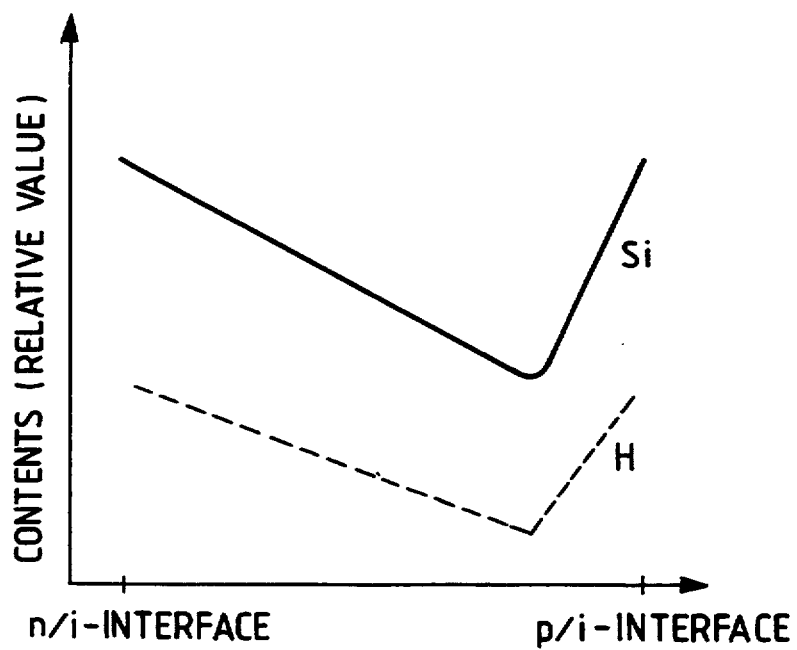

Also, the distribution in the layer thickness direction of the Si atoms and hydrogen atoms in the i-type layer of the photovoltaic element were analyzed using a secondary ion mass spectrometer (IMS-3F manufactured by CAMECA). The results are shown in FIG. 25B.

From the above results, it has been found that the photovoltaic element in which the content of hydrogen atoms changes corresponding to the content of Si atoms has excellent characteristics, whereby the effects of the present invention have been evidenced.

Example 7

A photovoltaic element was fabricated (Element Example 7) by forming a reflecting layer, a transparent conductive layer, an n-type layer, an i-type layer, a p-type layer, a transparent electrode, and a collector electrode on the substrate under the same conditions as those of Element No. Example 1-5, except that the distance between the point of mixing $SiH_4$ gas and $GeH_4$ gas and the deposition chamber 1001 in the source gas supply unit 1020 was set as listed in Table 11.

For the photovoltaic element thus fabricated, the initial characteristics, the low illuminance characteristic, and the durability characteristic were measured in the same manner as in Example 1. The results are listed in Table 11. As will be seen from Table 11, if the distance between the point of mixing $SiH_4$ gas and $GeH_4$ gas and the deposition chamber 1001 is 5 m or less, a photovoltaic element having excellent characteristics can be obtained.

Example 8

A photovoltaic element was fabricated under the same conditions as in Element No. Example 1-5, and using this photovoltaic element, a solar cell module was fabricated, whereby an analog clock with a circuit configuration as shown in FIG. 28 was made. In FIG. 28, the electric power generated by a solar cell module 9101 is passed via a reverse current preventing diode 9102 to charge a secondary cell 9104. 9103 is an overcharge preventing diode.

The electric power from the solar cell module 9101 and the secondary cell 9104 is supplied to a drive circuit 9105 of the analog clock.

Comparative Example 2

As a comparative example, a photovoltaic element was fabricated as in Element No. Comparative Example 1-7, and using this photovoltaic element, the same analog clock as in Example 8 was made.

The analog clocks as fabricated in Example 8 and the Comparative Example 2 were installed on the wall of a room, and an indoor lamp was lit for 8.5 hours a day. As a result, the analog clock of Example 8 worked the entire day, but the analog clock of the comparative example did not work the entire day, whereby the effects of the power generation system of the present invention could be evidenced.

Example 9

Figure 26:
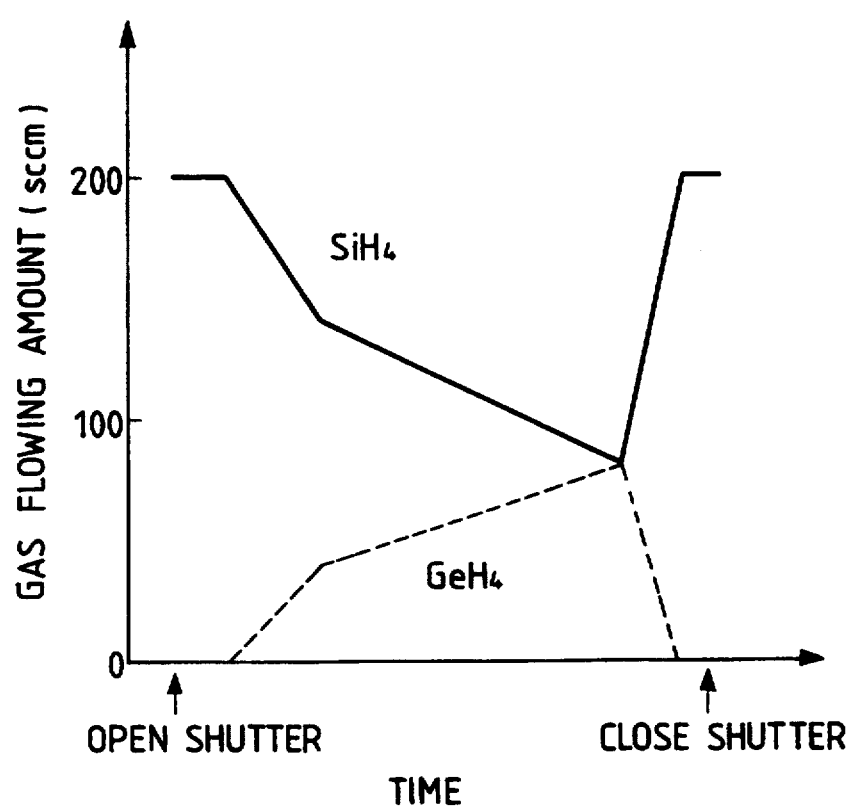
FIG. 26 is a graphical representation showing variation of $SiH_4$ and $GeH_4$ gas flow rate patterns with time.

A photovoltaic element was fabricated (Element No. Example 9) by forming a reflective layer, a transparent conductive layer, an n-type layer, an i-type layer, a p-type layer, a transparent electrode, and a collector electrode on the substrate under the same conditions as those of Element No. Example 1-5 in Example 1, except that the flow rates of $SiH_4$ gas and $GeH_4$ gas were regulated by mass flow controllers 1021, 1026 in accordance with the flow patterns as shown in FIG. 26 during formation of the i-type layer.

For the fabricated photovoltaic element, the initial characteristics, the low illuminance characteristic, and the durability characteristic were measured in the same manner in Example 1, and the results were equivalent to those of Element No. Example 1-5, whereby the effects of the present invention were evidenced.

Example 10

A photovoltaic element was fabricated (Element No. Example 10) by forming a reflective layer, a transparent conductive layer, an n-type layer, an i-type layer, a p-type layer, a transparent electrode, and a collector electrode on the substrate under the same conditions as those of Element No. Example 1-5 in Example 1, except $B_2H_6$ gas diluted to 1% with $H_2$ gas (hereinafter abbreviated as "$B_2H_6(1\%)/H_2$") was used instead of $BF_3(2000\ ppm)/H_2$ gas at a flow rate 0.05 sccm during formation of the i-type layer by RF plasma CVD.

For the fabricated photovoltaic element, the initial characteristics, the low illuminance characteristic, and the durability characteristic were measured in the same manner as in Example 1, and the results were equivalent to those of Element No. Example 1-5, whereby the effects of the present invention were evidenced.

Example 11

Figure 33A:
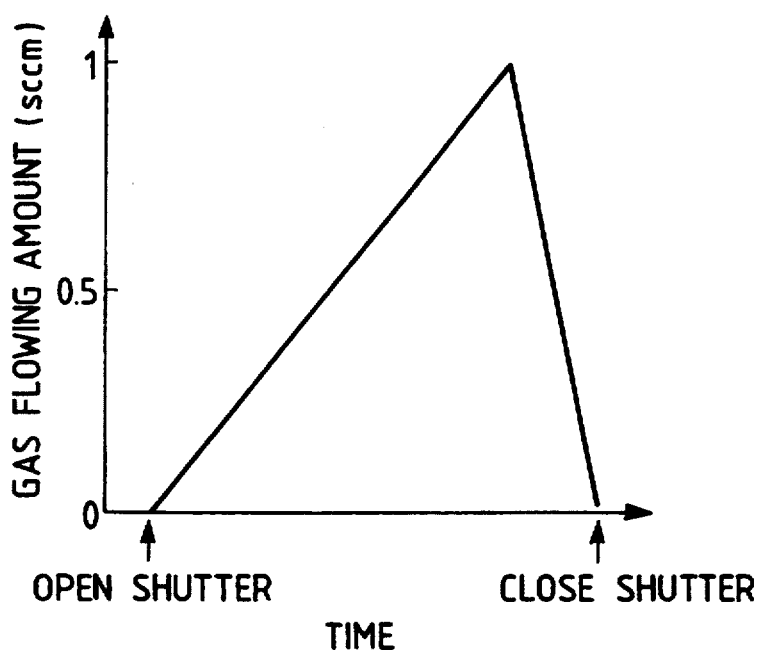
FIGS. 33A and 33B are graphical representations respectively showing the flow rate of NO/He gas introduced during forming of the i-type layer, varying with time, and the variation in the layer thickness direction of N and O atoms in the i-type layer.

A photovoltaic element was fabricated (Element No. Example 11) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that the flow of NO/He gas was regulated by a mass flow controller 1029 in accordance with the flow pattern as shown in FIG. 33A during formation of the i-type layer by microwave plasma CVD.

For the fabricated photovoltaic element, the initial characteristics, the low illuminance characteristic, and the durability characteristic were measured in the same manner as in Example 1, and the results were equivalent to those of Element No. Example 1-5.

Figure 33B:
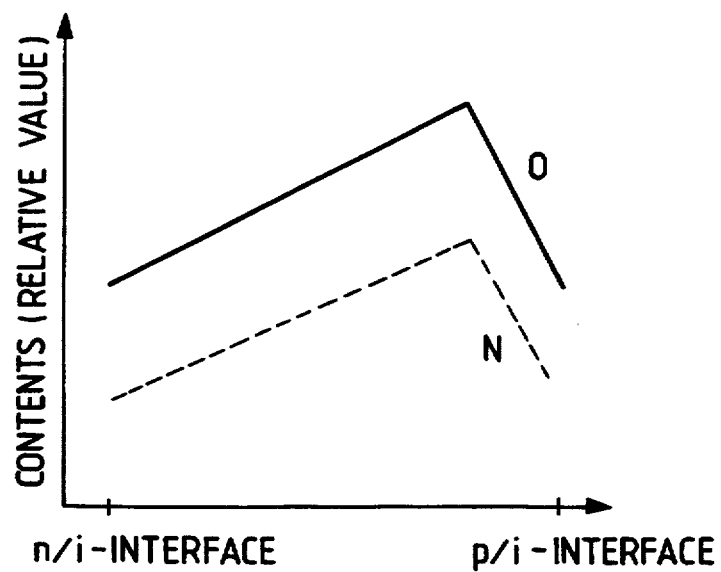

Also, the distribution in the layer thickness direction of N atoms and O atoms in the i-type layer of the photovoltaic element was analyzed using a secondary mass spectrometer. The results are shown in FIG. 33B. From the above results, the effects of the present invention have been evidenced.

Example 12

Figure 34:
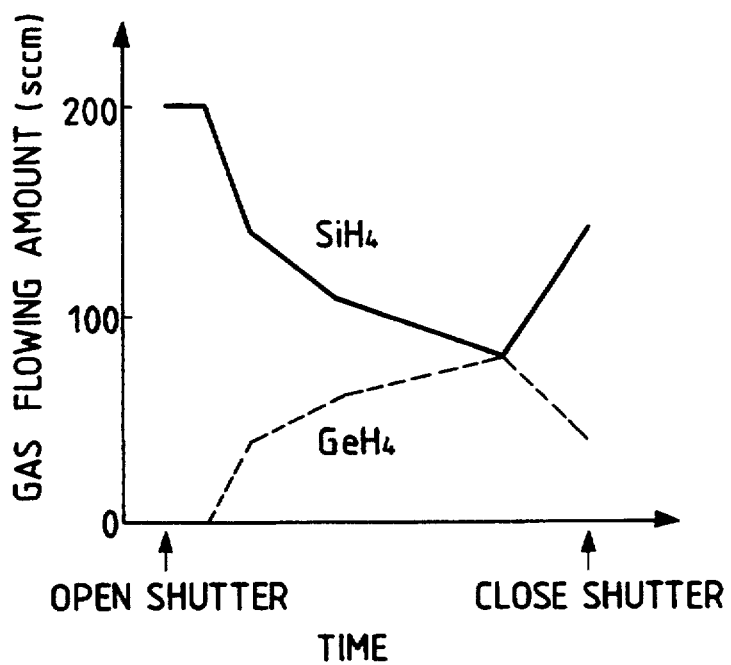
FIGS. 34-40 are graphical representations showing the patterns of variation of the flow rates of $SiH_4$ and $GeH_4$ gases with time.

A photovoltaic element was fabricated (Element No. Example 12) by forming a reflecting layer, a transparent conductive layer, an n-type layer, an i-type layer, a p-type layer, a transparent electrode, and a collector electrode on the substrate under the same conditions as Element No. Example 1-5, except that the flow rates of $SiH_4$ gas and $GeH_4$ gas were regulated by mass flow controllers 1021, 1026 in accordance with the flow patterns as shown in FIG. 34 during formation of the i-type layer by microwave plasma CVD.

For the fabricated photovoltaic element, the initial characteristics, the low illuminance characteristic, and durability characteristic were measured in the same manner as in Example 1, and the results were equivalent to those of Element No. Example 1-5, whereby the effects of the present invention were evidenced.

Example 13

A photovoltaic element was fabricated (Element No. Example 13) by forming a reflective layer, a transparent conductive layer, an n-type layer, an i-type layer, a p-type layer, a transparent electrode, and a collector electrode on the substrate under the same conditions as those of Example 9, except that the RF bias power source 1011 was set at 250 mW/cm$^3$, and the DC bias was set via a coil at 50 V for application to the bias rod 1012 during formation of the i-type layer by microwave plasma CVD.

For the photovoltaic element thus fabricated, the initial characteristics, the low illuminance characteristic, and the durability characteristic were measured in the same manner as int Example 9, and the results were equivalent to those of Example 9, whereby the effects of the present invention were evidenced.

Example 14

A photovoltaic element was fabricated (Element No. Example 14) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that a cylinder of $D_2$ gas (not shown) was used instead of $H_2$ at a flow rate of 300 sccm during formation of the i-type layer by microwave plasma CVD.

For the fabricated photovoltaic element, the initial characteristics, the low illuminance characteristic, and the durability characteristic were measured in the same manner as in Example 1, and the results were equivalent to those of Element No. Example 1-5.

Also, composition analysis of the photovoltaic element was performed using a secondary ion mass spectrometer, and it was confirmed that D atoms were contained in the i-type layer, whereby the effects of the present invention were evidenced.

Example 15

A photovoltaic element was fabricated (Element No. Example 15) by forming a reflecting layer, a transparent conductive layer, an n-type layer, an i-type layer, a p-type layer, a transparent electrode, and a collector electrode on the substrate under the same conditions as those of Element No. Example 1-5 in Example 1, except that the DC bias from bias power source 1011 was changed at a constant rate from 50 V to 80 V at the same time when the shutter 1013 was opened during formation of the n-type layer.

For the fabricated photovoltaic element, the initial characteristics, the low illuminance characteristic, and the durability characteristic were measured in the same manner as in Example 1, and the results were equivalent to those of Element No. Example 1-5, whereby the effects of the present invention were evidenced.

Example 16

Using an RF plasma CVD apparatus as shown in FIG. 19, an n-type layer and a p-type layer of a photovoltaic element of the present invention were fabricated in accordance with the same procedures as that for the i-type layer formed by RF plasma CVD of Example 1.

In the figure, 1104 is a substrate similar to that used in Example 1. The gas cylinders 1071 to 1079 as shown in the figure each were filled with the same source gases as in Example 1, each gas being introduced into a mass flow controller 1021 to 1029 with the same operation procedure as in Example 1.

After preparation for film formation was completed in the above way, the n-type layer was formed on the substrate 1104.

To make the n-type layer, the substrate 1104 was heated to 350° C. by the heater 1105, the outflow valves 1042, 1044, 1045 and the auxiliary valve 1108 were gradually opened to flow $H_2$ gas, $PH_3(1\%)/H_2$ gas, and $Si_2H_6$ gas through the gas introducing pipe 1103 into the deposition chamber 1101. The inflow rates of the gases were regulated by mass flow controllers 1022, 1024, 1025 so that the $H_2$ gas flow, $PH_3(1\%)/H_2$ gas flow and $Si_2H_6$ gas flow were 50 sccm, 5 sccm, and 3 sccm. The opening of conductance valve 1107 was adjusted by referring to the vacuum gauge 1106 so that the pressure within the deposition chamber 1101 was 1 Torr.

Thereafter, the output power of RF power source 1111 was set at 120 mW/cm², and RF electric power was introduced through the RF matching box 1112 into the cathode 1102 to excite an RF glow discharge to start formation of the n-type layer on the substrate 1104. Upon depositing the n-type layer to a thickness of 10 nm, the RF glow discharge was stopped, and the outflow valves 1042, 1044, 1045 and the auxiliary valve 1008 were closed to stop the gas inflow into the deposition chamber 1101, whereby the formation of the n-type layer was completed.

Then, the substrate 1004 having the n-type layer deposited thereon was taken out from the deposition chamber 1101, and installed in the deposition apparatus 1000 with the microwave glow discharge decomposition method as used in Example 1, where an i-type layer formed by microwave plasma CVD was deposited on the n-type layer under the same conditions as those of Element No. Example 1-5 in Example 1.

Then, the substrate 1004 having the i-type layer formed by microwave plasma CVD thereon was taken out from the deposition chamber 1000, and installed in the RF plasma CVD deposition apparatus 1100, as previously described, where an i-type layer formed by RF plasma CVD was deposited on the i-type layer formed by microwave plasma CVD under the same conditions as those of Element No. Example 1-5 in Example 1.

Subsequently, a p-type layer was deposited on the i-type by RF plasma CVD. To make the p-type layer, the substrate 1104 was heated to 200° C. by the heater 1105, the outflow valves 1041 to 1043 and the auxiliary valve 1108 were gradually opened to flow $SiH_4$ gas, $H_2$ gas, and $BF_3(1\%)/H_2$ gas through the gas introducing tube 1103 into the deposition chamber 1101. Then, the inflow rates were regulated by mass flow controllers 1021 to 1023 so that the $SiH_4$ gas flow, $H_2$ gas flow, and $BF_3(1\%)/H_2$ gas flow were 0.5 sccm, 100 sccm, and 1 sccm. The opening of conductance valve 1107 was adjusted by referring to the vacuum gauge 1106 so that the pressure within the deposition chamber 1101 was 1 Torr.

Thereafter, the output power of RF power source 1111 was set at 2 mW/cm² and RF electric power was introduced through the RF matching box 1112 to the cathode 1102 to excite an RF glow discharge to start the formation of the p-type layer on the i-type layer. Upon deposition the p-type layer to thickness of 5 nm, the RF glow discharge was stopped, and the outflow valves 1041 to 1043 and the auxiliary valve 1108 were closed to stop the gas inflow into the deposition chamber 1101, whereby the formation of the p-type layer was completed.

Next, on the p-type layer, a transparent electrode and a collector electrode were vapor deposited in vacuum to fabricate a photovoltaic element (Cell No. Example 16). The fabrication conditions for the photovoltaic element as described above are listed in Table 12.

Comparative Example 3

A photovoltaic element was fabricated (Element No. Comparative Example 3) by forming a reflective layer, a transparent conductive layer, an n-type layer, an i-type layer, a p-type layer, a transparent electrode, and a collector electrode on the substrate under the same conditions as those of Example 16, except that the i-type layer formed by the RF plasma CVD was not made.

For the photovoltaic elements thus fabricated (Element No. Example 16 and Element No. Comparative Example 3), the initial characteristics, the low illuminance characteristic, and the durability characteristic were measured as in Example 1. From the measurements, it was determined that the photovoltaic element of Element No. Example 16 was superior to Element No. Comparative Example 3, such that the open-circuit voltage and the fill factor of the initial characteristics, the photoelectric conversion efficiency of the low illuminance characteristic, and the decrease in the photoelectric conversion efficiency (the durability characteristic) were 1.03 times, 1.04 times, 1.09 times, and 1.07 times better, respectively. Thus, the effects of the present invention were evidenced.

Example 17

A photovoltaic element was fabricated (Element No. Example 17) by forming a reflecting layer, a reflection multiplying layer, a first n-type layer, a first i-type layer, a first p-type layer, a second n-type layer, a second i-type layer, a second p-type layer, a transparent electrode, and a collector electrode on the substrate under the same conditions as listed in Table 13, with the same method as in Example 1.

Comparative Example 4

A photovoltaic element was fabricated (Element No. Example 4) by forming a reflecting layer, a reflection multiplying layer, a first n-type layer, a first i-type layer, a first p-type layer, a second n-type layer, a second i-type layer, a second p-type layer, a transparent electrode, and a collector electrode on the substrate under the same conditions as listed in Table 17, except that the first i-type layer formed by RF plasma CVD was not made.

For the photovoltaic elements thus fabricated (Element No. Example 17 and Comparative Example 4) in the above manner, the initial characteristics, the low illuminance characteristic, and the durability characteristic were measured as in Example 1. From the measurements, it has been determined that the photovoltaic element of Element No. Example 17 was superior to that of Element No. Comparative Example 4, such that the open-circuit voltage and the fill factor of the initial characteristics, the photoelectric conversion efficiency of the low illuminance characteristic, and the decrease in the photoelectric conversion efficiency (the durability characteristic) were 1.04 times, 1.03 times, 1.06 times and 1.10 times better, respectively. Thus, the effects of the present invention were evidenced.

Example 18

A photovoltaic element was fabricated (Element No. Example 18 by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrodes and a collector electrode on the substrate under the same conditions as listed in Table 14, with the same method as in Example 1.

Comparative Example 5

A photovoltaic element was fabricated (Element No. Comparative Example 5) by forming a reflecting layer, a reflection multiplying layer, a first n-type layer, a first i-type layer, a first type p-layer, a second n-type layer, a second i-type layer, a second p-type layer, a third n-type layer, a third i-type layer, a third p-type layer, a transparent electrode, and a collector electrode on the substrate under the conditions of Table 17, except that the i-type layers formed by RF plasma CVD were not made.

For the photovoltaic elements thus fabricated (Element No. Example 18 and Comparative Example 5), the initial characteristics, the low illuminance characteristic, and the durability characteristic were measured in the same manner as in Example 1. From the measurements, it has been determined that the photovoltaic element of Element No. Example 18 was superior to that of Element No. Comparative Example 5, such that the open-circuit voltage and the fill factor of the initial characteristics, the photoelectric conversion efficiency of the low illuminance characteristic, and the decrease in the photoelectric conversion efficiency (the durability characteristic) were 1.03 times, 1.02 times and 1.07 times better, respectively. Thus, the effects of the present invention were evidenced.

Example 19

Using a multiple chamber separation-type deposition apparatus as shown in FIG. 20, a photovoltaic element of the present invention was fabricated. In the figure, 1201 and 1209 are a load chamber and an unload chamber, respectively, 1202, 1204, 1205, 1206, and 1208 are deposition chambers for the layers formed by RF plasma CVD as in Example 16, 1203 and 1207 are deposition chambers for the layers formed by microwave plasma CVD as in Example 1, 1211 to 1218 are gate valves for separating one chamber from the other, 1221, 1223 to 1225 and 1227 are cathode electrodes, and 1222 and 1226 are a waveguide portion for microwaves and a dielectric window, respectively.

First, the substrate was installed in the load chamber 1201, and the load chamber was evacuated of air. Thereafter, gate valve 1211 was opened, the substrate was moved to first n-type layer deposition chamber 1202, and gate valve 1211 was closed. Next, the first n-type layer was made on the substrate under the same conditions as those of the first n-type layer of Example 17. Then, gate valve 1212 was opened, the substrate was moved to a first microwave plasma CVD i-type layer deposition chamber 1203, and gate valve 1212 was closed. Next, a first i-type layer formed by microwave plasma CVD was deposited on the first n-type layer under the same conditions as those of the first i-type layer formed by microwave plasma CVD of Example 17. Next, gate valve 1213 was opened, the substrate was moved to first RF plasma CVD, i-type layer deposition chamber 1204 and gate valve 1213 was closed. Next, a first i-type layer formed by RF plasma CVD was deposited on the first i-type layer formed by microwave plasma CVD under the same conditions as those of the first i-type layer by RF plasma CVD of Example 17.

Gate valve 1214 was then opened, the substrate moved to first p-type layer deposition chamber 1205, and gate valve 1214 was closed. Next, a first p-type layer was formed on the first i-type layer by RF plasma CVD under the same conditions as those of the first p-type layer of Example 17. Then, gate valve 1215 was opened, the substrate was moved to a second n-type layer deposition chamber 1206, and gate valve 1215 was closed. Next, a second n-type layer was formed on the first p-type layer under the same conditions as those of the second n-type layer of Example 17. Next, gate valve 1216 was opened, the substrate was moved to second i-type layer deposit in chamber 1207, and gate valve 1216 was closed. Next, a second i-type layer was formed on the second n-type layer under the same conditions as those of the second i-type layer of Example 17. Next, gate valve 1217 was opened, the substrate was moved to second p-type layer deposition chamber 1208, and gate valve 1217 was closed. Next, a second p-type layer was formed on the second i-type layer under the same conditions as those of the second p-type layer of Example 17. Then, gate valve 1218 was opened, the substrate was moved to unload chamber 1209, and gate valve 1218 was closed. Then, the substrate was taken out from the unload chamber 1209, whereby the fabrication of a photovoltaic element was completed (Element No. Example 19).

For the fabricated photovoltaic element, the initial characteristics, the low illuminance characteristic and the durability characteristic were measured as in Example 1. From the measurements, it has been determined that the photovoltaic element was superior to that of Element No. Example 17, such that the open-circuit voltage and the fill factor of the initial characteristics, the photoelectric conversion efficiency of the low illuminance characteristic, and the decrease in the photoelectric conversion efficiency (the durability characteristic) were 1.01 times, 1.02 times, 1.03 times and 1.01 times better, respectively. Thus, it has been found that a photovoltaic element of the present invention can exhibit improved characteristics by fabricating it in the multiple chamber separation-type deposition chamber.

Example 20

A photovoltaic element was fabricated under the same conditions as those of Example 17, and using the photovoltaic element, a solar cell module was fabricated for use in a car-mounted ventilation fan having a circuit configuration as shown in FIG. 28. In FIG. 28, the electric power generated by the solar cell module 9101, which is bonded to the bonnet of car, is charged through a reverse-current preventing diode 9102 into a secondary cell 9104. 9103 is an overcharge preventing diode. The electric power from the solar cell module 9101 and the secondary cell 9104 is supplied to a motor 9105 for the ventilation fan.

Comparative Example 6

As a comparative example, a photovoltaic element was fabricated under the same conditions as those of Comparative Example 4, and a car-mounted ventilation fan similar to that of Example 21 was made using the photovoltaic element.

A car which has mounted thereon the ventilation fans as fabricated in Example 20 and Comparative Example 4 was left in an idling state with the engine running for 168 hours, and then left in sunny weather with the ventilation fan operating and with the engine stopped, whereafter the temperature within the car was measured.

As a result, the car-mounted cooling fan of Example 20 achieved an interior temperature three degrees lower than the car-mounted cooling fan of the comparative example, whereby the effect of the power generation system of the present invention was demonstrated.

Example 21

In this example, a photovoltaic element having a laminated p-type layer was fabricated.

In a source gas supply unit 1020 as shown in FIGS. 18 and 19, the $BF_3(1\%)/H_2$ gas cylinder was replaced with a cylinder of $B_2H_6$ gas diluted to 10% with $H_2$ gas ($B_2H_6(10\%)/H_2$ gas).

On a SUS substrate, a reflecting layer, a reflection multiplying layer, an n-type layer, an i-type layer formed by microwave plasma CVD, and an i-type layer formed by RF plasma CVD were deposited as in Example 1, and subsequently a p-type layer was formed in the following manner.

After the formation of the i-type layer by RF plasma CVD, the substrate was installed in a microwave plasma CVD apparatus as shown in FIG. 18 to form laminated p-type layer with a doping layer A and a doping layer B.

To make a doping layer B1, the substrate 1004 was heated to 300° C. by the heater 1005, the outflow valves 1041, 1042, 1047 and the auxiliary valve 1008 were gradually opened to flow $SiH_4$ gas, $H_2$ gas, and $BF_3/H_2$ gas through the gas introducing pipe 1003 into the deposition chamber 1001. The inflow rates of the gases were regulated by mass flow controllers 1021, 1022, 1027 so that the $SiH_4$ gas flow, the $H_2$ gas flow, and the $BF_3/H_2$ gas flow were 1 sccm, 300 sccm, and 2 sccm. The pressure within the deposition chamber 1101 was set to 1 Torr by adjusting the opening of conductance valve 1007 while referring to the vacuum gauge 1006.

Thereafter, the output power of the microwave power source (not shown), was set at 50 mW/cm$^3$ and microwave electric power was introduced through a waveguide (not shown), waveguide portion 1010, and dielectric window 1002 into deposition chamber 1001 to excite a microwave glow discharge to start the formation of the doping layer B1 on the i-type layer by opening the shutter 1013. Upon depositing doping layer B1 to a thickness of 0.5 nm, shutter 1013 was closed, the microwave glow discharge was stopped, and outflow valves 1041, 1042, 1047 and auxiliary valve 1008 were closed to stop the gas inflow into the deposition chamber 1001.

To make doping layer A, the substrate 1004 was heated to 300° C. by the heater 1005, the outflow valve 1043 and the auxiliary valve 1008 were gradually opened to flow $B_2H_6(10\%)/H_2$ gas through the gas introducing pipe 1003 into the deposition chamber 1001. The inflow rate of the gas was regulated by mass flow controller 1023 so that the $B_2H_6(10\%)/H_2$ gas flow was 100 sccm. The pressure within the deposition chamber 1001 was set to 30 mTorr by adjusting the opening of conductance valve 1007 while referring to the vacuum gauge 1006.

Thereafter, the output power of the microwave power source (not shown) was set at 50 mW/cm$^3$, and microwave electric power was introduced through a waveguide (not shown), the waveguide portion 1010, and the dielectric window 1002 into the deposition chamber 1001 to excite a microwave glow discharge to start formation of doping layer A on doping layer B1 by opening the shutter 1013. Upon depositing doping layer A to a thickness of 0.3 nm, the shutter 1013 was closed, the microwave glow discharge was stopped, and the outflow valve 1043 and the auxiliary valve 1008 was closed to stop the gas inflow into the deposition chamber 1001.

Next, doping layer B2 was formed on doping layer A under the same conditions as those of doping layer B1, except that the layer thickness was 10 nm.

Subsequently, on the p-type layer, a 70 μm-thick ITO ($In_2O_3 + SnO_2$) thin film as the transparent electrode and a 2 μm-thick aluminum (Al) thin film as the collector electrode were vapor deposited in vacuum to fabricate photovoltaic elements (Element No. Examples 1-1 to 1-7 and Comparative Example 7-1). The fabrication conditions for the photovoltaic elements as described above are listed in Table 15.

The initial characteristics, low illuminance characteristic, and durability characteristic were measured for the thus fabricated photovoltaic elements (Element No. Examples 21-1 to 21-7 and Comparative Example 7-1). The results are listed in Table 16.

From Table 16, it is seen that a photovoltaic element with better characteristics is obtained by forming the i-type layer by microwave plasma CVD within the deposition chamber at a pressure of 50 mTorr or less.

Next, photovoltaic elements were fabricated (Element No. Examples 21-8 to 21-10 and Comparative Examples 7-2 to 7-3) by forming a reflecting layer, a reflection multiplying layer, an n-type layer, an i-type layer, a p-type layer, a transparent electrode and a collector electrode on the substrate under the same conditions as those of Element No. Example 21-5, except that the output power of microwave electric power source was as indicated in Table 17 in making the i-type layer by microwave plasma CVD.

For the thus fabricated photovoltaic elements, the initial characteristics, the low illuminance characteristic, and the durability characteristic were measured in the same manner as in Example 1. The results are listed in Table 17. From Table 17, it is seen that a photovoltaic element having better characteristics can be obtained by decomposing the source gas with a lower microwave energy than that necessary to decompose 100% of the source gas.

Then, photovoltaic elements were fabricated (Element Nos. Examples 21-11 to 21-14 and Comparative Example 7-4) by forming a reflecting layer, a reflection multiplying layer, an n-type layer, an i-type layer, a p-type layer, a transparent electrode, and a collector electrode on the substrate under the same conditions as those of Element No. Example 21-5, except that the RF bias was as indicated in Table 18 during deposition of the i-type layer by microwave plasma CVD.

For the thus fabricated photovoltaic elements, the initial characteristics, the low illuminance characteristic, and the durability characteristic were measured in the same manner as in Example 1. The results are listed in Table 18. From Table 18, it is seen that a photovoltaic element having excellent characteristics can be obtained by apply a higher RF energy to the source gas than the microwave energy.

Figure 23A:
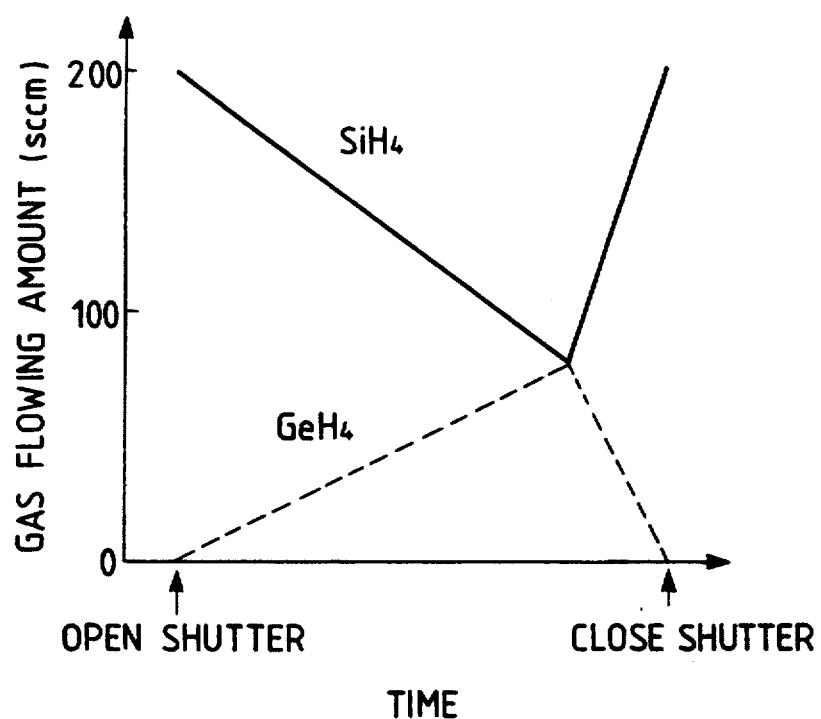
FIGS. 23A and 23B are graphical representations showing the patterns of the flow rates of $SiH_4$ and $GeH_4$ gases varying with time.
Figure 23B:
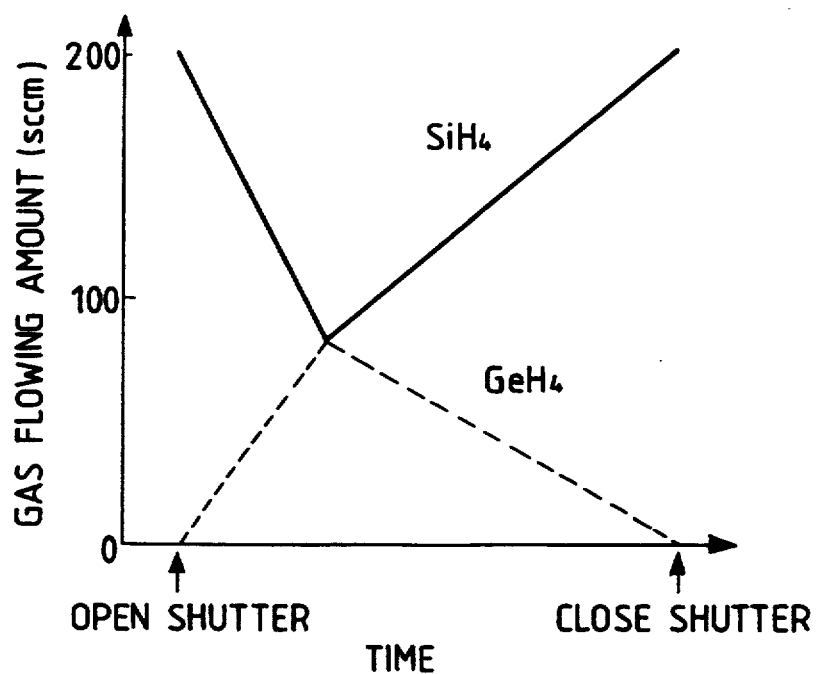

Then, a photovoltaic element was fabricated (Element No. Comparative Example 7-5) by forming a reflecting layer, a reflection multiplying layer, an n-type layer, an i-type layer, a p-type layer, a transparent electrode, and a collector electrode on the substrate under the same conditions as those of Element No. Example 21-5, except that $SiH_4$ gas flow and $GeH_4$ gas flow were regulated by the mass flow controllers 1021, 1026 in accordance with the flow patterns as shown in FIG. 23B during deposition of the i-type layer by microwave plasma CVD.

For the fabricated photovoltaic element, the initial characteristics, the low illuminance characteristic, and the durability characteristic were measured in the same manner as in Example 1. The results indicated that the open-circuit voltage and the fill factor in the initial characteristics, the photoelectric conversion efficiency in the low illuminance characteristic and the decrease in the photoelectric conversion efficiency (the durability characteristic) in Element No. Example 21-5 were 1.03 times, 1.02 times, 1.08 times and 1.07 times better, respectively, than those in Element No. Comparative Example 7-5.

Also, the variation in the bandgap in the direction of layer thickness of the i-type layer was examined, whereby it was found that the photovoltaic element in Element No. Example 21-5 has the minimum value of bandgap at a position shifted toward the interface between the p-type layer and the i-type layer, away from the central position of the i-type layer, while the photovoltaic element in Element No. Comparative Example 7-5 has the minimum value of bandgap at a position shifted toward the interface between the n-type layer and the i-type layer, away from the central position of the i-type layer.

Then, photovoltaic elements were fabricated (Element No. Examples 21-15 to 21-19 and Comparative Example 7-6) by forming a reflecting layer, a reflection multiplying layer, an n-type layer, an i-type layer, a p-type layer, a transparent electrode, and a collector electrode on the substrate under the same conditions as those of the photovoltaic element of Element No. Example 21-5, except that $SiH_4$ gas flow and RF discharge electric power were as indicated in Table 19 during formation of the i-type layer by RF plasma CVD.

For the fabricated photovoltaic elements, the initial characteristics, the low illuminance characteristic, and the durability characteristic were measured in the same manner as in Element No. Example 21-5. The results are listed in Table 19. As seen in Table 19, a photovoltaic element having better characteristics can be obtained by depositing the i-type layer formed by RF plasma CVD at a deposition rate of 2 nm/sec or less.

Then, photovoltaic elements were fabricated (Element No. Examples 21-20 to 21-22 and Comparative Examples 7-7 to 7-8) by forming a reflecting layer, a reflection multiplying layer, an n-type layer, an i-type layer, a p-type layer, a transparent electrode, and a collector electrode on the substrate under the same conditions as those of Element No. Example 21-5, except that the thickness of the i-type layer formed by RF plasma CVD was as indicated in Table 20.

For the fabricated photovoltaic elements, the initial characteristics, the low illuminance characteristic, and the durability characteristic were measured in the same manner as in Element No. Example 21-5. The results are listed in Table 20. As will be seen from Table 20, a photovoltaic element having better characteristics can be obtained by making the thickness of the i-type layer formed by RF plasma CVD to be 30 nm or less (Element No. Examples 21-20 to 21-22).

Then, photovoltaic elements were fabricated (Element No. Examples 21-23 to 21-26) by forming a reflecting layer, a reflection multiplying layer, an n-type layer, an i-type layer a p-type layer, a transparent electrode, and a collector electrode on the substrate under the same conditions as those of the photovoltaic element of Element No. Example 21-5, except that the RF electric power was as indicated in Table 21 during formation of the i-type layer by RF plasma CVD.

For the thus fabricated photovoltaic elements, the initial characteristics, the low illuminance characteristic, and the durability characteristic were measured in the same manner as in Element No. Example 21-5. The results are listed in Table 21. As will be seen from Table 21, a photovoltaic element having better characteristics can be obtained when the value of the half width of a peak at $2000\ cm^{-1}$ in the infrared absorption spectrum divided by the peak height is greater in the i-type layer formed by microwave plasma CVD than in the i-type layer formed by RF plasma CVD.

Then, a photovoltaic element was fabricated (Element No. Example 21-27) by forming a reflecting layer, a reflection multiplying layer, an n-type layer, an i-type layer, a p-type layer, a transparent electrode, and a collector electrode on the substrate under the same conditions as Element No. Example 21-5, except that doping layer A was not formed in making the p-type layer.

For the thus fabricated photovoltaic element, the initial characteristics, the low illuminance characteristic, and the durability characteristic were measured in the same manner as in Example 1. The results indicated that the open-circuit voltage and the fill factor of the initial characteristics, the photoelectric conversion efficiency of the low illuminance characteristics and the decrease in the photoelectric conversion efficiency (the durability characteristic) in Element No. Example 21-5 were 1.02 times, 1.03 times, 1.07 times and 1.08 times better, respectively, than those in Element No. Example 21-27.

From the above results, it is seen that the photovoltaic elements (Element No. Examples 21-1 to 21-26) of the present invention exhibit better characteristics than conventional photovoltaic elements. The photovoltaic elements of the present invention have been fabricated such that an i-type layer formed by microwave plasma CVD is deposited at an internal pressure of 50 mTorr or less by applying a lower microwave energy and a higher RF energy than the microwave energy necessary to decompose 100% of the source gas, and an i-type layer formed by RF plasma CVD is deposited to a thickness of 30 nm or less on the p-type layer at a deposition rate of 2 nm/sec. The bandgap smoothly changes in the direction of layer thickness, and the minimum value of bandgap is at a position shifted toward the interface between the p-type layer and the i-type layer, away from the central position of the i-type layer. The p-type layer and/or the n-type layer has a laminated structure comprising a layer composed of a Group III and/or a Group V element as the main constituent, and a layer containing a valence electron control agent and silicon atoms as the main constituent. Thus, the effects of the present invention have been evidenced.

Example 22

Photovoltaic elements (Element No. Examples 22-1 to 22-8) were fabricated to form a reflecting layer, a reflection multiplying layer, an n-type layer, an i-type layer, a p-type layer, a transparent electrode, and a collector electrode on the substrate under the same conditions as those of Element No. Example 21-5 in Example 21, except that the $SiH_4$ gas flow and $GeH_4$ gas flow were regulated by mass flow controllers 1021, 1026 in accordance with the flow patterns as shown in FIG. 23A, and as conducted in Example 21. The SiH$_4$ gas flow was maintained at 200 sccm and the GeH$_4$ gas flow at 1 sccm, and the region of the maximum bandgap has a layer thickness as indicated in Table 22 during formation of the i-type layer by microwave plasma CVD.

For the fabricated photovoltaic elements, the initial characteristics, the low illuminance characteristic, and the durability characteristic were measured in the same manner as in Example 21. The results are listed in Table 22. As will be seen from Table 22, the photovoltaic elements (Element Nos. Examples 22-1 to 22-7) having a layer thickness of 1 to 30 nm in the region of the maximum bandgap exhibit better characteristics, whereby the effects of the present invention are demonstrated.

Example 23

A photovoltaic element (Element No. Example 23) was fabricated by forming a reflecting layer, a transparent conductive layer, an n-type layer, an i-type layer, a p-type layer, a transparent electrode, and a collector electrode on the substrate under the same conditions as those of Element No. Example 21-5 in Example 1, except that the BF$_3$ (2000 pm)/H$_2$ gas flow and PH$_3$ (2000 ppm)/H$_2$ gas flow were 0.4 sccm and 0.02 sccm, using cylinder 1077 and cylinder 1078, respectively, during deposition of the i-type layer by RF plasma CVD.

For the fabricated photovoltaic element, the initial characteristics, the low illuminance characteristic, and the durability characteristic were measured in the same manner as in the Example 21, and the results were equivalent to those of Element No. Example 21-5.

Example 24

A photovoltaic element (Element No. Example 24) was fabricated by forming a reflecting layer, a transparent conductive layer, an n-type layer, an i-type layer, a p-type layer, a transparent electrode, and a collector electrode on the substrate under the same conditions as those of the element in Example 23, except for using a cylinder of AsH$_3$/H$_2$ gas instead of PH$_3$(2000 ppm)/H$_2$ gas at a flow rate of 0.01 sccm during deposition of the i-type layer by RF plasma CVD.

For the fabricated photovoltaic element, the initial characteristics, the low illuminance characteristic, and the durability characteristic were measured in the same manner as in Example 23, and the results were equivalent to those of Element No. Example 23.

Example 25

A photovoltaic element (Element No. Example 25) was fabricated by forming a reflecting layer, a reflection multiplying layer, an n-type layer, an i-type layer, a p-type layer, a transparent electrode, and a collector electrode on the substrate under the same conditions as Element No. Example 21-5, except for using a cylinder of NO/He gas 1079 at a flow rate of 0.5 sccm for the i-type layer formed by microwave plasma CVD and at 0.05 sccm for the i-type layer formed by RF plasma CVD.

For the fabricated photovoltaic element, the initial characteristics, the low illuminance characteristic and the durability characteristic were measured in the same manner as in Example 21, and the results were equivalent to those of Element No. Example 21-5.

Also, composition analysis of the photovoltaic element in Example 25 was performed using a secondary ion mass spectrometer, and it was confirmed that oxygen atoms and nitrogen atoms were contained in the i-type layer.

The effects of the present invention thus have been demonstrated from the above results.

Example 26

A photovoltaic element (Element No. Example 26) was fabricated by forming a reflecting layer, a reflection multiplying layer, an n-type layer, an i-type layer, a p-type layer, a transparent electrode, and a collector electrode on the substrate under the same conditions as those of Element No. Example 21-5, except for using a cylinder of Si$_2$H$_6$ gas at a flow rate of 40 sccm, regulated by a mass flow controller 1021 in accordance with a flow pattern as shown in FIG. 25A, during deposition of the i-type layer by microwave plasma CVD.

For the fabricated photovoltaic element, the initial characteristics, the low illuminance characteristic, and the durability characteristic were measured in the same manner as in Example 21, and the results were equivalent to those of Element No. Example 21-5.

Also, the distribution in the layer thickness direction of Si and hydrogen atoms in the i-type layer of the photovoltaic element was analyzed using a secondary ion mass spectrometer, resulting in the same tendency as in FIG. 25B. From the above results, the effects of the present invention have been demonstrated.

Example 27

Photovoltaic elements (Element No. Examples 27-1 to 27-5) were fabricated by forming a reflecting layer, a reflection multiplying layer, an n-type layer, an i-type layer, a p-type layer, a transparent electrode, and a collector electrode on a substrate under the same conditions as Element No. Example 21-5, except that the distance between the mixing point of SiH$_4$ gas and GeH$_4$ gas and the deposition chamber 1001 in the source gas supply unit 1020 was set as indicated in Table 23.

For the photovoltaic elements thus fabricated, the initial characteristics, the low illuminance characteristic, and the durability characteristic were measured in the same manner as in Example 21. The results are listed in Table 23. As will be seen from Table 17, by making the distance between the mixing point of SiH$_4$ gas and GeH$_4$ gas and the deposition chamber 1001 5 m or less, a photovoltaic element having further improved characteristics can be obtained.

Example 28

A photovoltaic element was fabricated under the same conditions as Element No. Example 21-5, and using this photovoltaic element, a solar cell module was fabricated and used as a power source for an analog clock with a circuit configuration as shown in FIG. 28.

Comparative Example 8

As a comparative example, a photovoltaic element was fabricated under the same conditions as Element No. Comparative Example 7-7. Using this photovoltaic element, the same analog clock as in Example 28 was made.

The analog clocks as fabricated in Example 28 and Comparative Example 8 were installed on the wall of a room, and an indoor lamp was lit for 8.5 hours a day. As a result, the analog clock of Example 28 worked the entire day, but the analog clock of the comparative example did not work the entire day, whereby the effects of the power generation system of the present invention were evidenced.

Example 29

A photovoltaic element (Element No. Example 29) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except that the flow rates of SiH$_4$ gas and GeH$_4$ gas were regulated by mass flow controllers 1021, 1026 in accordance with the flow pattern shown in FIG. 26 during formation of the i-type layer by microwave plasma CVD.

For the fabricated photovoltaic element, the initial characteristics, the low illuminance characteristic, and the durability characteristic were measured in the same manner as in Example 21, and the results were equivalent to those of Element No. Example 21-5, whereby the effects of the present invention were demonstrated.

Example 30

A photovoltaic element (Element No. Example 30) was fabricated by forming a reflecting layer, a transparent conductive layer, an n-type layer, an i-type layer, a p-type layer, a transparent electrode, and a collector electrode on the substrate under the same conditions as Element No. Example 21-5, except for using a cylinder of B$_2$H$_6$(2000 ppm)/H$_2$ gas at a flow rate of 0.5 sccm during formation of the i-type layer by RF plasma CVD.

For the fabricated photovoltaic element, the initial characteristics, the low illuminance characteristic, and the durability characteristic were measured in the same manner as in Example 21, and the results were equivalent to Element No. Example 21-5, whereby the effects of the present invention were demonstrated.

Example 31

A photovoltaic element (Element No. Example 31) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except that the flow rate of NO/He gas was regulated by a mass flow controller 1029 in accordance with the flow pattern shown in FIG. 33A, during formation of the i-type layer by microwave plasma CVD.

For the fabricated photovoltaic element, the initial characteristics, the low illuminance characteristic, and the durability characteristic were measured in the same manner as in Example 21, and the results were equivalent to those of Element No. Example 21-5.

Also, the distribution in the layer thickness direction of N atoms and O atoms in the i-type layer of the photovoltaic element was analyzed using a secondary ion mass spectrometer, resulting in the same tendency as indicated in FIG. 33B. From the above results, the effects of the present invention were demonstrated.

Example 32

A photovoltaic element (Element No. Example 32) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except that the flow rates of SiH$_4$ gas and GeH$_4$ gas were regulated by mass flow controllers 1021, 1026 in accordance with the flow patterns as shown in FIG. 34, during formation of the i-type layer by microwave plasma CVD.

For the photovoltaic element thus fabricated, the initial characteristics, the low illuminance characteristic and the durability characteristic were measured in the same manner as in the Example 21, and the results were equivalent to those of Element No. Example 21-5, whereby the effects of the present invention were evidenced.

Example 33

Photovoltaic elements (Element No. Examples 33-1 to 33-5) were fabricated by forming a reflecting layer, a reflection multiplying layer, an n-type layer, an i-type layer, a p-type layer, a transparent electrode, and a collector electrode on substrates under the same conditions as Element No. Example 21-5, except that the layer thickness of doping layer A was as indicated in Table 24, during formation of the p-type layer.

For the photovoltaic elements thus fabricated, the initial characteristics, the low illuminance characteristic, and the durability characteristic were measured in the same manner as in Example 21. The results are listed in Table 24. As will be seen from Table 24, the photovoltaic elements (Element No. Examples 33-1 to 33-4) having a layer thickness of the doping layer of 0.01 to 1 nm exhibit improved characteristics, whereby the effects of the present invention are demonstrated.

Example 34

A photovoltaic element (Element No. Example 34) was fabricated by forming a reflecting layer, a reflection multiplying layer, an n-type layer, an i-type layer, a p-type layer, a transparent electrode, and a collector electrode on a substrate under the same conditions as Element No. Example 21-5, except that doping layer A and doping layer B were formed under the conditions of Table 25, during formation of the n-type layer.

For the fabricated photovoltaic element, the initial characteristics, the low illuminance characteristic, and the durability characteristic were measured in the same manner as in Example 21, and the results were equivalent to those of Element No. Example 21-5 whereby the effects of the present invention were demonstrated.

Example 35

A photovoltaic element (Element No. Example 35) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except that doping layer A and doping layer B were formed under the conditions indicated in Table 26, during formation of the p-type layer.

For the fabricated photovoltaic element, the initial characteristics, the low illuminance characteristic and the durability characteristic were measured in the same manner as in Example 21, and the results were equivalent to Element No. Example 21-5, whereby the effects of the present invention were evidenced.

Example 36

A photovoltaic element (Element No. Example 36) was fabricated by forming a reflecting layer, a reflection multiplying layer, an n-type layer, an i-type layer, a p-type layer, a transparent electrode, and a collector electrode on a substrate under the same conditions as those of Example 29, except that the power output of the bias power source 1011 was set at 250 mW/cm$^3$, and the DC bias was set via a coil at 50 V for application to the bias rod 1012 during formation of the i-type layer by microwave plasma CVD.

For the photovoltaic element thus fabricated, the initial characteristics, the low illuminance characteristic, and the durability characteristic were measured in the same manner as in Example 29, and the results were equivalent to those of Example 29, whereby the effects of the present invention were evidenced.

Example 37

A photovoltaic element (Element No. Example 37) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except for using a cylinder of $D_2$ gas (not shown) instead of a $H_2$ gas at a flow rate of 300 sccm during formation of the i-type layer by microwave plasma CVD.

For the fabricated photovoltaic element, the initial characteristics, the low illuminance characteristic, and the durability characteristic were measured in the same manner as in Example 21, and the results were equivalent to those of Element No. Example 21-5.

Also, composition analysis of the photovoltaic element was performed using a secondary ion mass spectrometer, and it was confirmed that D atoms were contained in the i-type layer, whereby the effects of the present invention were evidenced.

Example 38

A photovoltaic element (Element No. Example 38) was fabricated by forming a reflecting layer, a reflection multiplying layer, an n-type layer, an i-type layer, a p-type layer, a transparent electrode, and a collector electrode on a substrate under the same conditions as those of Element No. Example 21-5, except that the DC bias of bias power source 1011 was changed at a constant rate from 50 V to 80 V when the shutter 1013 was opened during formation of the n-type layer.

For the fabricated photovoltaic element, the initial characteristics, the low illuminance characteristic, and the durability characteristic were measured in the same manner as in Example 21, and the results were equivalent to Element No. Example 21-5, whereby the effects of the present invention were evidenced.

Example 39

A photovoltaic element was fabricated under the same conditions as those of Element No. Example 21-5, except for forming the n-type layer and the p-type layer using a deposition apparatus employing the RF plasma CVD method as shown in FIG. 19.

To make the n-type layer, the substrate 1104 was heated to 350° C. by the heater 1105, the outflow valves 1042, 1044, 1045 and the auxiliary valve 1108 were gradually opened to flow $H_2$ gas, $PH_3(1\%)/H_2$ gas and $Si_2H_6$ gas through the gas introducing pipe 1103 into the deposition chamber 1101. The inflow rates of the gases were regulated by mass flow controllers 1022, 1024, 1025 so that the $H_2$ gas flow, the $PH_3(1\%)/H_2$ gas flow, and the $Si_2H_6$ gas flow were 50 sccm, 5 sccm, and 3 sccm. The pressure within the deposition chamber 1101 was set to 1 Torr by adjusting the opening of conductance valve 1107 while referring to the vacuum gauge 1106.

Thereafter, the output power of RF power source 1111 was set at 120 mW/cm$^2$ and it was introduced through the RF matching box 1112 to the cathode 1102 to excite an RF glow discharge to start the formation of the n-type layer on the substrate 1104. Upon forming an n-type layer having a thickness of 10 nm, the RF flow discharge was stopped, and the outflow valves 1042, 1044, 1045 and the auxiliary valve 1108 were closed to stop the gas inflow into the deposition chamber 1101, whereby the formation of the n-type layer was completed.

Then, the substrate 1004 having the n-type layer formed thereon was taken out from the deposition chamber 1101, and installed in the microwave plasma CVD deposition apparatus 1000 as with Element No. Example 21-5, where an i-type layer formed by microwave plasma CVD was deposited on the n-type layer under the same conditions as those of Element No. Example 21-5.

Then, the substrate 1004 having the i-type layer formed thereon was taken out from the deposition chamber 1000, and installed in the RF plasma CVD deposition apparatus 1100 as previously described, where an i-type layer formed by RF plasma CVD was deposited on the i-type layer formed by microwave plasma CVD under the same conditions as those of Element No. Example 21-5.

Subsequently, a p-type layer having a doping layer A and a doping layer B laminated together was formed on the i-type layer formed by RF plasma CVD.

To form doping layer B1, the substrate 1104 was heated to 200° C. by the heater 1105, the outflow valves 1041, 1042, 1047 and the auxiliary valve 1108 were gradually opened to flow $SiH_4$ gas, $H_2$ gas, and $BF_3(2000$ ppm$)/H_2$ gas through the gas introducing tube 1103 into the deposition chamber 1101. The inflow rates of these gases were regulated by mass flow controllers 1021, 1022, 1027 so that the $SiH_4$ gas flow, $H_2$ gas flow, and $BF_3(2000$ ppm$)/H_2$ gas flow were 0.03 sccm, 100 sccm, and 1 sccm. The pressure within the deposition chamber 1101 was set to 1 Torr by adjusting the conductance valve 1107 while referring to the vacuum gauge 1106.

Thereafter, the output power of RF power source 1111 was set at 2 W/cm$^2$, and RF electric power was introduced through the RF matching box 1112 to the cathode 1102 to excite an RF glow discharge to start the formation of doping layer B1 on the i-type layer by RF plasma CVD. Upon depositing doping layer B1 having a thickness of 0.3 nm, the RF glow discharge was stopped, and the outflow valves 1041, 1042, 1047 and the auxiliary valve 1108 were closed to stop the gas inflow into the deposition chamber 1101.

Then, to form doping layer A, the substrate 1104 was heated to 200° C. by the heater 1105, and the outflow valve 1043 and the auxiliary valve 1108 were gradually opened to flow $B_2H_6(10\%)/H_2$ gas through the gas introducing tube 1103 into the deposition chamber 1101. The inflow rate of the gas was regulated by a mass flow controller 1023 so that the $B_2H_6(10\%)/H_2$ gas flow was 50 sccm. The pressure within the deposition chamber 1101 was set to 1 Torr by adjusting the conductance valve 1107 while referring to the vacuum gauge 1106.

Thereafter, the output power of RF power source 1111 was set at 3 W/cm$^2$, and RF electric power was introduced through the RF matching box 1112 into the cathode 1102 to excite an RF glow discharge to start the formation of doping layer A on doping layer B1. Upon forming doping layer A having a thickness of 0.1 nm, the RF glow discharge was stopped, and the outflow valve 1048 and the auxiliary valve 1108 were closed to stop the gas inflow into the deposition chamber 1101.

Next, doping layer B2 was formed on doping layer A under the same conditions as doping layer B1, except that the SiH$_4$ gas flow and the BF$_3$/H$_2$ gas flow were 0.5 sccm and 10 sccm and the layer thickness was 5 nm.

Next, a transparent electrode and a collector electrode were vapor deposited on the p-type layer, whereby a photovoltaic element (Cell No. Example 39) was fabricated. The fabrication conditions for the photovoltaic element as described above are listed in Table 27.

Comparative Example 9

A photovoltaic element (Element No. Comparative Example 9) was fabricated by forming a reflecting layer, a reflection multiplying layer, an n-type layer, an i-type layer, a p-type layer, a transparent electrode, and a collector electrode on a substrate under the same conditions as those of Example 39, except that the i-type layer formed by RF plasma CVD was not deposited.

For the photovoltaic elements thus fabricated (Element No. Example 39 and Comparative Example 9), the initial characteristics, the low illuminance characteristic, and the durability characteristic were measured in the same manner as in Example 21. From the measurements, it was determined that the photovoltaic element of Element No. Example 39 was superior to Comparative Example 9, in that the open-circuit voltage and the fill factor of the initial characteristics, the photoelectric conversion efficiency of the low illuminance characteristic, and the decrease in the photoelectric conversion efficiency (the durability characteristic) were 1.03 times, 1.04 times, 1.09 times, and 1.07 times better, respectively, whereby the effects of the present invention were demonstrated.

Example 40

A photovoltaic element (Element No. Example 40) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the same conditions as listed in Table 28, with the same method as in Example 21.

Comparative Example 10

A photovoltaic element (Element No. Comparative Example 10) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the same conditions as in Example 40, except that the first i-type layer formed by RF plasma CVD was not deposited.

For the photovoltaic elements thus fabricated (Element No. Example 40 and Comparative Example 10), the initial characteristics, the low illuminance characteristic, and the durability characteristic were measured in the same manner as in Example 21. From the measurements, it was determined that the photovoltaic element of Element No. Example 40 was superior to Comparative Example 10, in that the open-circuit voltage and the fill factor of the initial characteristics, the photoelectric conversion efficiency of the low illuminance characteristic, and the decrease in the photoelectric conversion efficiency (the durability characteristic) were 1.03 times, 1.03 times, 1.07 times, and 1.06 times better, respectively, whereby the effects of the present invention were demonstrated.

Example 41

A photovoltaic element (Element No. Example 41) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as listed in Table 29, with the same method as in Example 21.

Comparative Example 11

A photovoltaic element was fabricated (Element No. Comparative Example 11) by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as in Example 41, except that the first and second RF plasma CVD i-type layers were not formed.

For the photovoltaic elements thus fabricated (Element No. Example 41 and Comparative Example 11), the initial characteristics, the low illuminance characteristic, and the durability characteristic were measured in the same manner as in Example 21. From the measurements, it was determined that the photovoltaic element of Element No. Example 41 was superior to Comparative Example 11, in that the open-circuit voltage and the fill factor of the initial characteristics, the photoelectric conversion efficiency of the low illuminance characteristic, and the decrease in the photoelectric conversion efficiency (the durability characteristic) were 1.03 times, 1.03 times, 1.08 times and 1.07 times better, respectively, whereby the effects of the present invention were demonstrated.

Example 42

Using a multiple chamber separation-type deposition apparatus as shown in FIG. 21, a photovoltaic element of the present invention was fabricated. In the figure, 1301 and 1311 are a load chamber and an unload chamber, respectively, 1302, 1304 to 1308 and 1310 are deposition chambers for the layers formed by RF plasma CVD as in Example 39, 1303 and 1309 are deposition chambers for the layers formed by microwave plasma CVD as in Example 21, 1321 to 1330 are gate valves for separating one chamber from the other, 1341, 1343 to 1347 and 1349 are cathode electrodes, and 1342 and 1348 are a waveguide portion for microwaves and a dielectric window, respectively.

First, the substrate was installed in the load chamber 1301, and the load chamber 1301 was evacuated. Thereafter, gate valve 1321 was opened, the substrate was moved to first n-type layer deposition chamber 1302, and the gate valve 1321 was closed. Next, the first n-type layer was formed on the substrate under the same conditions as those of the first n-type layer of Example 40. Then gate valve 1322 was opened, the substrate was moved to first i-type layer microwave plasma CVD deposition chamber 1303 and the gate valve 1322 was closed. Next a first i-type layer formed by microwave plasma CVD was deposited on the first n-type layer under the same conditions as those of the first i-type layer formed by microwave plasma CVD of Example 40. Next, gate valve 1323 was opened, the substrate was moved to first i-type layer RF plasma CVD deposition chamber 1304, and the gate valve 1323 was closed. Next, a first i-type layer formed by RF plasma CVD was deposited on the first n-type layer under the same conditions as those of the first i-type layer formed by RF plasma CVD of Example 40.

Gate valve 1324 was then opened, the substrate was moved to first p-type layer/doping layer B1 deposition chamber 1305, and the gate valve 1324 was closed. Next, a first p-type layer/doping layer B1 was formed on the first i-type layer formed by RF plasma CVD under the same conditions as those of the first p-type layer/doping layer B1 of Example 40. Then gate valve 1325 was opened, the substrate was moved to first p-type layer/doping layer A deposition chamber 1306, and the gate valve 1325 was closed. Next a first p-type layer/doping layer A was formed on the first p-type layer/doping layer B1 under the same conditions as those of the first p-type layer/doping layer A of Example 40. Next, gate valve 1326 was opened, the substrate was moved to first p-type layer/doping layer B2 deposition chamber 1307, and the gate valve 1326 was closed. Next, first p-type layer/doping layer B2 was formed on the first p-type layer/doping layer A under the same conditions as those of the first p-type layer/doping layer B2 of Example 40. Next, gate valve 1327 was opened, the substrate was moved to second n-type layer deposition chamber 1308, and the gate valve 1327 was closed. Next, a second n-type layer was formed on the first p-type layer/doping layer B2 under the same conditions as those of the second n-type layer of Example 40. Then, gate valve 1328 was opened, the substrate was moved to the second i-type layer deposition chamber 1309, and the gate valve 1328 was closed. Next, a second i-type layer was formed on the second n-type layer under the same conditions as those of the second i-type layer of Example 40. Then, gate valve 1329 was opened, the substrate was moved to the second p-type layer deposition chamber 1310, and the gate valve 1329 was closed. Next, a second p-type layer was made on the second i-type layer under the same conditions as the second p-type layer of Example 40. The, gate valve 1330 was opened, the substrate was moved to unload chamber 1311, and gate valve 1330 was closed. Then, the substrate was taken out from unload chamber 1311, whereby the fabrication of a photovoltaic element was completed (Element No. Example 42).

For the photovoltaic element thus fabricated, the initial characteristics, the low illuminance characteristic, and the durability characteristic were measured in the same manner as in Example 21. From the measurements, it was found that the photovoltaic element of Element No. Example 42 was superior to that of Element No. Example 40, in the open-circuit voltage and the fill factor of the initial characteristics, the photoelectric conversion efficiency of the low illuminance characteristic, and the decrease in the photoelectric conversion efficiency (the durability characteristic) were 1.01 times, 1.02 times, 1.02 times and 1.02 times better, respectively, whereby it was shown that a photovoltaic element of the prevent invention can exhibit better characteristics by fabricating it in the multiple chamber separation-type deposition chamber. Thus, the effects of the present invention were evidenced.

Example 43

A photovoltaic element was fabricated under the same conditions as those of Example 40, whereby a solar cell module was formed using the photovoltaic element, and a car-mounted ventilation fan having a circuit configuration as shown in FIG. 28 was fabricated.

Comparative Example 11

As a comparative example, a photovoltaic element was fabricated under the same conditions as those of Comparative Example 10, and a car-mounted ventilation fan similar to that of Example 41 was made using the photovoltaic element, A car which has mounted thereon the car-mounted ventilation fans as fabricated in Example 41 and Comparative Example 11 was left in an idling state with the engine running for 168 hours, and then left in sunny weather with the ventilation fan working and with the engine stopped, whereafter the temperature within the car was measured. As a result, the car-mounted cooling fan of Example 43 achieved an interior temperature three degrees lower than the car-mounted cooling fan of the comparative example, whereby the effects of the power generation system of the present invention were demonstrated.

Example 44

Using a microwave plasma CVD manufacturing apparatus comprising a source gas supply unit 1020 and a deposition unit 1000 as shown in FIG. 18 and an RF plasma manufacturing CVD manufacturing apparatus comprising a source gas supply unit 1020 and a deposition unit 1100 as shown in FIG. 19, a photovoltaic element of the present invention was fabricated. In this example, B and P atoms were doped into the i-type layer formed by microwave plasma CVD.

On a substrate, a reflecting layer, a reflection multiplying layer, and an n-type layer were formed under the same conditions as those of Element No. Example 1-5 of Example 1, and subsequently, the formation of i-type layers by microwave plasma CVD and RF plasma CVD was performed in the following manner.

To form an i-type layer by microwave plasma CVD, the substrate 1004 was heated to 350° C. by the heater 1005, the outflow valves 1041, 1042, 1046 to 1048 and the auxiliary valve 1008 were gradually opened to flow $SiH_4$ gas, $H_2$ gas, $GeH_4$ gas, $BF_3$(2000 ppm)/$H_2$ gas, and $PH_3$(2000 ppm)/$H_2$ gas through a gas introducing pipe 1003 into the deposition chamber. The inflow rates of the gases were regulated by mass flow controllers 1021, 1022, 1026 to 1028 so that the $SiH_4$ gas flow, $H_2$ gas flow, $GeH_4$ gas flow, $BF_3$(2000 ppm)/$H_2$ gas flow, and $PH_3$(2000 ppm)/$H_2$ gas flow were 200 sccm, 500 sccm, 1 sccm, 0.2 sccm, and 0.1 sccm. The pressure within the deposition chamber 1001 was set as indicated in Table 30 by adjusting the opening of conductance valve 1007 while referring to the vacuum gauge 1006.

Thereafter, shutter 1013 was closed, the output power of a microwave power source (not shown) was set at 170 mW/cm$^3$, and the microwaves were introduced through a waveguide (not shown), the waveguide portion 1010, and the dielectric window 1002 into the deposition chamber 1001 to excite a microwave glow discharge. Then, the RF bias of bias power source 1011 was set at 350 mW/cm$^3$, and the DC bias was set via a coil at 0 V, and applied to the bias rod 1012. Thereafter, the shutter 1013 was opened to start fabrication of an i-type layer by microwave plasma CVD on the n-type layer, while at the same time regulating the SiH$_4$ gas flow in accordance with the flow patterns as indicated in FIG. 23A, by means of the mass flow controllers 1021, 1026. Upon forming the i-type layer having a layer thickness of 300 nm, the shutter 1013 was closed, the output of bias power source 1011 was turned off, the microwave glow discharge was stopped, and the outflow valves 1041, 1042, 1046 and the auxiliary valve 1008 were closed to stop the gas inflow into the deposition chamber 1001.

Then, the substrate 1004 was taken out from the deposition chamber 1001, and installed in the deposition chamber 1101 of the RF plasma CVD deposition unit 1100 as shown in FIG. 19, where an i-type layer formed by RF plasma CVD was deposited.

To deposit an i-type layer by RF plasma CVD, the substrate 1104 was heated to 300° C. by the heater 1105, the outflow valves 1041, 1042, 1047, 1048 and the auxiliary valve 1008 were gradually opened to flow SiH$_4$ gas, H$_2$ gas, BF$_3$(2000 ppm)/H$_2$ gas, and PH$_3$(2000 ppm)/H$_2$ gas through the gas introducing tube 1003 into the deposition chamber 1101. The inflow rates of the gases were regulated by mass flow controllers 1021, 1022, 1027, 1028 so that the SiH$_4$ gas flow, H$_2$ gas flow, BF$_3$(2000 ppm)/H$_2$ gas flow, and PH$_3$(2000 ppm)/H$_2$ gas flow were 8 sccm, 100 sccm, 0.4 sccm, and 0.02 sccm. The pressure within the deposition chamber 1101 was set to 0.5 Torr by adjusting the opening of conductance valve 1007 while referring to the vacuum gauge 1006.

Thereafter, the output power of an RF power source 1111 was set at 120 mW/cm$^3$, and the RF electric power was introduced through the RF matching box 1112 into the cathode 1102 to excite an RF glow discharge to start fabrication of an i-type layer by RF plasma CVD on the i-type layer formed by microwave plasma CVD. Upon making the i-type layer 10 nm thick, the RF glow discharge was stopped, and outflow valves 1041, 1042 and auxiliary valve 1008 were closed to stop the gas inflow into the deposition chamber 1101, whereby the formation of the i-type layer was completed.

Then, the substrate 1004 was taken out from the deposition chamber 1101, and installed in the deposition chamber 1001 microwave plasma CVD deposition unit 1000 as shown in FIG. 18, where a p-type layer was formed under the same conditions as in Example 1.

Further, on the p-type layer, a 70 μm-thick ITO (In$_2$O$_3$+SnO$_2$) thin film as the transparent electrode and a 2 μm-thick aluminum (Al) thin film as the collector electrode were vapor deposited in vacuum to fabricate a photovoltaic element (Element No. Examples 44-1 to 44-7, Comparative Example 12-1).

The initial characteristics, low illuminance characteristic, and durability characteristic were measured for the thus fabricated photovoltaic elements. The results are listed in Table 30. As will be seen from Table 30, a photovoltaic element having excellent characteristics can be fabricated by making the i-type layer by microwave plasma CVD under a pressure in the deposition chamber 1001 of 50 mTorr or less.

Next, using a substrate of barium borosilicate glass (7059 manufactured by Corning), an i-type layer formed by microwave plasma CVD was deposited on the substrate by opening the shutter 1013 for two minutes under the same fabrication conditions as the i-type layer formed by microwave plasma CVD in Element No. Example 44-5, except that SiH$_4$ gas flow and GeH$_4$ gas flow and the microwave power were as indicated in Table 3, whereby the decomposition efficiency of the source gas was obtained in accordance with the layer thickness, and the same results of Table 3 were attained.

Then, photovoltaic elements (Element No. Examples 44-8 to 44-10 and Comparative Examples 12-2 to 12-3) were fabricated by forming a reflecting layer, a reflection multiplying layer, an n-type layer, an i-type layer, a p-type layer, a transparent electrode, and a collector electrode on a substrate under the same conditions as those of the photovoltaic element in Element No. Example 44-5, except that the microwave power was as indicated in Table 31 during formation of the i-type layer by microwave plasma CVD.

For the fabricated photovoltaic elements, the initial characteristic, and the durability characteristic were measured as in Element No. Example 44-5. The results are listed in Table 31. As will be seen from Table 31, a photovoltaic element having excellent characteristics can be obtained by decomposing the source gas with a lower microwave energy than the microwave energy necessary to decompose 100% of the source gas.

Then, photovoltaic elements (Elements No. Examples 44-11 to 44-14 and Comparative Example 12-4) were fabricated by forming a reflecting layer, a reflection multiplying layer, an n-type layer, an i-type layer, a p-type layer, a transparent electrode, and a collector electrode on a substrate under the same conditions as in Element No. Example 44-5, except that the RF bias was as indicated in Table 32 during formation of the i-type layer by microwave plasma CVD.

For the fabricated photovoltaic elements, the initial characteristics, the low illuminance characteristic, and the durability characteristic were measured in the same manner as in Element No. Example 44-5. The results are listed in Table 32. As is seen from Table 32, a photovoltaic element having excellent characteristics can be obtained by applying a higher RF energy to the source gas than the microwave energy.

Next, using a stainless substrate and a barium borosilicate glass (7059 manufactured by Corning) substrate, an i-type layer 1 μm thick was formed on a substrate under the same conditions as the i-type layer formed by microwave plasma CVD in Element No. Example 44-5, except that the SiH$_4$ gas flow and GeH$_4$ gas flow were as indicated in Table 6, whereby a sample for the measurement of material properties was fabricated. Further, using a barium borosilicate glass (7059 manufactured by Corning) substrate, an i-type layer 1 μm thick was formed on a substrate under the same conditions as the i-type layer formed by RF plasma CVD in Element No. Example 44-5, whereby a sample for the measurement of material properties was fabricated.

The bandgap and the composition of the fabricated sample for the measurement of material properties were determined to obtain the relation between the composition ratio of Si to Ge atoms and the bandgap, and the same results as in Table 6 were obtained.

Then, a photovoltaic element was fabricated (Element No. Comparative Example 12-5) by forming a reflecting layer, a reflection multiplying layer, an n-type layer, an i-type layer, a p-type layer, a transparent electrode, and a collector electrode on a substrate under the same conditions as those of the photovoltaic element in Element No. Example 44-5, except that the SiH$_4$ gas flow and GeH$_4$ gas flow were regulated by the mass flow controllers 1021, 1026 in accordance with the flow patterns as shown in FIG. 23B during deposition of the i-type layer by microwave plasma CVD.

For the thus fabricated photovoltaic element, the initial characteristics, the low illuminance characteristic, and the durability characteristic were measured in the same manner as in Element No. Example 44-5. The results indicated that the open-circuit voltage and the fill factor of the initial characteristics, the low illuminance characteristic, and the durability characteristic of Element No. Example 44-5 were 1.03 times, 1.03 times, 1.08 times and 1.06 times better, respectively, than those in Element No. Comparative Example 12-5.

Further, the composition analysis in the layer thickness direction of the Si atoms and Ge atoms in the i-type layer formed by microwave plasma CVD in Element No. Example 44-5 and Element No. Comparative Example 12-5 was performed in the same manner as the previous composition analysis. It was found that the photovoltaic element in Element No. Example 44-5 had a minimum value of bandgap at a position shifted toward the interface between the p-type layer and the i-type layer away from the central position of the i-type layer, while the photovoltaic element in Element No. Comparative Example 12-5 had the minimum value of bandgap at a position shifted toward the interface between the n-type layer and the i-type layer away from the central position of the i-type layer.

For comparison, a photovoltaic element was fabricated (Element No. Example 44-15) by forming a reflecting layer, a reflection multiplying layer, an n-type layer, an i-type layer, a p-type layer, a transparent electrode, and a collector electrode on a substrate under the same conditions as those of the photovoltaic element in Element No. Example 44-5, except that BF$_3$(2000 ppm)/H$_2$ gas and PH$_3$(2000 ppm)/H$_2$ gas were not flowed during formation of the i-type layer by microwave plasma CVD.

For the fabricated photovoltaic element, the initial characteristics, the low illuminance characteristic, and the durability characteristic were measured in the same manner as in Element No. Example 44-5. From the results, it was found that the photovoltaic element of Element No. Example 44-5 was superior to that of Element No. Example 44-15, in that the open-circuit voltage and the fill factor of the initial characteristics, the low illuminance characteristic, and the durability characteristic were 1.03 times, 1.02 times, 1.07 times, and 1.07 times better.

Composition analysis of the photovoltaic element of Element No. Example 44-5 was performed using a secondary ion mass spectrometer, confirming that B atoms and P atoms were contained in the i-type layer.

Then, photovoltaic elements were fabricated (Element No. Examples 44-16 to 44-20 and Comparative Example 12-6) by forming a reflecting layer, a reflection multiplying layer, a n-type layer, an i-type layer, a p-type layer, a transparent electrode, and a collector electrode on a substrate under the same conditions as those of the photovoltaic element in Element No. Example 44-5, except that the SiH$_4$ gas flow and the RF discharge electric power were as indicated in Table 33 during deposition of the i-type layer by RF plasma CVD.

For the fabricated photovoltaic elements, the initial characteristics, the low illuminance characteristic, and the durability characteristic were measured in the same manner as in Element No. Example 44-5. The results are listed in Table 33.

As seen from Table 33, a photovoltaic element having excellent characteristics can be fabricated by depositing the i-type layer by RF plasma CVD at a deposition rate of 2 nm/sec or less.

Then, photovoltaic elements were fabricated (Element No. Examples 44-21 to 44-23 and Comparative Examples 12-7 to 12-8) by forming a reflecting layer, a reflection multiplying layer, a n-type layer, an i-type layer, a p-type layer, a transparent electrode, and a collector electrode on a substrate under the same conditions as those of the photovoltaic element in Element No. Example 44-5, except that the layer thickness of the i-type layer formed by RF plasma CVD was as indicated in Table 34.

For the fabricated photovoltaic elements, the initial characteristics, the low illuminance characteristic, and the durability characteristic were measured in the same manner as in Element No. Example 44-5. The results are listed in Table 34. As is seen from Table 34, the photovoltaic elements (Element No. Examples 44-21 to 44-23) provided with the i-type layer formed by RF plasma CVD having a layer thickness of 30 nm or less have excellent characteristics.

Then, photovoltaic elements were fabricated (Element No. Examples 44-24 to 44-27) by forming a reflecting layer, a reflection multiplying layer, an n-type layer, an i-type layer, a p-type layer, a transparent electrode, and a collector electrode on a substrate under the same conditions as those of the photovoltaic element in Element No. Example 44-5, except that the RF discharge power was as indicated in Table 35 during formation of the i-type layer by RF plasma CVD.

For the fabricated photovoltaic elements, the initial characteristics, the low illuminance characteristics, and the durability characteristic were measured in the same manner as in Element No. Example 44-5. The results are listed in Table 35. As is seen from Table 35, the photovoltaic elements having a greater value of half-width of a peak of 2000 cm$^{-1}$ in the infrared absorption spectrum divided by the height of the peak in the i-type layer formed by RF plasma CVD than in the i-type layer formed by microwave plasma CVD have the better characteristics.

From the above results, it has been found that the photovoltaic elements of the present invention have better characteristics as compared with conventional photovoltaic elements. The photovoltaic elements of the present invention have an i-type layer formed by microwave plasma CVD at an internal pressure of 50 mTorr or less by applying to the source gas a lower microwave energy and a higher RF energy than the microwave energy necessary to decompose 100% of the source gas. An i-type layer formed by RF plasma CVD is deposited 30 nm thick or less at a deposition rate of 2 nm/sec or less, such that the bandgap smoothly changes in the direction of layer thickness. The minimum value of bandgap is at a position shifted toward the interface between the p-type layer and the i-type layer, away from the central position of the i-type layer, wherein the valence electron control agent serving as a donor and an acceptor is doped in the i-type layer. Thus, the effects of the present invention have been evidenced.

Example 45

Photovoltaic elements (Element No. Examples 45-1 to 45-8) were fabricated in such a manner as to form a reflecting layer, a transparent conductive layer, an n-type layer, an i-type layer, a p-type layer, a transparent electrode, and a collector electrode on a substrate under the same conditions as Element No. Example 44-5, except that after the $SiH_4$ gas flow and $GeH_4$ gas flow were regulated by mass flow controllers 1021, 1026 in accordance with the flow patterns as shown in FIG. 23A, as conducted in Example 1, the $SiH_4$ gas flow was maintained at 200 sccm and $GeH_4$ at 1 sccm. The region of the maximum bandgap was made to have a layer thickness as indicated in Table 36, during formation of the i-type layer by microwave plasma CVD.

For the fabricated photovoltaic elements, the initial characteristics, the low illuminance characteristic, and the durability characteristic were measured in the same manner as in Example 44. The results are listed in Table 36. As is seen from Table 36, the photovoltaic elements (Element No. Examples 45-1 to 45-7) having a layer thickness of 1 to 30 nm in the region of the maximum bandgap according to the present invention exhibit better characteristics, whereby the effects of the present invention have been evidenced.

Example 46

A photovoltaic element (Element No. Example 46) was fabricated by forming a reflecting layer, a transparent conductive layer, an n-type layer, an i-type layer, a p-type layer, a transparent electrode, and a collector electrode on the substrate under the same conditions as those of Element No. 44-5 in Example 44, except that a cylinder of $AsH_3/H_2$ gas was used instead of $PH_3$(2000 ppm)/$H_2$ at a flow rate of 0.5 sccm for the i-type layer formed by microwave plasma CVD, and of 0.1 sccm for the i-type layer formed by RF plasma CVD, during deposition of the i-type layer by RF plasma CVD.

For the photovoltaic element, the initial characteristics, the low illuminance characteristic, and the durability characteristic were measured in the same manner as in Example 44, and the results were equivalent to those of Element No. Example 44-5.

Example 47

Figure 41:
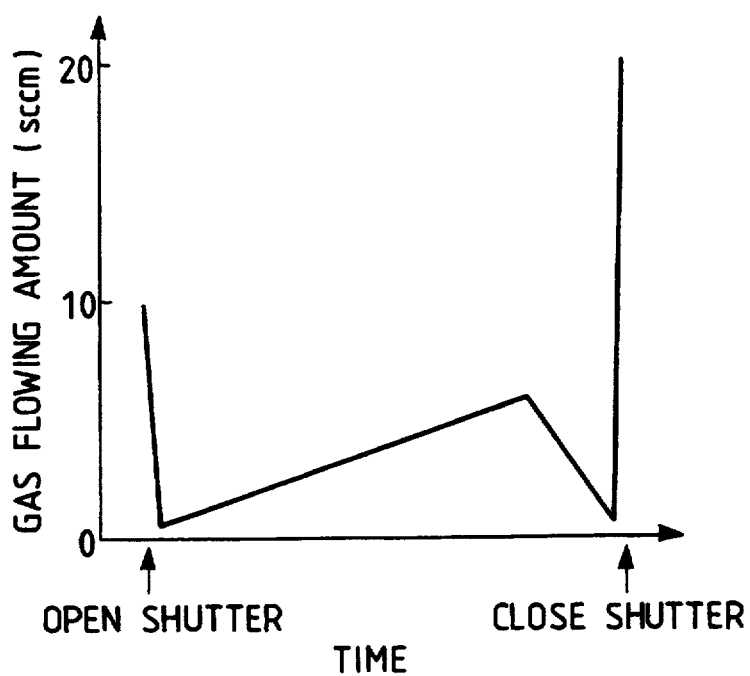
FIGS. 41 and 42 are graphical representations showing variation of the flow rates of $BF_3/H_2$ and $PH_3/H_2$ gases introduced during forming of the i-type layer.
Figure 42:
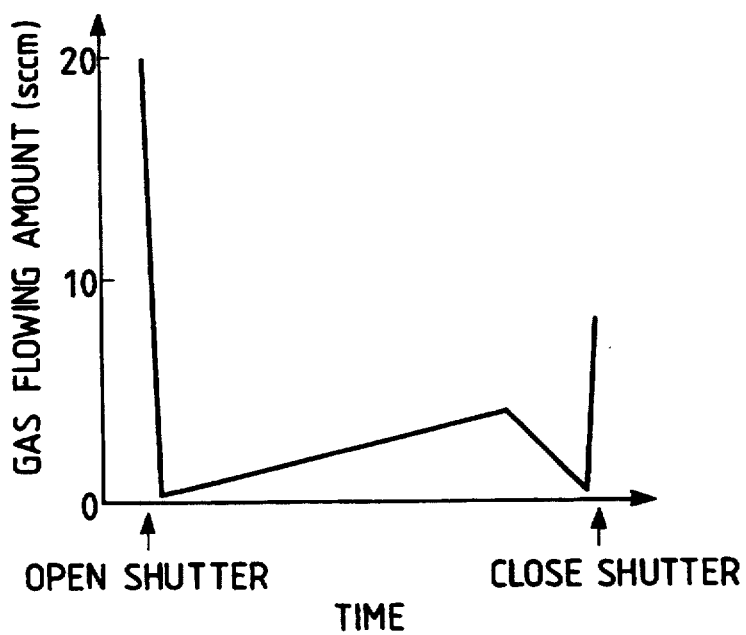

A photovoltaic element (Element No. Example 47) was fabricated by forming a reflecting layer, a transparent conductive layer, an n-type layer, an i-type layer, a p-type layer, a transparent electrode, and a collector electrode on a substrate under the same conditions as Element No. Example 44-5, except that the $BF_3$(2000 ppm)/$H_2$ gas flow and $PH_3$(2000 ppm)/$H_2$ gas flow were regulated in accordance with the flow patterns as shown in FIGS. 41 and 42 by the mass flow controllers 1027, 1028 during deposition of the i-type layer formed by microwave plasma CVD. The $BF_3$(2000 ppm)/$H_2$ gas flow and $PH_3$(2000 ppm)/$H_2$ gas flow were 1 sccm and 0.3 sccm during formation of the i-type layer by RF plasma CVD.

For the photovoltaic element, the initial characteristics, the low illuminance characteristic, and the durability characteristics were measured in the same manner as in Example 44, and the results were equivalent to those of Element No. Example 44-5.

Figure 43:
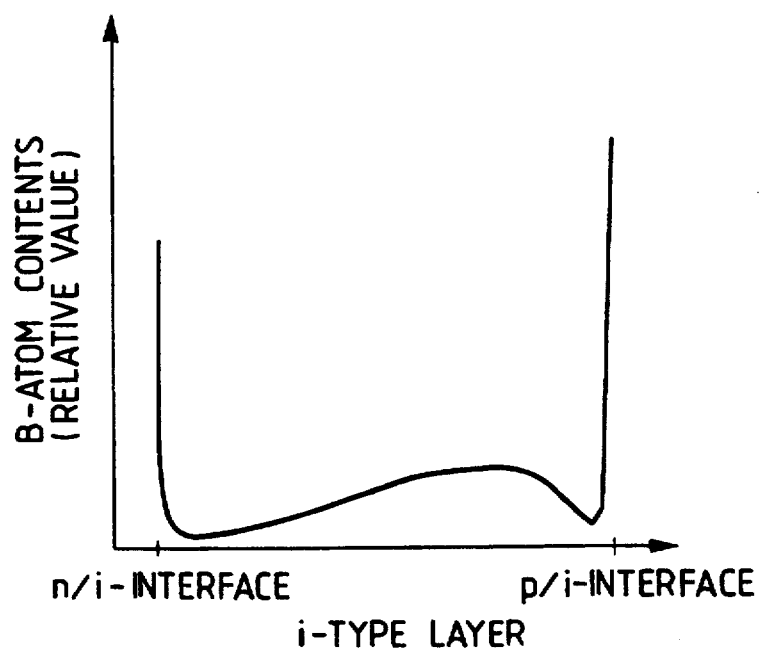
FIGS. 43 and 44 are graphical representations showing the variation in the layer thickness direction of the contents of B and P atoms in the i-type layer.
Figure 44:
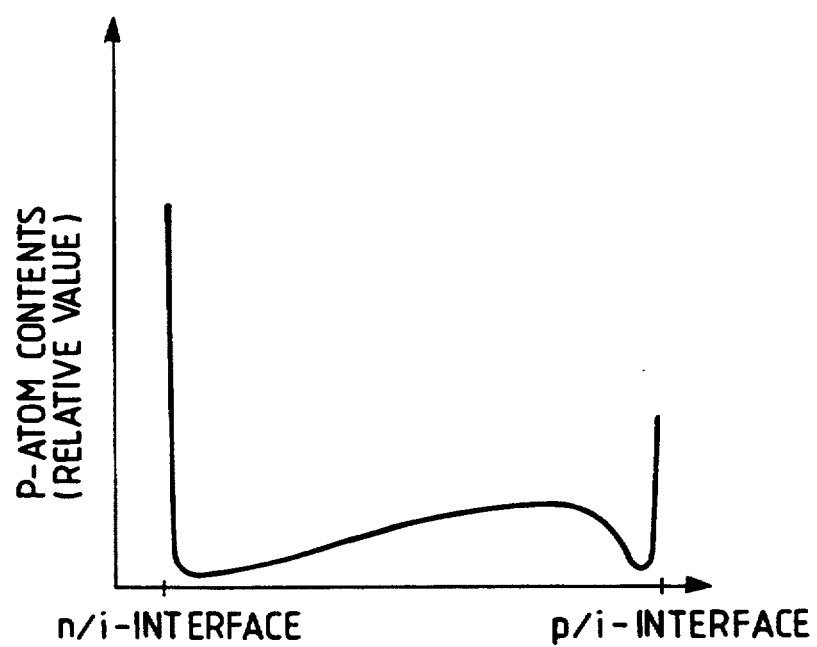

Also, the distribution of B and P atoms in the i-type layer of the photovoltaic element was analyzed using a secondary ion mass spectrometer. The results are shown in FIGS. 43 and 44. From the above results, the effects of the present invention were evidenced.

Example 48

A photovoltaic element (Element No. Example 48) was fabricated by forming a reflecting layer, a transparent conductive layer, an n-type layer, an i-type layer, a p-type layer, a transparent electrode, and a collector electrode on a substrate under the same conditions as those of Element No. Example 44-5 in Example 44, except for a cylinder of NO/He gas 1079 being used at a flow rate of 0.5 sccm for the i-type layer formed by microwave plasma CVD and 0.05 sccm for the i-type layer formed by RF plasma CVD.

For the fabricated photovoltaic element, the initial characteristics, the low illuminance characteristic, and the durability characteristic were measured in the same manner as in Example 44, and the results were equivalent to those of Element No. Example 44-5.

Also, composition analysis of the photovoltaic element was performed using a secondary ion mass spectrometer, and O and N atoms were confirmed in the i-type layer.

Example 26

A photovoltaic element (Element No. Example 49) was fabricated by forming a reflecting layer, a transparent conductive layer, an n-type layer, an i-type layer, a p-type layer, a transparent electrode, and a collector electrode on a substrate under the same conditions as those of Element No. Example 44-5, except a cylinder of $Si_2H_6$ gas was used at a flow rate of 40 sccm, regulated by a mass flow controller 1021 in accordance with the flow pattern shown in FIG. 25A, during formation of the i-type layer by microwave plasma CVD.

For the fabricated photovoltaic element, the initial characteristics, the low illuminance characteristic, and the durability characteristic were measured in the same manner as in Example 44, and the results were equivalent to those of Element No. Example 44-5.

The distribution in the layer thickness direction of Si and hydrogen atoms in the i-type layer of the photovoltaic element was analyzed using a secondary ion mass spectrometer (IMS-3F manufactured by CAMECA), resulting in the same tendency as FIG. 25B.

From the above results, it has been found that the effects of the invention are evidenced in photovoltaic elements in which the content of hydrogen atoms changes in correspondence with the content of Si atoms.

Example 50

Photovoltaic elements (Elements No. Examples 50-1 to 50-5) were fabricated by forming a reflecting layer, a transparent conductive layer, an n-type layer, an i-type layer, a p-type layer, a transparent electrode, and a collector electrode on a substrate under the same conditions as Element No. Example 44-5, except that the distance between the mixing point of $SiH_4$ gas and GeH₄ gas and the deposition chamber 1001 in the source gas supply unit 1020 was as indicated in Table 37.

For the photovoltaic elements thus fabricated, the initial characteristics, the low illuminance characteristic, and the durability characteristic were measured in the same manner as in Example 44. The results are listed in Table 37. As is seen from Table 37, by making the distance between the mixing point of SiH₄ gas and GeH₄ gas and the deposition chamber 1001 equal to or less than 5 m, a photovoltaic element having further improved characteristics can be obtained.

Example 51

A photovoltaic element was fabricated under the same conditions as those of Element No. Example 44-5 of Example 44. A solar cell module was fabricated using this photovoltaic element and used in an analog clock with a circuit configuration as shown in FIG. 28.

Comparative Example 13

As a comparative example, a photovoltaic element was fabricated under the same conditions as those of Element No. Comparative Example 12-6, and using this photovoltaic element, the same analog clock as in Example 51 was made.

The analog clocks as fabricated in Example 51 and Comparative Example 13 were installed on the wall of a room, and an indoor lamp was lit for 8.5 hours a day. As a result, the analog clock of Example 51 worked for the entire day, but the analog clock of Comparative Example 13 did not work the entire day, whereby the effects of the power generation system of the present invention were evidence.

Example 52

Figure 35:
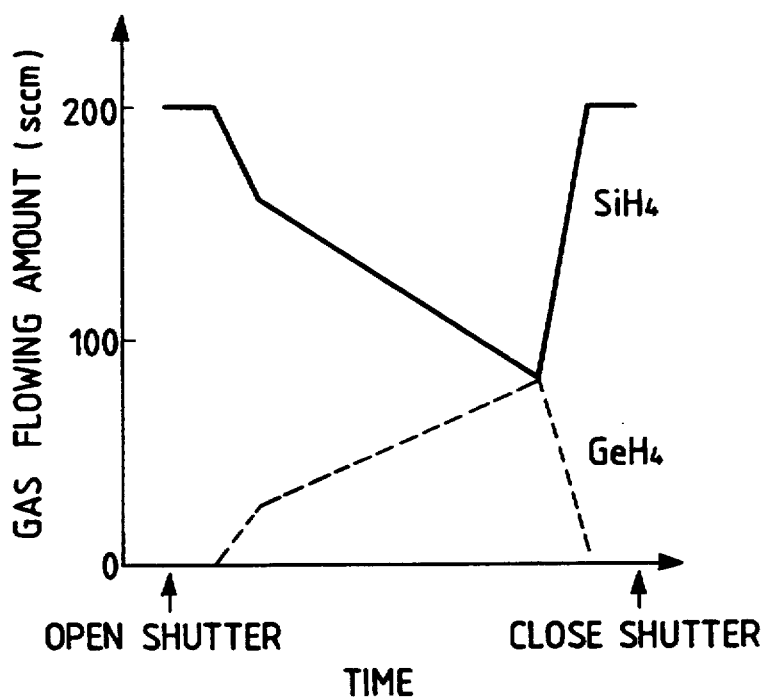

A photovoltaic element (Element No. Example 52) was fabricated by forming a reflecting layer, a reflection multiplying layer, an n-type layer, an i-type layer, a p-type layer, a transparent electrode, and a collector electrode on a substrate under the same conditions as Element No. Example 44-5, except that the flow rates of SiH₄ gas and GeH₄ gas were regulated by mass flow controllers 1021, 1026 in accordance with the flow patterns as shown in FIG. 35 during formation of the i-type layer by microwave plasma CVD.

For the photovoltaic element thus fabricated, the initial characteristics, the low illuminance characteristic, and the durability characteristic were measured in the same manner as in Example 44, and the results were equivalent to those of Element No. Example 44-5 in Example 44, whereby the effects of the present invention were evidenced.

Example 53

A photovoltaic element (Element No. Example 53) was fabricated by forming a reflecting layer, a transparent conductive layer, an n-type layer, an i-type layer, a p-type layer, a transparent electrode, and a collector electrode on a substrate under the same conditions as Element No. Example 44-5, except for using a cylinder of B₂H₆(2000 ppm)/H₂ gas instead of BF₃(2000 ppm)/H₂ gas at a flow rate of 1 sccm during formation of the i-type layer by microwave plasma CVD, and 0.5 sccm during formation of the i-type layer by RF plasma CVD.

For the fabricated photovoltaic element, the initial characteristics, the low illuminance characteristic and the durability characteristic were measured in the same manner as in the Example 44, and the results were equivalent to Element No. Example 44-5, whereby the effects of the present invention were evidenced.

Example 54

A photovoltaic element (Element No. Example 54) was fabricated by forming a reflecting layer, a transparent conductive layer, an n-type layer, an i-type layer, a p-type layer, a transparent electrode, and a collector electrode on the substrate under the same conditions as those of Element No. Example 44-5 in Example 44, except that the flow rate of NO/He gas was regulated by a mass flow controller 1029 in accordance with the flow pattern as shown in FIG. 33A, during formation of the i-type layer by microwave plasma CVD.

For the fabricated photovoltaic element, the initial characteristics, the low illuminance characteristic, and the durability characteristic were measured in the same manner as in the Example 44, and the results were equivalent to those of Element No. Example 44-5.

Also, the distribution in the layer thickness direction of N and O atoms in the i-type layer of the photovoltaic element was analyzed using a secondary ion mass spectrometer, resulting in the same tendency as indicated in FIG. 33B. From the above results, the effects of the present invention were evidenced.

Example 55

A photovoltaic element (Element No. Example 55) was fabricated by forming a reflecting layer, a transparent conductive layer, an n-type layer, an i-type layer, a p-type layer, a transparent electrode, and a collector electrode on a substrate, under the same conditions as those of Element No. Example 44-5, except that the flow rates of SiH₄ gas and GeH₄ gas were regulated by mass flow controllers 1021, 1026 in accordance with the flow patterns as shown in FIG. 34, during formation of the i-type layer by microwave plasma CVD.

For the fabricated photovoltaic element, the initial characteristics, the low illuminance characteristic, and the durability characteristic were measured in the same manner as in Example 44, and the results were equivalent to Element No. Example 44-5, whereby the effects of the present invention were evidenced.

Example 56

A photovoltaic element (Element No. Example 56) was fabricated by forming a reflecting layer, a transparent conductive layer, an n-type layer, an i-type layer, a p-type layer, a transparent electrode, and a collector electrode on a substrate under the same conditions as Example 52, except that the power of the bias power source 1011 was set at 250 mW/cm³, and the DC bias was set at 50 V for application to the bias rod 1012, during formation of the i-type layer by microwave plasma CVD.

For the photovoltaic element thus fabricated, the initial characteristics, the low illuminance characteristic, and the durability characteristic were measured in the same manner as in Example 52, and the results were equivalent to those of Example 52, whereby the effects of the present invention were demonstrated.

Example 57

A photovoltaic element (Element No. Example 57) was fabricated by forming a reflecting layer, a transparent conductive layer, an n-type layer, an i-type layer, a p-type layer, a transparent electrode, and a collector electrode on a substrate, under the same conditions as those of Element No. Example 44-5 in Example 44, except for using a cylinder of $D_2$ gas (not shown) instead of $H_2$ at a flow rate of 300 sccm during formation of the i-type layer by microwave plasma CVD.

For the fabricated photovoltaic element, the initial characteristics, the low illuminance characteristic, and the durability characteristic were measured in the same manner as in Example 44, and the results were equivalent to those of Element No. Example 44-5.

Also, composition analysis of the photovoltaic element was performed using a secondary ion mass spectrometer, and it was confirmed that D atoms were contained in the i-type layer, whereby the effects of the present invention were evidenced.

Example 58

A photovoltaic element (Element No. Example 58) was fabricated by forming a reflecting layer, a transparent conductive layer, an n-type layer, an i-type layer, a p-type layer, a transparent electrode, and a collector electrode on a substrate under the same conditions as those of Element No. Example 44, except that the DC bias of bias power source 1011 was changed at a constant rate from 50 V to 80 V when the shutter 1013 was opened, during formation of the n-type layer.

For the fabricated photovoltaic element, the initial characteristics, the low illuminance characteristic, and the durability characteristic were measured in the same manner as in Example 44, and the results were equivalent to Element Example No. 44-5, whereby the effects of the present invention were evidenced.

Example 59

A photovoltaic element (Element No. Example 59-1) was fabricated under the same fabrication conditions as those of Element No. Example 44-5 in Example 44, except that an n-type layer and a p-type layer were formed under the same conditions as those of Example 16, using an RF plasma CVD using deposition apparatus.

A photovoltaic element (Element No. Example 59-2) was fabricated by forming a reflecting layer, a transparent conductive layer, an n-type layer, an i-type layer, a p-type layer, a transparent electrode, and a collector electrode on a substrate under the same conditions as those of Example 59-1, except that $BF_3$(2000 ppm)/$H_2$ gas and $PH_3$(2000 ppm)/$H_2$ gas were not used during formation of the i-type layer by microwave plasma CVD.

For the fabricated photovoltaic elements, the initial characteristics, the low illuminance characteristic, and the durability characteristic were measured as in Example 44. From the results, it was determined that the photovoltaic element of Element No. Example 59-1 was better than the photovoltaic element of Element No. Example 59-2, i.e., 1.02 times better in the open-circuit voltage and 1.04 times better in the fill factor of the low illuminance characteristic, and 1.08 times better in the photovoltaic conversion efficiency of the low illuminance characteristic, and 1.07 times better in the decrease in the photovoltaic conversion efficiency (the durability characteristic), whereby the effects of the present invention were evidenced.

Example 60

A photovoltaic element (Element No. Example 60-1) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the same conditions as listed in Table 38, with the same method as in Example 44.

A photovoltaic element (Element No. Example 60-2) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the same conditions as those of Example 60-1, except that the $BF_3$(2000 ppm)/$H_2$ gas and $PH_3$(2000 ppm)/$H_2$ gas were not used during formation of the first i-type layer by microwave plasma CVD.

For the fabricated photovoltaic element, the initial characteristics, the low illuminance characteristic, and the durability characteristic were measured as in Example 44. From the results, it was evidenced that the photovoltaic element of Element No. Example 60-1 was better than the photovoltaic element of Element No. Example 60-2, i.e., 1.03 times better in the open-circuit voltage and 1.03 times better in the fill factor of the initial characteristics, 1.08 times better in the photovoltaic conversion efficiency of the low illuminance characteristic, and 1.09 times better in the decrease in the photovoltaic conversion efficiency (the durability characteristic), whereby the effects of the present invention were demonstrated.

Example 61

A photovoltaic element (Element No. Example 61-1) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as listed in Table 39, with the same method as in Example 44.

A photovoltaic element (Element No. Example 61-2) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as Example 61-1, except that the $BF_3$(2000 ppm)/$H_2$ gas and $PH_3$(2000 ppm)/$H_2$ gas were not used during formation of the first and second i-type layers by microwave plasma CVD.

For the fabricated photovoltaic element, the initial characteristics, the low illuminance characteristic, and the durability characteristic were measured as in Example 44. From the results, it was found that the photovoltaic element of Element No. Example 61-1 was better than the photovoltaic element of Element No. Example 61-2, i.e., 1.03 times better in the open-circuit voltage and 1.04 times better in the fill factor of the initial characteristics, 1.08 times better in the photovoltaic conversion efficiency of the low illuminance characteristic, and 1.07 times better in the decrease in the photovoltaic conversion efficiency (the durability characteristic), whereby the effects of the present invention were evidenced.

Example 62

A photovoltaic element of the present invention was fabricated using a multiple chamber separation-type deposition apparatus as shown in FIG. 20. The photovoltaic element (Element No. Example 62) was made in accordance with the procedure of Example 19 under the same layer forming conditions as Example 60.

For the photovoltaic element this fabricated, the initial characteristics, the low illuminance characteristic, and the durability characteristic were measured in the same manner as in Example 44. From the results, it was determined that the photovoltaic element (Element No. Example 62) of Example 62 was better than the photovoltaic element (Element No. Example 60) of Example 60, i.e., 1.01 times better in the open-circuit voltage and 1.02 times better in the fill factor of the initial characteristics, 1.03 times better in the photovoltaic conversion efficiency of the low illuminance characteristic, and 1.02 times better in the decrease in the photovoltaic conversion efficiency (the durability characteristic), whereby the photovoltaic devices of the present invention have better characteristics by fabricating the photovoltaic element in the multiple chamber separation-type deposition apparatus, whereby the effects of the present invention were demonstrated.

Example 63

A photovoltaic element was fabricated under the same conditions as those of Element No. Example 60-1, whereby a solar cell module was made using the photovoltaic element, and a car-mounted ventilation fan using the module and having a circuit configuration as shown in FIG. 28 was produced.

For the comparison, a photovoltaic element was fabricated under the same conditions as those of Element No. Example 60-2, and a car-mounted ventilation fan similar to that of Example 63 was made using the photovoltaic element.

A car which had mounted therein ventilation fans utilizing Element No. Examples 60-1 to 60-2 was left in an idling state with the engine running for 168 hours, and then left in sunny weather with the ventilation fan working and with the engine stopped, whereafter the temperature within the car was measured. As a result, the car-mounted cooling fan of Element No. Example 60-1 achieved an interior temperature four degrees lower than the fan of Element No. Example 60-2.

Example 64

In this example, a photovoltaic element wherein a valence electron control agent was doped into the i-type layer formed by microwave plasma CVD and a laminated p-type layer was fabricated.

The same gas supply unit as in Example 1 was used, except that the $BF_3(1\%)/H_2$ gas cylinder was replaced with a cylinder of $B_2H_6$ gas diluted to 10% with $H_2$ gas ($B_2H_6(10\%)/H_2$ gas) in a source gas supply unit 1020 as shown in FIGS. 18 and 19.

On a SUS substrate, a reflecting layer, a reflection multiplying layer, an n-type layer, and an i-type layer formed by microwave plasma CVD were formed under the same conditions as in Example 44, and then an i-type layer was formed by RF plasma CVD under the same conditions as those of the i-type layer formed by RF plasma CVD in Example 44 except that the $BF_3(2000$ ppm$)/H_2$ gas flow was changed to 0.05 sccm and the $PH_3(2000$ ppm$)/H_2$ gas flow to 0.05 sccm. Subsequently, a p-type layer was formed under the same conditions as the p-type layer in Example 21, whereby several photovoltaic elements were fabricated (Element No. Examples 64-1 to 64-7 and Comparative Example 14-1).

The initial characteristics, low illuminance characteristic, and durability characteristic were measured for the fabricated photovoltaic elements. The results are listed in Table 40. From Table 40, it is seen that a photovoltaic element having improved characteristics can be obtained by forming the i-type layer by microwave plasma CVD within the deposition chamber at a pressure of 50 mTorr or less.

Then, photovoltaic elements (Element No. Examples 64-8 to 64-10 and Comparative Examples 14-2 to 14-3) were fabricated by forming a reflecting layer, a reflection multiplying layer, an n-type layer, an i-type layer, a p-type layer, a transparent electrode, and a collector electrode on a substrate under the same conditions as those of Element No. Example 64-5, except that the microwave power was as indicated in Table 41, during formation of the i-type layer by microwave plasma CVD.

For the fabricated photovoltaic elements, the initial characteristics, the low illuminance characteristic, and the durability characteristic were measured in the same manner as in Example 1. The results are listed in Table 41. As seen from Table 41, a photovoltaic element having excellent characteristics can be obtained by decomposing the source gas with a lower microwave energy then the microwave energy necessary to decompose 100% of the source gas.

Then, several photovoltaic elements (Element No. Examples 64-11 to 64-14 and Comparative Example 14-4) were fabricated by forming a reflecting layer, a reflection multiplying layer, an n-type layer, an i-type layer, a p-type layer, a transparent electrode, and a collector electrode on a substrate under the same conditions as those of Element No. Example 64-5, except that the RF bias was as indicated in Table 42 during formation of the i-type layer by microwave plasma CVD.

For the fabricated photovoltaic elements, the initial characteristics, the low illuminance characteristic, and the durability characteristic were measured as in Example 1. The results are in Table 42. As seen in Table 42, a photovoltaic element having excellent characteristics is obtained by applying a higher RF energy to the source gas than the microwave energy.

Then, a photovoltaic element was fabricated (Element No. Comparative Example 14-5) by forming a reflecting layer, a reflection multiplying layer, an n-type layer, an i-type layer, a p-type layer, a transparent electrode, and a collector electrode on a substrate under the same conditions as those of Element No. Example 64-5, except that the $SiH_4$ gas flow and the $GeH_4$ gas flow were regulated by mass flow controllers 1021, 1026 in accordance with the flow patterns as shown in FIG. 23B during formulation of the i-type layer by microwave plasma CVD.

For the fabricated photovoltaic element, the initial characteristics, the low illuminance characteristic, and the durability characteristic were measured in the same manner as in Example 1. The results indicated that the open-circuit voltage and the fill factor in the initial characteristics, the low illuminance characteristic, and the durability characteristic in Element No. Example 64-5 were, respectively, 1.02 times, 1.03 times, 1.07 times, and 1.08 times better than those in Element No. Comparative Example 14-5.

The change in the bandgap of the i-type layer in the layer thickness direction was measured, and it was found that the photovoltaic element of Element No. Example 14-5 had a minimum value of bandgap at a position shifted toward the interface between the p-type layer and the i-type layer, away from the central position of the i-type layer.

Next, a photovoltaic element was fabricated (Element No. Example 64-15) by forming a reflecting layer, a reflection multiplying layer, an n-type layer, an i-type layer, a p-type layer, a transparent electrode, and a collector electrode on a substrate under the same conditions as those of Element No. Example 64-5, except that $BF_3$(2000 ppm)/$H_2$ gas and $PH_3$(2000 ppm)/$H_2$ gas were not flowed during fabrication of the i-type layer by microwave plasma CVD.

For the thus fabricated photovoltaic element, the initial characteristics, the low illuminance characteristic, and the durability characteristic were measured in the same manner as in Example 1. From the results, it was found that the photovoltaic element of Element No. Example 64-5 was superior to that of Element No. Example 64-15, wherein the open-circuit voltage and the fill factor of the initial characteristics, the low illuminance characteristic and the durability characteristic were, respectively, 1.03 times, 1.02 times, 1.07 times, and 1.07 times better.

Composition analysis of the photovoltaic element of Element No. Example 64-5 was performed using a secondary ion mass spectrometer, and it was confirmed that B atoms and P atoms were contained in the i-type layer formed by microwave plasma CVD.

Then, several photovoltaic elements (Element No. Examples 64-16 to 64-20 and Comparative Example 14-6) were fabricated by forming a reflecting layer, a reflection multiplying layer, an n-type layer, an i-type layer, a p-type layer, a transparent electrode, and a collector electrode on a substrate under the same conditions as the photovoltaic element in Element No. Example 64-5, except that the $SiH_4$ gas flow and the RF discharge electric power were as indicated in Table 43 during formation of the i-type layer by RF plasma CVD.

For the fabricated photovoltaic elements, the initial characteristics, the low illuminance characteristic, and the durability characteristic were measured in the same manner as in Element No. Example 64-5. The results are listed in Table 43.

As seen from Table 43, photovoltaic elements having excellent characteristics can be fabricated by depositing the i-type layer by RF plasma CVD at a deposition rate of 2 nm/sec or less.

Then, several photovoltaic elements (Element No. Examples 64-21 to 64-23 and Comparative Examples 14-7 to 14-8) were fabricated by forming a reflecting layer, a reflection multiplying layer, an n-type layer, an i-type layer, a p-type layer, a transparent electrode, and a collector electrode on a substrate under the same conditions as Element No. Example 64-5, except that the layer thickness of the i-type layer formed by RF plasma CVD was as indicated in Table 44.

For the fabricated photovoltaic elements, the initial characteristics, the low illuminance characteristic, and the durability characteristic were measured in the same manner as in Element No. Example 64-5. The results are listed in Table 44. As seen from Table 44, the photovoltaic elements (Element No. Examples 64-21 to 64-23) provided with the i-type layer formed by RF plasma CVD having a layer thickness of 30 nm or less have excellent characteristics.

Then, several photovoltaic elements (Element No. Examples 64-24 to 64-27) were fabricated by forming a reflecting layer, a reflection multiplying layer, an n-type layer, an i-type layer, a p-type layer, a transparent electrode, and a collector electrode on a substrate under the same conditions as those of the photovoltaic element in Element No. Example 64-5, except that the RF power was as indicated in Table 45 during formation of the i-type layer by RF plasma CVD.

For the fabricated photovoltaic elements, the initial characteristics, the low illuminance characteristic, and the durability characteristic were measured in the same manner as in Element No. Example 64-5. The results are listed in Table 45. As seen in Table 45, the photovoltaic elements wherein the value of half-width of a peak of 2000 $cm^{-1}$ in the infrared absorption spectrum divided by the peak height is greater in the i-type layer formed by RF plasma CVD than in the i-type layer formed by microwave plasma CVD and had better characteristics.

Next, a photovoltaic element (Element No. Example 64-28) was fabricated by forming a reflecting layer, a reflection multiplying layer, an n-type layer, an i-type layer, a p-type layer, a transparent electrode, and a collector electrode on a substrate under the same conditions as Element No. Example 64-5, except that doping layer A was not formed in making the p-type layer.

For the fabricated photovoltaic element, the initial characteristics, the low illuminance characteristic, and the durability characteristic were measured in the same manner as in Example 1. From the results, it was found that the photovoltaic element of Element No. Example 64-5 was superior to Element No. Comparative Example 64-28, wherein the open-circuit voltage and the fill factor of the initial characteristics, the photoelectric conversion efficiency of the low illuminance characteristic, and the decrease in the photoelectric conversion efficiency of the durability characteristic, respectively, were 1.04 times, 1.02 times, 1.09 times, and 1.07 times better.

From the above results, it has been found that the photovoltaic elements of the present invention have better characteristics as compared with the conventional photovoltaic elements. The photovoltaic elements of the present invention have been fabricated by a process such that an i-type layer formed by microwave plasma CVD is deposited at an internal pressure of 50 mTorr or less by simultaneously applying a lower microwave energy and a higher RF energy than the microwave energy necessary to decompose 100% of the source gas. An i-type layer formed by RF plasma CVD is deposited 30 nm thick or less on the p-type layer at a deposition rate of 2 nm/sec or less, such that the bandgap smoothly changes in the direction of layer thickness. The minimum value of bandgap is at a position shifted toward the interface between the p-type layer and the i-type layer, away from the central position of the i-type layer, wherein B and P atoms are doped in the i-type layer formed by microwave plasma CVD. The p-type layer and/or the n-type layer has a laminated structure consisting of a layer having a Group III and/or Group V element as the main constituent and a layer containing a valence electron control agent and having silicon atoms as the main constituent.

Example 65

Photovoltaic elements (Element No. Examples 65-1 to 65-8) were fabricated by forming reflecting layer, a reflection multiplying layer, an n-type, an i-type layer, a p-type layer, a transparent electrode, and a collector electrode on a substrate under the same conditions as those of Element No. Example 64-5 in Example 64, except that the SiH$_4$ gas flow and GeH$_4$ gas flow were regulated by mass flow controllers 1021, 1026 in accordance with the flow patterns as shown in FIG. 23A, as conducted in Example 64. The SiH$_4$ gas flow was maintained at 200 sccm and the GeH$_4$ gas flow at 1 sccm, and the region of the maximum bandgap was made to have a thickness as indicated in Table 46, during form of the i-type layer by microwave plasma CVD.

For the fabricated photovoltaic elements, the initial characteristics, the low illuminance characteristic, and the durability characteristic were measured in the same manner as in Example 64. The results are listed in Table 46. As seen from Table 46, the photovoltaic elements (Element No. Examples 65-1 to 65-7) having a layer thickness of 1 to 30 nm in the region of the maximum bandgap exhibit better characteristics, whereby the effects of the present invention are demonstrated.

Example 66

A photovoltaic element (Element No. Example 66) was fabricated by forming a reflecting layer, a transparent conductive layer, an n-type layer, an i-type layer, a p-type layer, a transparent electrode, and a collector electrode on a substrate under the same conditions as those of Element No. Example 64-5 in Example 64, except for using a cylinder of AsH$_3$/H$_2$ gas instead of cylinder PH$_3$(2000 )ppm/H$_2$ gas at a flow rate of 0.2 sccm for the i-type layer formed by microwave plasma CVD, and 0.02 sccm for the i-type layer formed by RF plasma CVD.

For the photovoltaic element, the initial characteristics, the low illuminance characteristic, and the durability characteristic were measured in the same manner as in Example 64, and the results were equivalent to those of Element No. Example 64-5.

Example 67

A photovoltaic element (Element No. Example 67) was fabricated by forming a reflecting layer, a transparent conductive layer, an n-type layer, an i-type layer, a p-type layer, a transparent electrode, and a collector electrode on a substrate under the same conditions as those of Element No. Example 64-5, except that the BF$_3$(2000 ppm)/H$_2$ gas flow and the PH$_3$(2000 ppm)/H$_2$ gas flow were regulated in accordance with the flow patterns as shown in FIGS. 41 and 42 by the mass flow controllers 1027, 1028, during formation of the i-type layer by microwave plasma CVD. The BF$_3$(2000 ppm)/H$_2$ gas flow and PH$_3$(2000 ppm)/H$_2$ gas flow were 3 sccm and 0.04 sccm, during formation of the i-type layer by RF plasma CVD.

For the photovoltaic element, the initial characteristics, the low illuminance characteristic, and the durability characteristic were measured in the same manner as in Example 64, and the results were equivalent to those of Element No. 64-5.

Also, the distribution of B and P atoms in the i-type layer was analyzed using a secondary ion mass spectrometer, resulting in the same tendency as shown in FIGS. 43 and 44.

Example 68

A photovoltaic element (Element No. Example 68) was fabricated by forming a reflecting layer, a reflection multiplying layer, an n-type layer, an i-type layer, a p-type layer, a transparent electrode, and a collector electrode on a substrate under the same conditions as those of Element No. Example 64-5, except for using a cylinder of NO/He gas 1079 at a flow rate of 0.5 sccm for the i-type layer formed by microwave plasma CVD and 0.05 sccm for the i-type layer formed by RF plasma CVD.

For the fabricated photovoltaic element, the initial characteristics, the low illuminance characteristic, and the durability characteristic were measured in the same manner as in the Example 64, and the results were equivalent to those of Element No. Example 64-5.

Also, composition analysis of the photovoltaic element was performed using a secondary ion mass spectrometer, and it was confirmed that O and N atoms were contained in the i-type layer. From the above results, the effects of the present invention could be evidenced.

Example 69

A photovoltaic element (Element No. Example 69) was fabricated by forming a reflecting layer, a reflection multiplying layer, an n-type layer, an i-type layer, a p-type layer, a transparent electrode, and a collector electrode on a substrate under the same conditions as those of Element No. Example 64-5, except for using a cylinder of Si$_2$H$_6$ gas 1079 at a flow rate of 40 sccm, regulated by a mass flow controller 1021 in accordance with the flow pattern as shown in FIG. 18A, during deposition of the i-type layer by microwave plasma CVD.

For the fabricated photovoltaic element, the initial characteristics, the low illuminance characteristics, and the durability characteristic were measured in the same manner as in the Example 64, and the results were equivalent to those of Element No. Example 64-5.

Also, the distribution in the layer thickness direction of Si and hydrogen atoms in the i-type layer of the photovoltaic element was analyzed using a secondary ion mass spectrometer, resulting in the same tendency as indicated in FIG. 25B. From the above results, the effects of the present invention could be evidenced.

Example 70

Photovoltaic elements (Element No. Examples 70-1 to 70-5) were fabricated by forming a reflecting layer, a reflection multiplying layer, an n-type layer, an i-type layer, a p-type layer, a transparent electrode, and a collector electrode on a substrate under the same conditions as Element No. Example 64-5, except that the distance between the mixing point of SiH$_4$ gas and GeH$_4$ gas and the deposition chamber 1001 in the source gas supply unit 1020 was set as indicated in Table 47.

For the fabricated photovoltaic elements, the initial characteristics, the low illuminance characteristic, and the durability characteristic were measured in the same manner as in the Example 64. The results were listed in Table 47. As seen from Table 47, by making the distance between the mixing point of SiH$_4$ gas and GeH$_4$ gas and the deposition chamber 1001 equal to or less than 5 m, a photovoltaic element having further improved characteristics can be obtained.

Example 71

A photovoltaic element was fabricated under the same conditions as those of Element No. Examples 64-5 and 64-15, a solar cell module was fabricated using this photovoltaic element, and the module was used as a power source for an analog clock with a circuit configuration as shown in FIG. 28.

The analog clocks as fabricated were installed on the wall of a room. As a result, the analog clock using Element No. Example 64-5 worked for a longer time than the analog clock using Element No. Example 64-15.

Example 72

A photovoltaic element (Element No. Example 72) was fabricated by forming a reflecting layer, a reflection multiplying layer, an n-type layer, an i-type layer, a p-type layer, a transparent electrode, and a collector electrode on a substrate, under the same conditions as Element No. Example 64-5, except that the flow rates of $SiH_4$ gas and $GeH_4$ gas were regulated by mass flow controllers 1021, 1026 in accordance with the flow patterns as shown in FIG. 26 during formation of the i-type layer by microwave plasma CVD.

For the fabricated photovoltaic element, the initial characteristics, the low illuminance characteristic, and the durability characteristic were measured in the same manner as in Example 64, and the results were equivalent to Element No. Example 64-5, whereby the effects of the present invention were demonstrated.

Example 73

A photovoltaic element (Element No. Example 73) was fabricated by forming a reflecting layer, a transparent conductive layer, an n-type layer, an i-type layer, a p-type layer, a transparent electrode, and a collector electrode on a substrate under the same conditions as Element No. Example 64-5, except for using a cylinder of $B_2H_6$(2000 ppm)/$H_2$ gas instead of $BF_3$(2000 ppm)/$H_2$ gas at a flow rate of 1 sccm during formation of the i-type layer by microwave plasma CVD and 2 sccm during formation of the i-type layer formed by RF plasma CVD.

For the fabricated photovoltaic element, the initial characteristics, the low illuminance characteristic, and the durability characteristic were measured in the same manner as in Example 64, and the results were equivalent to Element No. Example 64-5, whereby the effects of the present invention were evidenced.

Example 74

A photovoltaic element (Element No. Example 74) was fabricated by forming a reflecting layer, a reflection multiplying layer, an n-type layer, an i-type layer, a p-type layer, a transparent electrode, and a collector electrode on a substrate, under the same conditions as Element No. Example 64-5, except that the flow rate of NO/He gas was regulated by a mass flow controller 1029 in accordance with the flow patterns as shown in FIG. 33A, during formation of the i-type layer by microwave plasma CVD.

For the fabricated photovoltaic element, the initial characteristics, the low illuminance characteristic, and the durability characteristic were measured in the same manner as in the Example 64, and the results were equivalent to those of Element No. Example 64-5.

Also, the distribution in the layer thickness direction of N and O atoms in the i-type layer of the photovoltaic element was analyzed using a secondary ion mass spectrometer, resulting in the same tendency as indicated in FIG. 33B. From the above results, the effects of the present invention were demonstrated.

Example 75

A photovoltaic element (Element No. Example 75) was fabricated by forming a reflecting layer, a reflection multiplying layer, an n-type layer, an i-type layer, a p-type layer, a transparent electrode, and a collector electrode on a substrate, under the same conditions as those of Element No. Example 64-5, except that the flow rates of $SiH_4$ gas and $GeH_4$ gas were regulated by mass flow controllers 1021, 1026 in accordance with the flow patterns as shown in FIG. 34 during formation of the i-type layer by microwave plasma CVD.

For the fabricated photovoltaic element, the initial characteristics, the low illuminance characteristic, and the durability characteristic were measured in the same manner as in the Example 64, and the results were equivalent to Element No. Example 64-5, whereby the effects of the present invention were evidenced.

Example 76

Photovoltaic elements (Element No. Examples 76-1 to 76-5) were fabricated by forming a reflecting layer, a reflection multiplying layer, an n-type layer, an i-type layer, a p-type layer, a transparent electrode, and a collector electrode on a substrate under the same conditions as Element No. Example 64-5, except that the layer thickness of doping layer A of the p-type layer was as indicated in Table 48.

For the fabricated photovoltaic element, the initial characteristics, the low illuminance characteristic, and the durability characteristic were measured in the same manner as in the Example 64. The results are listed in Table 48. As seen from Table 48, the photovoltaic elements (Element No. Examples 76-1 to 76-4) having a layer thickness of the doping layer A of 0.01 to 1 nm exhibit better characteristics, whereby the effects of the present invention are evidenced.

Example 77

A photovoltaic element (Element No. Example 77) was fabricated by forming a reflecting layer, a reflection multiplying layer, an n-type layer, an i-type layer, a p-type layer, a transparent electrode, and a collector electrode on a substrate under the same conditions as Element No. Example 64-5, except that the doping layer A and the doping layer B of the n-type layer were formed under the conditions as indicated in Table 25.

For the fabricated photovoltaic element, the initial characteristics, the low illuminance characteristic, and the durability characteristic were measured in the same manner as in the Example 64, and the results were equivalent to Element No. Example 64-5, whereby the effects of the present invention were evidenced.

Example 78

A photovoltaic element (Element No. Example 78) was fabricated by forming a reflecting layer, a reflection multiplying layer, an n-type layer, an i-type layer, a p-type layer, a transparent electrode, and a collector electrode on a substrate under the same conditions as Element No. Example 64-5, except that the doping layer A and the doping layer B of the p-type layer were formed under the conditions as indicated in Table 26.

For the fabricated photovoltaic element, the initial characteristics, the low illuminance characteristic, and the durability characteristic were measured in the same manner as in Example 64, and the results were equivalent to Element No. Example 64-5, whereby the effects of the present invention were evidenced.

Example 79

A photovoltaic element (Element No. Example 79) was fabricated by forming a reflecting layer, a reflection multiplying layer, an n-type layer, an i-type layer, a p-type layer, a transparent electrode, and a collector electrode on a substrate under the same conditions as Example 72, except that the RF bias of the bias power source 1011 was set at 250 mW/cm$^3$, and the DC bias was set via a coil at 50 V for application to the bias rod 1012, during formation of the i-type layer by microwave plasma CVD.

For the photovoltaic element thus fabricated, the initial characteristics, the low illuminance characteristic, and the durability characteristic were measured in the same manner as in Example 72, and the results were equivalent to those of Example 72, whereby the effects of the present invention were evidenced.

Example 80

A photovoltaic element (Element No. Example 80) was fabricated by forming a reflecting layer, a reflection multiplying layer, an n-type layer, an i-type layer, a p-type layer, a transparent electrode, and a collector electrode on a substrate, under the same conditions as Element No. Example 64-5, except for using a cylinder of D$_2$ gas (not shown) instead of H$_2$ at a flow rate of 300 sccm during formation of the i-type layer by microwave plasma CVD.

For the fabricated photovoltaic element, the initial characteristics, the low illuminance characteristic, and the durability characteristic were measured in the same manner as in the Example 64, and the results were equivalent to those of Element No. Example 64-5.

Also, composition analysis of the photovoltaic element was performed using a secondary ion mass spectrometer, and it was confirmed that D atoms were contained in the i-type layer, whereby the effects of the present invention were evidenced.

Example 81

A photovoltaic element (Element No. Example 81) was fabricated by forming a reflecting layer, a reflection multiplying layer, an n-type layer, an i-type layer, a p-type layer, a transparent electrode, and a collector electrode on a substrate, under the same conditions as those of Element No. Example 64-5, except that the DC bias of bias power source 1011 was changed at a constant rate from 50 V to 80 V when the shutter 1013 was opened, during fabrication of the n-type layer.

For the fabricated photovoltaic element, the initial characteristics, the low illuminance characteristic, and the durability characteristic were measured in the same manner as in Example 64, and the results were equivalent to Element No. Example 64-5, whereby the effects of the present invention were evidenced.

Example 82

Using a deposition apparatus employing the RF plasma CVD method as shown in FIG. 19, an n-type layer and a p-type layer of laminated structure were formed by RF plasma CVD. A photovoltaic element (Element No. Example 82-1) was fabricated under the same fabrication conditions as Example 39 for the n-type layer and the p-type layer, and under the same fabrication conditions as Element No. Example 64-5 for the i-type layers formed by microwave plasma CVD and RF plasma CVD.

For comparison, a photovoltaic element (Element No. Example 82-2) was fabricated by forming a reflecting layer, a reflection multiplying layer, an n-type layer, an i-type layer, a p-type layer, a transparent electrode, and a collector electrode on a substrate under the same conditions as those of Element No. Example 82-1, except that BF$_3$(2000 ppm)/H$_2$ gas and PH$_3$(2000 ppm)/H$_2$ gas were not used, during deposition of the i-type layer by microwave plasma CVD.

For the fabricated photovoltaic elements, the initial characteristics, the low illuminance characteristic, and the durability characteristic were measured in the same manner as in Example 64. From the results, it was determined that the photovoltaic element of Element No. Example 82-1 was 1.04 times better in the open-circuit voltage and 1.03 times better in the fill factor of the initial characteristics, 1.08 times better in the photovoltaic conversion efficiency of the lower illuminance characteristic and 1.07 times better in the decrease in the photovoltaic conversion efficiency (the durability characteristic) that the photovoltaic element of Element No. Example 82-2, whereby the effects of the present invention were evidenced.

Example 83

A photovoltaic element (Element No. Example 83) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the conditions as indicated in Table 28, except that BF$_3$(2000 ppm)/H$_2$ gas was flowed at 0.3 sccm and PH$_3$(2000 ppm)/H$_2$ gas was flowed at 0.5 sccm, during fabrication of the first i-type layer by microwave plasma CVD, with the method of Example 64.

For the photovoltaic element thus fabricated, the initial characteristics, the low illuminance characteristic, and the durability characteristic were measured in the same manner as in Example 64. From the results, it was determined that the photovoltaic element of Element No. Example 83 was 1.03 times better in the open-circuit voltage and 1.04 times better in the fill factor of the initial characteristics, 1.07 times better in the photovoltaic conversion efficiency of the low illuminance characteristic, and 1.07 times better in the decrease in the photovoltaic conversion efficiency (the durability characteristic) than the photovoltaic element of Element No. Example 40, whereby the effects of the present invention were evidenced.

Example 84

A photovoltaic element (Element No. Example 84) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the conditions as indicated in Table 29, except that BF$_3$(2000 ppm)/H$_2$ gas was flowed at 1 sccm and PH$_3$(2000 ppm)/H$_2$ gas was flowed at 0.3 sccm, during deposition of the first i-type layer by microwave plasma CVD, and BF$_3$(2000 ppm)/H$_2$ was flowed at 0.5 sccm and PH$_3$(2000 ppm)/H$_2$ gas was flowed at 0.1 sccm, during deposition of the second i-type layer by microwave plasma CVD, with the same method as Example 64.

For the photovoltaic element thus fabricated, the initial characteristics, the low illuminance characteristic and the durability characteristic were measured in the same manner as Example 64. From the results, it was determined that the photovoltaic element of Element No. Example 84 was 1.03 times better in the open-circuit voltage and 1.03 times better in the fill factor of the initial characteristics, 1.08 times better in the photovoltaic conversion efficiency of the low illuminance characteristic, and 1.07 times better in the decrease in the photovoltaic conversion efficiency (the durability characteristic) than the photovoltaic element of Element No. Example 41, whereby the effects of the present invention were demonstrated.

Example 85

A photovoltaic element (Element No. Example 85) was fabricated by using a multiple chamber separation-type deposition apparatus as shown in FIG. 21. The formation of the photovoltaic element was performed by making each layer under the same conditions as in Example 83, in accordance with Example 42.

For the fabricated photovoltaic element, the initial characteristics, the low illuminance characteristic, and the durability characteristic were measured as in Example 64. From the results, it was determined that the photovoltaic element was 1.01 times better in the open-circuit voltage and 1.02 times better in the fill factor of the initial characteristics, 1.02 times better in the photovoltaic conversion efficiency of the low illuminance characteristic, and 1.02 times better in the decrease in the photovoltaic conversion efficiency (the durability characteristic) than Element No. Example 83, whereby a photovoltaic element having better characteristics could be obtained by fabricating the photovoltaic element of the present invention in the multiple chamber separation-type deposition apparatus. Thus, the effects of the present invention were evidenced.

Example 86

A photovoltaic element was fabricated under the same fabrication conditions as those of Element No. Examples 83 and 40, whereby a solar cell module was formed using the photovoltaic element. A car-mounted ventilation fan having a circuit configuration as shown and using the solar cell module in FIG. 28 was fabricated.

A car with the ventilation fans as fabricated was left in an idling state with the engine running for 168 hours, and then left in sunny weather with the ventilation fan working and with the engine stopped, whereafter the temperature within the car was measured. As a result, the car-mounted ceiling fan using Element No. Example 83 provided an interior temperature three degrees lower than the fan using Element No. Example 40, whereby the effects of the power generation system of the present invention were evidenced.

Example 87

After the preparation for film formation was completed, as in Example 1, on the substrates 1004, 1104, an n-type layer, RF plasma CVD and microwave i-type layers, and a p-type later were formed.

Herein, the film formations up to the n-type layer were performed as in Example 1.

Then, the substrate 1004 was taken out from the deposition chamber 1001, and installed in the deposition chamber 1101 of the RF plasma CD deposition unit 1100 as shown in FIG. 19, where an i-type layer was formed by RF plasma CVD.

To make an i-type layer by RF plasma CVD, the substrate 1104 was heated to 350° C. by the heater 1105, the outflow valves 1041, 1042 and the auxiliary valve 1108 were gradually opened to flow SiH$_4$ gas and H$_2$ gas through a gas introducing pipe 1103 into the deposition chamber 1101. The inflow rates of the gases were regulated by mass flow controllers 1021, 1022 so that the SiH$_4$ gas flow and H$_2$ gas flow were 8 sccm and 100 sccm. The pressure within the deposition chamber 1101 was set to 0.5 Torr by adjusting the conductance valve 1107 while referring to the vacuum gauge 1106.

Thereafter, the output power of an RF power source 1111 was set at 120 mW/cm$^3$, and RF electric power was introduced through the RF matching box 1112 into the cathode 1102 to excite an RF glow discharge to start the fabrication of an i-type layer by RF plasma CVD on the i-type layer made by microwave plasma CVD. Upon depositing an i-type layer having a layer thickness of 10 nm, the RF glow discharge was stopped, and the outflow valves 1041, 1042 and the auxiliary valve 1108 were closed to stop the gas flow into the deposition chamber 1101, whereby the fabrication of the i-type layer was completed.

Then, the substrate 1104 was taken out from the deposition chamber 1101, and installed in the deposition chamber 1001 of the microwave plasma CVD deposition unit 1000 as shown in FIG. 18, where an i-type layer was formed by microwave plasma CVD.

To form an i-type layer by microwave plasma CVD, the substrate 1004 was heated to 350° C. by the heater 1005, the outflow valves 1041, 1042, 1046 and the auxiliary valve 1008 were gradually opened to flow SiH$_4$ gas, H$_2$ gas, and GeH$_4$ gas, respectively, through the gas introducing tube 1003 into the deposition chamber 1001.

The inflow rates of the gases were regulated by mass flow controllers 1021, 1022, 1026 so that the SiH$_4$ gas flow, H$_2$ gas flow, and GeH$_4$ gas flow were 200 sccm, 500 sccm, and 1 sccm. The pressure within the deposition chamber 1001 was set to the value as indicated in Table 2 by adjusting the opening of conductance valve 1007 while referring to the vacuum gauge 1006.

Thereafter, the shutter 1013 was closed, the output power of the microwave power source (not shown) was set at 170 mW/cm$^3$, and microwave power was introduced through a waveguide (not shown), the waveguide portion 1010, and the dielectric window 1002 into the deposition chamber 1001 to excite a microwave glow discharge. Then, the radio frequency (hereinafter abbreviated as "RF") bias of the bias power source 1011 was set at 350 mW/cm$^3$ and the DC bias was set via a coil at 0 V for application to the bias rod 1012. Thereafter, the shutter 1013 was opened to start fabrication of an i-type layer by microwave plasma CVD on the i-type layer formed by RF plasma CVD, while at the same time regulating the SiH$_4$ gas flow and the GeH$_4$ gas flow in accordance with the flow patterns as shown in FIG. 14 by means of the mass flow controllers 1021, 1026. Upon depositing an i-type layer having a layer thickness of 300 nm, shutter 1013 was closed, the output of the microwave power supply was stopped, and outflow valves 1041, 1042, 1046 and auxiliary valve 1008 were closed to stop the gas inflow into deposition chamber 1001.

Subsequently, a p-type layer was fabricated under the same conditions as in Example 1.

The fabrication of the p-type layer on the i-type layer by microwave plasma CVD was started, and upon depositing p-type layer having a layer thickness of 10 nm, the shutter 1013 was closed, the microwave glow discharge was stopped, and the outflow valves 1041 to 1043 and the auxiliary valve 1008 were closed to stop the gas inflow into the deposition chamber 1001, whereby the fabrication of the p-type was completed.

Further, on the p-type layer, a 70 μm-thick ITO (In$_2$O$_3$+SnO$_2$) thin film as the transparent electrode and a 2 μm-thick aluminum (Al) thin film as the collector electrode were vapor deposited in vacuum to fabricate photovoltaic elements (Element No. Examples 87-1 to 87-7, Comparative Example 87-1). The fabrication conditions of the photovoltaic elements as above are listed in Table 49.

The initial characteristics, low illuminance characteristic, and durability characteristic of the fabricated photovoltaic elements were then measured.

The measurement of the initial characteristics was performed in terms of the open-circuit voltage and fill factor obtained by placing the fabricated photovoltaic elements under illumination of AM-1.5 (100 mW/cm$^2$) light and measuring the V-I characteristic. The results are listed in Table 50.

The measurement of the low illuminance characteristic was performed in terms of the photoelectric conversion efficiency obtained by installing the fabricated photovoltaic elements under illumination of AM-1.5 light (10 mW/cm$^2$) and measuring the V-I characteristic. The results of measurement are listed in Table 50.

The measurement of the durability characteristic was performed in terms of the change in the photoelectric conversion efficiency obtained by placing the fabricated photovoltaic elements in the dark at a humidity of 70% and a temperature of 60° C. and then applying vibrations of 1 mm at 3600 rpm for 48 hours. The results of measurement are listed in Table 50.

As seen from Table 50, a photovoltaic element having excellent characteristics is fabricated by making the i-type layer by microwave plasma CVD under a pressure of the deposition chamber 1001 of 50 mTorr or less.

Next, using a substrate of barium borosilicate glass (7059 manufactured by Corning), a microwave plasma CVD i-type layer was formed on the substrate by opening the shutter 1013 for two minutes under the same conditions as the i-type layer formed by microwave plasma CVD in Element No. Example 87-5, except that SiH$_4$ gas flow and GeH$_4$ gas flow and the microwave power were as indicated in Table 51, whereby a sample for the measurement of source gas decomposition efficiency was fabricated (Sample Nos. 87-1 to 87-5).

The film thickness of the fabricated sample for the measurement of source gas decomposition efficiency was measured by a layer thickness measuring instrument (alpha step 100 manufactured by TENCOR INSTRUMENTS) to obtain the decomposition efficiency of the source gas. The results are listed in Table 51.

Then, photovoltaic elements were fabricated (Element No. Examples 87-8 to 87-10 and Comparative Examples 87-2 to 87-3) by forming a reflecting layer, a reflection multiplying layer, an n-type layer, an i-type layer, a p-type layer, a transparent electrode, and a collector electrode on a substrate under the same conditions as those of the photovoltaic element in Element No. Example 87-5, except that the microwave electric power was as indicated in Table 52 during formation of the i-type layer by microwave plasma CVD.

For the fabricated photovoltaic elements, the initial characteristics, the low illuminance characteristic, and the durability characteristic were measured in the same manner as in Element No. Example 87-5. The results are listed in Table 52. As seen from Table 52, a photovoltaic element having excellent characteristics can be obtained by decomposing the source gas with a lower microwave energy than the microwave energy necessary to decompose 100% of the source gas.

Then, photovoltaic elements were fabricated (Element No. Examples 87-11 to 87-14 and Comparative Example 87-4) by forming a reflecting layer, a reflection multiplying layer, an n-type layer, an i-type layer, a p-type layer, a transparent electrode, and a collector electrode on a substrate under the same conditions as those of the photovoltaic element in Element No. Example 87-5, except that the RF bias was as indicated in Table 53 during formation of the i-type layer by microwave plasma CVD.

For the thus fabricated photovoltaic elements, the initial characteristics, the low illuminance characteristic, and the durability characteristic were measured in the same manner as in Element No. Example 87-5. The results are listed in Table 53. As seen from Table 53, a photovoltaic element having excellent characteristics can be obtained by applying a higher RF energy to the source gas than the microwave energy.

Next, using a stainless steel substrate and a barium borosilicate glass (7059 manufactured by Corning) substrate, an i-type layer 1 μm thick was formed on the substrates under the same conditions as the i-type layer formed by microwave plasma CVD in Element No. Example 87-5, except that the SiH$_4$ gas flow and GeH$_4$ gas flow were as indicated in Table 54, whereby a sample for the measurement of the material properties was fabricated (Sample Nos. 87-6 to 87-10).

Further, using a barium borosilicate glass (7059 manufactured by Corning) substrate, an i-type layer 1 μm thick was formed on the substrate under the same conditions as the i-type layer formed by RF plasma CVD in Element No. Example 87-5, whereby another sample for the measurement of material properties was fabricated (Sample No. 87-11).

The bandgap and the composition of the fabricated samples for the measurement of material properties were determined to obtained the relation between the composition ratio of Si to Ge atoms and the bandgap.

The measurement of bandgap was performed as in Example 1 to obtain the bandgap of the i-type layer.

Also, the composition analysis was performed in the same manner as in Example 1 to measure the composition ratio of Si atoms to Ge atoms. The results of bandgap and composition analysis are shown in Table 54.

Then, a photovoltaic element was fabricated (Element No. Comparative Example 87-5) by forming a reflecting layer, a reflection multiplying layer, an n-type layer, an i-type layer, a p-type layer, a transparent electrode, and a collector electrode on the substrate under the same conditions as those of the photovoltaic element in Element No. Example 87-5, except that the SiH$_4$ gas flow and GeH$_4$ gas flow were regulated by the mass flow controllers 1021, 1026 in accordance with the flow patterns as shown in FIG. 14 during formation of the i-type layer by microwave plasma CVD.

For the fabricated photovoltaic element, the initial characteristics, the low illuminance characteristic, and the durability characteristic were measured as in Element. No. Example 87-5. The results indicated that the open-circuit voltage and the fill factor of the initial characteristics, the low illuminance characteristic, and the durability characteristic in Element No. Example 87-5 were, respectively, 1.02 times, 1.03 times, 1.08 times, and 1.07 times better than Element No. Comparative Example 87-5.

Next, the composition analysis in the layer thickness direction of Si and Ge atoms in the i-type layer formed by microwave plasma CVD in Element No. Example 87-5 and Comparative Example 87-5 was performed in the same manner as the previous composition analysis. From the relation between the composition ratio of Si atoms to Ge atoms and the bandgap obtained by Sample Nos. 87-6 to 87-10 as previously described, the variation of the bandgap in the layer thickness direction of the i-type layer formed by microwave plasma CVD was obtained. The results are shown in FIG. 24. As seen from FIG. 24, the photovoltaic element in Element No. Example 87-5 has a minimum value of bandgap at a position shifted toward the interface between the p-type layer and the i-type layer, away from the central position of the i-type layer, while the photovoltaic element in Element No. Comparative Example 87-5 has a minimum value of bandgap at a position shifted toward the interface between the n-type layer and the i-type layer, away from the central position of the i-type layer.

Then, photovoltaic elements were fabricated (Element No. Examples 87-15 to 87-19 and Comparative Example 87-6) by forming a reflecting layer, a reflection multiplying layer, an n-type layer, an i-type layer, a p-type layer, a transparent electrode, and a collector electrode on a substrate under the same conditions as those of the photovoltaic element in Element No. Example 87-5, except that $SiH_4$ gas flow and RF discharge power were as indicated in Table 55 during fabrication of the i-type layer by RF plasma CVD.

For the fabricated photovoltaic elements, the initial characteristics, the low illuminance characteristic, and the durability characteristic were measured in the same manner as in Element No. Example 87-5. The results are listed in Table 55.

Next, using a barium borosilicate glass (7059 manufactured by Corning) substrate, an i-type layer 1 $\mu$m thick was formed on the substrate under the same conditions as the i-type layer formed by RF plasma CVD in Element No. Example 87-5, except that the $SiH_4$ gas flow and the RF discharge power were as indicated in Table 55, whereby samples for the measurement of deposition rate were fabricated (Sample Nos. 87-12 to 87-17). The deposition rate of the fabricated samples was obtained in the same manner as in Sample Nos. 87-1 to 87-5. The results are listed in Table 55.

As seen from Table 55, a photovoltaic element having excellent characteristics is obtained by making the i-type layer by RF plasma CVD at a deposition rate of 2 nm/sec or less.

Then, photovoltaic elements were fabricated (Element No. Examples 87-20 to 87-22 and Comparative Examples 87-7 to 87-8) by forming a reflecting layer, a reflection multiplying layer, an n-type layer, an i-type layer, a p-type layer, a transparent electrode, and a collector electrode on a substrate under the same conditions as in Element No. Example 87-5, except that the layer thickness of the RF plasma CVD i-type layer was as indicated in Table 56.

For the fabricated photovoltaic elements, the initial characteristics, the low illuminance characteristic, and the durability characteristic were measured in the same manner as in Element No. Example 87-5. The results are listed in Table 56. As seen from Table 56, the photovoltaic element provided with a i-type layer formed by RF plasma CVD having a layer thickness of 30 nm or less (Element No. Examples 87-20 to 87-22) has excellent characteristics.

Next, using a single crystal silicon substrate, a 1 $\mu$m thick i-type layer formed by RF plasma CVD was deposited on the substrate under the same conditions as the i-type layer formed by RF plasma CVD in Element No. Example 87-5, except that the RF discharge power was as indicated in Table 57, whereby samples for the measurement of infrared spectrum were fabricated (Sample Nos. 87-18 to 87-22).

Further, using a single crystal silicon substrate, a 1 $\mu$m thick i-type layer formed by microwave plasma CVD was deposited 1 $\mu$m thick on the substrate under the same conditions as the i-type layer formed by microwave plasma CVD in Element No. Example 87-5, whereby a sample for the measurement of the infrared spectrum was fabricated (Sample No. 87-23).

The sample for the measurement of infrared spectrum (Sample Nos. 87-18 to 87-23) was placed in an infrared spectrophotometer (1720-X manufactured by PERKIN ELMER) to obtain the value of the half-width at a peak of 2000 $cm^{-1}$ in the infrared absorption spectrum divided by the height of the peak. The results are in Table 57.

Then, photovoltaic elements were fabricated (Element No. Examples 87-23 to 87-26) by forming a reflecting layer, a reflection multiplying layer, an n-type layer, an i-type layer, a p-type layer: a transparent electrode, and a collector electrode on a substrate under the same conditions as those of the photovoltaic element in Element No. Example 87-5, except that the RF discharge power was as indicated in Table 57 during fabrication of the i-type layer by RF plasma CVD.

For the thus fabricated photovoltaic elements, the initial characteristics, the low illuminance characteristic, and the durability characteristic were measured in the same manner as in Element No. Example 87-5. The results are listed in Table 57. As seen from Table 57, the photovoltaic elements having a greater value of half-width at a peak of 2000 $cm^{-1}$ in the infrared absorption spectrum divided by the height of the peak in the i-type layer formed by RF plasma CVD rather than in the i-type layer formed by microwave plasma CVD have better characteristics.

From the above results, it has been found that the photovoltaic elements (Element No. Examples 87-1 to 87-23) of the present invention have better characteristics than the conventional photovoltaic elements (Element No. Comparative Examples 87-1 to 87-8). The photovoltaic elements of the present invention have been fabricated by a process wherein an i-type layer formed by microwave plasma CVD is deposited at an internal pressure of 50 mTorr or less by applying to the source gas a lower microwave energy and a higher RG energy than the microwave energy necessary to decompose 100% of the source gas. An i-type layer formed by RF plasma CVD is deposited 30 nm thick or less at a deposition rate of 2 nm/sec or less, in such a manner that the bandgap smoothly changes in the direction of layer thickness, and the minimum value of bandgap is at a position shifted toward the interface between the p-type layer and the i-type layer, away from the central position of the i-type layer. Thus, the effects of the present invention have been demonstrated.

Example 88

Photovoltaic elements were fabricated (Element No. Examples 88-1 to 88-8) by forming a reflecting layer, a transparent conductive layer, an n-type layer, an i-type layer, a p-type layer, a transparent electrode, and a collector electrode on a substrate under the same conditions as those of Element No. Example 87-5, except that after the $SiH_4$ gas flow and $GeH_4$ gas flow were regulated by the mass flow patterns as shown in FIG. 14, as in Example 1, the $SiH_4$ gas flow was maintained at 200 sccm and the $GeH_4$ gas flow at 1 sccm. The region of the maximum value of bandgap was made to have a layer thickness as indicated in Table 58 during formation of the i-type layer by microwave plasma CVD.

For the fabricated photovoltaic elements, the initial characteristics, the low illuminance characteristic, and the durability characteristic were measured in the same manner as in Example 1. The results are listed in Table 58. As seen from Table 58, the photovoltaic elements (Element No. Examples 88-1 to 88-7) having a layer thickness of 1 to 30 nm in the region of the maximum value of the bandgap have excellent characteristics, whereby the effects of the present invention have been evidenced.

Example 89

A photovoltaic element was fabricated (Element No. Example 89) by forming a reflecting layer, a transparent conductive layer, an n-type layer, an i-type layer, a p-type layer, a transparent electrode, and a collector electrode on a substrate under the same conditions as Element No. Example 87-5, except that $BF_3$(2000 ppm)/$H_2$ gas and $PH_3$(2000 ppm)/$H_2$ gas were flowed at 0.04 sccm and 0.02 sccm, using cylinder 1077 and cylinder 1078, respectively, during fabrication of the i-type layer by RF plasma CVD.

For the photovoltaic element, the initial characteristics, the low illuminance characteristic, and the durability characteristic were measured in the same manner as in Example 1, and the results were equivalent to those of Element No. Example 87-5.

Also, composition analysis of Element No. Example 89 was performed using a secondary ion mass spectrometer (IMS-3F manufactured by CAMECA), and it was confirmed that B and P atoms were contained in the i-type layer formed by RF plasma CVD.

Example 90

A photovoltaic element was fabricated (Element No. Example 90) by forming a reflecting layer, a reflection multiplying layer, an n-type layer, and i-type layer, a p-type layer, a transparent electrode, and a collector electrode on a substrate under the same conditions as those of Example 89, except for using a cylinder of $AsH_3$ gas diluted to 2000 ppm with $H_2$ gas (hereinafter abbreviated as "$AsH_3/H_2$"), instead of $PH_3$(2000 ppm)/$H_2$ gas at a flow rate of 0.1 sccm during fabrication of the i-type layer by RF plasma CVD.

For the photovoltaic element, the initial characteristics, the low illuminance characteristic, and the durability characteristic were measured in the same manner as in Example 1, and the results were equivalent to those of Element No. Example 89.

Example 91

A photovoltaic element was fabricated (Element No. Example 91) by forming a reflecting layer, a reflection multiplying layer, an n-type layer, an i-type layer, a p-type layer, a transparent electrode, and a collector electrode on a substrate under the same conditions as Element No. Example 87-5, except for using a cylinder of NO/He gas 1079 at a flow rate of 0.5 sccm for the i-type layer formed by microwave plasma CVD and 0.05 sccm for the i-type layer formed by RF plasma CVD.

For the fabricated photovoltaic element, the initial characteristics, the low illuminance characteristic and the durability characteristic were measured in the same manner as in the Example 1, and the results were equivalent to those of Element No. Example 87-5.

Also, composition analysis of Element No. Example 91 was performed using a secondary ion mass spectrometer, and it was confirmed that N and O atoms were contained in the i-type layer.

Example 92

A photovoltaic element was fabricated (Element No. Example 92) by forming a reflecting layer, a reflection multiplying layer, an n-type layer, an i-type layer, a p-type layer, a transparent electrode, and a collector electrode on a substrate under the same conditions as Element No. Example 87-5, except for using a cylinder of $Si_2H_6$ gas at a flow rate of 40 sccm, regulating the flow rate of $SiH_4$ gas by a mass flow controller 1021 in accordance with the flow pattern as shown in FIG. 25A, during fabrication of the i-type layer by microwave plasma CVD.

For the fabricated photovoltaic element, the initial characteristics, the low illuminance characteristic, and the durability characteristic were measured in the same manner as in the Example 1, and the results were equivalent to those of Element No. Example 87-5.

Also, the distribution in the layer thickness direction of Si and hydrogen atoms in the i-type layer of the photovoltaic element was analyzed using a secondary ion mass spectrometer (IMS-3F manufactured by CAMECA). The results are shown in FIG. 25B.

From the above results, it has been found that the photovoltaic element in which the content of hydrogen atoms change corresponding to the content of Si atoms has excellent characteristics, whereby the effects of the present invention have been evidenced.

Example 93

Photovoltaic elements were fabricated (Element No. Examples 93-1 to 93-5) by forming a reflecting layer, a reflection multiplying layer, an n-type layer, an i-type layer, a p-type layer, a transparent electrode, and a collector electrode on a substrate under the same conditions as Element No. Example 87-5, except that the distance between the point of mixing $SiH_4$ gas and $GeH_4$ gas and the deposition chamber 1001 in the source gas supply unit 1020 was set as listed in Table 59.

For the fabricated photovoltaic elements, the initial characteristics, the low illuminance characteristic, and the durability characteristic were measured in the same manner as in Example 1. The results are listed in Table 59. As seen from Table 59, if the distance between the point of mixing $SiH_4$ gas and $GeH_4$ gas and the deposition chamber 1001 is 5 m or less, a photovoltaic element having further improved characteristics can be obtained.

Example 94

A photovoltaic element was fabricated under the same conditions as in Element No. Example 87-5, and using this photovoltaic element, a solar cell module was fabricated, wherefrom an analog clock with a circuit configuration as shown in FIG. 28 was made. In FIG. 28, the electric power generated by a solar cell module 9101 is passed via a reverse current preventing diode 9102 to charge a secondary cell 9104. 9103 is an overcharge preventing diode.

The electric power from the solar cell module 9101 and the secondary cell 9104 is supplied to a drive circuit 9105 of the analog clock.

Comparative Example 88

As a comparative example, a photovoltaic element was fabricated under the same conditions as in Element No. 88-7, and using this photovoltaic element, the same analog clock as in Example 8 was made.

The analog clocks as fabricated in Example 94 and Comparative Example 88 were installed on a wall within a room, and an indoor lamp was lit for 8.5 hours a day. As a result, the analog clock of Example 94 worked the entire day, but the analog clock of the comparative example did not work the entire day, whereby the effects of the power generation system of the present invention were demonstrated.

Example 95

A photovoltaic element was fabricated (Element No. Example 95) by forming a reflecting layer, a reflection multiplying layer, an n-type layer, an i-type layer, a p-type layer, a transparent electrode, and a collector electrode on a substrate under the same conditions as Element No. Example 87-5, except that the flow rates of $SiH_4$ gas and $GeH_4$ gas were regulated by mass flow controllers 1021, 1026 in accordance with the flow patterns as shown in FIG. 26 during fabrication of the i-type layer by microwave plasma CVD.

For the fabricated photovoltaic elements, the initial characteristics, the low illuminance characteristic, and the durability characteristic were measured in the same manner as in Example 1, and the results were equivalent to Element No. Example 87-5, whereby the effects of the present invention were evidenced.

Example 96

A photovoltaic element was fabricated (Element No. Example 96) by forming a reflecting layer, a reflection multiplying layer, an n-type layer, an i-type layer, a p-type layer, a transparent electrode, and a collector electrode on a substrate under the same conditions as Element No. Example 87-5, except for using a cylinder of $B_2H_6$ gas diluted to 1% with $H_2$ gas (hereinafter abbreviated as "$B_2H_6(1\%)/H_2$") instead of $BF_3(2000$ ppm$)/H_2$ gas, at a flow rate of 0.05 sccm during deposition of the i-type layer by RF plasma CVD.

For the fabricated photovoltaic elements, the initial characteristics, the low illuminance characteristic, and the durability characteristic were measured in the same manner as in the Example 1, and the results were equivalent to Element No. Example 87-5, whereby the effects of the present invention were evidenced.

Example 97

A photovoltaic element was fabricated (Element No. Example 97) by forming a reflecting layer, a reflection multiplying layer, an n-type layer, an i-type layer, a p-type layer, a transparent electrode, and a collector electrode on a substrate under the same conditions as Element No. Example 87-5, except that the flow rate of NO/He gas was regulated by a mass flow controller 1029 in accordance with the flow pattern as shown in FIGS. 33A and 33B during formation of the i-type layer by microwave plasma CVD.

For the fabricated photovoltaic element, the initial characteristics, the low illuminance characteristics, and the durability characteristic were measured in the same manner as in the Example 1, and the results were equivalent to Element No. Example 87-5.

The distribution in the layer thickness direction of N and O atoms in the i-type layer of the photovoltaic element was analyzed using a secondary ion mass spectrometer. The results are in FIGS. 33A and 33B. From the above results, the effects of the present invention were demonstrated.

Example 98

Figure 37:
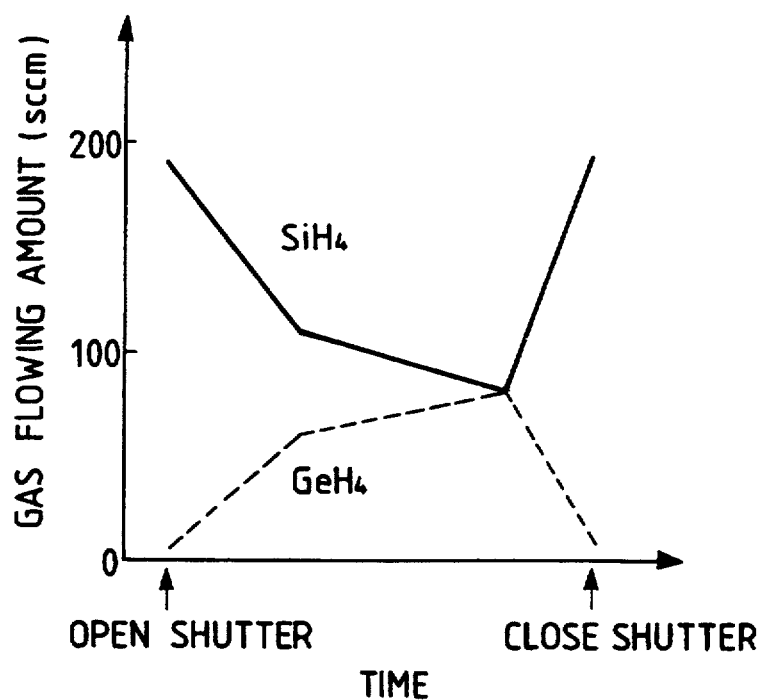

A photovoltaic element was fabricated (Element No. Example 98) by forming a reflecting layer, a reflection multiplying layer, an n-type layer, an i-type layer, a p-type layer, a transparent electrode, and a collector electrode on a substrate under the same conditions as Element No. Example 87-5, except that the flow rates of $SiH_4$ gas and $GeH_4$ gas were regulated by mass flow controllers 1021, 1026 in accordance with the flow patterns as shown in FIG. 37 during formation of the i-type layer by microwave plasma CVD.

For the fabricated photovoltaic element, the initial characteristics, the low illuminance characteristic, and the durability characteristic were measured in the same manner as in Example 1, and the results were equivalent to Element No. Example 87-5, whereby the effects of the present invention were evidenced.

Example 99

A photovoltaic element was fabricated (Element No. Example 99) by forming a reflecting layer, a reflection multiplying layer, an n-type layer, an i-type layer, a p-type layer, a transparent electrode, and a collector electrode on a substrate under the same conditions as those of Example 95, except that the RF bias of the bias power source 1011 was set at 250 mW/cm$^3$, and the DC bias was set via a coil at 50 V for application to the bias rod 1012 during deposition of the i-type layer by microwave plasma CVD.

For the fabricated photovoltaic element, the initial characteristics, the low illuminance characteristic, and the durability characteristic were measured in the same manner as in Example 95, and the results were equivalent to those of the Example 95, whereby the effects of the present invention were evidenced.

Example 100

A photovoltaic element was fabricated (Element No. Example 100) by forming a reflecting layer, a reflection multiplying layer, an n-type layer, an i-type layer, a p-type layer, a transparent electrode, and a collector electrode on a substrate under the same conditions as Element No. Example 87-5, except for using a cylinder of $D_2$ gas (not shown) instead of $H_2$ at flow rate of 300 sccm during formation of the i-type layer by RF plasma CVD.

For the fabricated photovoltaic elements, the initial characteristics, the low illuminance characteristic, and the durability characteristic were measured in the same manner as in the Example 1, and the results were equivalent to those of Element No. Example 87-5.

Also, the composition of the photovoltaic element was performed using a secondary ion mass spectrometer, and it was confirmed that D atoms were contained in the i-type layer, whereby the effects of the present invention were demonstrated.

Example 101

A photovoltaic element was fabricated (Element No. Example 101) by forming a reflecting layer, a reflection multiplying layer, an n-type layer, an i-type layer, a p-type layer, a transparent electrode, and a collector electrode on a substrate under the same conditions as Element No. Example 87-5, except that the DC bias of the bias power source 1011 was changed at a constant rate from 50 V to 80 V when the shutter 1013 was opened during deposition of the n-type layer.

For the fabricated photovoltaic element, the initial characteristics, the low illuminance characteristic, and the durability characteristic were measured in the same manner as in Example 1, and the results were equivalent to Element No. Example 87-5, whereby the effects of the present invention were evidenced.

Example 102

Using an RF plasma CVD manufacturing apparatus as shown in FIG. 19, an n-type layer and a p-type layer of a photovoltaic element of the present invention were fabricated by the same procedure as that for the i-type layer formed by RF plasma CVD of Example 87.

To make the n-type layer, the substrate 1104 was heated to 350° C. by the heater 1105, the outflow valves 1042, 1044, 1045 and the auxiliary valve 1108 were gradually opened to flow $H_2$ gas, $PH_3(1\%)/H_2$ gas and $Si_2H_6$ gas through the gas introducing pipe 1103 into the deposition chamber 1101. The inflow rates of the gases were regulated by mass flow controllers 1022, 1024, 1025 so that the $H_2$ gas flow, the $PH_3(1\%)/H_2$ gas flow, and the $Si_2H_6$ gas flow were 50 sccm, 5 sccm, and 3 sccm. The pressure within the deposition chamber 1101 was set at 1 Torr by adjusting the conductance valve 1107 while referring to the vacuum gauge 1106.

Thereafter, the output power of RF power source 1111 was set at 120 mW/cm$^2$, and RF electric power was introduced through the RF matching box 1112 into the cathode 1102 to excite an RF glow discharge to start the formation of the n-type layer on the substrate 1104. Upon forming an n-type layer having a thickness of 10 nm, the RF glow discharge was stopped, and the outflow valves 1042, 1044, 1045 and the auxiliary valve 1108 were closed to stop the gas inflow into the deposition chamber 1101, whereby the formation of the n-type layer was completed.

Then, an RF plasma CVD i-type layer was formed on the n-type layer under the same conditions as those of Element No. Example 87-5.

Then, the substrate 1104 having the i-type layer formed by RF plasma CVD thereon was taken out from the deposition chamber 1101, and placed in the microwave plasma CVD deposition apparatus 1000 as used in Example 87, where an i-type layer was deposited on the i-type layer formed by RF plasma CVD under the same conditions as those of Element No. Example 87-5.

Substrate 1004 having the i-type layer formed by microwave plasma CVD thereon was taken out from the deposition chamber 1000, and installed in the RF plasma CVD deposition apparatus 1100, as previously described, where a p-type layer was made on the i-type layer by RF plasma CVD.

To make the p-type layer, the substrate 1104 was heated to 200° C. by the heater 1105, the outflow valves 1041 to 1043 and the auxiliary valve 1108 were gradually opened to flow $SiH_4$ gas, $H_2$ gas, and $BF_3(1\%)/H_2$ gas through the gas introducing tube 1103 into the deposition chamber 1101. The inflow rates of those gases were regulated by mass flow controllers 1021 to 1023 so that the $SiH_4$ gas flow, $H_2$ gas flow, and $BF_3(1\%)/H_2$ gas flow were 0.5 sccm, 100 sccm and 1 sccm. The opening of conductance valve 1107 was adjusted by referring to the vacuum gauge 1106 so that the pressure within the deposition chamber 1101 was 1 Torr.

Thereafter, the output power of RF power source 1211 was set at 2 mW/cm$^2$, and RF electric power was introduced through the RF matching box 1112 into the cathode 1102 to excite an RF glow discharge to start the formation of the p-type layer on the i-type layer. Upon forming the p-type layer 5 nm thick, the RF glow discharge was stopped, and outflow valves 1041 to 1043 and the auxiliary valve 1108 were closed to stop the gas inflow into the deposition chamber 1001, whereby the formation of the p-type layer was completed.

Next, on the p-type layer, a transparent electrode and a collector electrode were vapor deposited to fabricate a photovoltaic element (Element No. Example 102). The fabrication conditions for the photovoltaic element as described above are listed in Table 61.

Comparative Example 89

A photovoltaic element was fabricated (Element No. Comparative Example 89) by forming a reflecting layer, a reflection multiplying layer, an n-type layer, an i-type layer, a p-type layer, a transparent electrode, and a collector electrode on a substrate under the same conditions as those of Element No. Example 102, except that the RF plasma CVD i-type layer was not formed.

For the fabricated photovoltaic elements (Element No. Example 102 and Comparative Example 89), the initial characteristics, the low illuminance characteristic, and the durability characteristic were measured in the same manner as in Example 1. From the measurements, it was demonstrated that the photovoltaic element of Element No. Example 102 was superior to Comparative Example 89, such that the open-circuit voltage and the fill factor of the initial characteristics, the photoelectric conversion efficiency of the low illuminance characteristic, and the decrease in the photoelectric conversion efficiency (the durability characteristic) were 1.04 times, 1.03 times, 1.8 times, and 1.09 times better, respectively. Thus, the effects of the present invention were evidenced.

Example 103

A photovoltaic element was fabricated (Element No. Example 103) by forming a reflecting layer, a reflection multiplying layer, a first n-type layer, a first i-type layer, a first p-type layer, a second n-type layer, a second i-type layer, a second p-type layer, a transparent electrode, and a collector electrode on the substrate under the conditions of Table 62, with the same method as in Example 1.

Comparative Example 90

A photovoltaic element was fabricated (Element No. Comparative Example 90) by forming a reflecting layer, a reflection multiplying layer, a first n-type layer, a first i-type layer, a first p-type layer, a second n-type layer, a second i-type layer, a second p-type layer, a transparent electrode, and a collector electrode on the substrate under the conditions as those of Example 103, except that the first i-type layer 1 and RF plasma CVD i-type layer 2 were not made.

For the fabricated photovoltaic elements (Element No. Example 103 and Comparative Example 90) the initial characteristics, the low illuminance characteristic, and the durability characteristic were measured as in Example 1. From the measurements, it was demonstrated that the photovoltaic element of Element No. Example 103 was superior to that of Comparative Example 90, such that the open-circuit voltage and the fill factor of the initial characteristics, the photoelectric conversion efficiency of the low illuminance characteristic, and the decrease in the photoelectric conversion efficiency (the durability characteristic) were 1.03 times, 1.03 times, 1.08 times and 1.10 times better, respectively. Thus, the effects of the present invention were evidenced.

Example 104

A photovoltaic element was fabricated (Element No. Example 104) by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the conditions of Table 63, with the same method as in Example 1.

Comparative Example 91

A photovoltaic element was fabricated (Element No. Comparative Example 91) by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as above, except that the first i-type layer and the second i-type layer 1 and RF plasma CVD i-type layer 2 were not made.

For the fabricated photovoltaic elements (Element No. Example 104 and Comparative Example 91), the initial characteristics, the low illuminance characteristic, and the durability characteristic were measured as in Example 1. From the measurements, it was shown that the photovoltaic element of Element No. Example 104 was superior to Comparative Example 91, such that the open-circuit voltage and fill factor of the initial characteristics, the photoelectric conversion efficiency of the low illuminance characteristics, and the decrease in the photoelectric conversion efficiency (the durability characteristic) were 1.03 times, 1.03 times, 1.09 times and 1.07 times better, respectively. Thus, the effects of the present invention were shown.

Example 105

Using the multiple chamber separation-type deposition apparatus of FIG. 22, a photovoltaic element of the present invention was fabricated. In the figure, 21201 and 21210 are a load chamber and an unload chamber, respectively, 21202, 21203, 21205 to 21207, and 21209 are chambers for the deposition of layers by RF plasma CVD as in Example 102, 21204 and 21208 are chambers for the deposition of layers by microwave plasma CVD as in Example 87, 21211 to 21219 are gate valves for separating one chamber form the other, 21221, 21222, 21224 to 21226 and 21228 are cathode electrodes, and 21223 and 21227 are, respectively, a waveguide portion for microwaves and a dielectric window.

First, the substrate was installed in the load chamber 21201, and the load chamber 21201 was evacuated of air. Thereafter, gate valve 21211 was opened, the substrate was moved to a first n-type layer deposition chamber 21202, and gate valve 21211 was closed. Next, the first n-type layer was formed on the substrate under the same conditions as those of the first n-type layer of Example 103. Then, gate valve 21212 was opened, the substrate was moved to a first RF plasma CVD i-type layer deposition chamber 21203, and gate valve 21212 was closed. Next, a first RF plasma CVD i-type layer 1 was formed on the first n-type layer under the same conditions as those of the first RF plasma CVD i-type layer 1 of Example 103. Next, gate valve 21213 was opened, the substrate was moved to a first microwave plasma CVD i-type layer deposition chamber 21204, and gate valve 21213 was closed. Next, a first microwave plasma CVD i-type layer was formed on the first i-type layer 1 formed by RF plasma CVD under the same conditions as those of the first i-type layer formed by microwave plasma CVD of-Example 103. Then, gate valve 21214 was opened, the substrate was moved to a first RF plasma CVD i-type layer deposition chamber 21205, and gate valve 21214 was closed. Next, a first RF plasma CVD i-type layer 2 was formed on the first i-type layer by microwave plasma CVD under the same conditions as those of the first i-type layer 2 formed by RF plasma CVD of Example 103.

Then, gate valve 21215 was opened, the substrate was moved to a first p-type layer deposition chamber 21206, and gate valve 21215 was closed. Next, a first p-type layer was formed on the first i-type layer 2 by RF plasma CVD under the same conditions as those of the first p-type layer of Example 103. Then, gate valve 21216 was opened, the substrate was moved to a second n-type layer deposition chamber 21207, and gate valve 21216 was closed. Next, a second n-type layer was formed on the first p-type layer under the same conditions as those of the second n-type layer of Example 103. Next, gate valve 21217 was opened, the substrate was moved to a second i-type layer deposition chamber 21208, and gate valve 21217 was closed. Next, a second i-type layer was formed on the second n-type layer under the same conditions as those of the second i-type layer of Example 103. Then, gate valve 21218 was opened, the substrate was moved to a second p-type layer deposition chamber 21209, and gate valve 21218 was closed. Next, a second p-type layer was formed on the second i-type layer under the same conditions as those of the second p-type layer of Example 103. Then, gate valve 21219 was opened, the substrate was moved to an unload chamber 21210, and gate valve 21219 was closed. Then, the substrate was taken out from unload chamber 21210, whereby the photovoltaic element fabrication was completed (Element No. Example 105).

For the fabricated photovoltaic element, the initial characteristics, the low illuminance characteristic, and the durability characteristic were measured as in Example 1. From the measurements, it was found that the photovoltaic element was superior to that of Element No. Example 103, such that the open-circuit voltage and the fill factor of the initial characteristics, the photoelectric conversion efficiency of the low illuminance characteristic, and the decrease in the photoelectric conversion efficiency (the durability characteristic) were 1.01 times, 1.02 times, 1.03 times and 1.02 times better, respectively. Therefore, it has been shown that a photovoltaic element of the present invention exhibits better characteristics by fabricating it in a multiple chamber separation-type deposition chamber. Thus, the effects of the present invention were evidenced.

Example 106

A photovoltaic element was fabricated under the same conditions as those of Example 103, and using the photovoltaic element, a solar cell module was fabricated to make a car-mounted ventilation fan having a circuit configuration as shown in FIG. 28. In FIG. 28, the electric power generated by the solar cell module 9101 which is bonded to the bonnet of the car is charged through a reverse-current preventing diode 9102 into a secondary cell 9104. 9103 is an overcharge preventing diode. The electric power from the solar cell module 9101 and the secondary cell 9104 is supplied to a motor 9105 for a ventilation fan.

Comparative Example 92

As a comparative example, a photovoltaic element was fabricated under the same conditions as those of Comparative Example 90, and a car-mounted ventilation fan similar to that of the Example 106 was made using the photovoltaic element.

A car mounted with the car-mounted ventilation fans as fabricated in Example 106 and Comparative Example 92 was left in an idling state with the engine running for 168 hours, and then left in sunny weather with the ventilation fan working and with the engine stopped, whereafter the temperature within the car was measured. As a result, the car-mounted cooling fan of Example 106 achieved an interior temperature three degrees lower than the fan of Comparative Example 92, whereby the effects of the power generation system of the present invention were evidenced.

Example 107

Using a microwave plasma CVD manufacturing apparatus comprising a source gas supply unit 1020 and a deposition unit 1000 as shown in FIG. 18 and an RF plasma CVD manufacturing apparatus with the RF plasma CVD method comprising a source gas supply unit 1020 and a deposition unit 1100 as shown in FIG. 19, a photovoltaic element of the present invention was fabricated. In this example, B and P atoms were doped into the i-type layer formed by microwave plasma CVD.

On a substrate, a reflecting layer, a reflection multiplying layer, and a n-type layer were formed under the same conditions as those of Element No. Example 87-5 of Example 87, and subsequently, the formation of i-type layers by RF plasma CVD and microwave plasma CVD was performed in the following manner.

The substrate 1004 was placed in the deposition chamber 1101 of the RF plasma CVD deposition unit 1100 of FIG. 19, where an RF plasma CVD i-type layer was formed.

To form the i-type layer by RF plasma CVD, the substrate 1104 was heated to 350° C. by the heater 1105, the outflow valves 1041, 1042, 1047, 1048 and the auxiliary valves 1008 were gradually opened to flow $SiH_4$ gas, $H_2$ gas, $BF_3$(2000 ppm)/$H_2$ gas, and $PH_3$(2000 ppm)/$H_2$ through the gas introducing tube 1103 into the deposition chamber 1101. The inflow rates of the gases were regulated by mass flow controllers 1021, 1022, 1027, 1028 so that the $SiH_4$ gas, $H_2$ gas, $BF_3$(2000 ppm)/$H_2$ gas, and $PH_3$(2000 ppm)/$H_2$ gas flow were 8 sccm, 100 sccm, 0.04 sccm and 1 sccm. The pressure within the deposition chamber 1101 was set to 0.5 Torr by adjusting the opening of conductance valve 1107 while referring to the vacuum gauge 1106.

Thereafter, the output power of RF power source 1111 was set at 120 mW/cm$^3$, and RF electric power was introduced through RF matching box 1112 to cathode 1102 to excite an RF glow discharge to start fabrication of an i-type layer by RF plasma CVD on the n-type layer. Upon making the i-type layer 10 nm thick, the RF glow discharge was stopped, and outflow valves 1041, 1042, and auxiliary valve 1108 were closed to stop the gas inflow into deposition chamber 1101, whereby the formation of the i-type layer was completed.

Then, the substrate 1104 was taken out from the deposition chamber 1101, and placed in the deposition chamber 1001 of the microwave plasma CVD deposition unit 1000 as shown in FIG. 18, where microwave plasma CVD i-type layer was formed.

To form the i-type layer by microwave plasma CVD, the substrate 1004 was heated to 350° C. by the heater 1005, the outflow valves 1041, 1042, 1046 to 1048 and the auxiliary valve 1008 were gradually opened to flow $SiH_4$ gas, $H_2$ gas, $GeH_4$ gas, $BF_3$(2000 ppm)/$H_2$ gas, and $PH_3$(2000 ppm)/$H_2$ gas through the gas introducing pipe 1003 into the deposition chamber 1001. The inflow rates of the gases were regulated by mass flow controllers 1021, 1022, 1026 to 1028 so that the $SiH_4$ gas flow, $H_2$ gas flow, $GeH_4$ gas flow, $BF_3$(2000 ppm)/$H_2$ gas flow, and $PH_3$(2000 ppm)/$H_2$ gas flow were 200 sccm, 500 sccm, 1 sccm, 0.2 sccm and 0.1 sccm. The pressure within the deposition chamber 1001 was set to the values in Table 16 by adjusting the opening of conductance valve 1007 while referring to the vacuum gauge 1006.

Then, shutter 1013 was closed, the output power of a microwave power source (not shown) was set at 170 mW/cm$^3$, and microwave power was introduced through a waveguide (not shown), the waveguide portion 1010, and the dielectric window 1002 into the deposition chamber 1001 to excite a microwave glow discharge. Then, the RF bias of bias power source 1011 was set at 350 mW/cm$^3$, and the DC bias was set via a coil at 0 V, and applied to the bias rod 1012. Thereafter, the shutter 1013 was opened to start fabrication of an i-type layer by microwave plasma CVD on the i-type layer formed by RF plasma CVD, while at the same time regulating the $SiH_4$ gas flow and the $GeH_4$ gas flow in accordance with the flow patterns as indicated in FIG. 14, by means of the mass flow controllers 1021, 1026. Upon forming an i-type layer having a layer thickness of 300 nm, the shutter 1013 was closed, the output of bias power source 1011 was turned off, the microwave glow discharge was stopped, and the outflow valves 1041, 1042, 1046 and the auxiliary valve 1008 were closed to stop the gas flow into the deposition chamber 1001.

Subsequently, a p-type layer was formed on the i-type layer by RF plasma CVD under the same conditions as those of Example 1. Further, on the p-type layer, a 70 μm-thick ITO (In$_2$O$_3$+SnO$_2$) thin film as the transparent electrode and a 2 μm-thick aluminum (Al) thin film as the collector electrode were vapor deposited in vacuum to fabricate photovoltaic elements (Element No. Examples 107-1 to 107-7 and Comparative Example 93-1).

The initial characteristics, low illuminance characteristics and durability characteristic were measured for the fabricated photovoltaic elements. The results are listed in Table 64. As seen from Table 64, a photovoltaic element having excellent characteristics can be fabricated by forming the i-type layer by microwave plasma CVD with the pressure of the deposition chamber 1001 being 50 mTorr or less.

Next, using a substrate made of barium borosilicate glass (7059 manufactured by Corning), an i-type layer formed by microwave plasma CVD was deposited on the substrate by opening the shutter 1013 for two minutes under the same fabrication conditions as the i-type layer formed by microwave plasma CVD in Element No. Example 107-5, except that SiH$_4$ gas flow and the microwave power were as indicated in Table 51, whereby the decomposition efficiency of the source gas was obtained in accordance with the layer thickness, and the same results of Table 51 were obtained.

Then, photovoltaic elements (Element No. Examples 107-8 to 107-10 and Comparative Examples 93-2 to 93-3) were fabricated by forming a reflecting layer, a reflection multiplying layer, an n-type layer, an i-type layer, a p-type layer, a transparent electrode, and a collector electrode on a substrate under the same conditions as those of the photovoltaic element in Element No. Example 107-5, except that the microwave power was as indicated in Table 65, during fabrication of i-type layer by microwave plasma CVD.

For the fabricated photovoltaic elements, the initial characteristics, the low illuminance characteristic, and the durability characteristic were measured in the same manner as in Element No. Example 107-5. The results are listed in Table 65. As seen from Table 65, a photovoltaic element having excellent characteristics can be obtained by decomposing the source gas with a lower microwave energy then the microwave energy necessary to decompose 100% of the source gas.

Then, photovoltaic elements (Element No. Examples 107-11 to 107-14 and Comparative Example 93-4) were fabricated by forming a reflecting layer, a reflection multiplying layer, an n-type layer, an i-type layer, a p-type layer, a transparent electrode, and a collector electrode a substrate under the same conditions as those of the photovoltaic element in Element No. Example 107-5, except that the RF bias was as indicated in Table 66 during formation of the i-type layer by microwave plasma CVD.

For the thus fabricated photovoltaic elements, the initial characteristics, the low illuminance characteristic and the durability characteristic were measured in the same manner as in Element No. Example 107-5. The results are listed in Table 66. As seen from Table 66, a photovoltaic element having excellent characteristics can be obtained by applying a higher RF energy to the source gas than the microwave energy.

Next, using a stainless steel substrate, a 1 μm thick i-type layer was formed on the substrate under the same conditions as the i-type layer formed by microwave plasma CVD in Element No. Example 107-5, except that the SiH$_4$ gas flow and GeH$_4$ gas flow were as shown in Table 57, whereby a sample for the measurement of material was fabricated. Further, using a barium borosilicate glass (7059 manufactured by Corning) substrate, a 1 μm thick i-type layer was formed on the substrate under the same conditions as the i-type layer by RF plasma CVD in Element No. Example 107-5, whereby a sample for the measurement of material was fabricated.

The bandgap and the composition analysis of the fabricated samples for the measurement of material properties were conducted to obtain the relation between the composition ratio of Si to Ge atoms and the bandgap, with the same results as in Table 57.

Then, a photovoltaic element was fabricated (Element No. Comparative Example 93-5) by forming a reflecting layer, a reflection multiplying layer, an n-type layer, an i-type layer, a p-type layer, a transparent electrode, and a collector electrode on a substrate under the same conditions as those of the photovoltaic element in Element No. Example 107-5, except that the SiH$_4$ gas flow and GeH$_4$ gas flow were regulated by the mass flow controllers 1021, 1026 in accordance with the flow patterns as shown in FIG. 14 during fabrication of the i-type layer by microwave plasma CVD.

For the thus fabricated photovoltaic element, the initial characteristics, the low illuminance characteristic, and the durability characteristic were measured in the same manner as in Element No. Example 107-5. The results indicated that the open-circuit voltage and the fill factor in the initial characteristics, the low illuminance characteristic, and the durability characteristic of Element No. Example 107-5 were 1.02 times, 1.03 times, 1.09 times, and 1.07 times better, respectively, than those in Element No. Comparative Example 93-5.

Further, the composition analysis in the layer thickness direction of Si atoms and Ge atoms in the i-type layer formed by microwave plasma CVD in Element No. Example 107-5 and Comparative Example 93-5 was performed in the same manner as the previous composition analysis. It was found that the photovoltaic element in Element No. Example 107-5 has a minimum value of bandgap at a position shifted toward the interface between the p-type layer and the i-type layer, away from the central position of the i-type layer, while the photovoltaic element in Comparative Example 93-5 has a minimum value of bandgap at a position shifted toward the interface between the n-type layer and the i-type layer, away from the central position of the i-type layer.

For comparison, a photovoltaic element was fabricated (Element No. Example 107-15) by forming a reflecting layer, a reflection multiplying layer, an n-type layer, an i-type layer, a p-type layer, a transparent electrode, and a collector electrode on a substrate under the same conditions as those of the photovoltaic element in Element No. Example 107-5, except that BF$_3$(2000 ppm)/H$_2$ gas and PH$_3$(2000 ppm)/H$_2$ gas were not flowed during fabrication of the i-type layer by microwave plasma CVD.

For the thus fabricated photovoltaic element, the initial characteristics, the low illuminance characteristic, and the durability characteristic were measured in the same manner as in Element No. Example 107-5. From the results, it was found that the photovoltaic element of Element No. Example 107-5 was superior to that of Element No. Example 107-15, in that the open-circuit voltage and the fill factor of the initial characteristics, the low illuminance characteristic, and the durability characteristic were 1.02 times, 1.03 times, 1.09 times, and 1.07 times better.

Composition analysis of the photovoltaic element of Element No. Example 107-5 was performed using a secondary ion mass spectrometer, and it was confirmed that B and P atoms were contained in the i-type layer.

Then, photovoltaic elements were fabricated (Element No. Examples 107-16 to 107-20 and Comparative Example 93-6) by forming a reflecting layer, a reflection multiplying layer, an n-type layer, an i-type layer, a p-type layer, a transparent electrode and a collector electrode on a substrate under the same conditions as those of the photovoltaic element in Element No. Example 107-5, except that the SiH$_4$ gas flow and the RF discharge power were as indicated in Table 67 during formation of the i-type layer by RF plasma CVD.

For the fabricated photovoltaic elements, the initial characteristics, the low illuminance characteristic, and the durability characteristic were measured in the same manner as in Element No. Example 107-5. The results are listed in Table 67. As seen from Table 67, a photovoltaic element having excellent characteristics can be fabricated by making the i-type layer by RF plasma CVD at a deposition rate of 2 nm/sec or less.

Then, photovoltaic elements were fabricated (Element No. Examples 107-21 to 107-23 and Comparative Examples 93-7 to 93-8) by forming a reflecting layer, a reflection multiplying layer, an n-type layer, an i-type layer, a p-type layer, a transparent electrode, and a collector electrode on substrates under the same conditions as in Element No. Example 107-5, except that the layer thickness of the i-type layer was as indicated in Table 68 during fabrication of the i-type layer by RF plasma CVD.

For the fabricated photovoltaic elements, the initial characteristics, the low illuminance characteristic, and the durability characteristic were measured in the same manner as in Element No. Example 107-5. The results are listed in Table 68. As seen from Table 68, the photovoltaic elements (Element Nos. Example 107-21 to 107-23) provided with the i-type layer formed by RF plasma CVD and having a layer thickness of 30 nm or less have excellent characteristics.

Then, photovoltaic elements were fabricated (Element No. Example 107-24 to 107-27) by forming a reflecting layer, a reflection multiplying layer, an n-type layer, an i-type layer, a p-type layer, a transparent electrode, and a collector electrode on a substrate under the same conditions as the photovoltaic element in Element No. Example 107-5, except that the RF discharge power was as indicated in Table 69 during formation of the i-type layer by RF plasma CVD.

For the fabricated photovoltaic elements, the initial characteristics, the low illuminance characteristic, and the durability characteristic were measured as in Element No. Example 107-5. The results are listed in Table 69. As seen in Table 69, a photovoltaic element having a greater value of half-width of a peak of $2000^{-1}$ in the infrared absorption spectrum divided by the height of peak in the i-type layer formed by RF plasma CVD has better characteristics.

From the above results, it has been found that the photovoltaic elements of the present invention have better characteristics than the conventional photovoltaic elements. The photovoltaic elements of the present invention have been fabricated by a process wherein an i-type layer is formed by microwave plasma CVD at an internal pressure of 50 m Torr less by applying to the source gas a lower microwave energy and a higher RF energy than the microwave energy necessary to decompose 100% of the source gas and a 30 nm or less thick i-type layer formed by RF plasma CVD is deposited at a dependent rate of 2 nm/sec or less. The bandgap smoothly changes in the direction of layer thickness, and the minimum value of bandgap occurs at a position shifted toward the interference between the p-type layer and the i-type layer, away from the central position of the i-type layer, wherein a valance electron control agent serving as a donor and an acceptor is doped in the i-type layer. Thus, the effects of the present invention have been demonstrated.

Example 108

Photovoltaic elements (Element No. Examples 108-1 to 108-8) were fabricated in such a manner as to form a reflecting layer, a reflection multiplying layer, an n-type layer, an i-type layer, a p-type layer, a transparent electrode, and a collector electrode on a substrate under the same conditions as Element No. Example 107-5, except that after the SiH$_4$ gas flow and the GeH$_4$ gas flow were regulated by mass flow controllers 1021, 1026 in accordance with the flow patterns as shown in FIG. 14, as conducted in Example 1. The SiH$_4$ gas flow was maintained at 200 sccm and the GeH$_4$ gas flow at 1 sccm, and the region of the maximum bandgap had a layer thickness as indicated in Table 70, in making the i-type layer by microwave plasma CVD.

For the fabricated photovoltaic elements, the initial characteristics, the low illuminance characteristic, and the durability characteristic were measured as in Example 107. The results are listed in Table 70. As will be seen from Table 70, the photovoltaic elements (Element No. Examples 108-1 to 108-7) having a layer thickness of 1 to 30 nm in the region of the maximum bandgap exhibit better characteristics, whereby the effects of the present invention have been evidenced.

Example 109

A photovoltaic element (Element No. Example 109) was fabricated by forming a reflecting layer, a reflection multiplying layer, an n-type layer, an i-type layer, a p-type layer, a transparent electrode, and a collector electrode on a substrate under the same conditions as Element No. Example 107-5, except for using a cylinder of AsH$_3$/H$_2$ gas instead of PH$_3$(2000 ppm)/H$_2$ gas, at a flow rate of 0.2 sccm for the i-type layer formed by microwave plasma CVD, and 0.5 sccm for the i-type layer formed by RF plasma CVD, during deposition of the i-type layers by microwave plasma CVD and RF plasma CVD.

For the fabricated photovoltaic element, the initial characteristics, the low illuminance characteristic, and the durability characteristic were measured in the same manner as in Example 107, and the results were equivalent to those of Element No. Example 107-5.

Example 110

A photovoltaic element (Element No. Example 110) was fabricated by forming a reflecting layer, a reflection multiplying layer, an n-type layer, an i-type layer, a p-type layer, a transparent electrode, and a collector electrode on a substrate under the same conditions as Element No. Example 107-5, except that the BF$_3$(2000 pm)/H$_2$ gas flow and the PH$_3$(2000 ppm)/H$_2$ gas flow were regulated in accordance with the flow patterns as shown in FIGS. 41 and 42 by the mass flow controllers

1027, 1028, during formation of the i-type layer by microwave plasma CVD. The $BF_3$(2000 ppm)/$H_2$ gas flow and the $PH_3$(2000 ppm)/$H_2$ gas flow were 0.06 sccm and 2 sccm, during formation of the i-type layer by RF plasma CVD.

For the photovoltaic element, the initial characteristics, the low illuminance characteristic and the durability characteristic were measured in the same manner as in the Example 107, and the results were equivalent to those of Element No. Example 107-5.

Also, the distribution of B and P atoms in the i-type layer of the photovoltaic element was analyzed using a secondary ion mass spectrometer. The results are shown in FIGS. 43 and 44. From the above results, the effects of the present invention were evidenced.

Example 111

A photovoltaic element (Element No. Example 111) was fabricated by forming a reflecting layer, a reflection multiplying layer, an n-type layer, an i-type layer, a p-type layer, a transparent electrode, and a collector electrode on a substrate under the same conditions as Element No. Example 107-5, except for using a cylinder of NO/He gas 1079 at a flow rate of 0.5 sccm for the i-type layer formed by microwave plasma CVD and 0.05 sccm for the i-type layer formed by RF plasma CVD.

For the fabricated photovoltaic element, the initial characteristics, the low illuminance characteristics and the durability characteristic were measured in the same manner as in Example 107, and the results were equivalent to those of Element No. Example 107-5.

Also, composition analysis of the photovoltaic element of the Example 111 was performed using a secondary ion mass spectrometer, and O and N atoms were confirmed in the i-type layer.

Example 112

A photovoltaic element (Element No. Example 112) was fabricated by forming a reflecting layer, a reflection multiplying layer, an n-type layer, an i-type layer, a p-type layer, a transparent electrode, and a collector electrode on a substrate under the same conditions as Element No. Example 107-5, except for using a cylinder of $SiH_4H_6$ gas at a flow rate of 40 sccm, regulated by a mass flow controller 1021 in accordance with the flow pattern as shown in FIGS. 25A and 25B, during formation of the i-type layer by microwave plasma CVD.

For the fabricated photovoltaic element, the initial characteristics, the low illuminance characteristic, and the durability characteristic were measured in the same manner as in Example 107, and the results were equivalent to those of Element No. Example 107-5.

Also, the distribution in the layer thickness direction of Si and hydrogen atoms in the i-type layer of the photovoltaic element was analyzed using a secondary ion mass spectrometer (IMS-3F manufactured by CAMECA), resulting in the same tendency as in FIGS. 25A and 25B.

From the above results, it has been found that the photovoltaic element in which the content of hydrogen atoms changes in correspondence with the content of Si atoms is improved in performance whereby the effects of the present invention have been evidenced.

Example 113

Photovoltaic elements (Element No. Examples 113-1 to 113-5) were fabricated by forming a reflecting layer, a reflection multiplying layer, an n-type layer, an i-type layer, a p-type layer, a transparent electrode, and a collector electrode on a substrate under the same conditions as Element No. Example 107-5, except that the distance between the mixing point of $SiH_4$ gas and $GeH_4$ gas and the deposition chamber 1001 in the source gas supply unit 1020 was set to the values in Table 71.

For the fabricated photovoltaic elements, the initial characteristics, the low illuminance characteristics, and the durability characteristic were measured in the same manner as in the Example 107. The results are listed in Table 71. As seen from Table 71, by making the distance between the mixing point of $SiH_4$ gas and $GeH_4$ gas and the deposition chamber 1001 equal to or less than 5 m, a photovoltaic element having further improved characteristics can be obtained.

Example 114

A photovoltaic element was fabricated under the same conditions as those of Element No. Examples 107-5 and 107-15, whereby a solar cell module was fabricated using this photovoltaic element, and an analog clock with a circuit configuration as shown in FIG. 28 was made using the solar cell module as a power source.

The analog clocks as fabricated were installed on a wall within a room, and the analog clock using Element No. Example 107-5 exhibited better performance than the analog clock using Element No. Example 107-15.

Example 115

A photovoltaic element (Element No. Example 115) was fabricated by forming a reflecting layer, a reflection multiplying layer, an n-type layer, an i-type layer, a p-type layer, a transparent electrode, and a collector electrode on a substrate under the same conditions as Element No. Example 107-5, except that the flow rates of $SiH_4$ gas and $GeH_4$ gas were regulated by mass controllers 1021, 1026 in accordance with the flow patterns as shown in FIG. 26 during fabrication of the i-type layer by microwave plasma CVD.

For the fabricated photovoltaic element, the initial characteristics, the low illuminance characteristic, and the durability characteristic were measured as in Example 107, and the results were equivalent to those of Element No. Example 107-5, whereby the effects of the present invention were demonstrated.

Example 116

A photovoltaic element (Element No. Example 116) was fabricated by forming a reflecting layer, a reflection multiplying layer, an n-type layer, an i-type layer, a p-type layer, a transparent electrode, and a collector electrode on a substrate under the same conditions as Element No. Example 107-5, except for using a cylinder of $B_2H_6$ gas diluted to 2000 ppm with $H_2$ gas ($B_2H_6$(2000 ppm)/$H_2$ gas), instead of $BF_3/H_2$ gas, at a flow rate of 1 sccm during formation of the i-type layer by microwave plasma CVD, and 0.05 sccm during formation of the i-type layer by RF plasma CVD.

For the fabricated photovoltaic element, the initial characteristics, the low illuminance characteristics, and the durability characteristic were measured as in Example 107, and the results were equivalent to those of Element No. Example 107-5, whereby the effects of the present invention were evidenced.

Example 117

A photovoltaic element (Element No. Example 117) was fabricated by forming a reflecting layer, a reflection multiplying layer, an n-type layer, an i-type layer, a p-type layer, a transparent electrode, and a collector electrode on a substrate under the same conditions as Element No. Example 107-5, except that the flow rate of NO/He gas was regulated by mass flow controller 1029 in accordance with the flow pattern as shown in FIGS. 33A and 33B, during formation of the i-type layer by microwave plasma CVD.

For the fabricated photovoltaic element, the initial characteristics, the low illuminance characteristic, and the durability characteristic were measured in the same manner as in the Example 107, and the results were equivalent to those of Element No. Example 107-5.

Also, the distribution in the layer thickness direction of N and O atoms in the i-type layer of the photovoltaic element was analyzed using a secondary ion mass spectrometer, resulting in the same tendency as in FIGS. 33A and 33B. From the above results, the effects of the present invention were demonstrated.

Example 118

A photovoltaic element (Element No. Example 118) was fabricated by forming a reflecting layer, a reflection multiplying layer, an n-type layer, an i-type layer, a p-type layer, a transparent electrode, and a collector electrode on a substrate under the same conditions as Element No. Example 107-5, except that the flow rates of $SiH_4$ gas and $GeH_4$ gas were regulated by mass flow controllers 1021, 1026 in accordance with the flow patterns as shown in FIG. 37, and the RF plasma CVD i-type layer was formed under the fabrication conditions of Table 60 after the formation of i-type layer formed by microwave plasma CVD.

For the fabricated photovoltaic element, the initial characteristics, the low illuminance characteristic, and the durability characteristic were measured in the same manner as in Example 107, and the results were equivalent to Element No. Example 107-5, whereby the effects of the present invention were evidenced.

Example 119

A photovoltaic element (Element No. Example 119) was fabricated by forming a reflecting layer, a reflection multiplying layer, an n-type layer, an i-type layer, a p-type layer, a transparent electrode, and a collector electrode on a substrate under the same conditions as Example 115, except that RF bias power source 1011 was set at 250 $mW/cm^3$, and the DC bias was set via a coil at 50 V for application to bias rod 1012 during fabrication of the i-type layer by microwave plasma CVD.

For the fabricated photovoltaic element, the initial characteristics, the low illuminance characteristic, and the durability characteristic were measured in the same manner as in Example 115, and the results were equivalent to those of the Example 115, whereby the effects of the present invention were evidenced.

Example 120

A photovoltaic element (Element No. Example 120) was fabricated by forming a reflecting layer, a reflection multiplying layer, an n-type layer, an i-type layer, a p-type layer, a transparent electrode, and a collector electrode on a substrate under the same conditions as Element No. Example 107-5, except for using a cylinder of $D_2$ gas (not shown), instead of $H_2$ at flow rate of 300 sccm during formation of the i-type layer by microwave plasma CVD.

For the fabricated photovoltaic element, the initial characteristics, the low illuminance characteristic, and the durability characteristic were measured in the same manner as in the Example 107, and the results were equivalent to those of Element No. Example 107-5.

Also, composition analysis of the photovoltaic element was performed using a secondary ion mass spectrometer, and it was confirmed that D atoms were contained in the i-type layer, whereby the effects of the present invention were evidenced.

Example 121

A photovoltaic element (Element No. Example 121) was fabricated by forming a reflecting layer, a reflection multiplying layer, an n-type layer, an i-type layer, a p-type layer, a transparent electrode, and a collector electrode on a substrate under the same conditions as Element No. Example 107-5, except that DC bias power source 1011 was changed at a constant rate from 50 V to 80 V when shutter 1013 was opened during formation of the n-type layer.

For the fabricated photovoltaic element, the initial characteristics, the low illuminance characteristic, and the durability characteristic were measured in the same manner as in Example 107, and the results were equivalent to those of Element No. 107-5, whereby the effects of the present invention were evidenced.

Example 122

A photovoltaic element (Element No. Example 122-1) was fabricated by forming an n-type layer and a p-type layer under the same conditions as Example 102, and the other layers were formed under the same conditions as Element No. Example 107-5.

A photovoltaic element (Element No. Example 122-2) was fabricated by forming a reflecting layer, a reflection multiplying layer, an n-type layer, an i-type layer, a p-type layer, a transparent electrode, and a collector electrode on a substrate under the same conditions as those of Example 122-1, except that $BF_3$(2000 ppm)/$H_2$ gas and $PH_3$(2000 ppm)/$H_2$ gas were not used in forming the i-type layer by microwave plasma CVD.

For the fabricated photovoltaic elements (Element No. Examples 122-1 to 122-2), the initial characteristics, the low illuminance characteristic, and the durability characteristic were measured in the same manner as in Example 107. From the results, it was determined that the photovoltaic element of Element No. 122-1 was 1.03 times better in the open-circuit voltage and 1.04 times better in the fill factor of the initial characteristics, 1.09 times better in the photovoltaic conversion efficiency of the low illuminance characteristic, and 1.08 times better in the decrease in the photovoltaic conversion efficiency (the durability characteristics) than the photovoltaic element of Element No. Example 122-1, whereby the effects of the present invention were demonstrated.

Example 123

A photovoltaic element (Element No. Example 123-1) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the conditions as listed in Table 72, with the same method as the Example 107.

A photovoltaic element (Element No. Example 123-2) was fabricated by forming a reflecting layer, a reflection multiplying layer, a first n-type layer, a first i-type layer, a first p-type layer, a second n-type layer, a second i-type layer, a second p-type layer, a transparent electrode, and a collector electrode on a substrate under the same conditions as Example 123-1, except that $BF_3$(2000 ppm)/$H_2$ gas and $PH_3$(2000 ppm)/$H_2$ gas were not used in forming the first i-type layer by microwave plasma CVD.

For the fabricated photovoltaic elements (Element No. Example 123-1 to 123-2), the initial characteristics, the low illuminance characteristic, and the durability characteristic were measured in the same manner as in Example 107. From the results, it was determined that the photovoltaic element of Element No. Example 123-1 was 1.04 times better in the open-circuit voltage and 1.03 times better in the fill factor of the initial characteristics, 1.08 times better in the photovoltaic conversion efficiency of the low illuminance characteristic, and 1.09 times better in the decrease in the photovoltaic conversion efficiency (the durability characteristic) than the photovoltaic element of Element No. Example 123-2, whereby the effects of the present invention were demonstrated.

Example 124

A photovoltaic element (Element No. Example 124-1) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as listed in Table 73, with the same method as Example 107.

A photovoltaic element (Element No. Example 124-2) was fabricated by forming a reflecting layer, a reflection multiplying layer, a first n-type layer, a first i-type layer, a first p-type layer, a second n-type layer, a second i-type layer, a second p-type layer, a third n-type layer, a third i-type layer, a third p-type layer, a transparent electrode, and a collector electrode on a substrate under the same conditions as those of Example 124-1, except that $BF_3$(2000 ppm)/$H_2$ gas and $PH_3$(2000 ppm)/$H_2$ gas were not used in forming the first and second i-type layers by microwave plasma CVD.

For the fabricated photovoltaic elements (Element No. Examples 124-1 to 124-2), the initial characteristics, the low illuminance characteristic, and the durability characteristic were measured in the same manner as in Example 107. Form the results, it was determined that the photovoltaic element of Element No. Example 124-1 was 1.03 times better in the open-circuit voltage and 1.04 times better in the fill factor of the initial characteristics, 1.08 times better in the photovoltaic conversion efficiency of the low illuminance characteristic, and 1.07 times better in the decrease in the photovoltaic conversion efficiency (the durability characteristic) than the photovoltaic element of Element No. Example 124-2, whereby the effects of the present invention were demonstrated.

Example 125

A photovoltaic element of the present invention was fabricated using a multiple chamber separation-type deposition apparatus as shown in FIG. 22. The photovoltaic element (Element No. Example 125) was made in accordance with the procedure of Example 105 under the same conditions as those of Example 123.

For the fabricated photovoltaic element, the initial characteristics, the low illuminance characteristic, and the durability characteristic were measured in the same manner as in Example 107. From the results, it was found that the photovoltaic element was 1.01 times better in open-circuit voltage and 1.02 times better in fill factor of the initial characteristics, 1.02 times better in photovoltaic conversion efficiency of the low illuminance characteristic, and 1.03 times better in decrease in the photovoltaic conversion efficiency (durability characteristic) than Element No. Example 123. The photovoltaic device of the present invention had better characteristics by fabricating it in a multiple chamber separation-type deposition apparatus, whereby the effects of the present invention were evidenced.

Example 126

A photovoltaic element was fabricated under the same conditions as those of Element No. Examples 123-1 to 123-2, whereby a solar cell module was made using the photovoltaic element, and a car-mounted ventilation fan having a circuit configuration as shown in FIG. 28 was produced using the solar cell module.

A car mounted with ventilation fans utilizing Element No. Examples 123-1 to 123-2 was left in an idling state with the engine running for 168 hours, and then left in sunny weather with the ventilation fan working and with the engine stopped, whereafter the temperature within the car was measured. As a result, the car-mounted cooling fan of Element No. Example 123-1 achieved an interior temperature three degrees lower than the fan of Element No. Example 123-2.

TABLE 1

| Substrate | SUS430BA 50mm square 1 mm thick | | | | | | |
|---|---|---|---|---|---|---|---|
| Reflecting layer | Silver (Ag) thin film 100 nm | | | | | | |
| Reflection multiplying layer | Zinc oxide (ZnO) thin film 1 $\mu$m | | | | | | |
| | Layer name | Gas used and flow (sccm) | Microwave discharge electric power (mW/cm$^3$) | Bias | Pressure (mTorr) | Substrate (°C.) | Layer thickness (nm) |
|---|---|---|---|---|---|---|---|
| Fabrication conditions of layer | n-type layer | SiH$_4$ 50<br>PH$_3$/H$_2$ 200<br>(diluted to 1%) | 130 | DC<br>50 V | 10 | 350 | 10 |
| | i-type layer by microwave plasma CVD | SiH$_4$ See FIG. 23A<br>H$_2$ 500<br>GeH$_4$ See FIG. 23A | 170 | RF 350 (mW/cm$^3$)<br>DC 0 V | See Table 2 | 350 | 300 |
| | i-type | SiH$_4$ 8 | RF 120 | | 500 | 350 | 10 |

TABLE 1-continued

| Substrate | SUS430BA 50mm square 1 mm thick |
| Reflecting layer | Silver (Ag) thin film 100 nm |
| Reflection multiplying layer | Zinc oxide (ZnO) thin film 1 μm |

| | Layer name | Gas used and flow (sccm) | | Microwave discharge electric power (mW/cm$^3$) | Bias | Pressure (mTorr) | Substrate (°C.) | Layer thickness (nm) |
|---|---|---|---|---|---|---|---|---|
| | layer by RF plasma CVD | H$_2$ | 100 | (mW/cm$^2$) | | | | |
| | p-type layer | SiH$_4$ | 10 | 250 | | 25 | 300 | 10 |
| | | H$_2$ | 700 | | | | | |
| | | BF$_3$/H$_2$ (diluted to 1%) | 30 | | | | | |
| Transparent electrode | ITO (IN$_2$O$_3$ + SnO$_2$) thin film 70 μm | | | | | | | |
| Collector electrode | Aluminum (Al) thin film 2μm | | | | | | | |

TABLE 2

| Element No. | Pressure within deposition chamber (mTorr) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Example 1-1 | 0.5 | 1.02 | 1.02 | 1.06 | 1.05 |
| Example 1-2 | 1 | 1.02 | 1.02 | 1.06 | 1.05 |
| Example 1-3 | 2 | 1.02 | 1.02 | 1.06 | 1.06 |
| Example 1-4 | 5 | 1.03 | 1.03 | 1.08 | 1.07 |
| Example 1-5 | 10 | 1.03 | 1.03 | 1.07 | 1.08 |
| Example 1-6 | 20 | 1.03 | 1.02 | 1.05 | 1.08 |
| Example 1-7 | 50 | 1.02 | 1.02 | 1.05 | 1.06 |
| Comparative Example 1-1 | 100 | 1.00 | 1.00 | 1.00 | 1.00 |

Note)
The initial characteristics, low illuminance characteristic and durability are relative values with reference to Element No. Comparative Example 1-1.

TABLE 3

| | Gas flow rate (sccm) | | Decomposition efficiency of source gas at each microwave electric power (W/cm$^3$) (%) | | | | |
|---|---|---|---|---|---|---|---|
| Sample No. | SiH$_4$ | GeH$_4$ | 0.1 | 0.2 | 0.3 | 0.4 | 0.5 |
| 1-1 | 200 | 1 | 24 | 45 | 68 | 93 | 100 |
| 1-2 | 170 | 20 | 25 | 48 | 73 | 97 | 100 |
| 1-3 | 140 | 40 | 27 | 51 | 76 | 99 | 100 |
| 1-4 | 110 | 60 | 28 | 53 | 81 | 100 | 100 |
| 1-5 | 80 | 80 | 31 | 58 | 88 | 100 | 100 |

TABLE 4

| Element No. | Microwave electric power (W/cm$^3$) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Example 1-8 | 0.1 | 1.02 | 1.02 | 1.08 | 1.07 |
| Example 1-9 | 0.2 | 1.04 | 1.03 | 1.07 | 1.08 |
| Example 1-10 | 0.3 | 1.02 | 1.02 | 1.07 | 1.06 |
| Comparative Example 1-2 | 0.4 | 1.00 | 1.01 | 1.01 | 1.01 |
| Comparative Example 1-3 | 0.5 | 1.00 | 1.00 | 1.00 | 1.00 |

Note)
The initial characteristics, low illuminance characteristic and durability are relative values with reference to Element No. Comparative Example 1-3.

TABLE 5

| Element No. | RF bias (mW/cm$^3$) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Comparative | 150 | 1.00 | 1.00 | 1.00 | 1.00 |

TABLE 5-continued

| Element No. | RF bias (mW/cm³) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Example 1-4 | | | | | |
| Example 1-11 | 200 | 1.02 | 1.01 | 1.05 | 1.06 |
| Example 1-12 | 250 | 1.03 | 1.02 | 1.06 | 1.07 |
| Example 1-13 | 300 | 1.03 | 1.03 | 1.06 | 1.07 |
| Example 1-14 | 350 | 1.02 | 1.02 | 1.07 | 1.07 |

Note)
The initial characteristics, low illuminance characteristic and durability are relative values with reference to Element No. Comparative Example 1-4.

TABLE 6

| Sample No. | Gas flow rate (sccm) SiH₄ | GeH₄ | Bandgap (eV) | Composition ratio Si | Ge |
|---|---|---|---|---|---|
| 1-6 | 200 | 1 | 1.71 | 100 | 1 |
| 1-7 | 170 | 20 | 1.60 | 8.7 | 1 |
| 1-8 | 140 | 40 | 1.52 | 3.3 | 1 |
| 1-9 | 110 | 60 | 1.45 | 1.9 | 1 |
| 1-10 | 80 | 80 | 1.38 | 1.1 | 1 |
| 1-11 | | | 1.69 | | |

TABLE 7

| Element No. (Sample No.) | Flow rate of SiH₄ gas (sccm) | RF power (mW/cm²) | Deposition rate (nm/sec) | Initial characteristics Open-circuit voltage | Fill factor | Low illuminance Photoelectric conversion efficiency | Durability characteristic Decrease in photo-electric conversion efficiency |
|---|---|---|---|---|---|---|---|
| Example 1-15 (1-12) | 1 | 15 | 0.05 | 1.03 | 1.04 | 1.08 | 1.06 |
| Example 1-16 (1-13) | 2 | 30 | 0.1 | 1.03 | 1.03 | 1.08 | 1.06 |
| Example 1-17 (1-14) | 10 | 150 | 0.5 | 1.03 | 1.03 | 1.07 | 1.07 |
| Example 1-18 (1-15) | 20 | 300 | 1.1 | 1.02 | 1.03 | 1.05 | 1.07 |
| Example 1-19 (1-16) | 40 | 500 | 2.0 | 1.02 | 1.03 | 1.05 | 1.06 |
| Example 1-16 (1-17) | 60 | 1000 | 2.8 | 1.00 | 1.00 | 1.00 | 1.00 |

Note)
The initial characteristics, low illuminance characteristic and durability are relative values with reference to Element No. Comparative Example 1-6.

TABLE 8

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Comparative Example 1-7 | 0 | 1.00 | 1.00 | 1.00 | 1.00 |
| Example 1-20 | 1 | 1.02 | 1.02 | 1.02 | 1.04 |
| Example 1-21 | 3 | 1.03 | 1.02 | 1.04 | 1.06 |
| Example 1-5 | 10 | 1.03 | 1.03 | 1.07 | 1.07 |
| Example 1-22 | 30 | 1.02 | 1.02 | 1.05 | 1.07 |
| Comparative Example 1-8 | 50 | 1.01 | 1.00 | 1.02 | 1.02 |

Note)
The initial characteristics, low illuminance characteristic and durability are relative values with reference to Element No. Comparative Example 1-7.

TABLE 9

| Element No. (Sample No.) | RF discharge power (mW/cm²) | Value of half-width at a peak of 2000 cm⁻¹ divided by peak height | Initial characteristics Open-circuit voltage | Fill factor | Low illuminance Photoelectric conversion efficiency | Durability characteristic Decrease in photo-electric conversion efficiency |
|---|---|---|---|---|---|---|
| Example 1-23 (1-18) | 90 | 1.31 | 1.02 | 1.03 | 1.04 | 1.06 |
| Example 1-5 (1-19) | 120 | 1.16 | 1.02 | 1.02 | 1.05 | 1.05 |
| Example 1-24 (1-20) | 150 | 1.07 | 1.01 | 1.01 | 1.04 | 1.05 |

TABLE 9-continued

| Element No. (Sample No.) | RF discharge power (mW/cm$^2$) | Value of half-width at a peak of 2000 cm$^{-1}$ divided by peak height | Initial characteristics Open-circuit voltage | Fill factor | Low illuminance Photoelectric conversion efficiency | Durability characteristic Decrease in photo-electric conversion efficiency |
|---|---|---|---|---|---|---|
| Example 1-25 (1-21) | 180 | 0.95 | 1.00 | 1.01 | 1.02 | 1.01 |
| Example 1-26 (1-22) | 210 | 0.88 | 1.00 | 1.00 | 1.00 | 1.00 |
| (1-23) | | 1.0 | | | | |

Note)
The initial characteristics, low illuminance characteristic and durability are relative values with reference to Element No. Comparative Example 1-26.
The value of half-width divided by height is relative value with reference to Sample No. 1-23.

TABLE 10

| Element No. | Layer thickness of the region at maximum bandgap (nm) | Initial characteristics Open-circuit voltage | Fill factor | Low illuminance characteristic Photoelectric conversion efficiency | Durability characteristic Decrease in photo-electric conversion efficiency |
|---|---|---|---|---|---|
| Example 2-1 | 1 | 1.01 | 1.02 | 1.03 | 1.02 |
| Example 2-2 | 2 | 1.02 | 1.03 | 1.05 | 1.04 |
| Example 2-3 | 3 | 1.03 | 1.03 | 1.06 | 1.06 |
| Example 2-4 | 5 | 1.03 | 1.03 | 1.05 | 1.07 |
| Example 2-5 | 10 | 1.04 | 1.03 | 1.05 | 1.06 |
| Example 2-6 | 20 | 1.03 | 1.02 | 1.04 | 1.05 |
| Example 2-7 | 30 | 1.02 | 1.02 | 1.04 | 1.04 |
| Example 2-8 | 50 | 1.00 | 1.00 | 1.00 | 1.00 |

Note)
The initial characteristics, low illuminance characteristic and durability are relative values with reference to Element No. Comparative Example 2-8.

TABLE 11

| Element No. | Distance between mixing point of gases and deposition chamber (m) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 7-1 | 1 | 1.03 | 1.04 | 1.05 | 1.07 |
| Example 7-2 | 2 | 1.02 | 1.03 | 1.05 | 1.06 |
| Example 7-3 | 3 | 1.02 | 1.03 | 1.03 | 1.05 |
| Example 7-4 | 5 | 1.02 | 1.02 | 1.03 | 1.03 |
| Example 7-5 | 8 | 1.00 | 1.00 | 1.00 | 1.00 |

Note) The initial characteristics, low illuminance characteristic and durability are relative values with reference to Element No. Example 7-5.

TABLE 12

| | Substrate | SUS430BA 50 mm square 1 mm thick | | | | |
|---|---|---|---|---|---|---|
| | Reflecting layer | Silver (Ag) thin film 100 nm | | | | |
| | Reflection multiplying layer | Zinc oxide (ZnO) thin film 1 μm | | | | |
| | Layer name | gas used and flow (sccm) | | RF discharge electric power (W/cm$^3$) | Pressure (Torr) | Substrate (C.°) | Layer thickness (nm) |
| Fabrication conditions of layer | n-type layer | Si$_2$H$_6$ | 3 | 0.12 | 1 | 350 | 10 |
| | | PH$_3$/H$_2$ (diluted to 1%) | 5 | | | | |
| | | H$_2$ | 50 | | | | |
| | i-type layer | Same as Element No. Example 1-5 | | | | | |
| | p-type layer | SiH$_4$ | 0.5 | 2 | 1 | 200 | 5 |
| | | H$_2$ | 100 | | | | |
| | | BF$_3$/H$_2$ (diluted to 1%) | 1 | | | | |
| Transparent electrode | | ITO (In$_2$O$_3$ + SnO$_2$) thin film 70 μm | | | | | |
| Collector electrode | | Aluminum (Al) thin film 2 μm | | | | | |

TABLE 13

| Substrate | SUS430BA 50 mm square 1 mm thick |
|---|---|

TABLE 13-continued

| | | Reflecting layer | Silver (Ag) thin film 100 nm | | | | |
|---|---|---|---|---|---|---|---|
| | | Reflection multiplying layer | Zinc oxide (ZnO) thin film 1 μm | | | | |
| | Layer name | gas used and flow (sccm) | Discharge electric power | Bias | Pressure (mTorr) | Substrate temperature (°C.) | Layer thickness (nm) |
| Fabrication conditions of layer | First n-type layer | $Si_2H_6$ 1<br>$H_2$ 50<br>$PH_3/H_2$ 1<br>(diluted to 1%) | RF 80 $(mW/cm^2)$ | | 1500 | 370 | 20 |
| | First i-type layer by microwave plasma CVD | $SiH_4$ See FIG. 35<br>$H_2$ 500<br>$GeH_4$ See FIG. 35 | Microwave 170 $(mW/cm^3)$ | RF 350 $(mW/cm^3)$<br>DC 0V | 10 | 350 | 300 |
| | First i-type layer by RF plasma CVD | $SiH_4$ 8<br>$H_2$ 100<br>$BF_3/H_2$ 1<br>(2000 ppm)<br>$PH_3/H_2$ 0.05<br>(2000 ppm) | RF 120 $(mW/cm^2)$ | | 500 | 350 | 10 |
| | First p-type layer | $SiH_4$ 0.05<br>$H_2$ 100<br>$BF_3/H_2$ 5<br>(diluted to 1%) | RF 1.5 $(W/cm^2)$ | | 2000 | 250 | 10 |
| | Second n-type layer | $Si_2H_6$ 1<br>$H_2$ 50<br>$PH_3/H_2$ 1<br>(diluted to 1%) | RF 80 $(mW/cm^2)$ | | 1500 | 300 | 10 |
| | Second i-type layer | $SiH_4$ 200<br>$H_2$ 700 | Microwave 130 $(mW/cm^3)$ | RF 250 $(mW/cm^3)$<br>DC 0V | 5 | 300 | 150 |
| | Second p-type layer | $SiH_4$ 0.05<br>$H_2$ 100<br>$BF_3H_2$ 5<br>(diluted to 1%) | RF 1.5 $(W/cm^2)$ | | 2000 | 200 | 5 |
| Transparent electrode | | ITO ($In_2O_3$ + $SnO_2$) thin film 70 μm | | | | | |
| Collector electrode | | Aluminum (Al) thin film 2 μm | | | | | |

TABLE 14

Figure 36A:
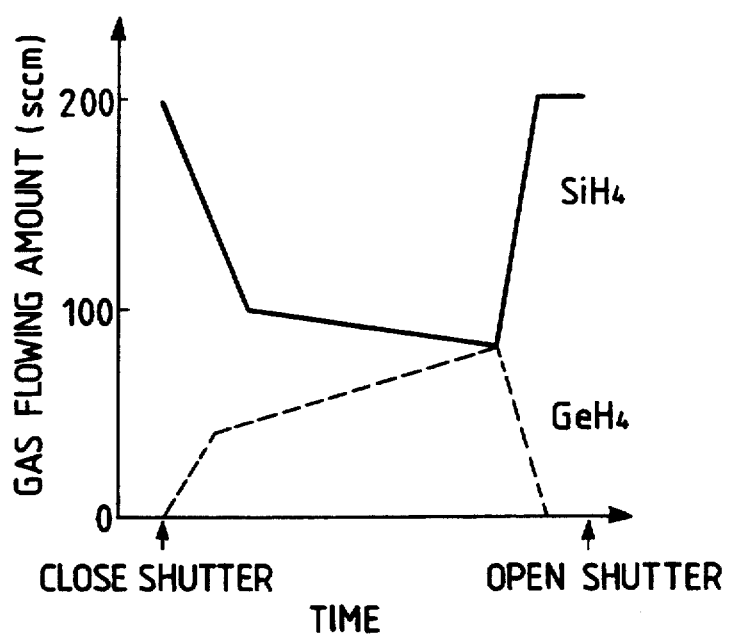
Figure 36B:
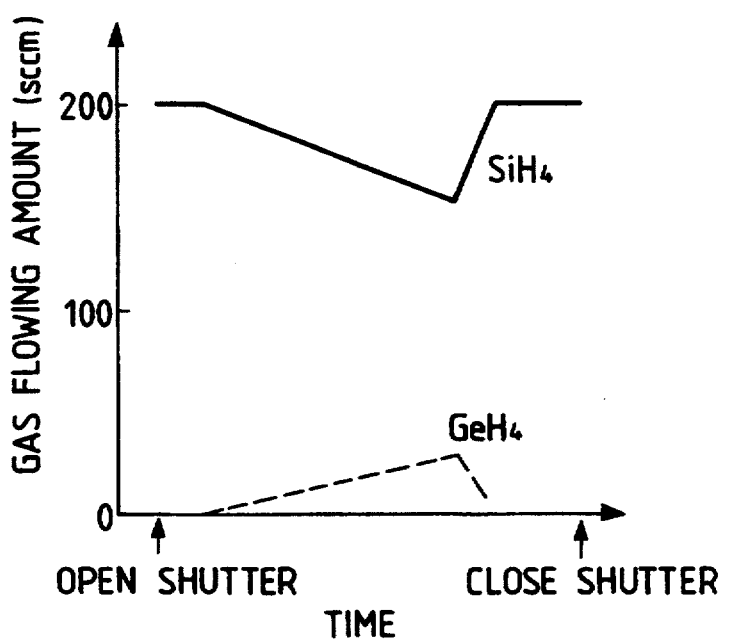

| | | Substrate | SUS430BA 50 mm square 1 mm thick | | | | |
|---|---|---|---|---|---|---|---|
| | | Reflecting layer | Silver (Ag) thin film 100 nm | | | | |
| | | Reflection multiplying layer | Zinc oxide (ZnO) thin film 1 μm | | | | |
| | Layer name | gas used and flow (sccm) | Microwave discharge electric power $(mW/cm^3)$ | Bias | Pressure (mTorr) | Substrate temperature (°C.) | Layer thickness (nm) |
| Fabrication conditions of layer | First n-type layer | $Si_2H_4$ 50<br>$PH_3/H_2$ 200<br>(diluted to 1%) | 130 | DC 50V | 10 | 350 | 10 |
| | First i-type layer by microwave plasma CVD | $SiH_4$ See FIG. 36A<br>$H_2$ 500<br>$GeH_4$ See FIG. 36A | 170 | RF 350 $(mW/cm^3)$ | 10 | 350 | 250 |
| | First i-type layer by RF plasma CVD | $SiH_4$ 8<br>$H_2$ 100<br>$BF_3/H_2$ 0.5<br>(2000 ppm)<br>$PH_3/H_2$ 0.06<br>(2000 ppm) | RF 120 $(mW/cm^2)$ | | 500 | 350 | 10 |
| | First p-type layer | $SiH_4$ 10<br>$H_2$ 700<br>$BF_3/H_2$ 30<br>(diluted to 1%) | 250 | | 25 | 350 | 10 |
| | Second n-type layer | $SiH_4$ 50<br>$PH_3/H_2$ 200<br>(diluted to 1%) | 130 | DC 50V | 10 | 350 | 10 |
| | Second i-type layer by | $SiH_4$ See FIG. 36B<br>$H_2$ 500<br>$GeH_4$ See FIG. 36B | 210 | RF 280 $(mW/cm^3)$<br>DC 0V | 10 | 350 | 200 |

TABLE 14-continued

| | | | | | | | |
|---|---|---|---|---|---|---|---|
| microwave plasma CVD Second i-type layer by RF plasma CVD | SiH$_4$<br>H$_2$<br>BF$_3$/H$_2$ (2000 ppm)<br>PH$_3$/H$_2$ (2000 ppm) | 8<br>100<br>2<br><br>0.03 | 210 | RF 280 | 10 | 350 | 200 |
| Second p-type layer | SiH$_4$<br>H$_2$<br>BF$_3$/H$_2$ | 10<br>700<br>30 | 250 | | 25 | 350 | 10 |
| Third n-type layer | SiH$_4$<br>PH$_3$/H$_2$ (diluted to 1%) | 50<br>200 | 130 | DC 50V | 10 | 350 | 10 |
| Third i-type layer | SiH$_4$<br>H$_2$ | 200<br>700 | 150 | RF 300 (mW/cm$^3$)<br>DC 0V | 5 | 300 | 100 |
| Third p-type layer | SiH$_4$<br>H$_2$<br>BF$_3$/H$_2$ (diluted to 1%) | 10<br>700<br>30 | 250 | | 25 | 300 | 5 |
| Transparent electrode | ITO (In$_2$O$_3$ + SnO$_2$) thin film 70 μm | | | | | | |
| Collector electrode | Aluminum (Al) thin film 2 μm | | | | | | |

TABLE 15

| | | Substrate<br>Reflecting layer<br>Reflection multiplying layer | SUS430BA 50 mm square 1 mm thick<br>Silver (Ag) thin film 100 nm<br>Zinc oxide (ZnO) thin film 1 μm | | | | |
|---|---|---|---|---|---|---|---|
| | Layer name | gas used and flow (sccm) | | Microwave discharge electric power (mW/cm$^3$) | Bias | Pressure (mTorr) | Substrate temperature (°C.) | Layer thickness (nm) |

| | Layer name | gas used and flow (sccm) | | Microwave discharge electric power (mW/cm$^3$) | Bias | Pressure (mTorr) | Substrate temperature (°C.) | Layer thickness (nm) |
|---|---|---|---|---|---|---|---|---|
| Fabrication conditions of layer | n-type layer | SiH$_4$<br>PH$_3$/H$_2$ (diluted 1%) | 50<br>200 | 130 | DC 50V | 10 | 350 | 10 |
| | i-type layer by microwave plasma CVD | SiH$_4$<br>H$_2$<br>GeH$_4$ (diluted to 1%) | See FIG. 23A<br>500<br>See FIG. 23A | 170 | RF 350 (mW/cm$^3$)<br>DV 0V | Table 16 | 350 | 300 |
| | i-type layer by RF plasma CVD | SiH$_4$<br>H$_2$ | 8<br>100 | RF 120 (mW/cm$^2$) | | 500 | 300 | 10 |
| | p-type layer doping layer B1 | SiH$_4$<br>H$_2$<br>BF$_3$/H$_2$ (2000 ppm) | 1<br>300<br>2 | 50 | | 25 | 300 | 0.5 |
| | p-type layer doping layer A | B$_2$H$_6$/H$_2$ (10%) | 100 | 50 | | 30 | 300 | 0.3 |
| | p-type layer doping layer B2 | SiH$_4$<br>H$_2$<br>BF$_3$/H$_2$ (2000 ppm) | 1<br>300<br>2 | 50 | | 25 | 300 | 10 |
| Transparent electrode | | ITO (In$_2$O$_3$ + SnO$_2$) thin film 70 μm | | | | | | |
| Collector electrode | | Aluminum (Al) thin film 2 μm | | | | | | |

TABLE 16

| Element No. | Pressure within deposition chamber (mTorr) | Initial characteristics | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Example 21-1 | 0.5 | 1.02 | 1.02 | 1.05 | 1.05 |
| Example 21-2 | 1 | 1.02 | 1.02 | 1.06 | 1.05 |
| Example 21-3 | 2 | 1.02 | 1.03 | 1.06 | 1.06 |
| Example 21-4 | 5 | 1.02 | 1.03 | 1.07 | 1.07 |
| Example 21-5 | 10 | 1.03 | 1.03 | 1.06 | 1.07 |
| Example 21-6 | 20 | 1.03 | 1.02 | 1.06 | 1.06 |

TABLE 16-continued

| Element No. | Pressure within deposition chamber (mTorr) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 21-7 | 50 | 1.02 | 1.02 | 1.05 | 1.06 |
| Comparative Example 7-1 | 100 | 1.00 | 1.00 | 1.00 | 1.00 |

Note) The initial characteristics, low illuminance characteristic and durability are relative values with reference to Element No. Example 7-1.

TABLE 17

| Element No. | Microwave power (W/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 21-8 | 0.1 | 1.02 | 1.02 | 1.08 | 1.07 |
| Example 21-9 | 0.2 | 1.02 | 1.02 | 1.07 | 1.08 |
| Example 21-10 | 0.3 | 1.01 | 1.02 | 1.07 | 1.06 |
| Comparative Example 7-2 | 0.4 | 1.00 | 1.01 | 1.02 | 1.01 |
| Comparative Example 7-3 | 0.5 | 1.00 | 1.00 | 1.00 | 1.00 |

Note) The initial characteristics, low illuminance characteristic and durability are relative values with reference to Element No. Comparative Example 7-3.

TABLE 18

| Element No. | RF bias (mW/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 7-4 | 150 | 1.00 | 1.00 | 1.00 | 1.00 |
| Example 21-11 | 200 | 1.02 | 1.02 | 1.05 | 1.06 |
| Example 21-12 | 250 | 1.02 | 1.03 | 1.07 | 1.07 |
| Example 21-13 | 300 | 1.03 | 1.02 | 1.06 | 1.07 |
| Example 21-14 | 350 | 1.02 | 1.02 | 1.06 | 1.06 |

Note) The initial characteristics, low illuminance characteristic and durability are relative values with reference to Element No. Comparative Example 7-4.

TABLE 19

| Element No. | Flow rate of SiH$_4$ gas (sccm) | RF power (mW/cm$^2$) | Deposition rate (nm/sec) | Initial characteristics Open-circuit voltage | Fill factor | Low illuminance Photoelectric conversion efficiency | Durability characteristic Decrease in photoelectric conversion efficiency |
|---|---|---|---|---|---|---|---|
| Example 21-15 | 1 | 15 | 0.05 | 1.02 | 1.03 | 1.06 | 1.07 |
| Example 21-16 | 2 | 30 | 0.1 | 1.03 | 1.04 | 1.06 | 1.07 |
| Example 21-17 | 10 | 150 | 0.5 | 1.03 | 1.03 | 1.07 | 1.08 |
| Example 21-18 | 20 | 300 | 1.1 | 1.03 | 1.02 | 1.07 | 1.07 |
| Example 21-19 | 40 | 500 | 2.0 | 1.02 | 1.02 | 1.06 | 1.05 |
| Comparative Example 7-6 | 60 | 1000 | 2.8 | 1.00 | 1.00 | 1.00 | 1.00 |

Note) The initial characteristics, low illuminance characteristic and durability are relative values with reference to Element No. Comparative Example 7-6.

TABLE 20

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 7-7 | 0 | 1.00 | 1.00 | 1.00 | 1.00 |

TABLE 20-continued

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 21-20 | 1 | 1.02 | 1.01 | 1.04 | 1.06 |
| Example 21-21 | 3 | 1.02 | 1.03 | 1.05 | 1.07 |
| Example 21-5 | 10 | 1.03 | 1.03 | 1.07 | 1.07 |
| Example 21-22 | 30 | 1.02 | 1.02 | 1.05 | 1.06 |
| Comparative Example 7-8 | 50 | 1.01 | 1.00 | 1.01 | 1.02 |

Note) The initial characteristics, low illuminance characteristic and durability are relative values with reference to Element No. Comparative Example 7-7.

TABLE 21

| Element No. | RF discharge power (mW/cm$^2$) | Value of half-width at a peak of 2000 cm$^{-1}$ divided by peak height | Initial characteristics Open-circuit voltage | Fill factor | Low illuminance Photoelectric conversion efficiency | Durability characteristic Decrease in photoelectric conversion efficiency |
|---|---|---|---|---|---|---|
| Example 21-23 | 90 | 1.31 | 1.02 | 1.02 | 1.05 | 1.05 |
| Example 21-5 | 120 | 1.16 | 1.02 | 1.03 | 1.05 | 1.05 |
| Example 21-24 | 150 | 1.07 | 1.02 | 1.02 | 1.04 | 1.04 |
| Example 21-25 | 180 | 0.95 | 1.00 | 1.01 | 1.01 | 1.02 |
| Example 21-26 | 210 | 0.88 | 1.00 | 1.00 | 1.00 | 1.00 |

Note) The initial characteristics, low illuminance characteristic and durability are relative values with reference to Element No. Example 21-26.

TABLE 22

| Element No. | Layer thickness of the region at maximum bandgap (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 22-1 | 1 | 1.02 | 1.02 | 1.04 | 1.04 |
| Example 22-2 | 2 | 1.02 | 1.03 | 1.05 | 1 05 |
| Example 22-3 | 3 | 1.02 | 1.03 | 1.05 | 1.06 |
| Example 22-4 | 5 | 1.02 | 1.03 | 1.06 | 1.07 |
| Example 22-5 | 10 | 1.02 | 1.02 | 1.06 | 1.06 |
| Example 22-6 | 20 | 1.03 | 1.02 | 1.05 | 1.06 |
| Example 22-7 | 30 | 1.02 | 1.01 | 1.05 | 1.06 |
| Example 22-8 | 50 | 1.00 | 1.00 | 1.00 | 1.00 |

Note)
The initial characteristics, low illuminance characteristic and durability are relative values with reference to Element No. Example 22-8.

TABLE 23

| Element No. | Distance between mixing point of gases and deposition chamber (m) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 27-1 | 1 | 1.02 | 1.03 | 1.05 | 1.07 |
| Example 27-2 | 2 | 1.03 | 1.04 | 1.06 | 1.06 |
| Example 27-3 | 3 | 1.02 | 1.03 | 1.06 | 1.05 |
| Example 27-4 | 5 | 1.02 | 1.02 | 1.04 | 1.05 |
| Example 27-5 | 8 | 1.00 | 1.00 | 1.00 | 1,00 |

Note)
The initial characteristics, low illuminance characteristic and durability are relative values with reference to Element No. Enample 27-5.

TABLE 24

| Element No. | Layer thickness of the region at maximum bandgap (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 33-1 | 0.01 | 1.02 | 1.02 | 1.05 | 1.06 |
| Example 33-2 | 0.03 | 1.02 | 1.03 | 1.06 | 1.06 |
| Example 33-3 | 0.1 | 1.03 | 1.02 | 1.07 | 1.07 |
| Enample 21-5 | 0.3 | 1.02 | 1.02 | 1.06 | 1.06 |
| Example 33-4 | 1 | 1.02 | 1.02 | 1.05 | 1.04 |
| Example 33-5 | 3 | 1.00 | 1.00 | 1.00 | 1.00 |

Note)
The initial characteristics, low illuminance characteristic and durability are relative values with reference to Element No. Example 33-5.

TABLE 25

| | Layer name | gas used and flow (sccm) | | Microwave discharge electric power (mW/cm³) | Pressure (mTorr) | Substrate temperature (°C.) | Layer thickness (nm) |
|---|---|---|---|---|---|---|---|
| Fabrication conditions of n-type layer | n-type layer doping layer B1 | SiH₄<br>H₂<br>PH₃/H₂ (1%) | 5<br>200<br>20 | 40 | 30 | 350 | 0.5 |
| | n-type layer doping layer A | PH₃/H₂ (1%) | 300 | 50 | 20 | 350 | 0.3 |
| | n-type layer doping layer B2 | SiH₄<br>PH₃/H₂ (1%) | 50<br>200 | 150 | 15 | 350 | 10 |

TABLE 26

| | Layer name | gas used and flow (sccm) | | Microwave discharge electric power (mW/cm³) | Pressure (mTorr) | Substrate temperature (°C.) | Layer thickness (nm) |
|---|---|---|---|---|---|---|---|
| Fabrication conditions of n-type layer | doping layer B1 | SiH₄<br>H₂<br>PF₃/H₂ (2000 ppm) | 1<br>300<br>2 | 50 | 25 | 300 | 0.3 |
| | doping layer A1 | B₂H₆/H₂ (10%) | 100 | 50 | 20 | 300 | 0.1 |
| | doping layer B2 | SiH₄<br>H₂<br>BF₃/H₂ (2000 ppm) | 1<br>300<br>2 | 50 | 25 | 300 | 0.5 |
| | doping layer A2 | B₂H₆/H₂ (10%) | 100 | 30 | 30 | 300 | 0.2 |
| | doping layer B3 | SiH₄<br>H₂<br>PF₃/H₂ (2000 ppm) | 1<br>300<br>2 | 50 | 25 | 300 | 0.5 |
| | doping layer A3 | B₂H₆/H₂ (10%) | 200 | 50 | 20 | 300 | 0.5 |
| | doping layer B4 | SiH₄<br>H₂<br>BF₃/H₂ (2000 ppm) | 1<br>300<br>2 | 50 | 25 | 300 | 0.8 |

TABLE 27

| Substrate | SUS430BA 50 mm square 1 mm thick |
| Reflecting layer | Silver (Ag) thin film 100 nm |
| Reflection multiplying layer | Zinc oxide (ZnO) thin film 1 μm |

| | Layer name | gas used and flow (sccm) | | RF discharge electric power (W/cm³) | Pressure (Torr) | Substrate temperature (C.°) | Layer thickness (nm) |
|---|---|---|---|---|---|---|---|
| Fabrication conditions of layer | n-type | Si₂H₆<br>PH₃/H₂ (diluted | 3<br>5 | 0.12 | 1 | 350 | 10 |

TABLE 27-continued

| | | | | RF discharge | | | |
|---|---|---|---|---|---|---|---|
| | Layer name | gas used and flow (sccm) | | electric power (W/cm$^3$) | Pressure (Torr) | Substrate temperature (C.°) | Layer thickness (nm) |
| | | to 1%) | | | | | |
| | | H$_2$ | 50 | | | | |
| | i-type layer | | | Same as Element No. Example 21-5 | | | |
| | p-type layer doping layer B1 | SiH$_4$<br>H$_2$<br>BF$_3$/H$_{22}$<br>(2000 ppm) | 0.03<br>100<br>1 | 2 | 1 | 200 | 0.3 |
| | p-type layer doping layer A | B$_2$H$_6$/H$_2$<br>(10%) | 50 | 3 | 1 | 200 | 0.1 |
| | p-type layer doping layer B2 | SiH$_4$<br>H$_2$<br>BF$_3$/H$_2$<br>(2000 ppm) | 0.5<br>100<br>10 | 2 | 1 | 200 | 5 |
| Transparent electrode | ITO (In$_2$O$_3$ + SnO$_2$) thin film 70 μm | | | | | | |
| Collector electrode | Aluminum (Al) thin film 2 μm | | | | | | |

TABLE 28

Substrate: SUS430BA 50 mm square 1 mm thick
Reflecting layer: Silver (Ag) thin film 100 nm
Reflection multiplying layer: Zinc oxide (ZnO) thin film 1 μm

| | Layer name | gas used and flow (sccm) | | Dishcarge electric power | Bias | Pressure (mTorr) | Substrate temperature (°C.) | Layer thickness (nm) |
|---|---|---|---|---|---|---|---|---|
| Fabrication conditions of layer | First n-type layer | Si$_2$H$_6$<br>H$_2$<br>PH$_3$/H$_2$<br>(diluted to 1%) | 1<br>50<br>1 | RF<br>80<br>(mW/cm$^2$) | | 1500 | 370 | 20 |
| | First i-type layer by microwave plasma CVD | SiH$_4$ See FIG. 35<br>H$_2$<br>GeH$_4$ See FIG. 35 | <br>500<br> | Microwave<br>170<br>(mW/cm$^3$) | RF<br>350<br>(mW/cm$^3$)<br>DC 0V | 10 | 350 | 300 |
| | First i-type layer by RF plasma CVD | SiH$_4$<br>H$_2$<br>BF$_3$/H$_2$<br>(2000 ppm)<br>PH$_3$/H$_2$<br>(2000 ppm) | 8<br>100<br>3<br><br>0.05 | RF<br>120<br>(mW/cm$^2$) | | 500 | 350 | 10 |
| | First p-type layer doping layer B1 | SiH$_4$<br>H$_2$<br>BF$_3$/H$_2$<br>(2000 ppm) | 0.03<br>100<br>6 | RF<br>1<br>(W/cm$^2$) | | 2000 | 250 | 0.5 |
| | First p-type layer doping layer A | B$_2$H$_6$/H$_2$<br>(10%) | 100 | RF<br>2<br>(W/cm$^2$) | | 20 | 250 | 0.3 |
| | First p-type layer doping layer B2 | SiH$_4$<br>H$_2$<br>BF$_3$/H$_2$<br>(2000 ppm) | 0.05<br>80<br>25 | | | 2000 | 250 | 10 |
| | Second n-type layer | Si$_2$H$_6$<br>H$_2$<br>PH$_3$/H$_2$<br>(diluted to 1%) | 1<br>50<br>1 | RF<br>80<br>(mW/cm$^2$) | | 1500 | 300 | 10 |
| | Second i-type layer by microwave plasma CVD | SiH$_4$<br>H$_2$ | 200<br>700 | Microwave<br>130<br>(mW/cm$^3$) | RF<br>250<br>(mW/cm$^3$)<br>DC 0V | 5 | 300 | 150 |
| | Second | SiH$_4$ | 0.05 | RF | | 2000 | 200 | 5 |

TABLE 28-continued

| Substrate | SUS430BA 50 mm square 1 mm thick | | | | | | |
|---|---|---|---|---|---|---|---|
| Reflecting layer | Silver (Ag) thin film 100 nm | | | | | | |
| Reflection multiplying layer | Zinc oxide (ZnO) thin film 1 μm | | | | | | |

| | Layer name | gas used and flow (sccm) | | Dishcarge electric power | Bias | Pressure (mTorr) | Substrate temperature (°C.) | Layer thickness (nm) |
|---|---|---|---|---|---|---|---|---|
| | p-type layer | $H_2$<br>$BF_3/H_2$<br>(diluted to 1%) | 80<br>25 | 1.5<br>(W/cm$^2$) | | | | |
| Transparent electrode | ITO ($In_2O_3$ + $SnO_2$) thin film 70 μm | | | | | | | |
| Collector electrode | Aluminum (Al) thin film 2 μm | | | | | | | |

TABLE 29

| Substrate | SUS430BA 50 mm square 1 mm thick |
|---|---|
| Reflecting layer | Silver (Ag) thin film 100 nm |
| Reflection multiplying layer | Zinc oxide (ZnO) thin film 1 μm |

| | Layer name | gas used and flow (sccm) | | Microwave discharge electric power (mW/cm$^3$) | Bias | Pressure (mTorr) | Substrate temperature (°C.) | Layer thickness (nm) |
|---|---|---|---|---|---|---|---|---|
| Fabrication conditions of layer | First n-type layer | $SiH_4$<br>$PH_3/H_2$<br>(diluted to 1%) | 50<br>200<br>50V | 130 | DC 50 V | 1500 | 350 | 10 |
| | First i-type layer by microwave plasma CVD | $SiH_4$ See FIG. 36A<br>$H_2$ 500<br>$GeH_4$ See FIG. 36A | | 170 | RF 350 (mW/cm$^3$) DC 0V | 10 | 300 | 250 |
| | First i-type layer by RF plasma CVD | $SiH_4$ 8<br>$H_2$ 100<br>$BF_3/H_2$ 0.3 (2000 ppm)<br>$PH_3/H_2$ 0.05 (2000 ppm) | | RF 120 (mW/cm$^2$) | | 500 | 350 | 10 |
| | First p-type layer doping layer B1 | $SiH_4$ 1<br>$H_2$ 300<br>$BF_3/H_2$ 3 | | 50 | | 25 | 300 | 0.5 |
| | First p-type layer doping layer A | $B_2H_6/H_2$ 100 (10%) | | 50 | | 20 | 300 | 0.3 |
| | First p-type layer doping layer B2 | $SiH_4$ 0.5<br>$H_2$ 80<br>$BF_3/H_2$ 25 (2000 ppm) | | 50 | | 25 | 300 | 10 |

| | Layer name | gas used and flow (sccm) | | Discharge electric power | Bias | Pressure (mTorr) | Substrate temperature (°C.) | Layer thickness (nm) |
|---|---|---|---|---|---|---|---|---|
| Fabrication conditions of layer | Second n-type layer | $SiH_4$ 50<br>$PH_3/H_2$ 200<br>(diluted to 1%) | | 130 | DC 50 V | 10 | 300 | 10 |
| | Second i-type layer by microwave plasma CVD | $SiH_4$ See FIG. 36A<br>$H_2$ 500<br>$GeH_4$ See FIG. 36A | | 210 | RF 280 (mW/cm$^3$) DC 0V | 10 | 350 | 200 |
| | Second i-type layer by RF plasma CVD | $SiH_4$ 8<br>$H_2$ 100<br>$BF_3/H_2$ 1 (2000 ppm)<br>$PH_3/H_2$ 0.5 (2000 ppm) | | RF 120 (mW/cm$^3$) | | 500 | 350 | 200 |
| | Second p-type layer doping | $SiH_4$ 1<br>$H_2$ 300<br>$BF_3/H_2$ 1 (2000 ppm) | | 50 | | 25 | 300 | 0.1 |

TABLE 29-continued

| Substrate | SUS430BA 50 mm square 1 mm thick | | | | | | |
|---|---|---|---|---|---|---|---|
| Reflecting layer | Silver (Ag) thin film 100 nm | | | | | | |
| Reflection multiplying layer | Zinc oxide (ZnO) thin film 1 μm | | | | | | |

| | layer B1 | | | | | | | |
|---|---|---|---|---|---|---|---|---|
| | Second p-type layer doping layer A | $B_2H_6/H_2$ (10%) | 100 | 50 | | 30 | 300 | 0.3 |
| | Second p-type layer doping layer B2 | $SiH_4$ $H_2$ $BF_3/H_2$ (2000 ppm) | 1 300 0.5 | 50 | | 25 | 300 | 10 |
| | Third n-type layer | $SiH_4$ $PH_3/H_2$ (diluted to 1%) | 50 200 | 130 | DC 50 V | 10 | 300 | 10 |
| | Third i-type layer | $SiH_4$ $H_2$ | 200 700 | 150 | RF 300 (mW/cm³) DC 0V | 5 | 300 | 100 |
| | Third p-type layer | $SiH_4$ $H_2$ $BF_3/H_2$ (diluted to 1%) | 10 600 150 | 250 | | 25 | 250 | 5 |
| Transparent electrode | ITO ($In_2O_3$ + $SnO_2$) thin film 70 μm | | | | | | |
| Collector electrode | Aluminum (Al) thin film 2 μm | | | | | | |

TABLE 30

| Element No. | Pressure within deposition chamber (mTorr) | Initial characteristics Open-circuit voltage | Initial characteristics Fill factor | Low illuminance characteristic Photoelectric conversion efficiency | Durability characteristic Decrease in photoelectric conversion efficiency |
|---|---|---|---|---|---|
| Example 44-1 | 0.5 | 1.02 | 1.02 | 1.06 | 1.05 |
| Example 44-2 | 1 | 1.02 | 1.03 | 1.07 | 1.06 |
| Example 44-3 | 2 | 1.02 | 1.03 | 1.07 | 1.06 |
| Example 44-4 | 5 | 1.03 | 1.03 | 1.08 | 1.07 |
| Example 44-5 | 10 | 1.03 | 1.03 | 1.07 | 1.07 |
| Example 44-6 | 20 | 1.02 | 1.02 | 1.06 | 1.08 |
| Example 44-7 | 50 | 1.02 | 1.02 | 1.05 | 1.07 |
| Comparative Example 12-1 | 100 | 1.00 | 1.00 | 1.00 | 1.00 |

Note)
The initial characteristics, low illuminance characteristic and durability are relative values with reference to Element No. Comparative Example 12-1.

TABLE 31

| Element No. | Microwave electric power (W/cm³) | Initial characteristics Open-circuit voltage | Initial characteristics Fill factor | Low illuminance characteristic Photoelectric conversion efficiency | Durability characteristic Decrease in photoelectric conversion efficiency |
|---|---|---|---|---|---|
| Example 44-8 | 0.1 | 1.02 | 1.02 | 1.08 | 1.07 |
| Example 44-9 | 0.2 | 1.02 | 1.03 | 1.09 | 1.09 |
| Example 44-10 | 0.3 | 1.02 | 1.02 | 1.07 | 1.08 |
| Comparative Example 12-2 | 0.4 | 1.00 | 1.01 | 1.01 | 1.02 |
| Comparative Example 12-3 | 0.5 | 1.00 | 1.00 | 1.00 | 1.00 |

Note)
The initial characteristics, low illuminance characteristic and durability are relative values with reference to Element No. Comparative Example 12-3.

TABLE 32

| Element No. | RF bias (mW/cm³) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 12-4 | 150 | 1.00 | 1.00 | 1.00 | 1.00 |
| Example 44-11 | 200 | 1.02 | 1.02 | 1.05 | 1.04 |
| Example 44-12 | 250 | 1.03 | 1.02 | 1.05 | 1.07 |
| Example 44-13 | 300 | 1.03 | 1.03 | 1.06 | 1.07 |
| Example 44-14 | 350 | 1.03 | 1.02 | 1.06 | 1.05 |

Note)
The initial characteristics, low illuminance characteristic and durability are relative values with reference to Element No. Comparative Example 12-4.

TABLE 33

| Element No. | Flow rate of SiH₄ gas (sccm) | RF power (mW/cm²) | Deposition rate (nm/sec) | Initial characteristics Open-circuit voltage | Curve factor | Low illuminance Photoelectric conversion efficiency | Durability characteristic Decrease in photoelectric conversion efficiency |
|---|---|---|---|---|---|---|---|
| Example 44-16 | 1 | 15 | 0.05 | 1.03 | 1.03 | 1.08 | 1.06 |
| Example 44-17 | 2 | 30 | 0.1 | 1.03 | 1.03 | 1.07 | 1.07 |
| Example 44-18 | 10 | 150 | 0.5 | 1.03 | 1.02 | 1.07 | 1.06 |
| Example 44-19 | 20 | 300 | 1.1 | 1.02 | 1.02 | 1.06 | 1.06 |
| Example 44-20 | 40 | 500 | 2.0 | 1.02 | 1.02 | 1.05 | 1.06 |
| Comparative Example 12-6 | 60 | 1000 | 2.8 | 1.00 | 1.00 | 1.00 | 1.00 |

Note) The initial characteristics, low illuminance characteristic and durability are relative values with reference to Element No. Comparative Example 12-6.

TABLE 34

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 12-7 | 0 | 1.00 | 1.00 | 1.00 | 1.00 |
| Example 44-21 | 1 | 1.02 | 1.02 | 1.03 | 1.04 |
| Example 44-22 | 3 | 1.02 | 1.02 | 1.05 | 1.06 |
| Example 44-5 | 10 | 1.03 | 1.02 | 1.07 | 1.07 |
| Example 44-23 | 30 | 1.02 | 1.02 | 1.06 | 1.05 |
| Comparative Example 12-8 | 50 | 1.01 | 1.00 | 1.02 | 1.02 |

Note) The initial characteristics, low illuminance characteristic and durability are relative values with reference to Element No. Comparative Example 12-7.

TABLE 35

| Element No. | RF discharge power (mW/cm²) | Value of half-width at a peak of 2000 cm⁻¹ divided by peak height | Initial characteristics Open-circuit voltage | Fill factor | Low illuminance Photoelectric conversion efficiency | Durability characteristic Decrease in photoelectric conversion efficiency |
|---|---|---|---|---|---|---|
| Example 44-24 | 90 | 1.31 | 1.03 | 1.02 | 1.04 | 1.06 |
| Example 44-5 | 120 | 1.16 | 1.02 | 1.02 | 1.05 | 1.06 |
| Example 44-25 | 150 | 1.07 | 1.01 | 1.01 | 1.05 | 1.05 |
| Example 44-26 | 180 | 0.95 | 1.00 | 1.01 | 1.02 | 1.02 |
| Example 44-27 | 210 | 0.88 | 1.00 | 1.00 | 1.00 | 1.00 |

Note) The initial characteristics, low illuminance characteristic and durability are relative values with reference to Element No. Example 44-27.

TABLE 36

| Element No. | Layer thickness of the region at maximum bandgap (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 45-1 | 1 | 1.01 | 1.02 | 1.03 | 1.02 |
| Example 45-2 | 2 | 1.03 | 1.03 | 1.05 | 1.04 |
| Example 45-3 | 3 | 1.03 | 1.03 | 1.05 | 1.06 |
| Example 45-4 | 5 | 1.03 | 1.02 | 1.05 | 1.06 |
| Example 45-5 | 10 | 1.04 | 1.02 | 1.05 | 1.06 |
| Example 45-6 | 20 | 1.04 | 1.02 | 1.04 | 1.06 |
| Example 45-7 | 30 | 1.02 | 1.01 | 1.04 | 1.05 |
| Example 45-8 | 50 | 1.00 | 1.00 | 1.00 | 1.00 |

Note) The initial characteristics, low illuminance characteristic and durability are relative values with reference to Element No. Example 45-8.

TABLE 37

| Element No. | Distance between mixing point of gases and deposition chamber (m) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 50-1 | 1 | 1.03 | 1.04 | 1.05 | 1.07 |
| Example 50-2 | 2 | 1.03 | 1.04 | 1.05 | 1.07 |
| Example 50-3 | 3 | 1.02 | 1.03 | 1.03 | 1.06 |
| Example 50-4 | 5 | 1.02 | 1.03 | 1.03 | 1.04 |
| Example 50-5 | 8 | 1.00 | 1.00 | 1.00 | 1.00 |

Note) The initial characteristics, low illuminance characteristic and durability are relative values with reference to Element No. Example 50-5.

TABLE 38

Substrate: SUS430BA 50 mm square 1 mm thick
Reflecting layer: Silver (Ag) thin film 100 nm
Reflection multiplying layer: Zinc oxide (ZnO) thin film 1 μm

| | Layer name | gas used and flow (sccm) | | Microwave discharge electric power (mW/cm$^3$) | Bias | Pressure (mTorr) | Substrate temperature (°C.) | Layer thickness (nm) |
|---|---|---|---|---|---|---|---|---|
| Fabrication conditions of layer | First n-type layer | Si$_2$H$_6$<br>H$_2$<br>PH$_3$/H$_2$ (diluted to 1%) | 1<br>50<br>1 | RF 80 (mW/cm$^2$) | | 1500 | 370 | 20 |
| | First i-type layer by microwave plasma CVD | SiH$_4$<br>H$_2$<br>GeH$_4$<br>BF$_3$/H$_2$ (2000 ppm)<br>PH$_3$/H$_2$ (2000 ppm) | See FIG. 35<br>500<br>See FIG. 35<br>0.3<br>0.5 | Microwave 170 (mW/cm$^3$) | RF 350 (mW/cm$^3$) DC 0V | 10 | 350 | 300 |
| | First i-type layer by RF plasma CVD | SiH$_4$<br>H$_2$<br>BF$_3$/H$_2$ (2000 ppm)<br>PH$_3$/H$_2$ (2000 ppm) | 8<br>100<br>0.5<br>0.05 | RF 120 (mW/cm$^2$) | | 500 | 350 | 10 |
| | First p-type layer | SiH$_4$<br>H$_2$<br>BF$_3$/H$_2$ (diluted to 1%) | 0.05<br>100<br>5 | RF 1.5 (W/cm$^2$) | | 2000 | 250 | 10 |
| | Second n-type layer | Si$_2$H$_6$<br>H$_2$<br>PH$_3$/H$_2$ (diluted to 1%) | 1<br>50<br>1 | RF 80 (mW/cm$^2$) | | 1500 | 300 | 10 |
| | Second i-type layer | SiH$_4$<br>H$_2$ | 200<br>700 | Microwave 130 (mW/cm$^3$) | RF 250 (mW/cm$^3$) DC 0V | 5 | 300 | 150 |
| | Second p-type layer | SiH$_4$<br>H$_2$<br>BF$_3$/H$_2$ (diluted to 1%) | 0.05<br>100<br>5 | RF 1.5 (W/cm$^2$) | | 2000 | 200 | 5 |
| Transparent electrode | | ITO (In$_2$O$_3$ + SnO$_2$) thin film 70 μm | | | | | | |
| Collector | | Aluminum (Al) thin film 2 μm | | | | | | |

TABLE 38-continued electrode

TABLE 39

| | | Substrate<br>Reflecting layer<br>Reflection multiplying layer | | SUS430BA 50 mm square 1 mm thick<br>Silver (Ag) thin film 100 nm<br>Zinc oxide (ZnO) thin film 1 μm | | | | |
|---|---|---|---|---|---|---|---|---|
| | Layer name | | gas used and flow<br>(sccm) | Microwave discharge<br>electric power<br>(mW/cm$^3$) | Bias | Pressure<br>(mTorr) | Substrate<br>temperature<br>(°C.) | Layer<br>thickness<br>(nm) |
| Fabrication<br>conditions<br>of layer | First<br>n-type<br>layer | SiH$_4$<br>PH$_3$/H$_2$<br>(diluted<br>to 1%) | 50<br>200 | 130 | DC<br>50V | 10 | 350 | 10 |
| | First<br>i-type<br>layer by<br>microwave<br>plasma CVD | SiH$_4$<br>H$_2$<br>GeH$_4$<br>BF$_3$/H$_2$<br>(2000 ppm)<br>PH$_3$/H$_2$<br>(2000 ppm) | See FIG. 35A5<br>500<br>See FIG. 35A<br>1<br>0.3 | 170 | RF<br>350<br>(mW/cm$^3$)<br>DC 0V | 10 | 350 | 250 |
| | First<br>i-type<br>layer by<br>RF plasma<br>CVD | SiH$_4$<br>H$_2$<br>BF$_3$/H$_2$<br>(2000 ppm)<br>PH$_3$/H$_2$<br>(2000 ppm) | 8<br>100<br>0.3<br>0.05 | RF 120<br>(mW/cm$^2$) | | 500 | 350 | 10 |
| | First<br>p-type<br>layer | SiH$_4$<br>H$_2$<br>BF$_3$/H$_2$<br>(diluted<br>to 1%) | 10<br>700<br>30 | 250 | | 25 | 350 | 10 |
| | Second<br>n-type<br>layer | SiH$_4$<br>PH$_3$/H$_2$<br>(diluted<br>to 1%) | 50<br>200 | 130 | DC<br>50V | 10 | 350 | 10 |
| | Second<br>i-type<br>layer by<br>microwave<br>plasma CVD | SiH$_4$<br>H$_2$<br>GeH$_4$<br>BF$_3$/H$_2$<br>(2000 ppm)<br>PH$_3$H$_2$<br>(2000 ppm) | See FIG. 36B<br>500<br>See FIG. 36B<br>0.5<br>0.1 | 210 | RF 280<br>(mW/cm$^3$)<br>DC 0V | 10 | 350 | 200 |
| | Second<br>i-type<br>layer by<br>RF plasma<br>CVD | SiH$_4$<br>H$_2$<br>BF$_3$/H$_2$<br>(2000 ppm)<br>PH$_3$/H$_2$<br>(2000 ppm) | 8<br>100<br>1<br>0.05 | RF<br>120<br>(mW/cm$^2$) | | 500 | 350 | 10 |
| | Second<br>p-type<br>layer | SiH$_4$<br>H$_2$<br>BF$_3$/H$_2$<br>(diluted<br>by 1%) | 10<br>700<br>30 | 250 | | 25 | 350 | 10 |
| | Third<br>n-type<br>layer | SiH$_4$<br>PH$_3$/H$_2$<br>(diluted<br>to 1%) | 50<br>200 | 130 | DC 50V | 10 | 300 | 10 |
| | Third<br>i-type<br>layer | SiH$_4$<br>H$_2$ | 200<br>700 | 150 | RF<br>300<br>(mW/cm$^3$)<br>DC 0V | 5 | 300 | 100 |
| | Third<br>p-type<br>layer | SiH$_4$<br>H$_2$<br>BF$_3$/H$_2$<br>(diluted<br>to 1%) | 10<br>700<br>30 | 250 | | 25 | 250 | 5 |
| Transparent<br>electrode | | | | ITO (In$_2$O$_3$ + SnO$_2$) thin film 70 μm | | | | |
| Collector<br>electrode | | | | Aluminum (Al) thin film 2 μm | | | | |

TABLE 40

| Element No. | Pressure within deposition chamber (mTorr) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 64-1 | 0.5 | 1.02 | 1.02 | 1.06 | 1.06 |
| Example 64-2 | 1 | 1.02 | 1.02 | 1.06 | 1.06 |
| Example 64-3 | 2 | 1.02 | 1.03 | 1.07 | 1.06 |
| Example 64-4 | 5 | 1.04 | 1.04 | 1.07 | 1.08 |
| Example 64-5 | 10 | 1.03 | 1.03 | 1.07 | 1.07 |
| Example 64-6 | 20 | 1.04 | 1.02 | 1.06 | 1.07 |
| Example 64-7 | 50 | 1.02 | 1.02 | 1.06 | 1.07 |
| Comparative Example 14-1 | 100 | 1.00 | 1.00 | 1.00 | 1.00 |

Note) The initial characteristics, low illuminance characteristic and durability are relative values with reference to Element No. Comparative Example 14-1.

TABLE 41

| Element No. | Microwave power (W/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 64-8 | 0.1 | 1.03 | 1.02 | 1.07 | 1.06 |
| Example 64-9 | 0.2 | 1.02 | 1.03 | 1.08 | 1.09 |
| Example 64-10 | 0.3 | 1.02 | 1.03 | 1.07 | 1.06 |
| Comparative Example 14-2 | 0.4 | 1.00 | 1.01 | 1.01 | 1.02 |
| Comparative Example 14-3 | 0.5 | 1.00 | 1.00 | 1.00 | 1.00 |

Note) The initial characteristics, low illuminance characteristic and durability are relative values with reference to Element No. Comparative Example 14-3.

TABLE 42

| Element No. | RF bias (mW/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 14-4 | 150 | 1.00 | 1.00 | 1.00 | 1.00 |
| Example 64-11 | 200 | 1.02 | 1.02 | 1.05 | 1.06 |
| Example 64-12 | 250 | 1.03 | 1.03 | 1.07 | 1.08 |
| Example 64-13 | 300 | 1.02 | 1.02 | 1.06 | 1.07 |
| Example 64-14 | 350 | 1.02 | 1.02 | 1.06 | 1.06 |

Note) The initial characteristics, low illuminance characteristic and durability are relative values with reference to Element No. Comparative Example 14-4.

TABLE 43

| Element No. | Flow rate of SiH$_4$ gas (sccm) | RF power (mW/cm$^2$) | Deposition rate (nm/sec) | Initial characteristics Open-circuit voltage | Fill factor | Low illuminance Photoelectric conversion efficiency | Durability characteristic Decrease in photoelectric conversion efficiency |
|---|---|---|---|---|---|---|---|
| Example 64-16 | 1 | 15 | 0.05 | 1.02 | 1.02 | 1.07 | 1.07 |
| Example 64-17 | 2 | 30 | 0.1 | 1.02 | 1.03 | 1.08 | 1.07 |
| Example 64-18 | 10 | 150 | 0.5 | 1.03 | 1.03 | 1.07 | 1.07 |
| Example 64-19 | 20 | 300 | 1.1 | 1.03 | 1.03 | 1.07 | 1.08 |
| Example 64-20 | 40 | 500 | 2.0 | 1.03 | 1.02 | 1.05 | 1.07 |
| Comparative Example 14-6 | 60 | 1000 | 2.8 | 1.00 | 1.00 | 1.00 | 1.00 |

Note) The initial characteristics, low illuminance characteristic and durability are relative values with reference to Element No. Comparative Example 14-6.

TABLE 44

| Element No. | Layer thickness of i-type layer by RF plasma CVD (nm) | Initial characteristics | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Comparative Example 14-7 | 0 | 1.00 | 1.00 | 1.00 | 1.00 |
| Example 64-21 | 1 | 1.02 | 1.01 | 1.05 | 1.05 |
| Example 64-22 | 3 | 1.03 | 1.02 | 1.06 | 1.06 |
| Example 64-5 | 10 | 1.02 | 1.03 | 1.06 | 1.07 |
| Example 64-23 | 30 | 1.02 | 1.02 | 1.04 | 1.05 |
| Comparative Example 14-8 | 50 | 1.01 | 1.00 | 1.01 | 1.02 |

Note)
The initial characteristics, low illuminance characteristic and durability are relative values with reference to Element No. Comparative Example 14-7.

TABLE 45

| Element No. | RF discharge power (mW/cm$^2$) | Value of half-width at a peak of 2000 cm$^{-1}$ divided by peak height | Initial characteristics | | Low illuminance characteristic Photoelectric conversion efficiency | Durability characteristic Decrease in photoelectric conversion efficiency |
|---|---|---|---|---|---|---|
| | | | Open-circuit voltage | Fill factor | | |
| Example 62-24 | 90 | 1.31 | 1.03 | 1.02 | 1.06 | 1.05 |
| Example 64-5 | 120 | 1.16 | 1.02 | 1.03 | 1.06 | 1.06 |
| Example 64-25 | 150 | 1.07 | 1.01 | 1.03 | 1.04 | 1.05 |
| Example 64-26 | 180 | 0.95 | 1.00 | 1.01 | 1.01 | 1.02 |
| Example 64-27 | 210 | 0.88 | 1.00 | 1.00 | 1.00 | 1.00 |

Note)
The initial characteristics, low illuminance characteristic and durability are relative values with reference to Element No. Example 64-27.

TABLE 46

| Element No. | Layer thickness of the region at maximum bandgap (nm) | Initial characteristics | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Example 65-1 | 1 | 1.02 | 1.02 | 1.04 | 1.04 |
| Example 65-2 | 2 | 1.02 | 1.03 | 1.05 | 1.04 |
| Example 65-3 | 3 | 1.02 | 1.03 | 1.06 | 1.05 |
| Example 65-4 | 5 | 1.02 | 1.03 | 1.07 | 1.07 |
| Example 65-5 | 10 | 1.03 | 1.02 | 1.07 | 1.07 |
| Example 65-6 | 20 | 1.03 | 1.02 | 1.05 | 1.06 |
| Example 65-7 | 30 | 1.02 | 1.01 | 1.05 | 1.06 |
| Example 65-8 | 50 | 1.00 | 1.00 | 1.00 | 1.00 |

Note)
The initial characteristics, low illuminance characteristic and durability are relative values with reference to Element No. Example 65-8.

TABLE 47

| Element No. | Distance between mixing point of gases and deposition chamber (m) | Initial characteristic | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Example 70-1 | 1 | 1.03 | 1.03 | 1.05 | 1.07 |
| Example 70-2 | 2 | 1.02 | 1.04 | 1.07 | 1.06 |
| Example 70-3 | 3 | 1.02 | 1.03 | 1.06 | 1.06 |
| Example 70-4 | 5 | 1.02 | 1.03 | 1.04 | 1.06 |
| Example 70-5 | 8 | 1.00 | 1.00 | 1.00 | 1.00 |

Note)
The initial characteristics, low illuminance characteristic and durability are relative values with reference to Element No. Example 70-5.

TABLE 48

| Element No. | Layer thickness of doping layer A (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 76-1 | 0.01 | 1.02 | 1.02 | 1.05 | 1.06 |
| Example 76-2 | 0.03 | 1.02 | 1.03 | 1.06 | 1.06 |
| Example 76-3 | 0.1 | 1.03 | 1.03 | 1.07 | 1.07 |
| Example 64-5 | 0.3 | 1.03 | 1.02 | 1.06 | 1.05 |
| Example 76-4 | 1 | 1.02 | 1.02 | 1.05 | 1.04 |
| Example 76-5 | 3 | 1.00 | 1.00 | 1.00 | 1.00 |

Note)
The initial characteristics, low illuminance characteristic and durability are relative values with reference to Element No. Example 76-5.

TABLE 49

| | | | | | | | |
|---|---|---|---|---|---|---|---|
| Substrate | SUS430BA 50 mm square 1 mm thick | | | | | | |
| Reflecting layer | Silver (Ag) thin film 100 nm | | | | | | |
| Reflection multiplying layer | Zinc oxide (ZnO) thin film 1 μm | | | | | | |

| | Layer name | gas used and flow (sccm) | | Microwave discharge electric power (mW/cm$^3$) | Bias | Pressure (mTorr) | Substrate temperature (°C.) | Layer thickness (nm) |
|---|---|---|---|---|---|---|---|---|
| Fabrication conditions of layer | n-type layer | SiH$_4$<br>PH$_3$/H$_2$<br>(diluted to 1%) | 50<br>200 | 130 | DC<br>50 V | 10 | 350 | 10 |
| | i-type layer by RF plasma CVD | SiH$_4$<br>H$_2$ | 8<br>100 | RF 120 (mW/cm$^3$) | | 500 | 350 | 10 |
| | i-type layer by microwave plasma CVD | SiH$_4$ See FIG. 14<br>H$_2$ 500<br>GeH$_4$ See FIG. 14<br>BF$_3$/H$_2$ 1<br>(2000 ppm) | | 170 | RF 350 (mW/cm$^3$)<br>DC 0V | See Table 2 | 350 | 300 |
| | p-type layer | SiH$_4$<br>H$_2$<br>BF$_3$/H$_2$<br>(diluted to 1%) | 10<br>700<br>30 | 250 | | 25 | 300 | 10 |
| Transparent electrode | ITO (In$_2$O$_3$ + SnO$_2$) thin film 70 μm | | | | | | | |
| Collector electrode | Aluminum (Al) thin film 2 μm | | | | | | | |

TABLE 50

| Element No. | Pressure within deposition chamber (mTorr) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 87-1 | 0.5 | 1.02 | 1.02 | 1.06 | 1.06 |
| Example 87-2 | 1 | 1.02 | 1.02 | 1.06 | 1.05 |
| Example 87-3 | 2 | 1.02 | 1.02 | 1.08 | 1.06 |
| Example 87-4 | 5 | 1.03 | 1.03 | 1.07 | 1.09 |
| Example 87-5 | 10 | 1.04 | 1.02 | 1.05 | 1.08 |
| Example 87-6 | 20 | 1.03 | 1.02 | 1.05 | 1.07 |
| Example 87-7 | 50 | 1.03 | 1.02 | 1.04 | 1.06 |
| Comparative Example 87-1 | 100 | 1.00 | 1.00 | 1.00 | 1.00 |

Note)
The initial characteristics, low illuminance characteristic and durability are relative values with reference to Element No. Comparative Example 87-1.

TABLE 51

| Sample No. | Gas flow rate (sccm) SiH$_4$ | GeH$_4$ | Decomposition efficiency of source gas at each microwave electric power (W/cm$^3$) (%) 0.1 | 0.2 | 0.3 | 0.4 | 0.5 |
|---|---|---|---|---|---|---|---|
| Example 87-1 | 200 | 1 | 24 | 45 | 68 | 93 | 100 |
| Example 87-2 | 170 | 20 | 25 | 48 | 73 | 97 | 100 |
| Example 87-3 | 140 | 40 | 27 | 51 | 76 | 99 | 100 |
| Example 87-4 | 110 | 60 | 28 | 53 | 81 | 100 | 100 |
| Example 87-5 | 80 | 80 | 31 | 58 | 88 | 100 | 100 |

TABLE 54

| Sample No. | Gas flow rate (sccm) SiH$_4$ | GeH$_4$ | Bandgap (eV) | Composition ratio Si | Ge |
|---|---|---|---|---|---|
| Example 87-6 | 200 | 1 | 1.71 | 100 | 1 |
| Example 87-7 | 170 | 20 | 1.60 | 8.7 | 1 |
| Example 87-8 | 140 | 40 | 1.52 | 3.3 | 1 |
| Example 87-9 | 110 | 60 | 1.45 | 1.9 | 1 |
| Example 87-10 | 80 | 80 | 1.38 | 1.1 | 1 |
| Example 87-11 | — | — | 1.69 | — | — |

TABLE 52

| Element No. | Microwave power (W/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 87-8 | 0.1 | 1.03 | 1.02 | 1.06 | 1.08 |
| Example 87-9 | 0.2 | 1.03 | 1.03 | 1.07 | 1.08 |
| Example 87-10 | 0.3 | 1.01 | 1.02 | 1.07 | 1.07 |
| Comparative Example 87-2 | 0.4 | 1.00 | 1.01 | 1.01 | 1.01 |
| Comparative Example 87-3 | 0.5 | 1.00 | 1.00 | 1.00 | 1.00 |

Note)
The initial characteristics, low illuminance characteristic and durability are relative values with reference to Element No. Comparative Example 87-3.

TABLE 53

| Element No. | RF bias (mW/cm$^3$) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 87-4 | 150 | 1.00 | 1.00 | 1.00 | 1.00 |
| Example 87-11 | 200 | 1.02 | 1.01 | 1.04 | 1.06 |
| Example 87-12 | 250 | 1.03 | 1.03 | 1.06 | 1.07 |
| Example 87-13 | 300 | 1.04 | 1.03 | 1.06 | 1.07 |
| Example 87-14 | 350 | 1.02 | 1.02 | 1.07 | 1.06 |

Note)
The initial characteristics, low illuminance characteristic and durability are relative values with reference to Element No. Comparative Example 87-4.

TABLE 55

| Element No. (Sample No.) | Flow rate of SiH$_4$ gas (sccm) | RF power (mW/cm$^2$) | Deposition rate (nm/sec) | Initial characteristics Open-circuit voltage | Fill factor | Low illuminance Photoelectric conversion efficiency | Durability characteristic Decrease in photoelectric conversion efficiency |
|---|---|---|---|---|---|---|---|
| Example 87-15 (87-12) | 1 | 15 | 0.05 | 1.02 | 1.04 | 1.07 | 1.07 |
| Example 87-16 (87-13) | 2 | 30 | 0.1 | 1.03 | 1.03 | 1.08 | 1.06 |
| Example 87-17 (87-14) | 10 | 150 | 0.5 | 1.03 | 1.04 | 1.07 | 1.07 |
| Example 87-18 (87-15) | 20 | 300 | 1.1 | 1.02 | 1.03 | 1.07 | 1.07 |
| Example 87-19 (87-16) | 40 | 500 | 2.0 | 1.01 | 1.03 | 1.06 | 1.05 |
| Comparative | 60 | 1000 | 2.8 | 1.00 | 1.00 | 1.00 | 1.00 |

TABLE 55-continued

| Element No. (Sample No.) | Flow rate of SiH$_4$ gas (sccm) | RF power (mW/cm$^2$) | Deposition rate (nm/sec) | Initial characteristics Open-circuit voltage | Fill factor | Low illuminance Photoelectric conversion efficiency | Durability characteristic Decrease in photoelectric conversion efficiency |
|---|---|---|---|---|---|---|---|
| Example 87-6 (87-17) | | | | | | | |

Note) The initial characteristics, low illuminance characteristic and durability are relative values with reference to Element No. Comparative Example 87-6.

TABLE 56

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative Example 87-7 | 0 | 1.00 | 1.00 | 1.00 | 1.00 |
| Example 87-20 | 1 | 1.02 | 1.01 | 1.03 | 1.04 |
| Example 87-21 | 3 | 1.03 | 1.02 | 1.04 | 1.06 |
| Example 87-5 | 10 | 1.03 | 1.03 | 1.07 | 1.08 |
| Example 87-22 | 30 | 1.03 | 1.02 | 1.05 | 1.07 |
| Comparative Example 87-8 | 50 | 1.01 | 1.00 | 1.01 | 1.02 |

Note) The initial characteristics, low illuminance characteristic and durability are relative values with reference to Element No. Comparative Example 87-7.

TABLE 57

| Element No. (Sample No.) | RF discharge power (mW/cm$^2$) | Value of half-width at a peak of 2000 cm$^{-1}$ divided by peak height | Initial characteristics Open-circuit voltage | Fill factor | Low illuminance Photoelectric conversion efficiency | Durability characteristic Decrease in photoelectric conversion efficiency |
|---|---|---|---|---|---|---|
| Example 87-23 (87-18) | 90 | 1.31 | 1.02 | 1.03 | 1.04 | 1.06 |
| Example 87-5 (87-19) | 120 | 1.16 | 1.02 | 1.02 | 1.04 | 1.06 |
| Example 87-24 (87-20) | 150 | 1.07 | 1.01 | 1.02 | 1.05 | 1.05 |
| Example 87-25 (87-21) | 180 | 0.95 | 1.00 | 1.01 | 1.02 | 1.01 |
| Example 87-26 (87-22) | 210 | 0.88 | 1.00 | 1.00 | 1.00 | 1.00 |
| (87-23) | | 1.0 | | | | |

Note) The initial characteristics, low illuminance characteristic and durability are relative values with reference to Element No. Example 87-26. The value of half-width divided by height is relative value with reference to Sample No. 87-23.

TABLE 58

| Element No. | Layer thickness of the region at maximum bandgap (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 88-1 | 1 | 1.02 | 1.02 | 1.03 | 1.03 |
| Example 88-2 | 2 | 1.02 | 1.03 | 1.05 | 1.04 |
| Example 88-3 | 3 | 1.03 | 1.04 | 1.06 | 1.07 |
| Example 88-4 | 5 | 1.04 | 1.03 | 1.06 | 1.06 |
| Example 88-5 | 10 | 1.03 | 1.03 | 1.05 | 1.06 |
| Example 88-6 | 20 | 1.03 | 1.02 | 1.04 | 1.05 |
| Example 88-7 | 30 | 1.01 | 1.02 | 1.04 | 1.04 |
| Example 88-8 | 50 | 1.00 | 1.00 | 1.00 | 1.00 |

Note) The initial characteristics, low illuminance characteristic and durability are relative values with reference to Element No. Example 88-8.

TABLE 59

| Element No. | Distance between mixing point of gases and deposition chamber (m) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 93-1 | 1 | 1.03 | 1.04 | 1.05 | 1.07 |
| Example 93-2 | 2 | 1.03 | 1.03 | 1.05 | 1.06 |
| Example 93-3 | 3 | 1.02 | 1.03 | 1.04 | 1.04 |
| Example 93-4 | 5 | 1.01 | 1.02 | 1.04 | 1.03 |
| Example 93-5 | 8 | 1.00 | 1.00 | 1.00 | 1.00 |

Note) The initial characteristics, low illuminance characteristic and durability are relative values with reference to Element No. Example 93-5.

TABLE 60

| | gas used and flow (sccm) | | RF discharge electric power (W/cm$^2$) | Pressure (Torr) | Substrate temperature (°C.) | Layer thickness (nm) |
|---|---|---|---|---|---|---|
| Fabrication conditions of i-type layer by RF plasma CVD | SiH$_4$ | 8 | | | | |
| | H$_2$ | 100 | | | | |
| | BF$_3$/H$_2$ (diluted to 2000 ppm) | 1 | | | | |
| | PH$_3$/H$_2$ (diluted to 2000 ppm) | 0.06 | 0.12 | 500 | 300 | 10 |

TABLE 61

| | Substrate | | SUS430BA 50 mm square 1 mm thick | | | | |
|---|---|---|---|---|---|---|---|
| | Reflecting layer | | Silver (Ag) thin film 100 nm | | | | |
| | Reflection multiplying layer | | Zinc oxide (ZnO) thin film 1 μm | | | | |
| | Layer name | gas used and flow (sccm) | | RF discharge electric power (W/cm$^3$) | Pressure (Torr) | Substrate temperature (C.°) | Layer thickness (nm) |
| Fabrication conditions of layer | n-type layer | Si$_2$H$_6$ | 3 | 0.12 | 1 | 350 | 10 |
| | | PH$_3$/H$_2$ (diluted to 1%) | 5 | | | | |
| | | H$_2$ | 50 | | | | |
| | i-type layer | | | Same as Element No. Example 87-5 | | | |
| | p-type layer | SiH$_4$ | 0.5 | 2 | 1 | 200 | 5 |
| | | H$_2$ | 100 | | | | |
| | | BF$_3$/H$_2$ (diluted to 1%) | 1 | | | | |
| Transparent electrode | | | ITO (In$_2$O$_3$ + SnO$_2$) thin film 70 μm | | | | |
| Collector electrode | | | Aluminum (Al) thin film 2 μm | | | | |

TABLE 62

Figure 38:
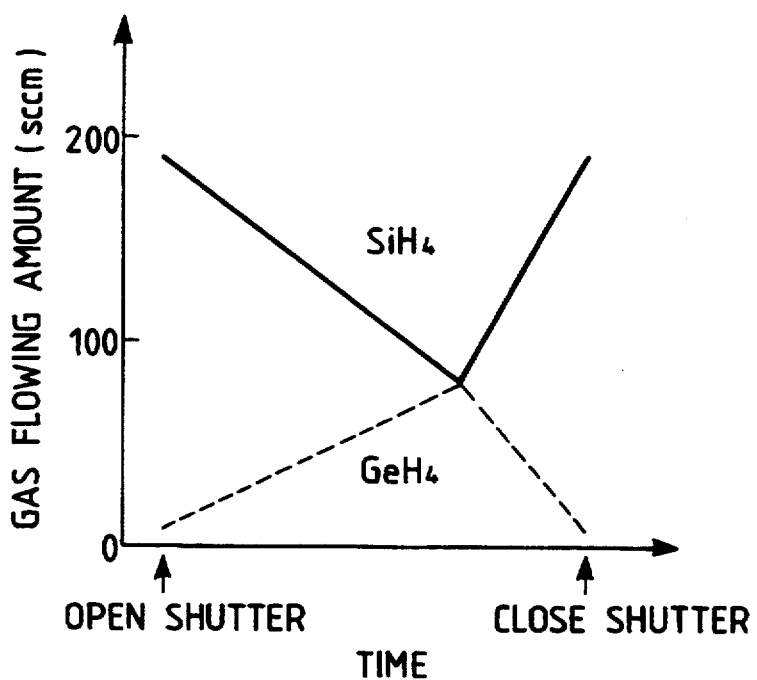

| | Substrate | | SUS430BA 50 mm square 1 mm thick | | | | | |
|---|---|---|---|---|---|---|---|---|
| | Reflecting layer | | Silver (Ag) thin film 100 nm | | | | | |
| | Reflection multiplying layer | | Zinc oxide (ZnO) thin film 1 μm | | | | | |
| | Layer name | gas used and flow (sccm) | | Discharge electric power | Bias | Pressure (mTorr) | Substrate temperature (°C.) | Layer thickness (nm) |
| Fabrication conditions of layer | First n-type layer | Si$_2$H$_6$ | 1 | RF 80 (mW/cm$^2$) | | 1500 | 370 | 20 |
| | | H$_2$ | 50 | | | | | |
| | | PH$_3$H$_2$ (diluted to 1%) | 1 | | | | | |
| | First i-type layer 1 by RF plasma CVD | SiH$_4$ | 8 | RF 120 (mW/cm$^2$) | | 500 | 350 | 20 |
| | | H$_2$ | 100 | | | | | |
| | | BF$_3$H$_2$ (2000 ppm) | 0.02 | | | | | |
| | | PH$_3$/H$_2$ (2000 ppm) | 0.04 | | | | | |
| | First i-type layer by microwave plasma CVD | SiH$_4$ | See FIG. 38 | Microwave 170 (mW/cm$^3$) | RF 350 (mW/cm$^3$) DC 0V | 10 | 350 | 300 |
| | | H$_2$ | 500 | | | | | |
| | | GeH$_4$ | See FIG. 38 | | | | | |

TABLE 62-continued

| | Layer name | gas used and flow (sccm) | | Discharge electric power | | Pressure (mTorr) | Substrate temperature (°C.) | Layer thickness (nm) |
|---|---|---|---|---|---|---|---|---|
| | First i-type layer 2 by RF plasma CVD | SiH$_4$<br>H$_2$<br>BF$_3$/H$_2$ (2000 ppm)<br>PH$_3$/H$_2$ (2000 ppm) | 8<br>100<br>2<br>0.05 | RF 120 (mW/cm$^2$) | | 500 | 350 | 10 |
| | First p-type layer | SiH$_4$<br>H$_2$<br>BF$_3$/H$_2$ (diluted to 1%) | 0.05<br>100<br>5 | RF 1.5 (W/cm$^2$) | | 2000 | 250 | 10 |
| | Second n-type layer | Si$_2$H$_6$<br>H$_2$<br>PH$_3$/H$_2$ (diluted to 1%) | 1<br>50<br>1 | RF 80 (mW/cm$^2$) | | 1500 | 300 | 10 |
| | Second i-type layer | SiH$_4$<br>H$_2$ | 200<br>700 | Microwave 130 (mW/cm$^3$) | RF 250 (mW/cm$^3$)<br>DC 0V | 5 | 300 | 150 |
| | Second p-type layer | SiH$_4$<br>H$_2$<br>BF$_3$/H$_2$ (diluted to 1%) | 0.05<br>100<br>5 | RF 1.5 (W/cm$^2$) | | 2000 | 200 | 5 |
| Transparent electrode | | ITO (In$_2$O$_3$ + SnO$_2$) thin film 70 μm | | | | | | |
| Collector electrode | | Aluminum (Al) thin film 2 μm | | | | | | |

TABLE 63

| | | Substrate | SUS430BA 50 mm square 1 mm thick | | | | |
| | | Reflecting layer | Silver (Ag) thin film 100 nm | | | | |
| | | Reflection multiplying layer | Zinc oxide (ZnO) thin film 1 μm | | | | |

Figure 39:
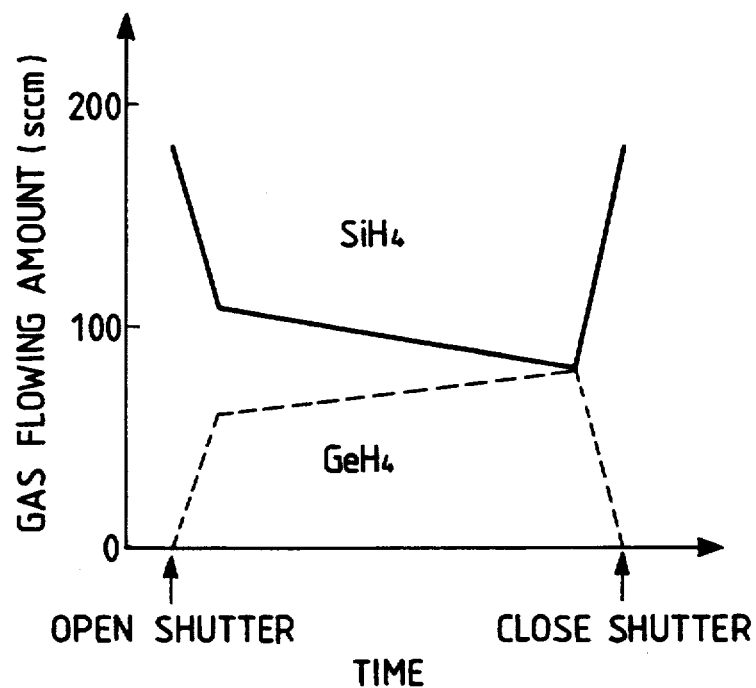
Figure 40:
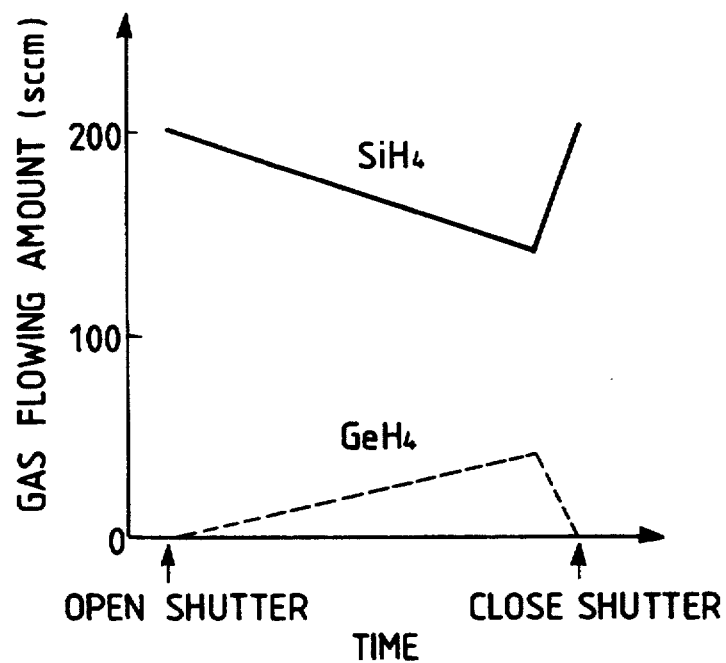

| | Layer name | gas used and flow (sccm) | | Microwave discharge electric power (mW/cm$^2$) | Bias | Pressure (mTorr) | Substrate temperature (°C.) | Layer thickness (nm) |
|---|---|---|---|---|---|---|---|---|
| Fabrication conditions of layer | First n-type layer | SiH$_4$<br>PH$_3$H$_2$ (diluted to 1%) | 50<br>200 | 130 | DC 50V | 10 | 350 | 10 |
| | First i-type layer 1 by RF plasma CVD | SiH$_4$<br>H$_2$<br>BF$_3$/H$_2$ (2000 ppm)<br>PH$_3$/H$_2$ (2000 ppm) | 8<br>100<br>0.05<br>1 | RF 120 (mW/cm$^2$) | | 500 | 350 | 10 |
| | First i-type layer by microwave plasma CVD | SiH$_4$<br>H$_2$<br>GeH$_4$ | See FIG. 39<br>500<br>See FIG. 39 | 170 | RF 350 (mW/cm$^3$)<br>DC 0V | 10 | 350 | 250 |
| | First i-type layer 2 by RF plasma CVD | SiH$_4$<br>H$_2$<br>BF$_3$/H$_2$ (2000 ppm)<br>PH$_3$/H$_2$ (2000 ppm) | 8<br>100<br>0.05<br>0.01 | RF 120 (mW/cm$^2$) | | 500 | 350 | 10 |
| | First p-type layer | SiH$_4$<br>H$_2$<br>BF$_3$/H$_2$ (diluted to 1%) | 10<br>700<br>30 | 250 | | 25 | 350 | 10 |
| | Second n-type layer | SiH$_4$<br>PH$_3$/H$_2$ (diluted to 1%) | 50<br>200 | 130 | DC 50V | 10 | 350 | 10 |
| | Second i-type layer 1 by RF plasma CVD | SiH$_4$<br>H$_2$<br>BF$_3$/H$_2$ (2000 ppm)<br>PH$_3$/H$_2$ (2000 ppm) | 8<br>100<br>0.1<br>3 | RF 120 (mW/cm$^2$) | | 500 | 350 | 10 |
| | Second i-type layer by microwave plasma CVD | SiH$_4$<br>H$_2$<br>GeH$_4$ | See FIG. 40<br>500<br>See FIG. 40 | 210 | RF 280 (mW/cm$^3$)<br>DC 0V | 10 | 350 | 200 |
| | Second i-type layer 2 by | SiH$_4$<br>H$_2$<br>BF$_3$/H$_2$ | 8<br>100<br>0.05 | RF 120 (mW/cm$^2$) | | 500 | 350 | 10 |

TABLE 63-continued

| | RF plasma CVD | (2000 ppm) PH$_3$/H$_2$ (2000 ppm) | 0.05 | | | | | |
|---|---|---|---|---|---|---|---|---|
| | Second p-type layer | SiH$_4$ H$_2$ BF$_3$/H$_2$ (diluted by 1%) | 10 700 30 | 250 | | 25 | 350 | 10 |
| | Third n-type layer | SiH$_4$ PH$_3$/H$_2$ (diluted to 1%) | 50 200 | 130 | DC 50V | 10 | 300 | 10 |
| | Third i-type layer | SiH$_4$ H$_2$ | 200 700 | 150 | RF 300 (mW/cm$^3$) DC 0V | 5 | 300 | 100 |
| | Third p-type layer | SiH$_4$ H$_2$ BF$_3$/H$_2$ (diluted to 1%) | 10 700 30 | 250 | | 25 | 300 | 5 |
| Transparent electrode | | | | ITO (In$_2$O$_3$ + SnO$_2$) thin film 70 μm | | | | |
| Collector electrode | | | | Aluminum (Al) thin film 2 μm | | | | |

TABLE 64

| Element No. | Pressure within deposition chamber (mTorr) | Initial characteristics Open-circuit voltage | Initial characteristics Fill factor | Low illuminance characteristic Photoelectric conversion efficiency | Durability characteristic Decrease in photoelectric conversion efficiency |
|---|---|---|---|---|---|
| Example 107-1 | 0.5 | 1.02 | 1.02 | 1.06 | 1.06 |
| Example 107-2 | 1 | 1.02 | 1.02 | 1.06 | 1.06 |
| Enample 107-3 | 2 | 1.03 | 1.03 | 1.07 | 1.06 |
| Example 107-4 | 5 | 1.03 | 1.03 | 1.07 | 1.08 |
| Example 107-5 | 10 | 1.04 | 1.02 | 1.07 | 1.08 |
| Example 107-6 | 20 | 1.03 | 1.02 | 1.06 | 1.07 |
| Example 107-7 | 50 | 1.03 | 1.01 | 1.06 | 1.07 |
| Comparative Example 93-1 | 100 | 1.00 | 1.00 | 1.00 | 1.00 |

Note) The initial characteristics, low illuminance characteristic and durability are relative values with reference to Element No. Comparative Example 93-1.

TABLE 65

| Element No. | Microwave power (W/cm$^3$) | Initial characteristics Open-circuit voltage | Initial characteristics Fill factor | Low illuminance characteristic Photoelectric conversion efficiency | Durability characteristic Decrease in photoelectric conversion efficiency |
|---|---|---|---|---|---|
| Example 107-8 | 0.1 | 1.03 | 1.02 | 1.07 | 1.06 |
| Example 107-9 | 0.2 | 1.02 | 1.02 | 1.09 | 1.09 |
| Example 107-10 | 0.3 | 1.02 | 1.02 | 1.06 | 1.07 |
| Comparative Example 93-2 | 0.4 | 1.00 | 1.01 | 1.01 | 1.02 |
| Comparative Example 93-3 | 0.5 | 1.00 | 1.00 | 1.00 | 1.00 |

Note) The initial characteristics, low illuminance characteristic and durability are relative values with reference to Element No. Comparative Example 93-3.

TABLE 66

| Element No. | RF bias (mW/cm$^3$) | Initial characteristics Open-circuit voltage | Initial characteristics Fill factor | Low illuminance characteristic Photoelectric conversion efficiency | Durability characteristic Decrease in photoelectric conversion efficiency |
|---|---|---|---|---|---|
| Comparative | 150 | 1.00 | 1.00 | 1.00 | 1.00 |
| Example 107-11 | 200 | 1.02 | 1.02 | 1.05 | 1.06 |
| Example 107-12 | 250 | 1.02 | 1.03 | 1.06 | 1.08 |
| Example 107-13 | 300 | 1.03 | 1.03 | 1.06 | 1.07 |

TABLE 66-continued

| Element No. | RF bias (mW/cm³) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 107-14 | 350 | 1.02 | 1.02 | 1.07 | 1.05 |

Note) The initial characteristics, low illuminance characteristic and durability are relative values with reference to Element No. Comparative Example 93-4.

TABLE 67

| Element No. | Flow rate of SiH₄ gas (sccm) | RF power (mW/cm²) | Deposition rate (nm/sec) | Initial characteristics Open-circuit voltage | Fill factor | Low illuminance characteristic Photoelectric conversion efficiency | Durability characteristic Decrease in photoelectric conversion efficiency |
|---|---|---|---|---|---|---|---|
| Example 107-16 | 1 | 15 | 0.05 | 1.03 | 1.03 | 1.08 | 1.07 |
| Example 107-17 | 2 | 30 | 0.1 | 1.04 | 1.03 | 1.07 | 1.07 |
| Example 107-17 | 10 | 150 | 0.5 | 1.04 | 1.02 | 1.07 | 1.08 |
| Example 107-19 | 20 | 300 | 1.1 | 1.03 | 1.02 | 1.07 | 1.07 |
| Example 107-20 | 40 | 500 | 2.0 | 1.03 | 1.02 | 1.06 | 1.06 |
| Comparative Example 93-6 | 60 | 1000 | 2.8 | 1.00 | 1.00 | 1.00 | 1.00 |

Note) The initial characteristics, low illuminance characteristic and durability are relative values with reference to Element No. Comparative Example 93-6.

TABLE 68

| Element No. | Layer thickness of i-type layer by RF plasma CVD (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Comparative | 0 | 1.00 | 1.00 | 1.00 | 1.00 |
| Example 107-21 | 1 | 1.02 | 1.02 | 1.03 | 1.05 |
| Example 107-22 | 3 | 1.03 | 1.02 | 1.05 | 1.07 |
| Example 107-5 | 10 | 1.03 | 1.03 | 1.06 | 1.07 |
| Example 107-23 | 30 | 1.02 | 1.02 | 1.06 | 1.05 |
| Comparative Example 93-8 | 50 | 1.01 | 1.00 | 1.02 | 1.01 |

Note) The initial characteristics, low illuminance characteristic and durability are relative values with reference to Element No. Comparative Example 93-7.

TABLE 69

| Element No. | Rf discharge power (mW/cm²) | Value of half-width at a peak of 2000 cm⁻¹ divided by peak height | Initial characteristics Open-circuit voltage | Fill factor | Low illuminance characteristic Photoelectric conversion efficiency | Durability characteristic Decrease in photoelectric conversion efficiency |
|---|---|---|---|---|---|---|
| Example 107-24 | 90 | 1.31 | 1.03 | 1.02 | 1.04 | 1.05 |
| Example 107-5 | 120 | 1.16 | 1.02 | 1.03 | 1.05 | 1.06 |
| Example 107-25 | 150 | 1.07 | 1.01 | 1.01 | 1.04 | 1.05 |
| Example 107-26 | 180 | 0.95 | 1.00 | 1.01 | 1.01 | 1.02 |
| Example 107-27 | 210 | 0.88 | 1.00 | 1.00 | 1.00 | 1.00 |

Note) The initial characteristics, low illuminance characteristic and durability are relative values with reference to Element No. Example 107-27.

TABLE 70

| Element No. | Layer Thickness of the region at maximum bandgap (nm) | Initial characteristics Open-circuit voltage | Fill factor | Low illuminance characteristic Photoelectric conversion efficiency | Durability characteristic Decrease in photoelectric conversion efficiency |
|---|---|---|---|---|---|
| Example 108-1 | 1 | 1.01 | 1.02 | 1.04 | 1.03 |
| Example 108-2 | 2 | 1.02 | 1.03 | 1.05 | 1.04 |
| Example 108-3 | 3 | 1.02 | 1.03 | 1.05 | 1.06 |
| Example 108-4 | 5 | 1.03 | 1.02 | 1.05 | 1.07 |
| Example 108-5 | 10 | 1.04 | 1.02 | 1.06 | 1.06 |
| Example 108-6 | 20 | 1.04 | 1.02 | 1.05 | 1.06 |

TABLE 70-continued

| Element No. | Layer Thickness of the region at maximum bandgap (nm) | Initial characteristics | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Example 108-7 | 30 | 1.02 | 1.02 | 1.04 | 1.05 |
| Example 108-8 | 50 | 1.00 | 1.00 | 1.00 | 1.00 |

Note) The initial characteristics, low illuminance characteristic and durability are relative values with reference to Element No. Example 108-8.

TABLE 71

| Element No. | Distance between mixing point of gases and deposition chamber (m) | Initial characteristics | | Low illuminance characteristic Photoelectric conversion efficiency | Durability characteristic Decrease in photoelectric conversion efficiency |
|---|---|---|---|---|---|
| | | Open-circuit voltage | Fill factor | | |
| Example 113-1 | 1 | 1.03 | 1.03 | 1.06 | 1.07 |
| Example 113-2 | 2 | 1.03 | 1.04 | 1.05 | 1.06 |
| Example 113-3 | 3 | 1.02 | 1.03 | 1.04 | 1.06 |
| Example 113-4 | 5 | 1.02 | 1.03 | 1.02 | 1.05 |
| Example 113-5 | 8 | 1.00 | 1.00 | 1.00 | 1.00 |

Note) The initial characteristics, low illuminance characteristic and durability are relative values with reference to Element No. Example 113-5.

TABLE 72

| Substrate | SUS430BA 50 mm square 1 mm thick |
|---|---|
| Reflecting layer | Silver (Ag) thin film 100 nm |
| Reflection multiplying layer | Zinc oxide (ZnO) thin film 1 μm |

| | Layer name | gas flow and flow (sccm) | Discharge electric power | Bias | Pressure (mTorr) | Substrate temperature (°C.) | Layer thickness (nm) |
|---|---|---|---|---|---|---|---|
| Fabrication conditions of layer | First n-type layer | $Si_2H_6$ 1<br>$H_2$ 50<br>$PH_3/H_2$ 1<br>(diluted to 1%) | RF 80 (mW/cm$^2$) | | 1500 | 370 | 20 |
| | First i-type layer 1 by RF plasma CVD | $SiH_4$ 8<br>$H_2$ 100<br>$BF_3/H_2$ 0.03<br>(2000 ppm)<br>$PH_3/H_2$ 0.5<br>(2000 ppm) | RF 120 (mW/cm$^2$) | | 500 | 350 | 20 |
| | First i type layer 2 by microwave plasma CVD | $SiH_4$ See FIG. 38<br>$H_2$ 500<br>$GeH_4$ See FIG. 38<br>$BF_3/H_2$ 0.3<br>(2000 ppm)<br>$PH_3/H_2$ 0.5<br>(2000 ppm) | Microwave 170 (mW/cm$^3$) | RF 350 (mW/cm$^3$) DC 0 V | 10 | 350 | 300 |
| | First i-type layer by RF plasma CVD | $SiH_4$ 8<br>$H_2$ 100<br>$CF_3/H_2$ 3<br>(2000 ppm)<br>$PH_3/H_2$ 0.05<br>(2000 ppm) | RF 120 (mW/cm$^2$) | | 500 | 350 | 10 |
| | First p-type layer | $SiH_4$ 0.05<br>$H_2$ 100<br>$BF_3/H_2$ 5<br>(diluted to 1%) | RF 1.5 (W/cm$^2$) | | 2000 | 250 | 10 |
| | Second n-type layer | $Si_2H_6$ 1<br>$H_2$ 50<br>$PH_3/H_2$ 1<br>(diluted to 1%) | RF 80 (mW/cm$^2$) | | 1500 | 300 | 10 |
| | Second i-type layer | $SiH_4$ 200<br>$H_2$ 700 | Microwave 130 (mW/cm$^3$) | FR 250 (mW/cm$^3$) DC 0 V | 5 | 300 | 150 |
| | Second p-type layer | $SiH_4$ 0.05<br>$H_2$ 100<br>$BF_3/H_2$ 5<br>(diluted to 1%) | RF 1.5 (W/cm$^2$) | | 2000 | 200 | 5 |
| Transparent electrode | ITO ($In_2O_3$ + $SnO_2$) thin film 70 μm | | | | | | |
| Collector electrode | Aluminum (Al) thin film 2 μm | | | | | | |

TABLE 73

| Substrate | SUS430BA 50 mm square 1 mm thick |
|---|---|
| Reflecting layer | Silver (Ag) thin film 100 nm |
| Reflection multiplying layer | Zinc oxide (ZnO) thin film 1 μm |

| | Layer name | gas used and flow (sccm) | Microwave discharge electric power (mW/cm$^3$) | Bias | Pressure (mTorr) | Substrate temperature (°C) | Layer thickness (nm) |
|---|---|---|---|---|---|---|---|
| Fabrication conditions of layer | First n-type layer | SiH$_4$ 50<br>PH$_3$/H$_2$ 200<br>(diluted to 1%) | 130 | DC 50 V | 10 | 350 | 10 |
| | First i-type layer 1 by RF plasma CVD | SiH$_4$ 8<br>H$_2$ 100<br>BF$_3$/H$_2$ 0.03<br>(2000 ppm)<br>PH$_3$/H$_2$ 1<br>(2000 ppm) | RF 120 (mW/cm$^2$) | | 500 | 350 | 10 |
| | First i-type layer by microwave plasma CVD | SiH$_4$ See FIG. 39<br>H$_2$ 500<br>GeH$_4$ See FIG. 39<br>BF$_3$/H$_2$ 1<br>(2000 ppm)<br>PH$_3$/H$_2$ 0.3<br>(2000 ppm) | 170 | RF 350 (mW/cm$^3$)<br>DC 0 V | 10 | 350 | 250 |
| | First i-type layer 2 by RF plasma CVD | SiH$_4$ 8<br>H$_2$ 100<br>BF$_3$/H$_2$ 0.3<br>(2000 ppm)<br>PH$_3$/H$_2$ 0.05<br>(2000 ppm) | RF 120 (mW/cm$^2$) | | 500 | 350 | 10 |
| | First p-type layer | SiH$_4$ 10<br>H$_2$ 700<br>BF$_3$/H$_2$ 30<br>(diluted to 1%) | 250 | | 25 | 350 | 10 |
| | Second n-type layer | SiH$_4$ 50<br>PH$_3$/H$_2$ 200<br>(diluted to 1%) | 130 | DC 50 V | 10 | 350 | 10 |
| | Second i-type layer 1 by RF plasma CVD | SiH$_4$ 8<br>H$_2$ 100<br>BF$_3$/H$_2$ 0.1<br>(2000 ppm)<br>PH$_3$/H$_2$ 2<br>(2000 ppm) | RF 120 (mW/cm$^2$) | | 500 | 350 | 10 |
| | Second i-type layer by microwave plasma CVD | SiH$_4$ See FIG. 40<br>H$_2$ 500<br>GeH$_4$ See FIG. 40<br>BF$_3$/H$_2$ 0.5<br>(2000 ppm)<br>PH$_3$/H$_2$ 0.1<br>(2000 ppm) | 210 | RF 280 (mW/cm$^3$)<br>DC 0 V | 10 | 350 | 200 |
| | Second i-type layer 2 by RF plasma CVD | SiH$_4$ 8<br>H$_2$ 100<br>BF$_3$/H$_2$ 1<br>(2000 ppm)<br>PH$_3$/H$_2$ 0.05<br>(2000 ppm) | RF 120 (mW/cm$^2$) | | 500 | 350 | 10 |
| | Second p-type layer | SiH$_4$ 10<br>H$_2$ 700<br>BF$_3$/H$_2$ 30<br>(diluted by 1%) | 250 | | 25 | 350 | 10 |
| | Third n-type layer | SiH$_4$ 50<br>PH$_3$/H$_2$ 200<br>(diluted to 1%) | 130 | DC 50 V | 10 | 300 | 10 |
| | Third i-type layer | SiH$_4$ 200<br>H$_2$ 700 | 150 | RF 300 (mW/cm$^3$)<br>DC 0 V | 5 | 300 | 100 |
| | Third p-type layer | SiH$_4$ 10<br>H$_2$ 700<br>BF$_3$/H$_2$ 30<br>(diluted to 1%) | 250 | | 25 | 250 | ≧5 |
| Transparent electrode | ITO (In$_2$O$_3$ + SnO$_2$) thin film 70 μm | | | | | | |
| Collector electrode | Aluminum (Al) thin film 2 μm | | | | | | |

As described above, the present invention provides a photoelectric conversion element with improved photoelectric conversion efficiency in which the open-circuit voltage and the path length of holes are enhanced by preventing the recombination of photoexcited carriers. Also, the photoelectric conversion element of the present invention has a superior conversion efficiency when the illuminating light is weak. The photoelectric conversion element of the present invention is not easily degraded in photoelectric conversion efficiency when annealed under vibrations for a long time period.

Furthermore, a power supply system utilizing the photoelectric conversion element of the present invention exhibits an excellent electric power supply capability when the illuminating light is weak.

What is claimed is:

1. A photoelectric conversion element in which at least a p-type layer, an i-type layer, and an n-type layer made of silicon-containing non-single crystalline semiconductor material are laminated, characterized in that said i-type layer is of a laminated structure consisting of an i-type layer formed by microwave plasma CVD located on the side of said n-type layer and an i-type layer formed by RF plasma CVD located on the side of said p-type layer, wherein said i-type layer formed by microwave plasma CVD is formed by a method in which a lower microwave energy and a higher RF energy than the microwave energy necessary to decompose 100% of the source gas are simultaneously applied to a source gas comprising a silicon atom-containing gas and a germanium atom-containing gas at a pressure of 50 mTorr or less, such that the minimum value of bandgap is shifted toward the p-type layer direction, away from the central position of the i-type layer, and wherein said i-type layer formed by RF plasma CVD is 30 nm thick or less and formed at a deposition rate of 2 nm/sec or less by an RF plasma CVD method using a source gas comprising a silicon atom-containing gas.

2. A photoelectric conversion element according to claim 1, characterized in that a valence electron control agent serving as a donor and a valence electron control agent serving as an acceptor are doped simultaneously in said i-type layer formed by microwave plasma CVD and/or said i-type layer formed by RF plasma CVD.

3. A photoelectric conversion element according to claim 2, characterized in that said valence electron control agent serving as a donor is an element of Group III in the periodic table, and said valence electron control agent serving as an acceptor is an element of Group V.

4. A photoelectric conversion element according to claim 2, characterized in that said valence electron control agents are distributed in the layer.

5. A photoelectric conversion element according to claim 4, characterized in that the greatest amount of valence electron agents is provided in the region having the minimum value of said bandgap.

6. A photoelectric conversion element according to claim 4, characterized in that the greatest amount of valence electron control agents is provided at the interface between said p-type layer and said i-type layer formed by RF plasma CVD.

7. A photoelectric conversion element according to claim 2, characterized in that said donor or acceptor of said valence electron control agent is from 0.1 to 100 ppm.

8. A photoelectric conversion element according to claim 1, characterized in that the maximum value of bandgap is located at the p-type layer side and/or the n-type layer side within said i-type layer formed by microwave plasma CVD, and the region of the maximum value of bandgap is from 1 to 30 nm thick.

9. A photoelectric conversion element according to claim 1, characterized in that oxygen atoms and/or nitrogen atoms are contained in said i-type layer formed by microwave plasma CVD and/or said i-type layer formed by RF plasma CVD.

10. A photoelectric conversion element according to claim 1, characterized in that the content of hydrogen contained in said i-type layer formed by microwave plasma CVD changes corresponding to the content of silicon atoms.

11. A photoelectric conversion element according to claim 1, characterized in that said p-type layer and/or said n-type layer is of a laminated structure consisting of a layer having a Group III and/or Group V element of the periodic table as the main constituent and a layer containing a valence electron control agent and having silicon atoms as the main constituent.

12. A photoelectric conversion element according to claim 11, characterized in that the thickness of said layer containing a Group III and/or Group V element of the periodic table as the main constituent is 1 nm thick or less.

13. A photoelectric conversion element according to claim 11, characterized in that said n-type and/or p-type layer containing a valence electron control agent and having silicon atoms as the main constituent is in contact with the i-type layer.

14. A photoelectric conversion element according to claim 1, characterized in that said silicon atom-containing gas and said germanium atom-containing gas are mixed at a distance of less than 5 meters away from the deposition chamber.

15. A photoelectric conversion element according to claim 1, characterized in that there is an i-type layer between said n-type layer and said i-type layer formed by microwave plasma CVD.

16. A photoelectric conversion element according to claim 15, characterized in that the i-type layer between said n-type layer and said i-type layer formed by microwave plasma CVD is an i-type layer formed by RF plasma CVD.

17. A power generation system comprising a photoelectric conversion element according to claim 1 and a control system for controlling the electric power to be supplied to a load while sensing the voltage and/or the current of said photoelectric conversion element.

18. A power generation system according to claim 17, characterized in that said load is an accumulator for accumulating electric power from said photoelectric conversion element and/or supplying electric power to an external load.

19. A photoelectric conversion element in which at least a p-type layer, an i-type layer, and an n-type layer made of silicon containing non-single crystalline semiconductor material are laminated, characterized in that said i-type layer is of a laminated structure consisting of an i-type layer formed by microwave plasma CVD located on the side of said p-type layer and an i-type layer formed by RF plasma CVD located on the side of said n-type layer, wherein said i-type layer formed by microwave plasma CVD is formed by a method in which a lower microwave energy and a higher RF energy than the microwave energy necessary to decompose 100% of the source gas are simultaneously applied to a source gas comprising a silicon atom-containing gas and a germanium atom-containing gas at a pressure of 50 mTorr or less, such that the minimum value of bandgap is shifted toward the p-type layer direction, away from the central position of the i-type layer, and wherein said i-type layer formed by RF plasma CVD is 30 nm thick or less and is formed at a deposition rate of 2 nm/sec or less.

20. A photoelectric conversion element according to claim 19, characterized in that a valence electron control agent serving as a donor and a valence electron control agent serving as an acceptor are doped simultaneously in said i-type layer formed by microwave plasma CVD and/or said i-type layer formed by RF plasma CVD.

21. A photoelectric conversion element according to claim 20, characterized in that said valence electron control agent serving as a donor is an element of Group III in the periodic table, and said valence electron control agent serving as an acceptor is an element of Group V.

22. A photoelectric conversion element according to claim 20, characterized in that said valence electron control agents are distributed in the layer.

23. A photoelectric conversion element according to claim 22, characterized in that the greatest amount of valence electron agents is provided in the region having the minimum value of said bandgap.

24. A photoelectric conversion element according to claim 22, characterized in that the greatest amount of valence electron control agents is provided at the interface between said n-type layer and said i-type layer formed by RF plasma CVD.

25. A photoelectric conversion element according to claim 20, characterized in that said donor or acceptor of said valence electron control agent is from 0.1 to 100 ppm.

26. A photoelectric conversion element according to claim 19, characterized in that the maximum value of bandgap is located at the p-type layer side and/or the n-type layer side within said i-type layer formed by microwave plasma CVD, and the region of the maximum value of bandgap is from 1 to 30 nm thick.

27. A photoelectric conversion element according to claim 19, characterized in that oxygen atoms and/or nitrogen atoms are contained in said i-type layer formed by microwave plasma CVD and/or said i-type layer formed by RF plasma CVD.

28. A photoelectric conversion element according to claim 19, characterized in that the content of hydrogen contained in said i-type layer formed by microwave plasma CVD changes corresponding to the content of silicon atoms.

29. A photoelectric conversion element according to claim 19, characterized in that said silicon atom-containing gas and said germanium atom-containing gas are mixed at a distance of less than 5 meters away from the deposition chamber.

30. A photoelectric conversion element according to claim 19, characterized in that there is an i-type layer between said p-type layer and said i-layer formed by microwave plasma CVD.

31. A photoelectric conversion element according to claim 30, characterized in that the i-type layer between said p-type layer and said i-type layer formed by microwave plasma CVD is an i-type layer formed by RF plasma CVD.

32. A power generation system comprising a photoelectric conversion element according to claim 19 and a control system for controlling the electric power to be supplied to a load while sensing the voltage and/or the current of said photoelectric conversion element.

33. A power generation system according to claim 32, characterized in that said load is an accumulator for accumulating electric power from said photoelectric conversion element and/or supplying electric power to an external load.

34. A photoelectric conversion element according to claim 19, characterized in that said p-type layer and/or said n-type layer is of a laminated structure consisting of a layer having a Group III and/or Group V element of the periodic table as the main constituent and a layer containing a valence electron control agent and having silicon atoms as the main constituent.

35. A photoelectric conversion element according to claim 34 characterized in that said n-type and/or p-type layer containing a valence electron control agent and having silicon atoms as the main constituent is in contact with the i-type layer.

* * * * *

UNITED STATES PATENT AND TRADEMARK OFFICE
CERTIFICATE OF CORRECTION

PATENT NO. : 5,429,685
DATED : July 4, 1995
INVENTOR(S) : KEISHI SAITO, ET AL.

It is certified that error appears in the above-indentified patent and that said Letters Patent is hereby corrected as shown below:

COLUMN 17
    Line 12, "sources" should read --source--.

COLUMN 21
    Line 30, "1 W/cm$_3$," should read --1 W/cm$^3$,--.

COLUMN 22
    Line 30, "ration" should read --ratio--.

COLUMN 23
    Line 22, "suitable" should read --suitably--.

COLUMN 25
    Line 22, "samples" should read --examples--.

COLUMN 27
    Line 65, "250mW/cM$^3$," should read --250mW/cm$^3$,--.

COLUMN 29
    Line 14, "photovoltaic," should read --photovoltaic elements,--.

UNITED STATES PATENT AND TRADEMARK OFFICE
CERTIFICATE OF CORRECTION

PATENT NO. : 5,429,685
DATED : July 4, 1995
INVENTOR(S) : KEISHI SAITO, ET AL.

It is certified that error appears in the above-indentified patent and that said Letters Patent is hereby corrected as shown below:

COLUMN 30

Line 20, FIG. 265" should read --FIG. 26B--.

COLUMN 39

Line 1, "electrodes" should read --electrode,--.

COLUMN 69

Line 2, "reflecting" should read --a reflecting--; and

Line 15, "form" should read --formation--.

COLUMN 88

Line 32, "of-Example" should read --of Example--.

COLUMN 94

Line 5, "dependent" should read --deposition--.

COLUMN 100

Line 2, "Form" should read --From--.

COLUMN 107

Table 13, under Layer name, "layer (diluted to 1%) should read --layer--; and under gas used and flow, $BF_3H_2$" should read --$BF_3H_2$ (diluted to 1%)--;

UNITED STATES PATENT AND TRADEMARK OFFICE
CERTIFICATE OF CORRECTION

PATENT NO. : 5,429,685
DATED : July 4, 1995
INVENTOR(S) : KEISHI SAITO, ET AL.

It is certified that error appears in the above-indentified patent and that said Letters Patent is hereby corrected as shown below:

COLUMN 107, Cont'd.

Table 14, under gas used and flow, "$Si_2H_4$" should read --$SiH_4$--; and under Bias, "RF 350 (mW/cm$^3$)" should read --RF350 (mW/cm$^3$) DC OV--.

COLUMN 109

Table 14, under Second i-type layer by RF plasma CVD,
"210    RF280    10    350    200" should read
--RF120 (mW/cm$^3$)  -  500  350  10--;

Table 15, under gas used and flow (sccm), "(diluted" (first occurrence) should read --(diluted to 1%)--; and under Layer name, "1%)" should be deleted.

COLUMN 111

Table 19, under Flowrate (etc.), "1" (second occurrence) should be deleted.

COLUMN 117

Table 27, "$BF_3/H_{22}$" should read --$BF_3/H_2$--.

COLUMN 119

Table 29, under gas used and flow (sccm), $PH_{33}/H_2$" should read --$PH_3/H_2$--.

UNITED STATES PATENT AND TRADEMARK OFFICE
CERTIFICATE OF CORRECTION

PATENT NO. : 5,429,685
DATED : July 4, 1995
INVENTOR(S) : KEISHI SAITO, ET AL.

It is certified that error appears in the above-indentified patent and that said Letters Patent is hereby corrected as shown below:

COLUMN 127

Table 39, "See FIG. 35A5" should read --See FIG. 36A--; and "See FIG. 35A" should read --See FIG. 36A--.

COLUMN 141

Table 63, under <u>Microwave discharge (etc.)</u>, RF 120" (second occurrence) should read --RF 120 $(mW/cm_2)$-- and under <u>Bias</u>, "$(mW/cm_2)$" should be deleted.

COLUMN 143

Table 63, under <u>gas used and flow (sccm)</u>, "by 1%)" should read --to 1%)--; and Table 66, under <u>Element No.</u>, "comparative" should read --Comparative Example 93-4--.

COLUMN 145

Table 67, under <u>Element No.</u>, "Example 107-17" (second occurrence should read --Example 107-18--;

Table 68, under <u>Element No.</u>, "comparative" should read --Comparative Example 93-7--;

Table 69, "Rf Discharge" should read --RF Discharge--; and

Table 70, "Thickness" should read --thickness--.

UNITED STATES PATENT AND TRADEMARK OFFICE
CERTIFICATE OF CORRECTION

PATENT NO. : 5,429,685
DATED : July 4, 1995
INVENTOR(S) : KEISHI SAITO, ET AL.

It is certified that error appears in the above-indentified patent and that said Letters Patent is hereby corrected as shown below:

COLUMN 147

Table 70, "Thickness" should read --thickness--; and

Table 72, "gas flow" should read --Gas used--; and under <u>gas flow, etc.</u>, "$CF_3/H_2$" should read --$BF_3/H_2$--.

COLUMN 149

Table 73, under <u>gas used and flow (sccm)</u>, "(diluted by 1%)" should read --(diluted to 1%)--.

COLUMN 152

Line 50, "silicon containing" should read --silicon-containing--.

COLUMN 154

Line 13, "i-layer" should read --i-type layer--.

Signed and Sealed this

Twenty-sixth Day of December, 1995

Attest:

BRUCE LEHMAN

*Attesting Officer*     *Commissioner of Patents and Trademarks*